(12) United States Patent
Ihn et al.

(10) Patent No.: US 11,404,646 B2
(45) Date of Patent: Aug. 2, 2022

(54) ORGANIC LIGHT-EMITTING DEVICE

(71) Applicant: Samsung Electronics Co., Ltd., Suwon-si (KR)

(72) Inventors: Sooghang Ihn, Hwaseong-si (KR); Myungsun Sim, Suwon-si (KR); Daun Jeong, Anyang-si (KR); Jongsoo Kim, Seoul (KR); Joonghyuk Kim, Seoul (KR); Hasup Lee, Seoul (KR); Soonok Jeon, Suwon-si (KR); Yeonsook Chung, Seoul (KR); Yongsik Jung, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 343 days.

(21) Appl. No.: 16/452,833

(22) Filed: Jun. 26, 2019

(65) Prior Publication Data

US 2019/0393425 A1 Dec. 26, 2019

(30) Foreign Application Priority Data

Jun. 26, 2018 (KR) ......................... 10-2018-0073403

(51) Int. Cl.
*H01L 51/50* (2006.01)
*H01L 51/00* (2006.01)
*H01L 51/52* (2006.01)

(52) U.S. Cl.
CPC ........ *H01L 51/0072* (2013.01); *H01L 51/006* (2013.01); *H01L 51/0054* (2013.01); *H01L 51/0056* (2013.01); *H01L 51/0061* (2013.01); *H01L 51/0067* (2013.01); *H01L 51/0081* (2013.01); *H01L 51/5036* (2013.01); *H01L 51/5056* (2013.01); *H01L 51/5072* (2013.01); *H01L 51/5092* (2013.01); *H01L 51/529* (2013.01); *H01L 2251/5376* (2013.01)

(58) Field of Classification Search
None
See application file for complete search history.

(56) References Cited

U.S. PATENT DOCUMENTS 9,899,609 B2    2/2018  Ren et al.
10,062,852 B2   8/2018  Kim et al.
(Continued)

FOREIGN PATENT DOCUMENTS

EP    3015457 A1    5/2016
EP    3130591 A1    2/2017
(Continued)

OTHER PUBLICATIONS

Zhang et al., A CBP derivative as bipolar host for performance enhancement in phosphorescent organic light-emitting diodes, 2013, J. Mater. Chem. C, 2013, 1, 757-764 (Year: 2013).*
(Continued)

*Primary Examiner* — Gregory D Clark
(74) *Attorney, Agent, or Firm* — Cantor Colburn LLP

(57) ABSTRACT

An organic light-emitting device including a first electrode, a second electrode facing the first electrode, and an emission layer disposed between the first electrode and the second electrode, wherein the emission layer includes a predetermined host and a thermally activated delayed fluorescence emitter.

20 Claims, 1 Drawing Sheet

(56) References Cited

U.S. PATENT DOCUMENTS

| | | |
|---|---|---|
| 10,297,764 B2 | 5/2019 | Ihn et al. |
| 2016/0130225 A1 | 5/2016 | Tasaki et al. |
| 2016/0315268 A1* | 10/2016 | Stoessel ............... H01L 51/005 |
| 2016/0380209 A1 | 12/2016 | Kim et al. |
| 2017/0047526 A1 | 2/2017 | Chung et al. |
| 2017/0062734 A1* | 3/2017 | Suzuki ............... H01L 51/5004 |
| 2017/0077421 A1 | 3/2017 | Ihn et al. |
| 2017/0141323 A1 | 5/2017 | Miyazaki et al. |
| 2018/0248125 A1 | 8/2018 | Kim et al. |
| 2019/0252622 A1 | 8/2019 | Kim et al. |

FOREIGN PATENT DOCUMENTS

| | | |
|---|---|---|
| EP | 3287450 A1 | 2/2018 |
| IN | 201634025274 | 12/2016 |
| JP | 2017-041636 A | 2/2017 |
| KR | 10-2017-0000310 A | 1/2017 |
| KR | 10-2017-0000323 A | 1/2017 |
| KR | 10-2017-0032148 A | 3/2017 |
| KR | 10-2017-0056951 A | 5/2017 |
| KR | 1020190059224 A | 5/2019 |
| KR | 1020190097971 A | 8/2019 |

OTHER PUBLICATIONS

Extended European search report issued by the European Patent Office dated Nov. 19, 2019 in the examination of the European Patent Application No. 19182341.8, which corresponds to the U.S. Application above.

Dong et al. "Supramolecular interactions induced fluorescent organic nanowires with high quantum yield based on 9,10-distyrylanthracene", CrystEngComm, 2012, 14, 6593-6598.

Kalcic et al. "Controlling he Excited State Charge Transfer in DMABN Using Shaped Femtosecond Pulses", JWA61.pdf, Optical Society of America, Lasers & Electro-Optics, 2007, 2 pages.

Lippert et al. "Umwandlung von Elektronenanregungsenergie", Angrew. Chem, 1961, 73(21), 695.

Lopez-De-Luzuriaga et al. "The effect of gold(l) coordination on the dual fluorescence of 4-(dimethylamino) pyridine", The Royal Society of Chemistry, Dalton Transactions, 2015, 44, 11029.

Sasaki et al. "Recent advances in twisted intramolecular charge transfer (TICT) fluorescence and related phenomena in materials chemistry", Journal of Materials Chemistry C ., 2016, 4, 2731.

Zhu et al. "Ultrafast Investigation of Intramolecular Charge transfer and Solvation Dynamics of Tetrahydro[5]-helicene-Based Imide derivatives", Nature, Scientific Reports, 2016, 6, 24313.

* cited by examiner

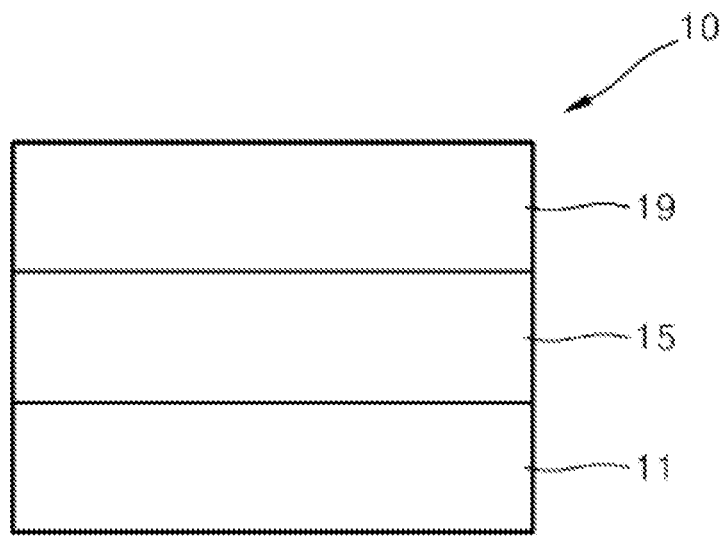

ORGANIC LIGHT-EMITTING DEVICE

CROSS-REFERENCE TO RELATED APPLICATION

This application claims priority to Korean Patent Application No. 10-2018-0073403, filed on Jun. 26, 2018, in the Korean Intellectual Property Office, and all the benefits accruing therefrom under 35 U.S.C. § 119, the content of which is incorporated herein in its entirety by reference.

BACKGROUND

1. Field

One or more embodiments relate to an organic light-emitting device.

2. Description of the Related Art

Organic light-emitting devices (OLEDs) are self-emission devices that produce full-color images, and that also have wide viewing angles, high contrast ratios, short response times, and excellent characteristics in terms of brightness, driving voltage, and response speed, compared to devices in the art.

In an example, an organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in an emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide an organic light-emitting device having high efficiency and a long lifespan.

Additional aspects will be set forth in part in the description which follows and, in part, will be apparent from the description, or may be learned by practice of the presented embodiments.

An aspect provides an organic light-emitting device including:

a first electrode;

a second electrode facing the first electrode; and an emission layer disposed between the first electrode and the second electrode, wherein the emission layer includes a host and a thermally activated delayed fluorescence emitter, and wherein the host includes at least one compound selected from a compound represented by Formula 1 and a compound represented by Formula 2, and CZ in Formulae 1 and 2 is a group represented by Formula CZ1 or CZ2:

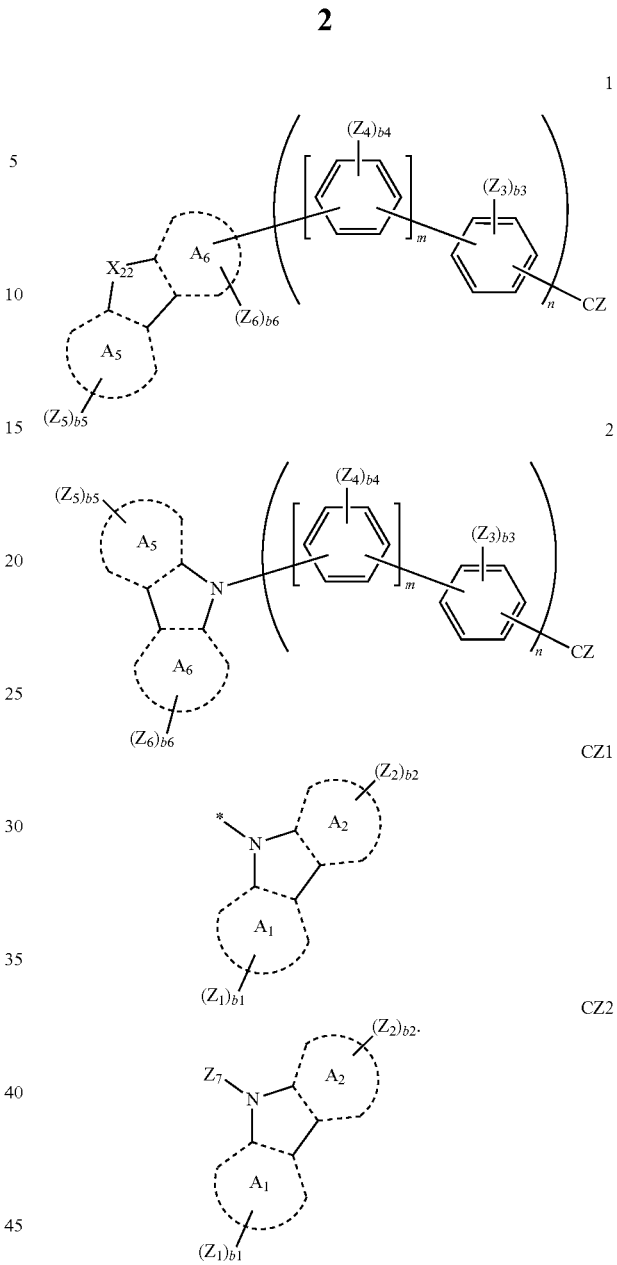

In Formulae 1, 2, CZ1, and CZ2, rings $A_1$, $A_2$, $A_5$, and $A_6$ may each independently be a benzene group, a naphthalene group, a fluorene group, a carbazole group, a dibenzosilole group, a dibenzofuran group, or a dibenzothiophene group, wherein ring $A_6$ in Formula 2 may be a dibenzofuran group or a dibenzothiophene group, $X_{22}$ may be O or S, m may be 0, 1, or 2, n may be 0 or 1, $Z_1$ to $Z_7$ may each independently be:

hydrogen, deuterium, or a cyano group (CN); or a $C_1$-$C_{20}$ alkyl group, a phenyl group, a biphenyl group, a terphenyl group, a dibenzofuranyl group, or a dibenzothiophenyl group, each unsubstituted or substituted with deuterium, a cyano group, a $C_1$-$C_{20}$ alkyl group, a phenyl group, a biphenyl group, or any combination thereof, b1 to b6 may each independently be 0, 1, 2, or 3,

*indicates a binding site to a neighboring atom, and each of the compound represented by Formula 1 and the compound represented by Formula 2 may include at least one cyano group.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURES are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

According to one or more exemplary embodiments, an organic light-emitting device is provided. The organic light-emitting device includes a first electrode, a second electrode facing the first electrode, and an emission layer disposed between the first electrode and the second electrode, The emission layer may include a host and a thermally activated delayed fluorescence emitter.

In one or more embodiments, the host may include at least one compound selected from a compound represented by Formula 1 and a compound represented by Formula 2:

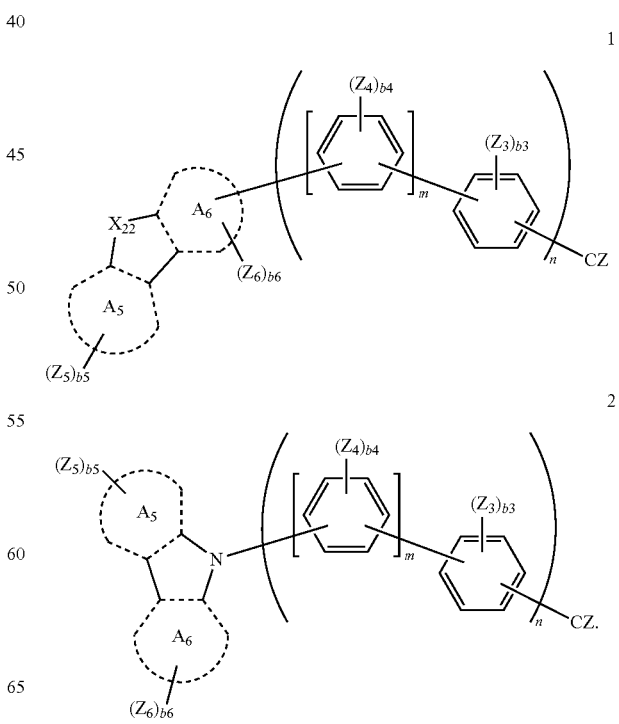

CZ in Formulae 1 and 2 may be a group represented by Formula CZ1 or CZ2:

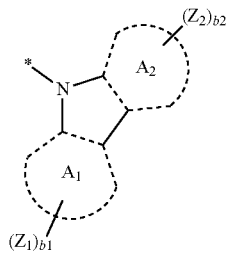

CZ1

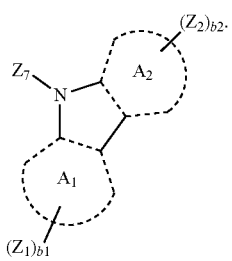

CZ2

In Formulae 1, 2, CZ1, and CZ2, rings $A_1$, $A_2$, $A_5$, and $A_6$ may each independently be a benzene group, a naphthalene group, a fluorene group, a carbazole group, a dibenzosilole group, a dibenzofuran group, or a dibenzothiophene group, wherein ring $A_6$ in Formula 2 may be a dibenzofuran group or a dibenzothiophene group.

For example, rings $A_5$ and $A_6$ in Formula 1, rings $A_5$ in Formula 2, and rings $A_1$ and $A_2$ in Formulae CZ1 and CZ2 may each be a benzene group, and ring $A_6$ in Formula 2 may be a dibenzofuran group or a dibenzothiophene group, but embodiments of the present disclosure are not limited thereto.

$X_{22}$ in Formula 1 may be O or S.

m in Formulae 1 and 2 may be 0, 1, or 2.

n in Formulae 1 and 2 may be 0 or 1.

When n in Formula 1 and 2 is 0, a group represented by

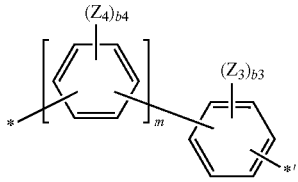

in Formulae 1 and 2 may be a single bond.

In Formulae 1, 2, CZ1, and CZ2, $Z_1$ to $Z_7$ may each independently be:

hydrogen, deuterium, or a cyano group (CN); or a $C_1$-$C_{20}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_1$-$C_{20}$ alkyl group, a phenyl group, and a biphenyl group.

In an embodiment, in Formulae 1, 2, CZ1, and CZ2, $Z_1$ to $Z_7$ may each independently be:

hydrogen, deuterium, or a cyano group; or a $C_3$-$C_{10}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_3$-$C_{10}$ alkyl group, a phenyl group, and a biphenyl group.

In one or more embodiments, in Formulae 1, 2, CZ1, and CZ2, $Z_1$ to $Z_7$ may each independently be:

hydrogen, deuterium, or a cyano group; or an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, a biphenyl group, or a terphenyl group, each unsubstituted or substituted with at least one selected from deuterium, a cyano group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a biphenyl group.

In Formulae 1, 2, CZ1, and CZ2, b1 to b6 respectively indicate the number of groups $Z_1$ to groups $Z_6$, and may each independently be 0, 1, 2, or 3. When b1 to b6 are each two or more, two or more groups corresponding $Z_1$ to groups $Z_6$ may be respectively identical to or different from each other. For example, b1 to b6 may each independently be 0, 1, or 2, but embodiments of the present disclosure are not limited thereto.

In Formulae CZ1 and CZ2, *indicates a binding site to a neighboring atom.

Each of the compound represented by Formula 1 and the compound represented by Formula 2 may include at least one cyano group.

For example, the number of cyano groups included in the compound represented by Formula 1 and the number of cyano groups included in the compound represented by Formula 2 may each independently be 1, 2, 3, or 4 (for example, 1 or 2).

In one or more embodiments, regarding Formulae 1 and 2, at least one selected from groups $Z_1$ in the number of b1 and groups $Z_2$ in the number of b2 may be a cyano group, at least one selected from groups $Z_3$ in the number of b3 and groups $Z_4$ in the number of b4 may be a cyano group, at least one selected from groups $Z_5$ in the number of b5 and groups $Z_6$ in the number of b6 may be a cyano group, at least one selected from groups $Z_1$ in the number of b1 and groups $Z_2$ in the number of b2 may be a cyano group, and at least one selected from groups $Z_3$ in the number of b3 and groups $Z_4$ in the number of b4 may be a cyano group, at least one selected from groups $Z_1$ in the number of b1 and groups $Z_2$ in the number of b2 may be a cyano group, and at least one selected from groups $Z_5$ in the number of b5 and groups $Z_6$ in the number of b6 may be a cyano group, at least one selected from groups $Z_3$ in the number of b3 and groups $Z_4$ in the number of b4 may be a cyano group, and at least one selected from groups $Z_5$ in the number of b5 and groups $Z_6$ in the number of b6 may be a cyano group, or at least one selected from groups $Z_1$ in the number of b1 and groups $Z_2$ in the number of b2 may be a cyano group, and at least one selected from groups $Z_3$ in the number of b3 and groups $Z_4$ in the number of b4 may be a cyano group, and at least one selected from groups $Z_5$ in the number of b5 and groups $Z_6$ in the number of b6 may be a cyano group.

In one or more embodiments, CZ in Formulae 1 and 2 may be a group represented by Formula CZ2, and $Z_7$ in Formula CZ2 may be a $C_1$-$C_{20}$ alkyl group, a phenyl group, a biphenyl group, a terphenyl group, a dibenzofuranyl group, or a dibenzothiophenyl group, each substituted with at least one cyano group, but embodiments of the present disclosure are not limited thereto.

In one or more embodiments, a group represented by
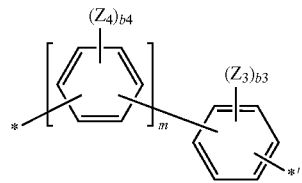
in Formulae 1 and 2 may be one selected from groups represented by Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, but embodiments of the present disclosure are not limited thereto:
PO1
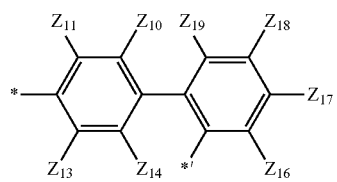
PO2
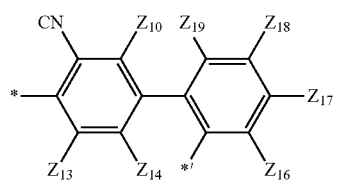
PO3
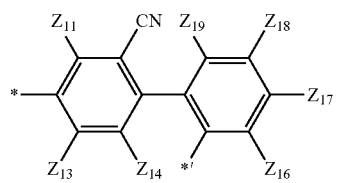
PO4
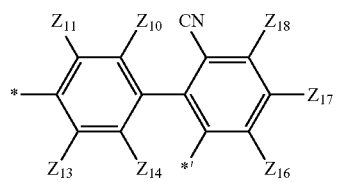
PO5
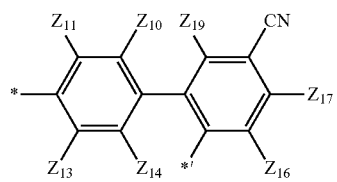
PO6
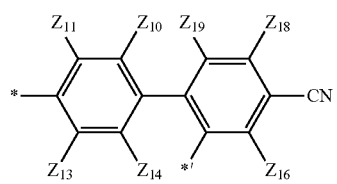
PO7
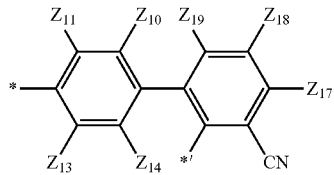
PO8
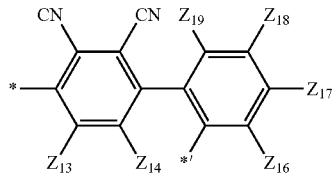
PO9
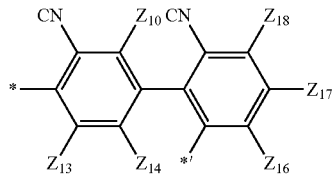
PO10
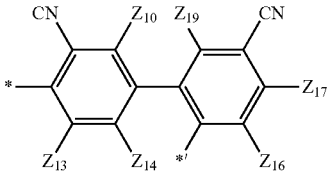
PO11
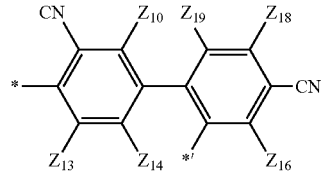
PO12
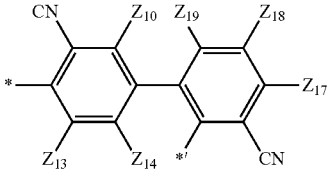
PO13
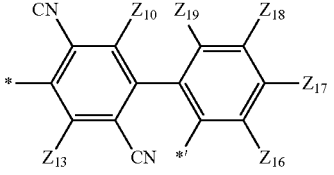
PO14
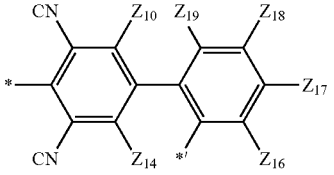

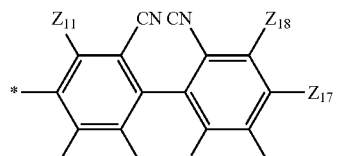
PO15
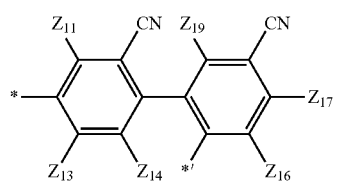
PO16
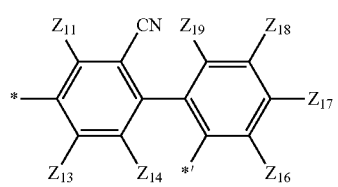
PO17
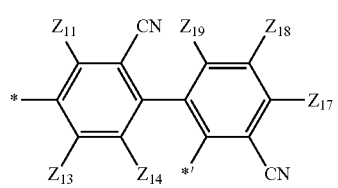
PO18
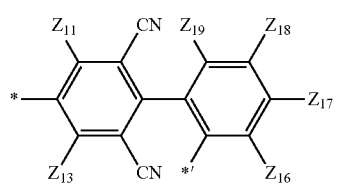
PO19
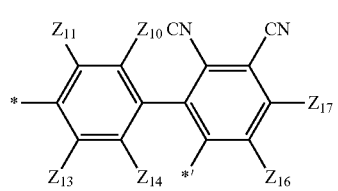
PO20
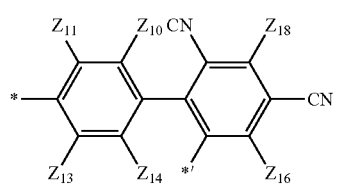
PO21
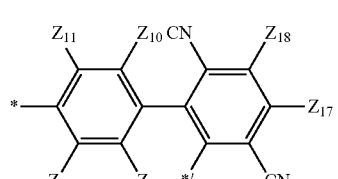
PO22
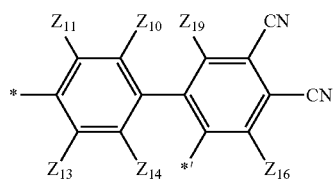
PO23
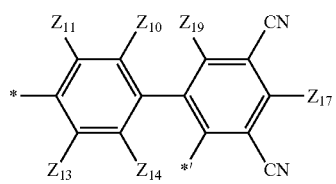
PO24
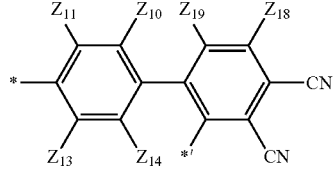
PO25
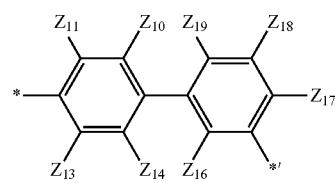
PM1
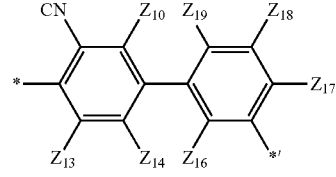
PM2
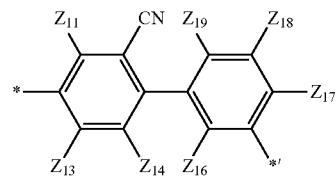
PM3
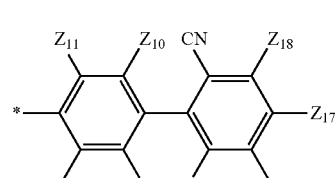
PM4
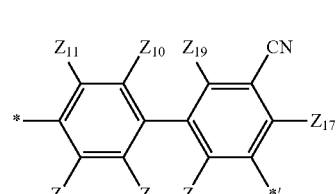
PM5

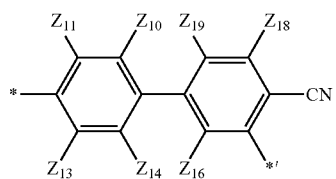 PM6
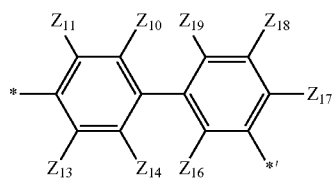 PM7
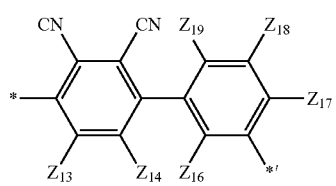 PM8
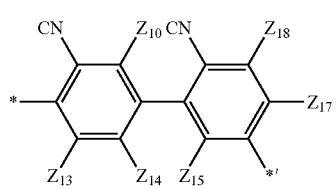 PM9
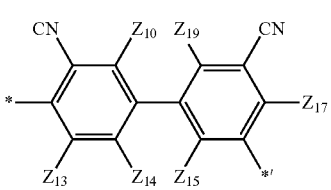 PM10
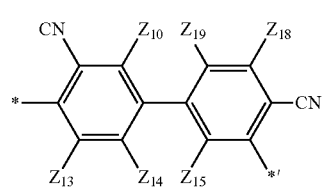 PM11
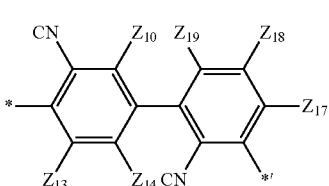 PM12
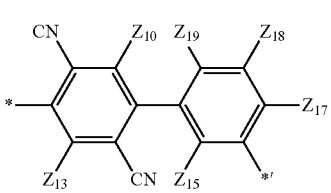 PM13
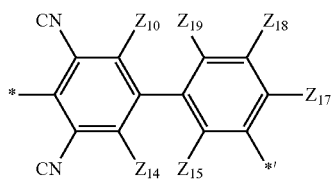 PM14
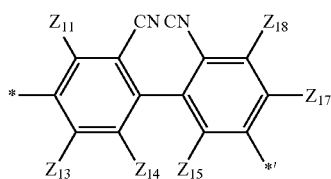 PM15
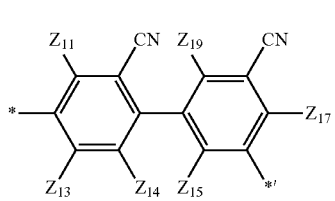 PM16
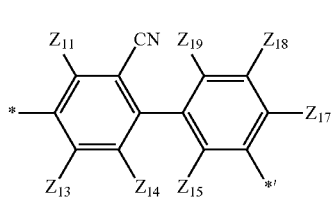 PM17
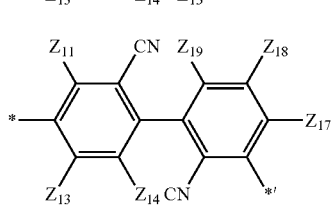 PM18
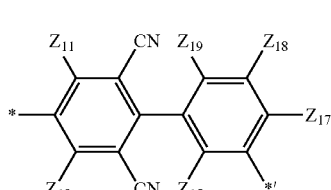 PM19
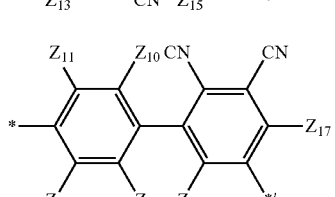 PM20
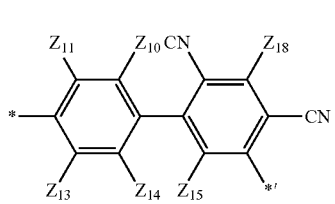 PM21

-continued

PM22, PM23, PM24, PM25, PP1, PP2, PP3, PP4

PP5, PP6, PP7, PP8, PP9, PP10, PP11, PP12

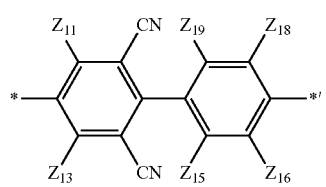 PP13
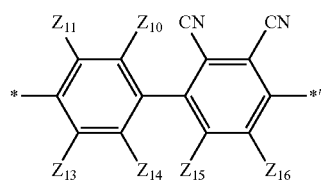 PP14
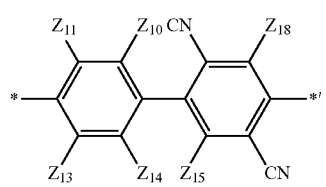 PP15
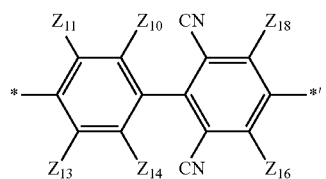 PP16
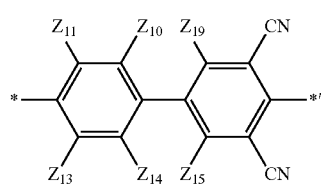 PP17
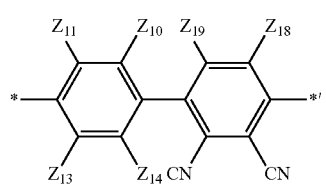 PP18
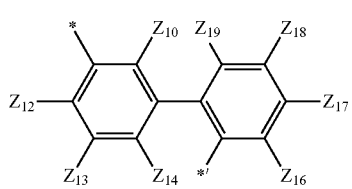 MO1
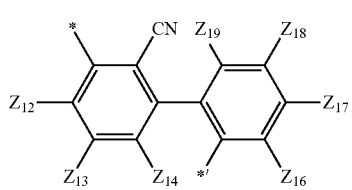 MO2
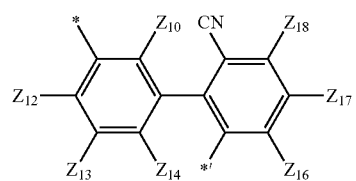 MO3
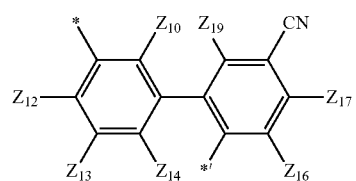 MO4
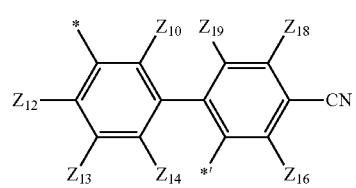 MO5
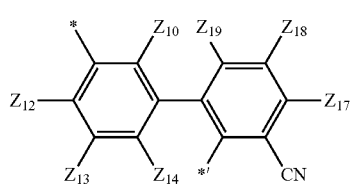 MO6
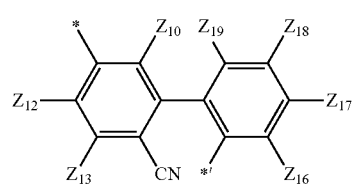 MO7
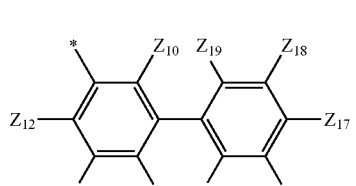 MO8
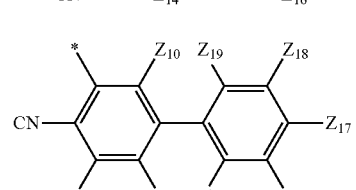 MO9
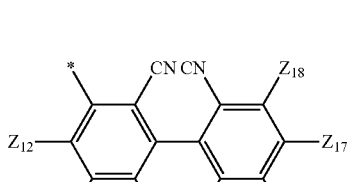 MO10

-continued
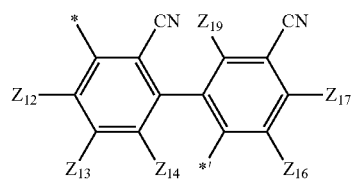
MO11
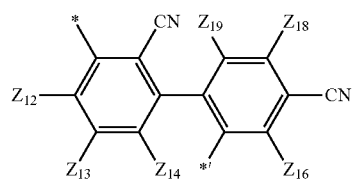
MO12
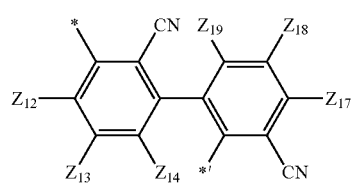
MO13
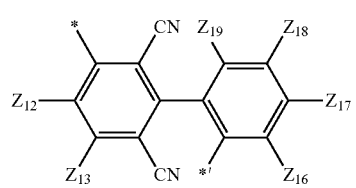
MO14
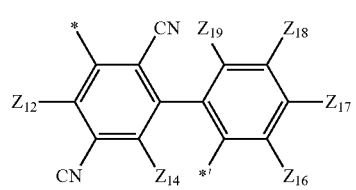
MO15
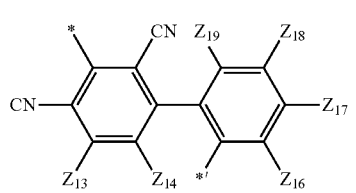
MO16
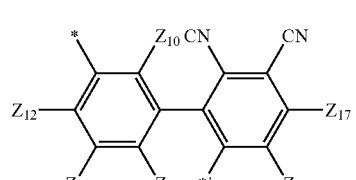
MO17
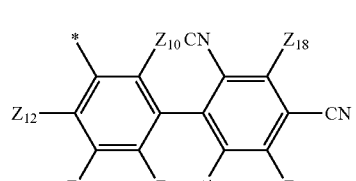
MO18
-continued
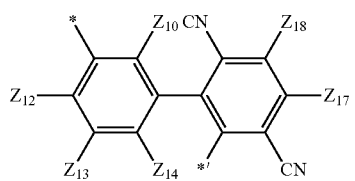
MO19
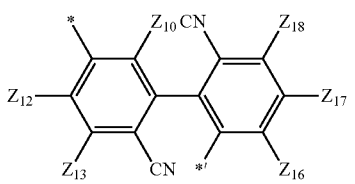
MO20
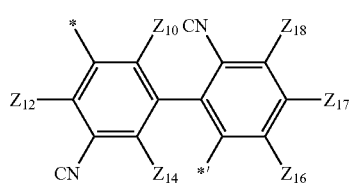
MO21
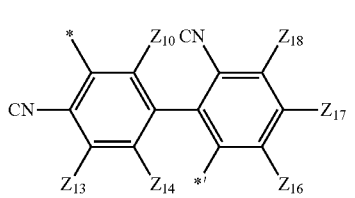
MO22
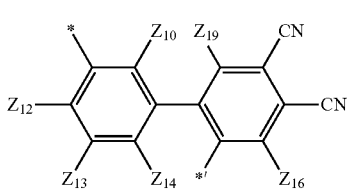
MO23
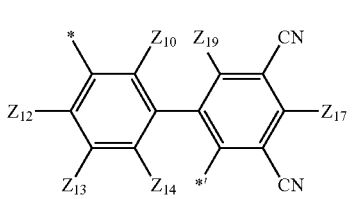
MO24
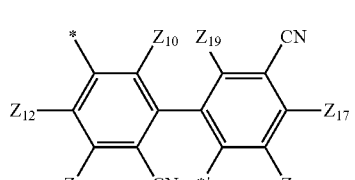
MO25
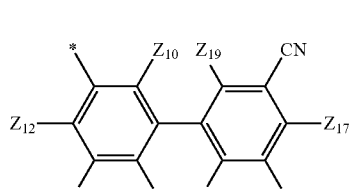
MO26

MO27
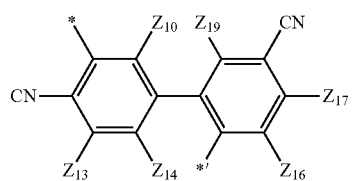
MO28
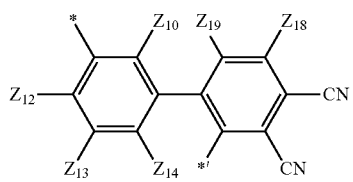
MO29
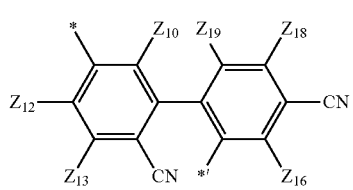
MO30
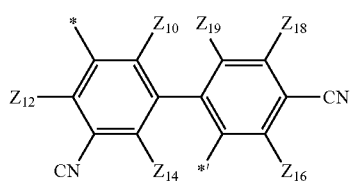
MO31
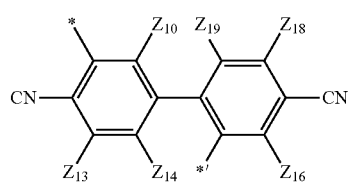
MO32
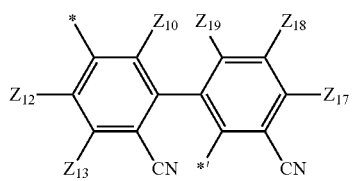
MO33
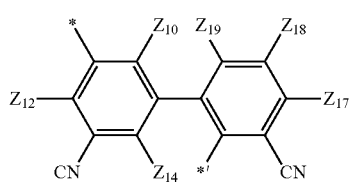
MO34
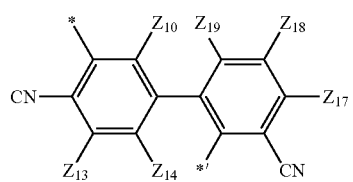
MO35
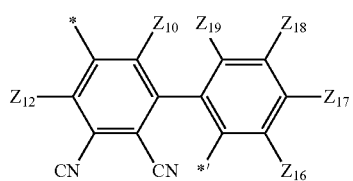
MO36
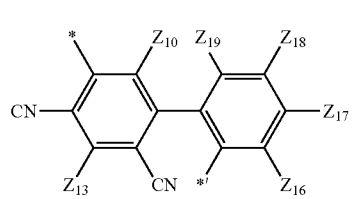
MO37
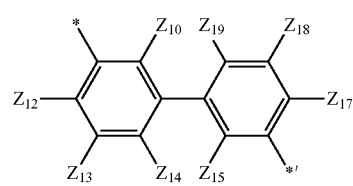
MM1
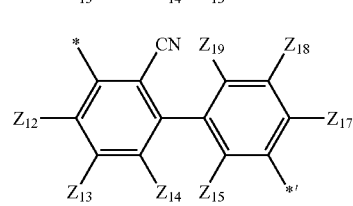
MM2
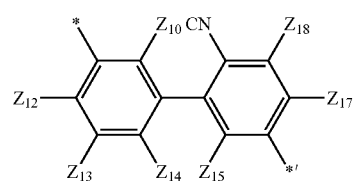
MM3
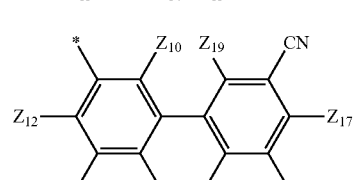
MM4
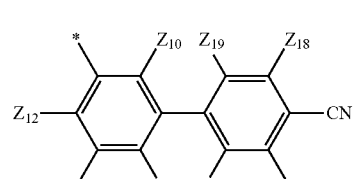
MM5

-continued

MM6
MM7
MM8
MM9
MM10
MM11
MM12
MM13
MM14
MM15
MM16
MM17
MM18
MM19
MM20
MM21

MM22
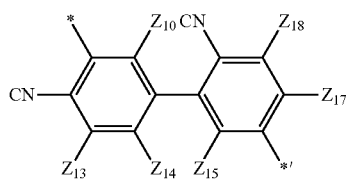
MM23
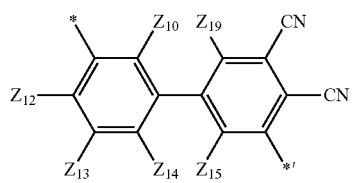
MM24
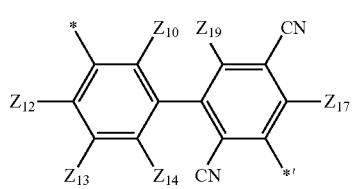
MM25
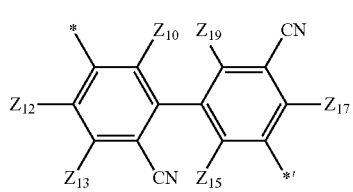
MM26
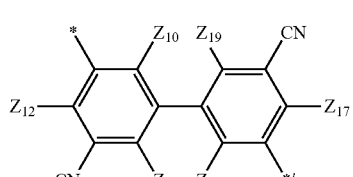
MM27
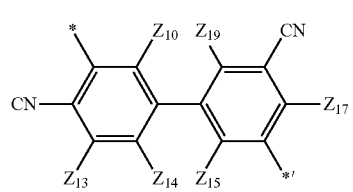
MM28
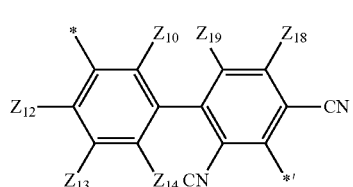
MM29
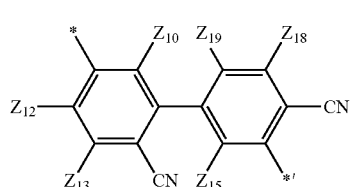
MM30
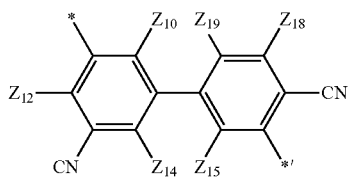
MM31
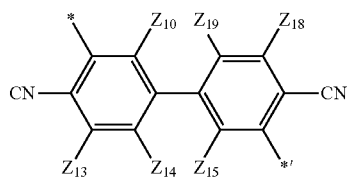
MM32
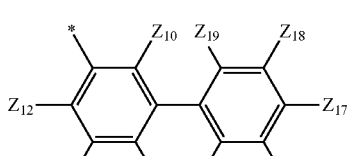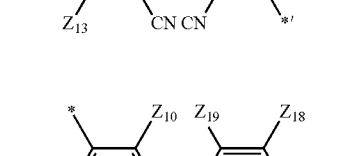
MM33
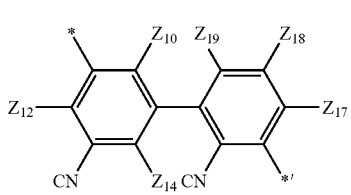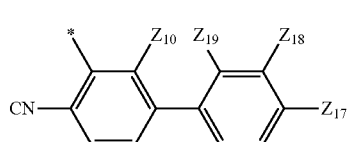
MM34
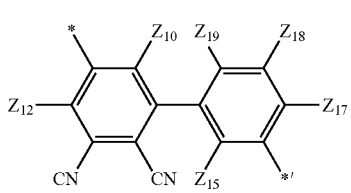
MM35
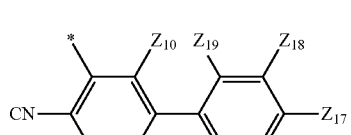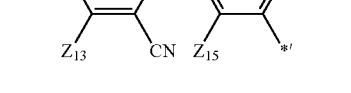
MM36
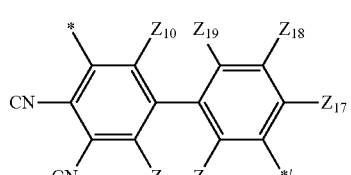
MM37

-continued
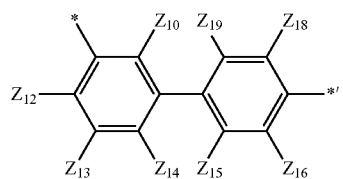
MP1
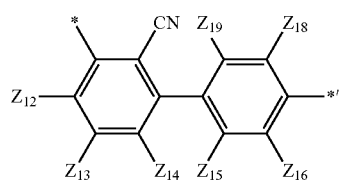
MP2
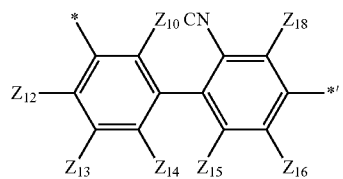
MP3
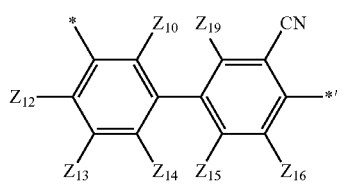
MP4
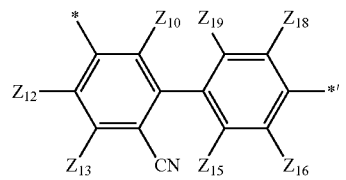
MP5
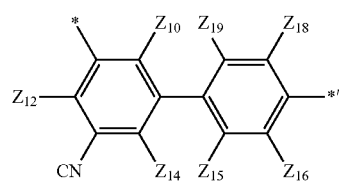
MP6
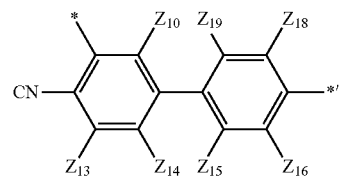
MP7
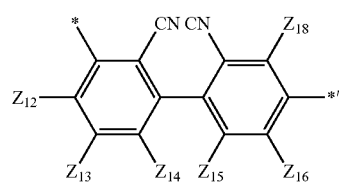
MP8
-continued
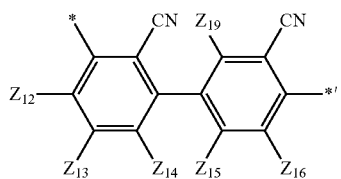
MP9
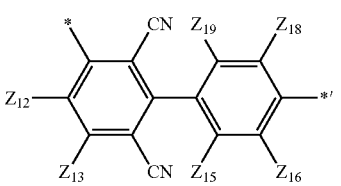
MP10
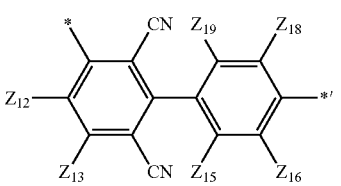
MP11

| | |
|---|---|
| [MP17 structure] | MP17 |
| [MP18 structure] | MP18 |
| [MP19 structure] | MP19 |
| [MP20 structure] | MP20 |
| [MP21 structure] | MP21 |
| [MP22 structure] | MP22 |
| [MP23 structure] | MP23 |
| [MP24 structure] | MP24 |
| [MP25 structure] | MP25 |
| [OO1 structure] | OO1 |
| [OO2 structure] | OO2 |
| [OO3 structure] | OO3 |
| [OO4 structure] | OO4 |
| [OO5 structure] | OO5 |
| [OO6 structure] | OO6 |
| [OO7 structure] | OO7 |

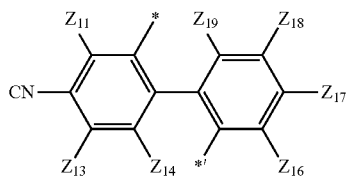
OO8
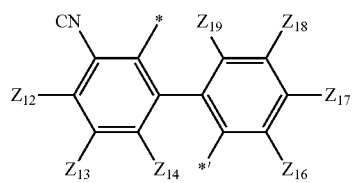
OO9
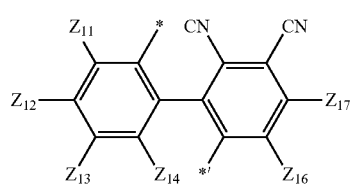
OO10
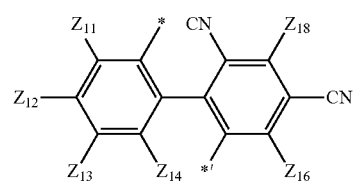
OO11
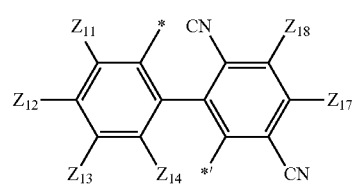
OO12
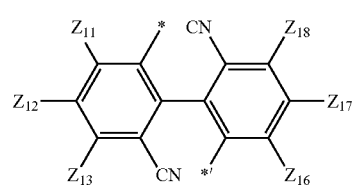
OO13
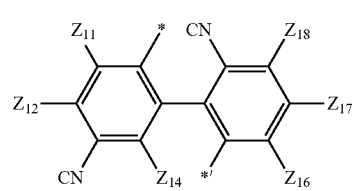
OO14
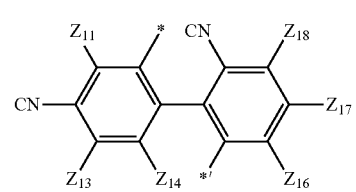
OO15
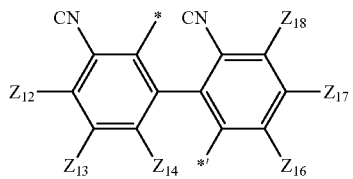
OO16
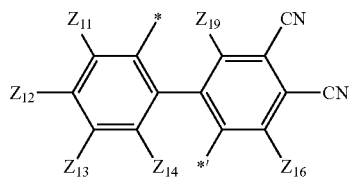
OO17
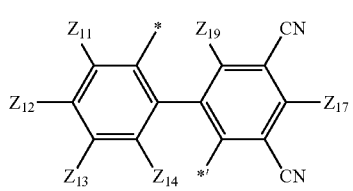
OO18
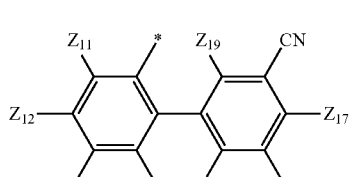
OO19
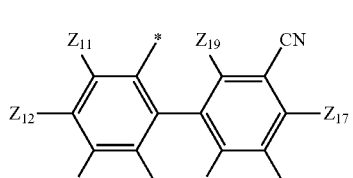
OO20
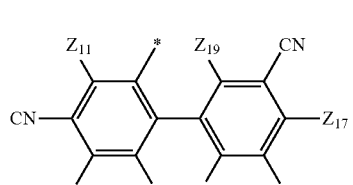
OO21
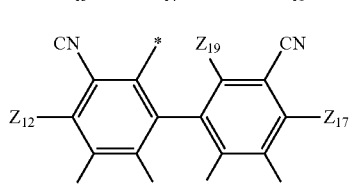
OO22
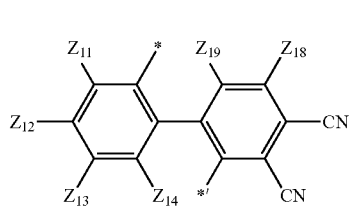
OO23

| | |
|---|---|
| 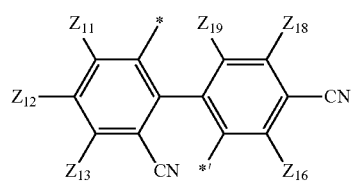 OO24 | 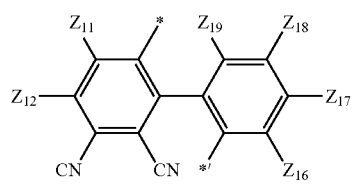 OO32 |
| 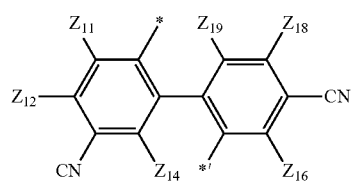 OO25 | 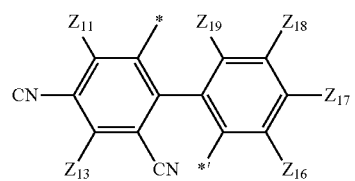 OO33 |
| 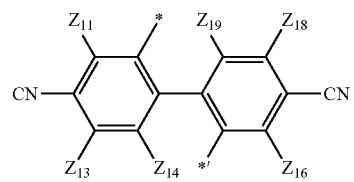 OO26 | 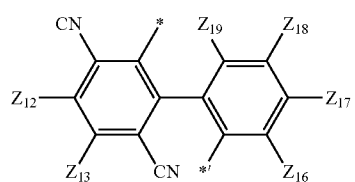 OO34 |
| 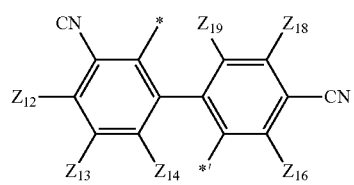 OO27 | 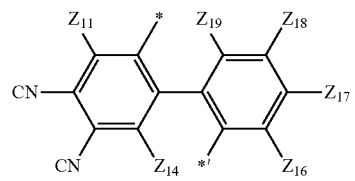 OO35 |
| 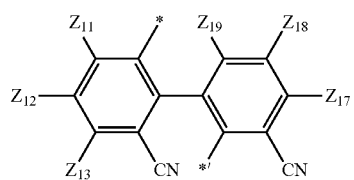 OO28 | 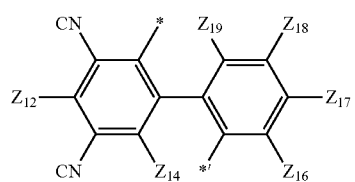 OO36 |
| 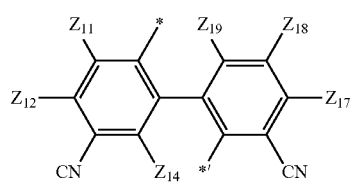 OO29 | 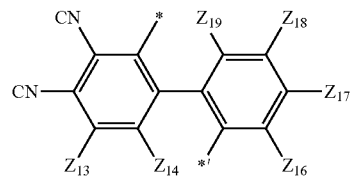 OO37 |
| 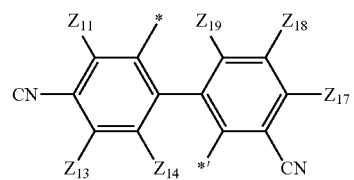 OO30 | 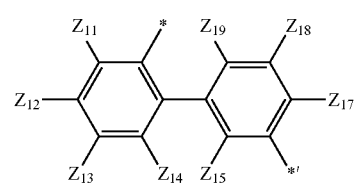 OM1 |
| 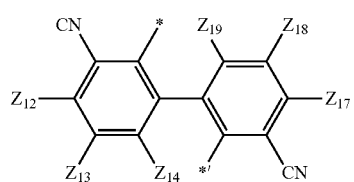 OO31 | 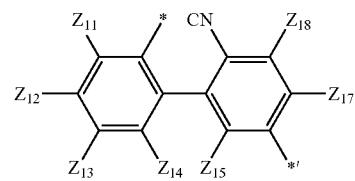 OM2 |

-continued
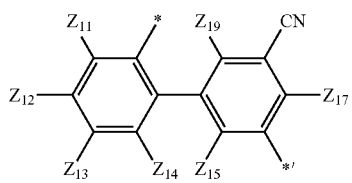 OM3
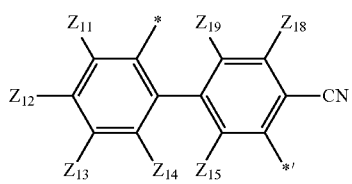 OM4
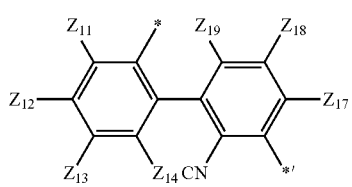 OM5
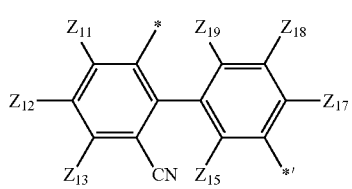 OM6
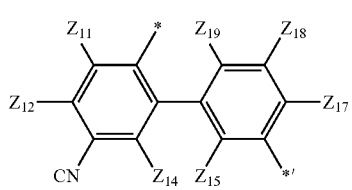 OM7
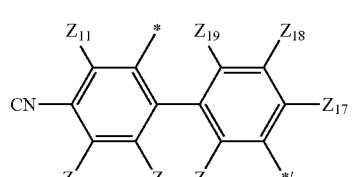 OM8
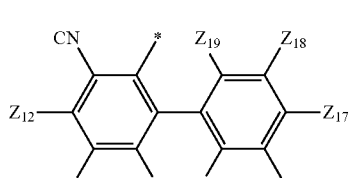 OM9
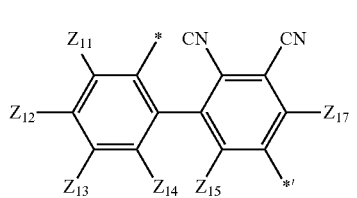 OM10
-continued
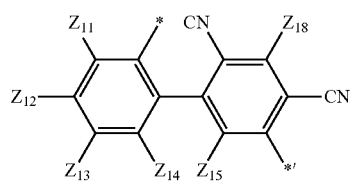 OM11
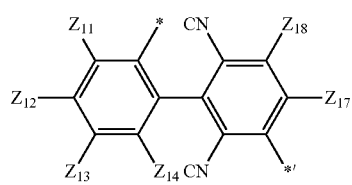 OM12
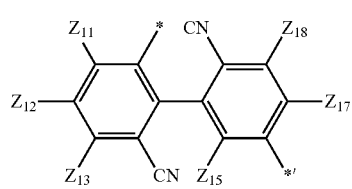 OM13
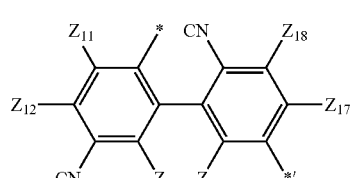 OM14
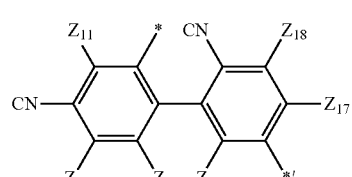 OM15
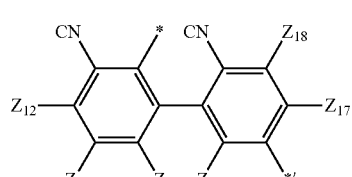 OM16
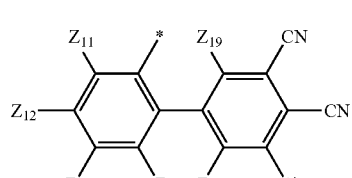 OM17
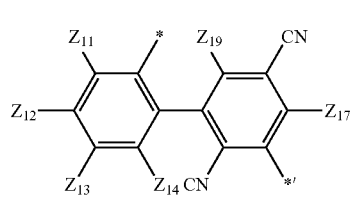 OM18

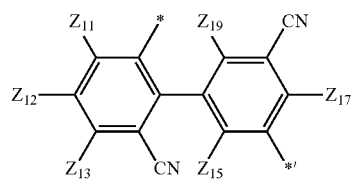 OM19
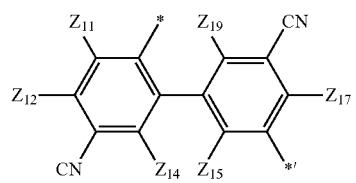 OM20
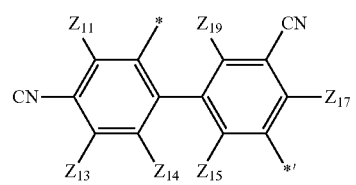 OM21
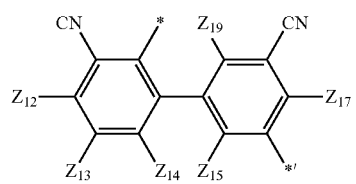 OM22
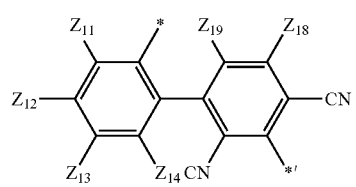 OM23
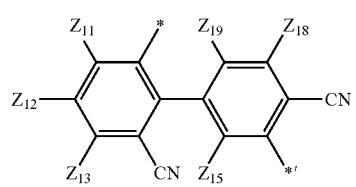 OM24
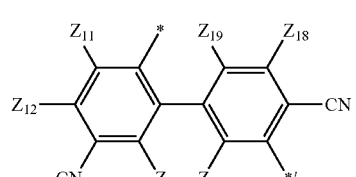 OM25
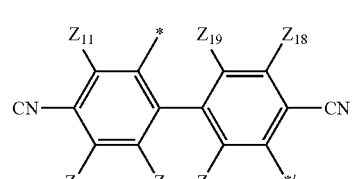 OM26
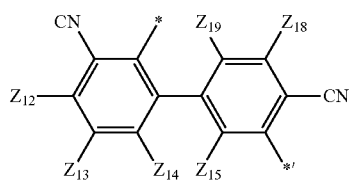 OM27
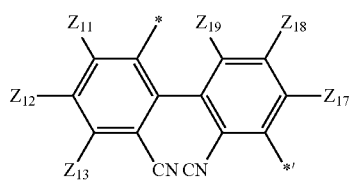 OM28
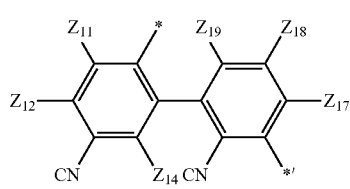 OM29
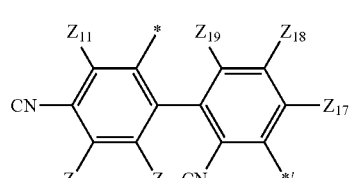 OM30
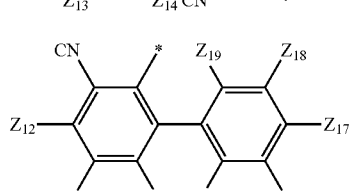 OM31
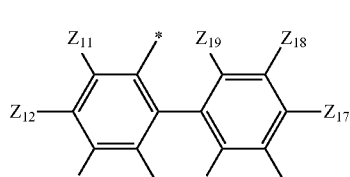 OM32
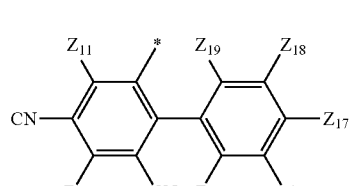 OM33
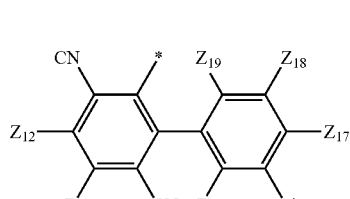 OM34

OM35
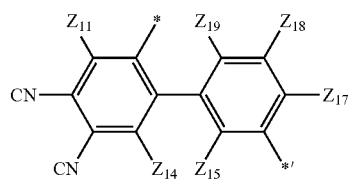
OM36
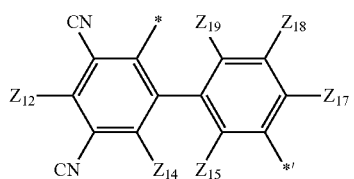
OM37
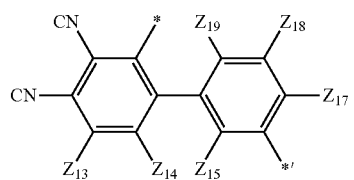
OP1
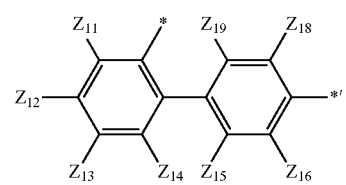
OP2
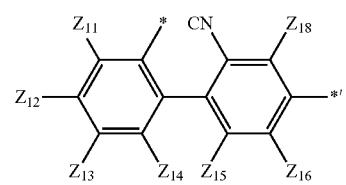
OP3
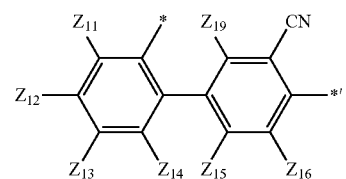
OP4
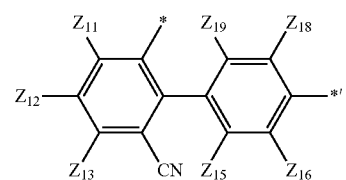
OP5
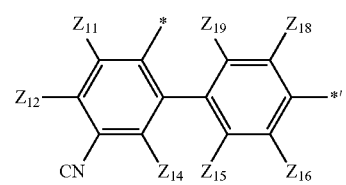
OP6
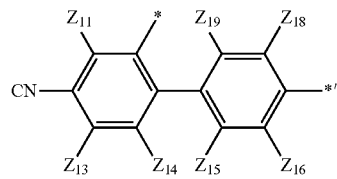
OP7
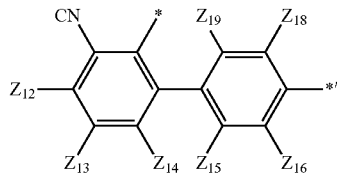
OP8
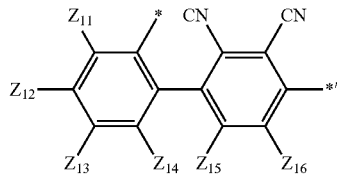
OP9
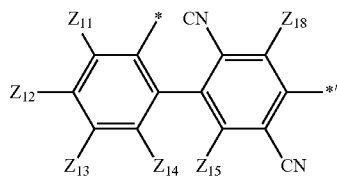
OP10
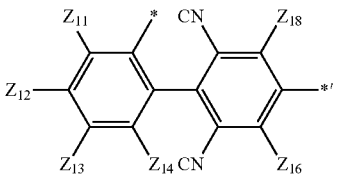
OP11
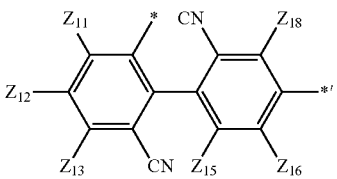
OP12
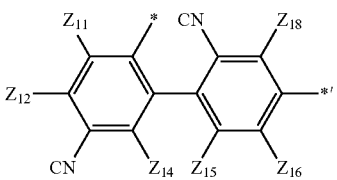
OP13
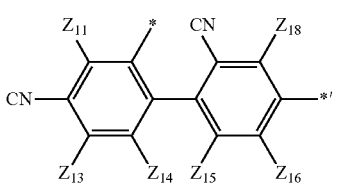

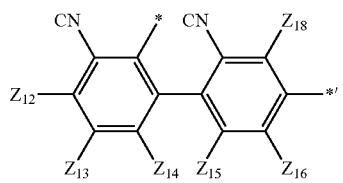
OP14
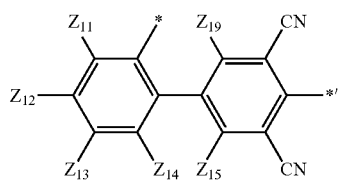
OP15
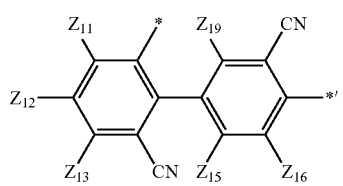
OP16
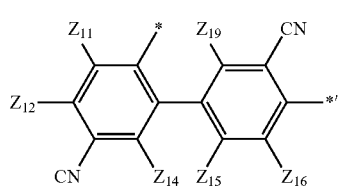
OP17
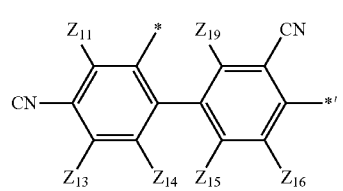
OP18
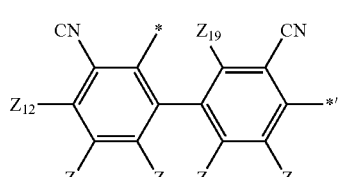
OP19
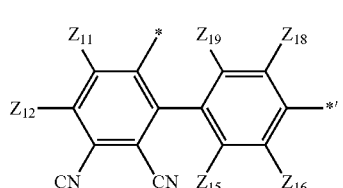
OP20
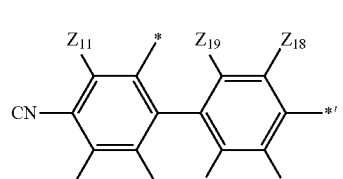
OP21
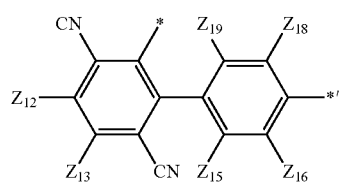
OP22
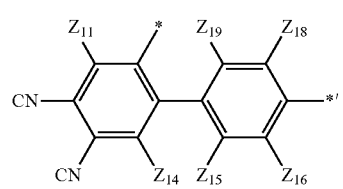
OP23
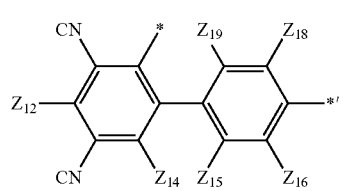
OP24
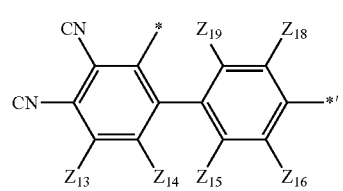
OP25
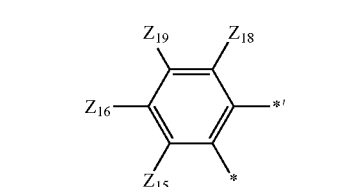
O1
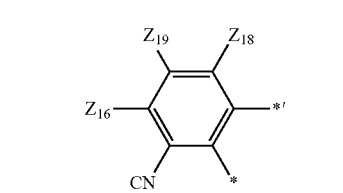
O2
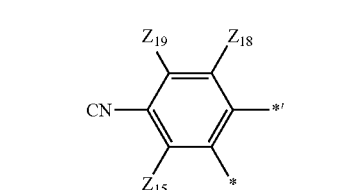
O3
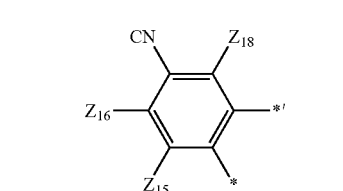
O4

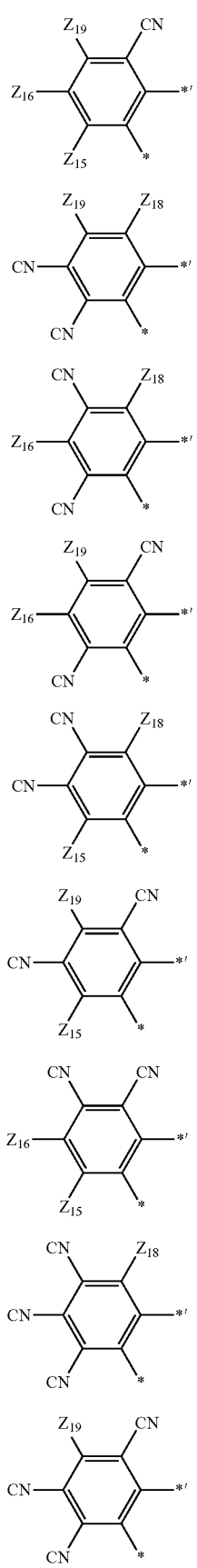
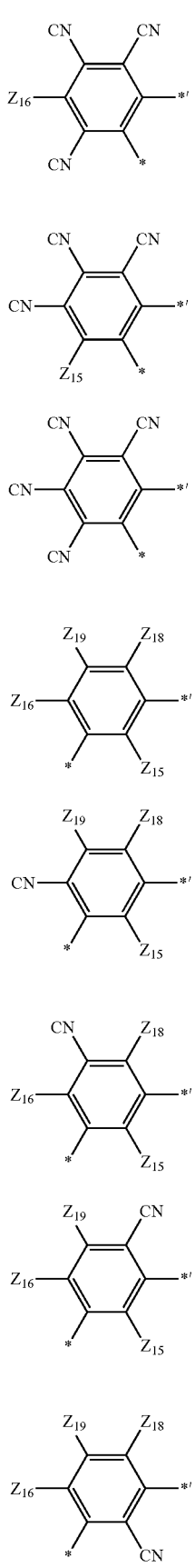

-continued
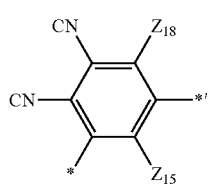 M6
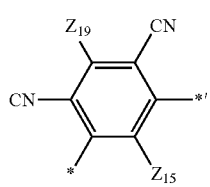 M7
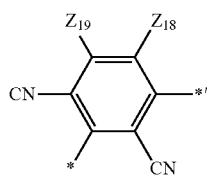 M8
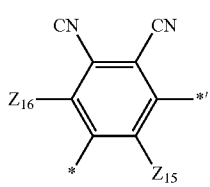 M9
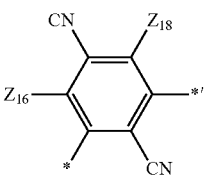 M10
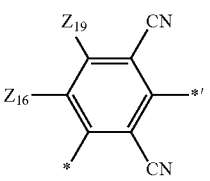 M11
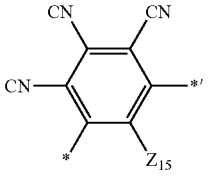 M12
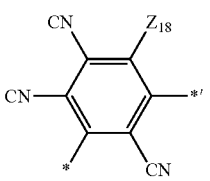 M13
-continued
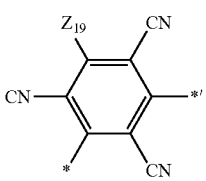 M14
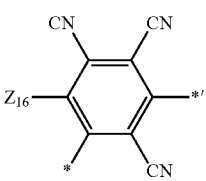 M15
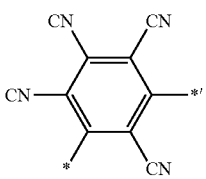 M16
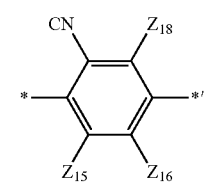 P1
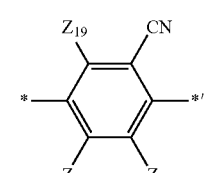 P2
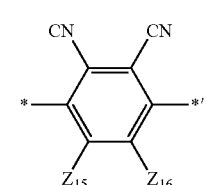 P3
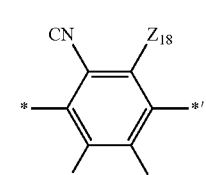 P4
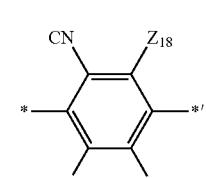 P5

-continued

P6
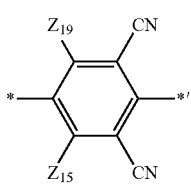

P7
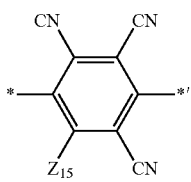

P8
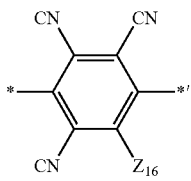

P9
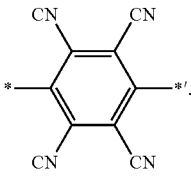

In Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ may each independently be the same as described in connection with $Z_3$ and $Z_4$, and * and *' each indicate a binding site to a neighboring atom.

In an embodiment, in Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ may not be a cyano group.

In one or more embodiments, in Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ may each independently be:

hydrogen, deuterium, or a cyano group; or an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, a biphenyl group, or a terphenyl group, each unsubstituted or substituted with at least one selected from deuterium, a cyano group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a biphenyl group.

In one or more embodiments, a group represented by

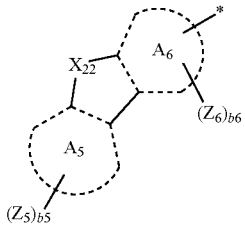

in Formula 1 may be selected from groups represented by Formulae 1(1) to 1(4), and/or
a group represented by

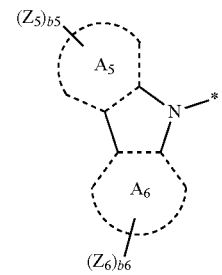

in Formula 2 may be selected from groups represented by Formulae 2(1) to 2(12), and/or
a group represented by Formula CZ1 may be selected from groups represented by Formulae CZ1(1) to CZ1(3), and/or
a group represented by Formula CZ2 may be selected from groups represented by Formulae CZ2(1) to CZ2(14), but embodiments of the present disclosure are not limited thereto:

1(1)
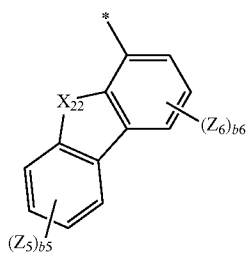

1(2)
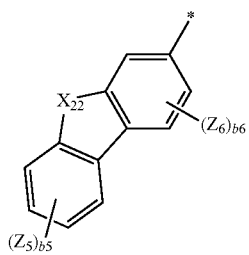

1(3)
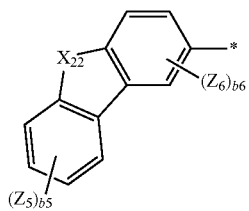

1(4)
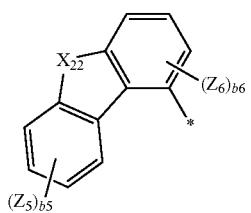
2(1)
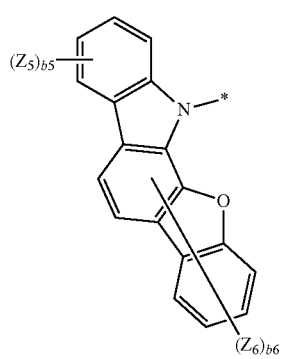
2(2)
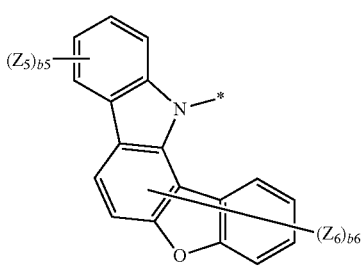
2(3)
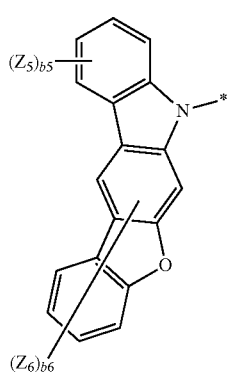
2(4)
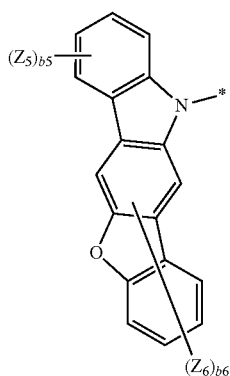
2(5)
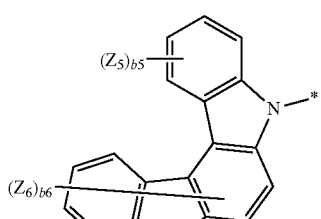
2(6)
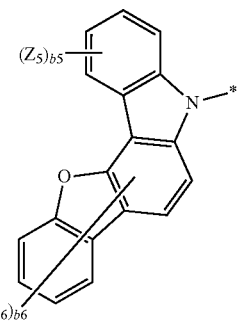
2(7)
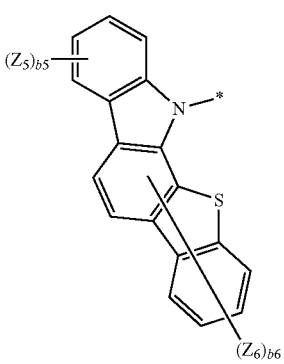
2(8)
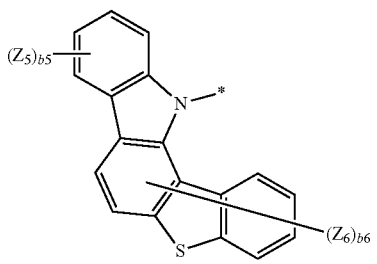
2(9)
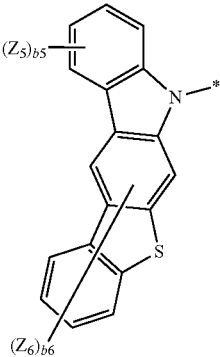

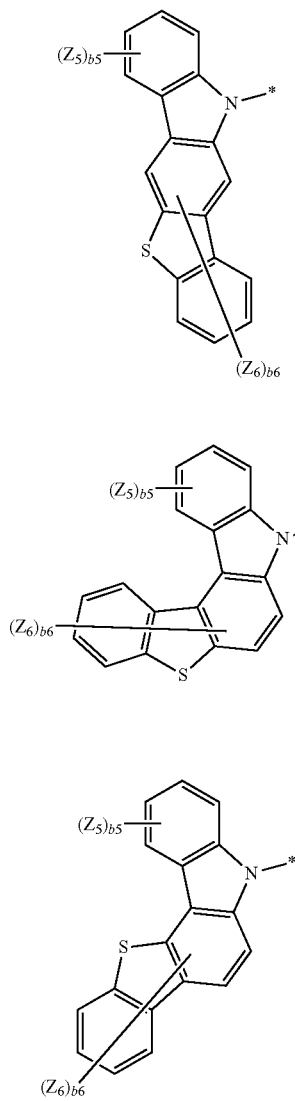
2(10)
2(11)
2(12)
CZ1(1)
CZ1(2)
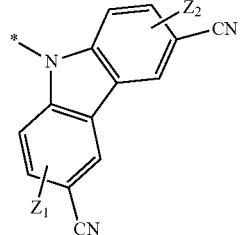
CZ1(3)
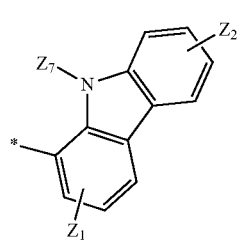
CZ2(1)
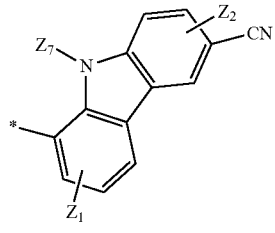
CZ2(2)
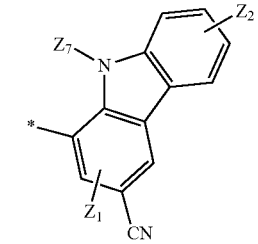
CZ2(3)
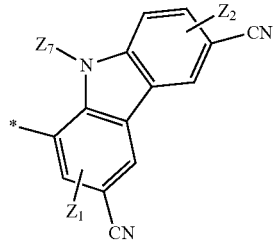
CZ2(4)
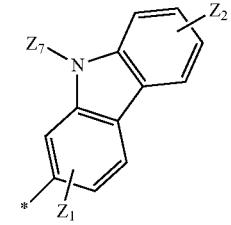
CZ2(5)

CZ2(6) 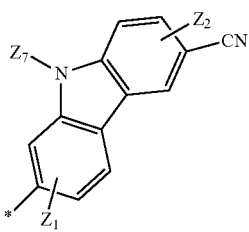

CZ2(7) 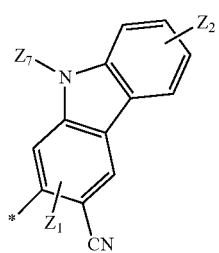

CZ2(8) 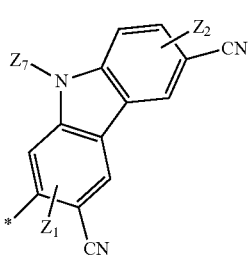

CZ2(9) 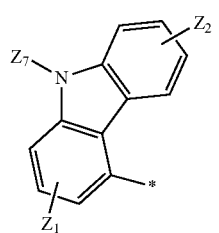

CZ2(10) 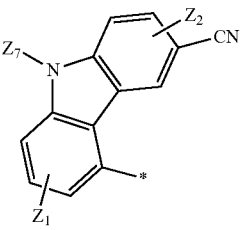

CZ2(11) 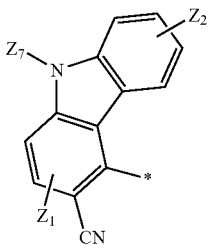

CZ2(12) 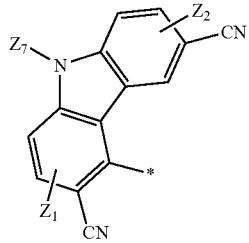

CZ2(13) 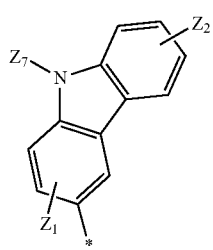

CZ2(14) 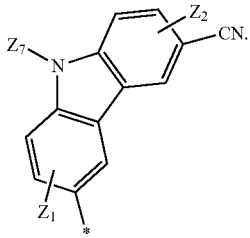

In Formulae 1(1) to 1(4), 2(1) to 2(12), CZ1(1) to CZ1(3), and CZ2(1) to CZ2(14), $X_{22}$, $Z_1$, $Z_2$, $Z_5$ to $Z_7$, b5, and b6 may each independently be the same as described herein, and *indicates a binding site to a neighboring atom.

For example, in Formulae 1(1) to 1(4), 2(1) to 2(12), CZ1(1) to CZ1(3), and CZ2(1) to CZ2(14), $Z_1$, $Z_2$, and $Z_5$ to $Z_7$ may not be a cyano group.

In an embodiment, in Formulae CZ2(1) to CZ2(14), $Z_7$ may be a phenyl group, a biphenyl group, a terphenyl group, a phenyl group substituted with at least one cyano group, a biphenyl group substituted with at least one cyano group, or a terphenyl group substituted with at least one cyano group, but embodiments of the present disclosure are not limited thereto.

For example, the host may be selected from Compounds H1 to H28, but embodiments of the present disclosure are not limited thereto:

H1 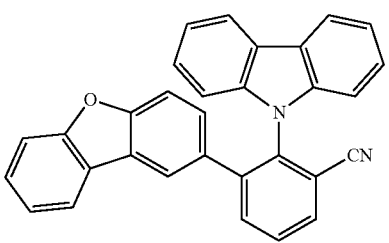

H2
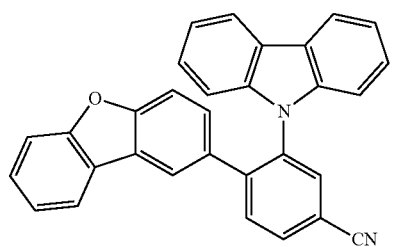
H3
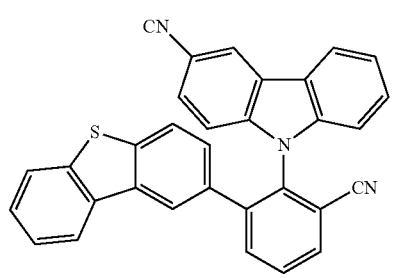
H4
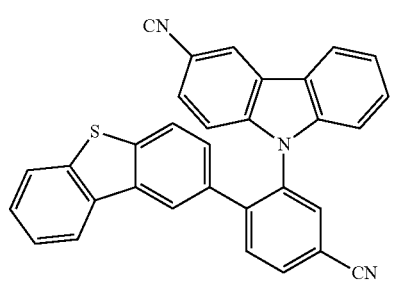
H5
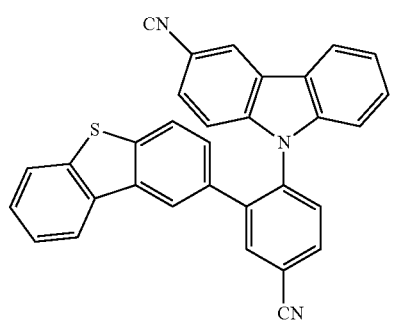
H6
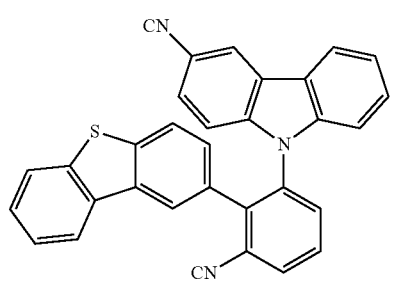
H7
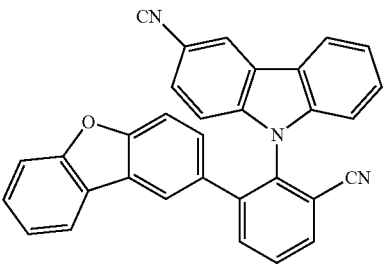
H8
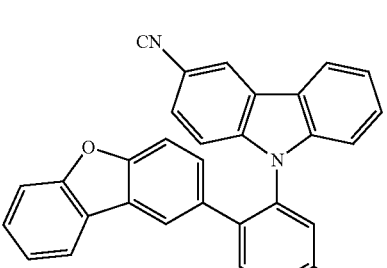
H9
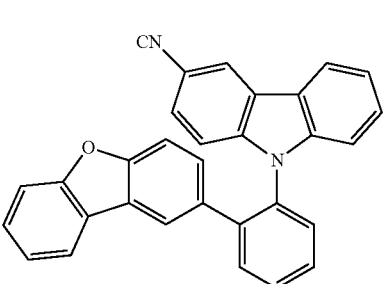
H10
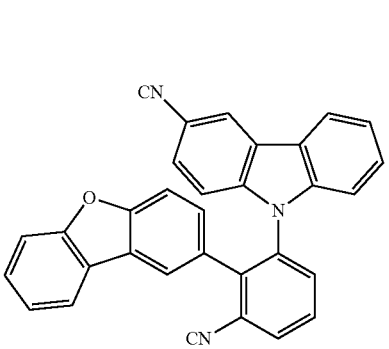
H11
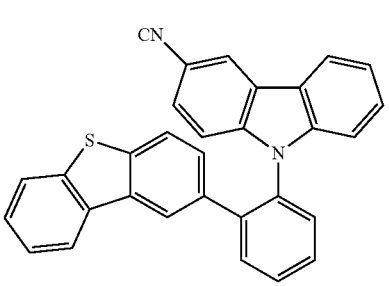

H12
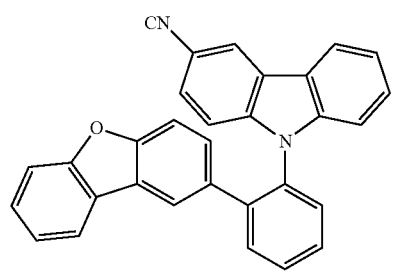
H13
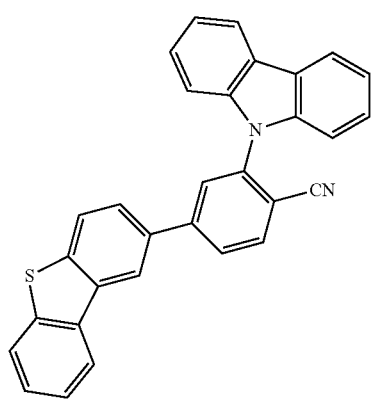
H14
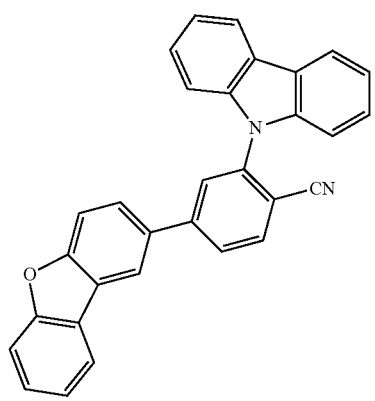
H15
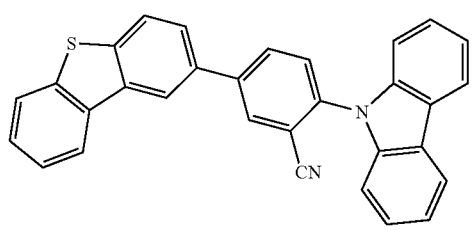
H16
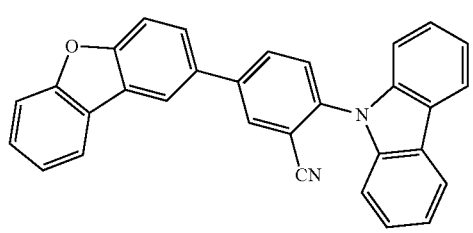
H17
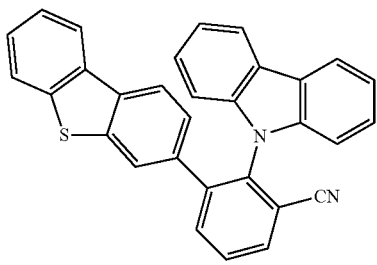
H18
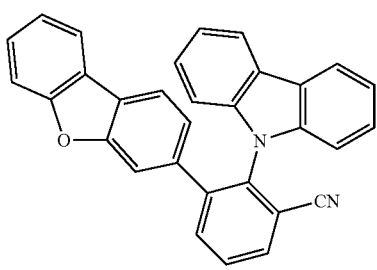
H19
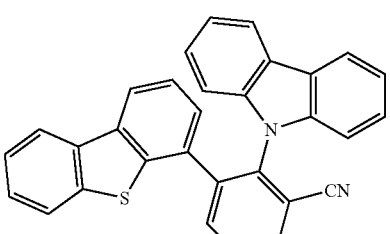
H20
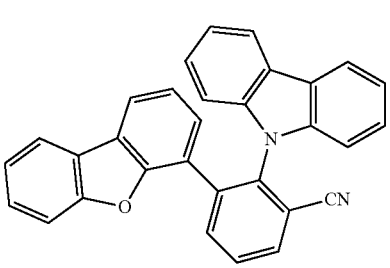
H21
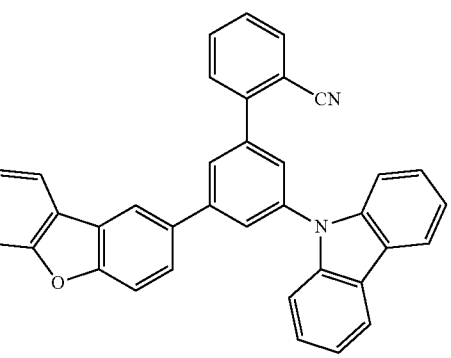

H22
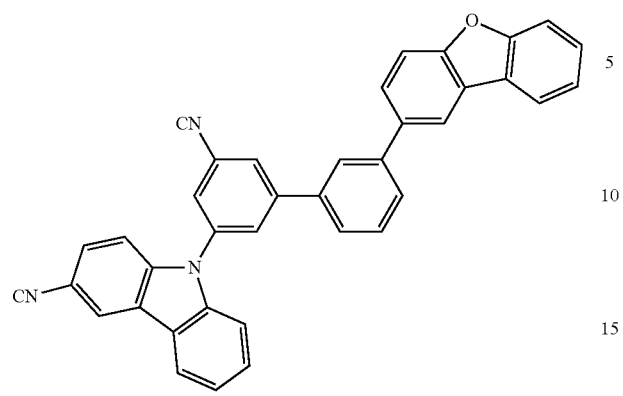

H23
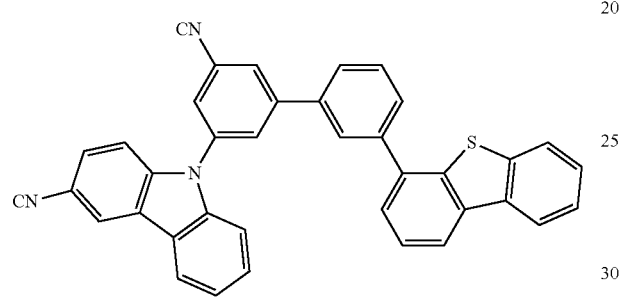

H24
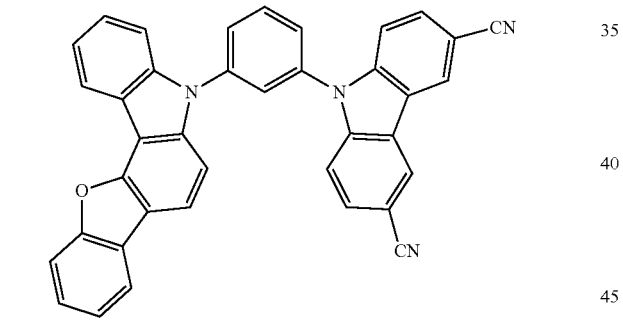

H25
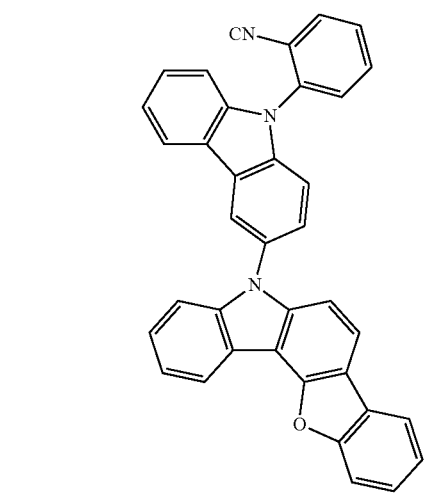

H26
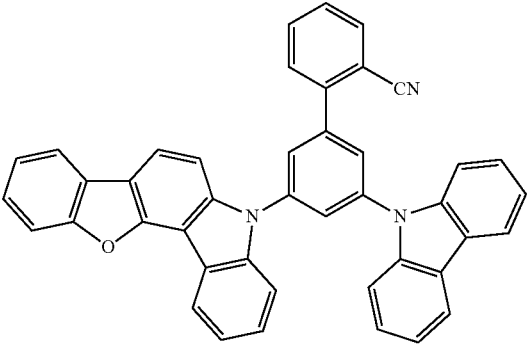

H27
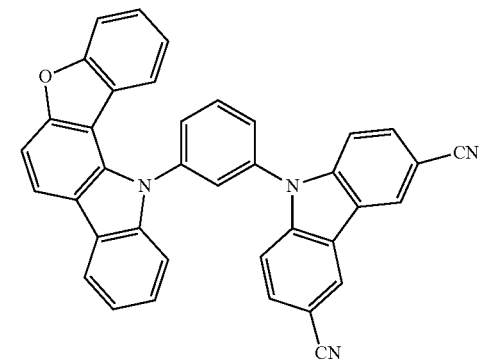

H28
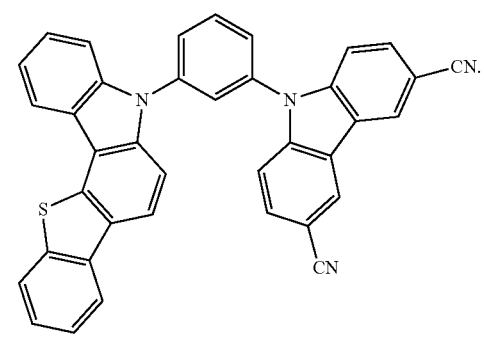

$X_{22}$ in Formula 1 is O or S, and ring $A_6$ in Formula 2 is a dibenzofuran group or a dibenzothiophene group. Therefore, each of Formulae 1 and 2 has an asymmetric structure that essentially includes, in addition to a carbazole-based group represented by CZ, a dibenzofuran group or a dibenzothiophene group (or a condensed cyclic group including a dibenzofuran group or a dibenzothiophene group), and thus may have a high dipole moment. Hence, an electronic device, for example, an organic light-emitting device, which includes at least one selected from the compound represented by Formula 1 and the compound represented by Formula 2, may have excellent luminescent efficiency.

For example, the dipole moment of the compound represented by Formula 1 and the compound represented by Formula 2 may be 3.41 Debye or more, for example, in a range of about 3.41 Debye to about 10 Debye, but embodiments of the present disclosure are not limited thereto.

The dipole moment may be evaluated by calculating the Mulliken charge and interatomic distance of each atom of the corresponding compounds by using a density functional theory (DFT) method of Gaussian program (structurally optimized at a level of B3LYP, 6-31G(d,p)) and calculating the dipole moment of the corresponding compound therefrom.

Since Formulae 1 and 2 have the asymmetric structure as described above but do not include a group represented by *=o (wherein *indicates a binding site to a neighboring atom) (for example, the phosphine oxide group-containing compound includes a group represented by *=o), it is possible to achieve high luminescent efficiency and substantially prevent the material for the emission layer from being decomposed by *=o in storing and/or driving the organic light-emitting device, thereby achieving high luminescent efficiency and a long lifespan at the "same time".

A difference between a triplet energy level (electron volts, eV) of the host and a triplet energy level (eV) of the thermally activated delayed fluorescence emitter may be in a range of about 0.2 eV to about 0.5 eV. While not wishing to be bound by theory, it is understood that when the difference between the triplet energy level (eV) of the host and the triplet energy level (eV) of the thermally activated delayed fluorescence emitter is within this range, energy of triplet excitons generated in the thermally activated delayed fluorescence emitter is prevented from leaking to the host in the emission layer. Therefore, it is possible to achieve efficient light emission and suppress the activated excitation energy level of the host, thereby implementing the long lifespan driving of the organic light-emitting device.

The triplet energy level was evaluated by using a DFT method structurally optimized at a level of B3LYP/6-31G (d,p), for example, by using Gaussian program.

The thermally activated delayed fluorescence emitter may be selected from any compounds that may emit delayed fluorescent light according to a thermally delayed fluorescence emission mechanism.

In an embodiment, the difference between the triplet energy level (eV) of the thermally activated delayed fluorescence emitter and the singlet energy level (eV) of the thermally activated delayed fluorescence emitter may be in a range of about 0 eV to about 0.5 eV. While not wishing to be bound by theory, it is understood that when the difference between the triplet energy level (eV) of the thermally activated delayed fluorescence emitter and the singlet energy level (eV) of the thermally activated delayed fluorescence emitter is within this range, up-conversion from the triplet state to the singlet state may be effectively achieved, and the fluorescent dopant may emit delayed fluorescence in a high efficiency.

The triplet energy level and the singlet energy level were evaluated by using a DFT method structurally optimized at a level of B3LYP/6-31G(d,p), for example, by using Gaussian program.

In an embodiment, the thermally activated delayed fluorescence emitter may include a compound represented by Formula 11:

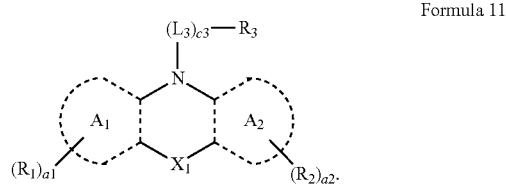

Formula 11

In Formula 11, $X_1$ may be a single bond, $N-[(L_4)_{c4}-R_4]$, $C(R_5)(R_6)$, O, or S.

For example, $X_1$ may be a single bond, but embodiments of the present disclosure are not limited thereto.

In Formula 11, ring $A_1$ and ring $A_2$ may each independently be a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group.

For example, in Formula 11, ring $A_1$ and ring $A_2$ may each independently be a benzene group, a fluorene group, a carbazole group, a dibenzofuran group, a dibenzothiophene group, or a dibenzosilole group, and at least one selected from ring $A_1$ and ring $A_2$ may each independently be a benzene group, but embodiments of the present disclosure are not limited thereto, and $L_3$ and $L_4$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formula 11, $L_3$ and $L_4$ may each independently be selected from:

a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group; and a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, —Si($Q_{31}$)($Q_{32}$)($Q_{33}$), and —N($Q_{34}$)($Q_{35}$), and $Q_{31}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group. However, embodiments of the present disclosure are not limited thereto.

In Formula 11, c3 and c4 each indicate the number of $L_3$ and the number of $L_4$, and may each independently be an integer from 0 to 4. When c3 is two or more, two or more of groups $L_3$ may be different from or identical to each other, and when, c4 is two or more, two or more of groups $L_4$ may be different from or identical to each other. For example, c3 and c4 may each independently be 0, 1, or 2, but embodiments of the present disclosure are not limited thereto. When c3 is 0, *-$(L_3)_{c3}$-*' may be a single bond, and when c4 is 0, *-$(L_4)_{c4}$-*' may be a single bond.

In Formula 11, $R_1$ to $R_6$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$), wherein $Q_1$ to $Q_7$ are the same as described above.

In an embodiment, in Formula 11, $R_3$ may include at least one π electron-depleted nitrogen-containing cyclic group.

The term "π electron-depleted nitrogen-containing cyclic group" as used herein refers to a group including a cyclic group having at least one *—N=* moiety, and examples thereof include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinolic group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

In one or more embodiments, $R_3$ in Formula 11 may be selected from:

a phenyl group, an indenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, an isoindolyl group, an indolyl group, a furanyl group, a thiophenyl group, a silolyl group, a benzofuranyl group, a benzothiophenyl group, a benzosilolyl group, a carbazolyl group, a dibenzofuranyl group, a dibenzothiophenyl group, a dibenzosilolyl group, an indeno carbazolyl group, an indolocarbazolyl group, a benzofuracarbazolyl group, a benzothienocarbazolyl group, a benzosilolocarbazolyl group, an imidazolyl group, a pyrazolyl group, a thiazolyl group, an isothiazolyl group, an oxazolyl group, an isoxazolyl group, a pyridinyl group, a pyrazinyl group, a pyridazinyl group, a pyrimidinyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, an azaindenyl group, an azaindolyl group, an azabenzofuranyl group, an azabenzothiophenyl group, an azabenzosilolyl group, an azafluorenyl group, an azacarbazolyl group, an azadibenzofuranyl group, an azadibenzothiophenyl group, and an azadibenzosilolyl group, each unsubstituted or substituted with at least one selected from deuterium, a $C_1$-$C_{10}$ alkyl group, a $C_1$-$C_{10}$ alkoxy group, a phenyl group, a ($C_1$-$C_{10}$ alkyl)phenyl group, a di($C_1$-$C_{10}$ alkyl)phenyl group, a biphenyl group, a terphenyl group, a di(phenyl)phenyl group, a di(biphenyl)phenyl group, a (pyridinyl)phenyl group, a di(pyridinyl)phenyl group, a (pyrimidinyl)phenyl group, a di(pyrimidinyl)phenyl group, a (triazinyl)phenyl group, a di(triazinyl)phenyl group, a pyridinyl group, a ($C_1$-$C_{10}$ alkyl)pyridinyl group, a di($C_1$-$C_{10}$ alkyl)pyridinyl group, a (phenyl)pyridinyl group, a di(phenyl)pyridinyl group, a (biphenyl)pyridinyl group, a di(biphenyl)pyridinyl group, a (terphenyl)pyridinyl group, a di(terphenyl)pyridinyl group, a (pyridinyl)pyridinyl group, a di(pyridinyl)pyridinyl group, a (pyrimidinyl)pyridinyl group, a di(pyrimidinyl)pyridinyl group, a (triazinyl)pyridinyl group, a di(triazinyl)pyridinyl group, a pyrimidinyl group, a ($C_1$-$C_{10}$ alkyl)pyrimidinyl group, a di($C_1$-$C_{10}$ alkyl)pyrimidinyl group, a (phenyl)pyrimidinyl group, a di(phenyl)pyrimidinyl group, a (biphenyl)pyrimidinyl group, a di(biphenyl)pyrimidinyl group, a (terphenyl)pyrimidinyl group, a bi(terphenyl)pyrimidinyl group, a (pyridinyl)pyrimidinyl group, a di(pyridinyl)pyrimidinyl group, a (pyrimidinyl)pyrimidinyl group, a di(pyrimidinyl)pyrimidinyl group, a (triazinyl)pyrimidinyl group, a di(triazinyl)pyrimidinyl group, a triazinyl group, a ($C_1$-$C_{10}$ alkyl)triazinyl group, a di($C_1$-$C_{10}$ alkyl)triazinyl group, a (phenyl)triazinyl group, a di(phenyl)triazinyl group, a (biphenyl)triazinyl group, a di(biphenyl)triazinyl group, a (terphenyl)triazinyl group, a bi(terphenyl)triazinyl group, a (pyridinyl)triazinyl group, a di(pyridinyl)triazinyl group, a (pyrimidinyl)triazinyl group, a di(pyrimidinyl)triazinyl group, a (triazinyl)triazinyl group, a di(triazinyl)triazinyl group, a fluorenyl group, a di($C_1$-$C_{10}$ alkyl)fluorenyl group, a di(phenyl)fluorenyl group, a di(biphenyl)fluorenyl group, a carbazolyl group, a ($C_1$-$C_{10}$ alkyl)carbazolyl group, a (phenyl)carbazolyl group, a (biphenyl)carbazolyl group, a dibenzofuranyl group, a ($C_1$-$C_{10}$ alkyl)dibenzofuranyl group, a (phenyl)dibenzofuranyl group, a (biphenyl)dibenzofuranyl group, a dibenzothiophenyl group, a ($C_1$-$C_{10}$ alkyl)dibenzothiophenyl group, a (phenyl)dibenzothiophenyl group, and a (biphenyl)dibenzothiophenyl group, but embodiments of the present disclosure are not limited thereto.

In one or more embodiments, $R_3$ in Formula 11 may be selected from:

a group represented by Formula 13(1) and 13(2);

a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group; and a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, and —Si($Q_{31}$)($Q_{32}$)($Q_{33}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

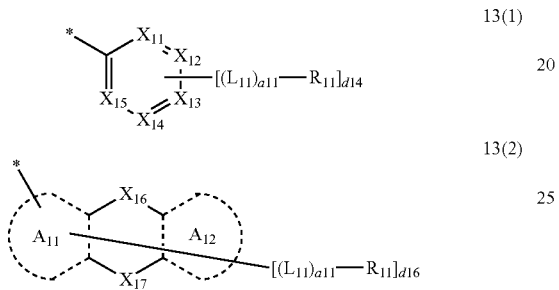

In Formula 13(1), $X_{11}$ to $X_{15}$ may each independently be C or N, wherein at least one selected from $X_{11}$ to $X_{15}$ may each independently be N.

For example, two or three of $X_{11}$ to $X_{15}$ may each independently be N.

In Formula 13(2), ring $A_{11}$ and ring $A_{12}$ may each independently be a benzene group, a naphthalene group, a pyridine group, a pyrazine group, a pyrimidine group, a pyridazine group, a quinoline group, an isoquinoline group, a quinoxaline group, or a quinazoline group, and at least one selected from ring $A_{11}$ and ring $A_{12}$ may each independently be a pyridine group, a pyrazine group, a pyrimidine group, a pyridazine group, a quinoline group, an isoquinoline group, a quinoxaline group, or a quinazoline group.

For example, ring $A_{11}$ may be a pyridine group, a pyrimidine group, a quinoline group, an isoquinoline group, a quinoxaline group, or a quinazoline group, and ring $A_{12}$ may be a benzene group, or a naphthalene group, but embodiments of the present disclosure are not limited thereto.

In Formula 13(2), $X_{16}$ may be N-[($L_{12}$)$_{a12}$-$R_{12}$], C($R_{14}$)($R_{15}$), O, or S, $X_{17}$ may be a single bond, N-[($L_{13}$)$_{a13}$-$R_{13}$], C($R_{16}$)($R_{17}$), O, or S.

For example, $X_{16}$ may be O or S, and $X_{17}$ may be a single bond, but embodiments of the present disclosure are not limited thereto.

In Formulae 13(1) and 13(2), $L_{11}$ to $L_{13}$ may each independently have the same definition as that of $L_3$, a11 to a13 may each independently have the same definition as that of c3, and $R_{11}$ to $R_{17}$ may each independently have the same definition as that of $R_1$.

In Formula 13(2), d16 may be an integer from 0 to 6, and in Formula 13(1), d14 may be an integer from 0 to 4.

In Formulae 13(1) and 13(2), *indicates a binding site to a neighboring atom.

In an embodiment, $R_3$ in Formula 11 may be a group represented by one selected from Formulae 13-1 to 13-20, but embodiments of the present disclosure are not limited thereto:

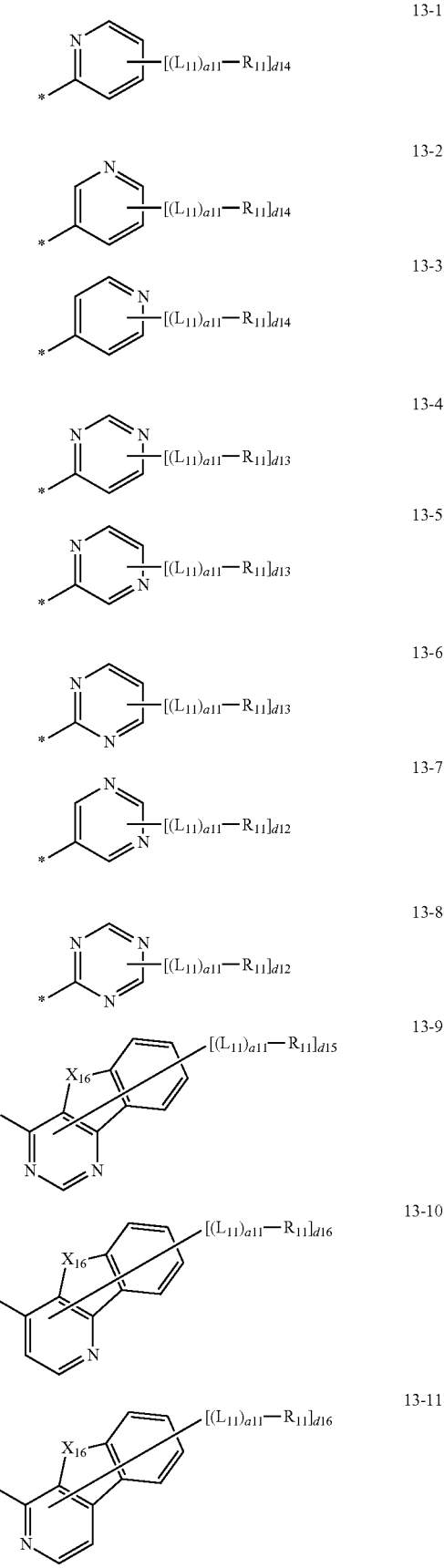

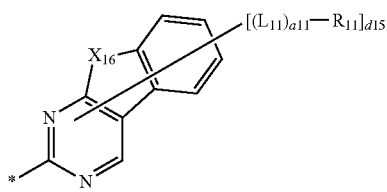

13-12

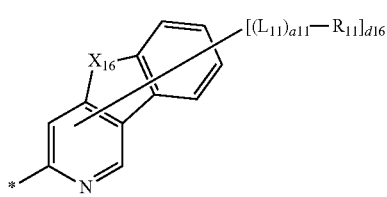

13-13

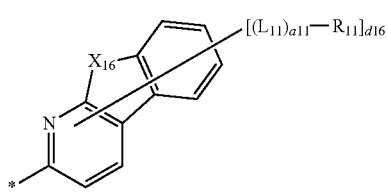

13-14

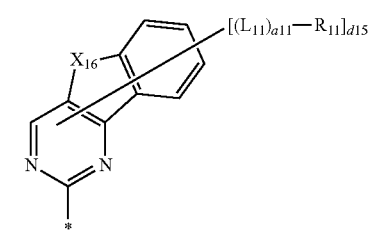

13-15

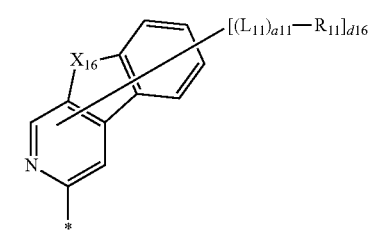

13-16

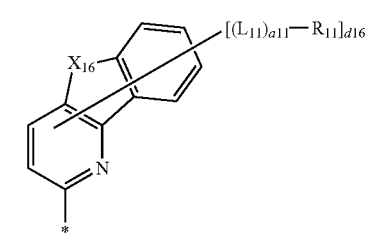

13-17

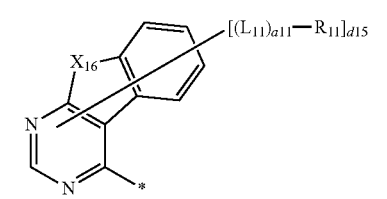

13-18

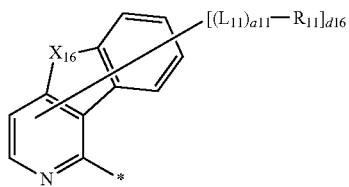

13-19

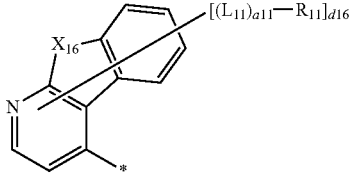

13-20

In Formulae 13-1 to 13-20, $X_{16}$ may be N-$[(L_{12})_{a12}$-$R_{12}]$, C($R_{14}$)($R_{15}$), O, or S, $L_{11}$ and $L_{12}$ may each independently have the same definition as that of $L_3$, a11 and a12 may each independently have the same definition as that of c3, $R_{11}$, $R_{12}$, $R_{14}$, and $R_{15}$ may each independently have the same definition as that of $R_1$, d16 may be an integer from 0 to 6, d15 may be an integer from 0 to 5, d14 may be an integer from 0 to 4, d13 may be an integer from 0 to 3, d12 may be an integer from 0 to 2, and

*indicates a binding site to a neighboring atom.

In an embodiment, in Formula 11, $R_1$, $R_2$, $R_5$, and $R_6$ may each independently be selected from hydrogen, deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a carbazolyl group, a dibenzofuranyl group, a dibenzothiophenyl group, an indolocarbazolyl group, —Si($Q_1$)($Q_2$)($Q_3$), and —N($Q_4$)($Q_5$), and $Q_1$ to $Q_5$ may each independently be selected from a $C_1$-$C_{10}$ alkyl group, a $C_1$-$C_{10}$ alkoxy group, a phenyl group, a biphenyl group, a terphenyl group, and a naphthyl group.

In Formula 11, a1 and a2 each indicate the number of $R_1$ and the number of $R_2$, and may each independently be an integer from 0 to 10. When a1 is two or more, two or more of groups $R_1$ may be identical to or different from each other, and when a2 is two or more, two or more of groups $R_2$ may be identical to or different from each other.

In an embodiment, the thermally activated delayed fluorescence emitter may include a compound represented by one selected from Formulae 11-1 to 11-7, but embodiments of the present disclosure are not limited thereto:

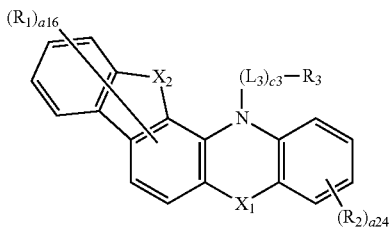

11-1

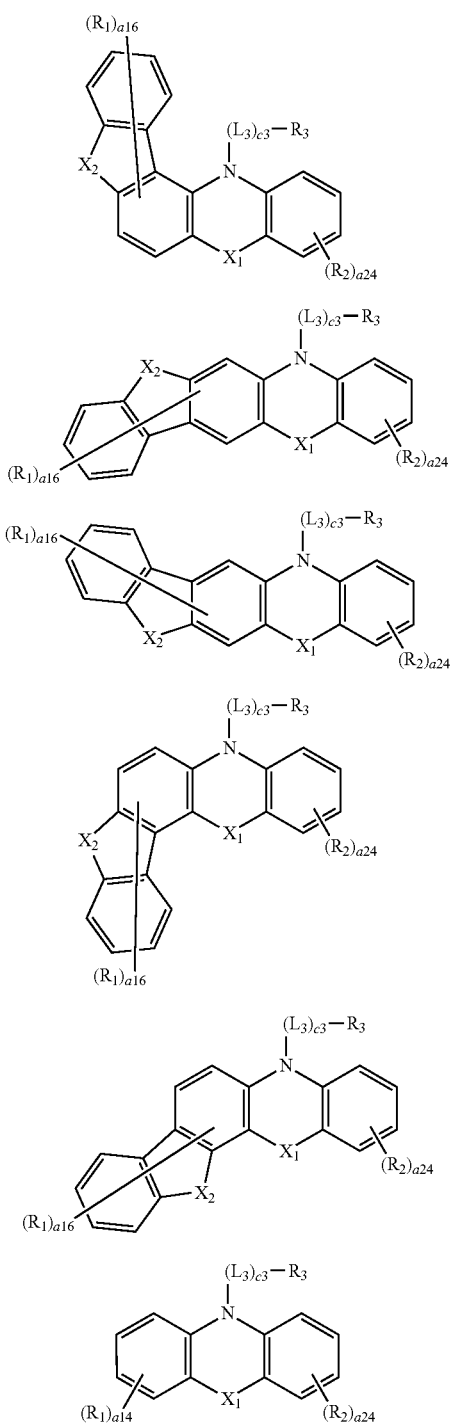

11-2

11-3

11-4

11-5

11-6

11-7

In Formulae 11-1 to 11-7, $X_1$, $L_3$, c3, and $R_1$ to $R_3$ may each independently be the same as described above, $X_2$ may be N-$[(L_5)_{c5}$-$R_7]$, $C(R_8)(R_9)$, O, or S, $L_5$ and c5 may each independently have the same definition as that of $L_3$ and c3, $R_7$ may have the same definition as that of $R_3$, $R_8$ and $R_9$ may each independently have the same definition as that of $R_5$ and $R_6$, a16 may be an integer from 0 to 6, and a14 and a24 may each independently be an integer form 0 to 4.

In an embodiment, in Formulae 11-1 to 11-17, 1) when $X_2$ is $C(R_8)(R_9)$, O, or S, $R_3$ may each independently include at least one π electron-depleted nitrogen-containing cyclic group, and 2) when $X_2$ is N-$[(L_5)_{c5}$-$R_7]$, at least one selected from $R_3$ and $R_7$, may each independently include at least one π electron-depleted nitrogen-containing cyclic group.

In one or more embodiments, in Formulae 11-1 to 11-17, 1) when $X_2$ is $C(R_8)(R_9)$, O, or S, $R_3$, and 2) when $X_2$ is N-$[(L_5)_{c5}$-$R_7]$, $R_3$ and $R_7$, may each independently be selected from:

a group represented by Formula 13(1) or 13(2) (for example, a group represented by one selected from Formulae 13-1 to 13-20);

a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group; and a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, and —Si($Q_{31}$)($Q_{32}$)($Q_{33}$), wherein 1) when $X_2$ is $C(R_8)(R_9)$, O, or S, $R_3$ may each independently be a group represented by Formula 13(1) or 13(2) (for example, a group represented by one selected from Formulae 13-1 to 13-20), and 2) when $X_2$ is N-$[(L_5)_{c5}$-$R_7]$, at least one selected from $R_3$ and $R_7$, may each independently be a group represented by Formula 13(1) or 13(2) (for example, a group represented by one selected from Formulae 13-1 to 13-20).

In an embodiment, the thermally activated delayed fluorescence emitter may include a compound represented by Formula 14A:

Formula 14A

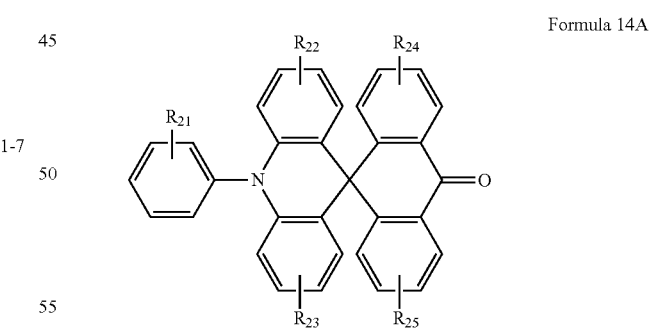

In Formula 14A, $R_{21}$ to $R_{25}$ may each independently be hydrogen, deuterium, a cyano group, a $C_1$-$C_{10}$ alkyl group, a phenyl group, a biphenyl group, or a terphenyl group.

In an embodiment, the thermally activated delayed fluorescence emitter may not include a cyano group.

The thermally activated delayed fluorescence emitter may include at least one compound selected from Compounds D1-1 to D1-83, D2-1 to D2-81, D3-1 to D3-81, and D201 to D211, but embodiments of the present disclosure are not limited thereto:

D1-1 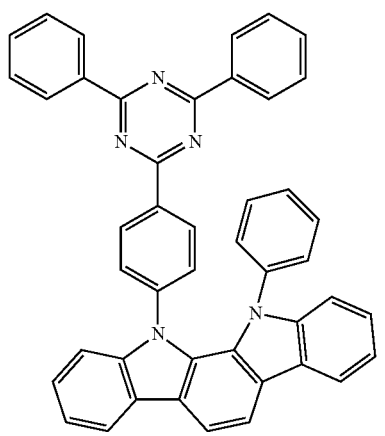
D1-2 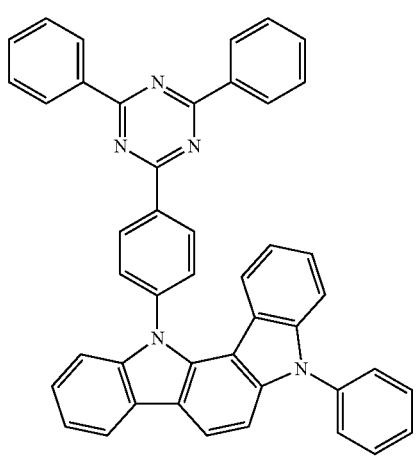
D1-3 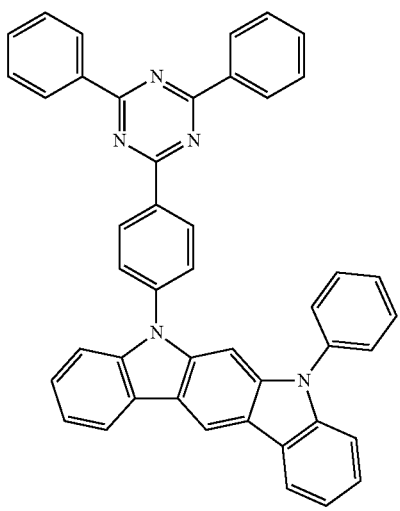
D1-4 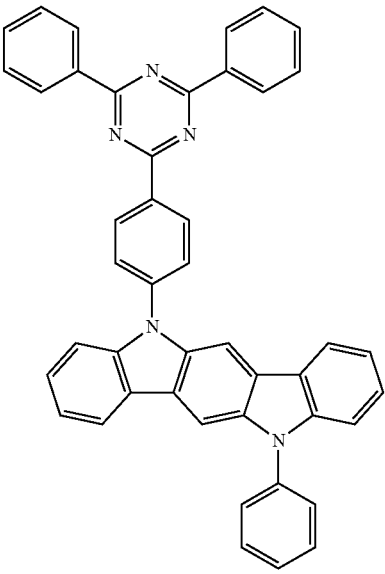
D1-5 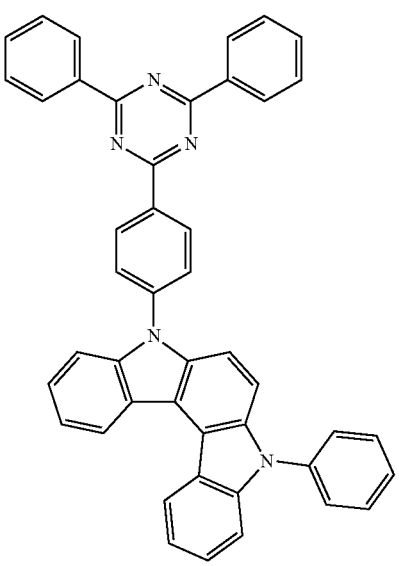
D1-6 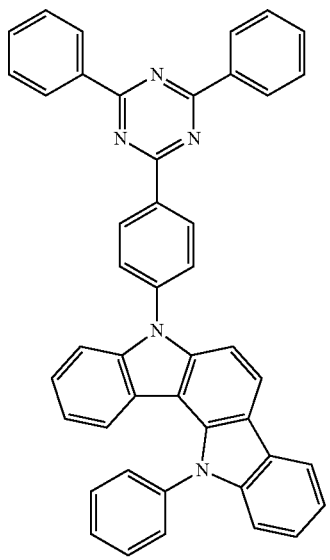

-continued
D1-7
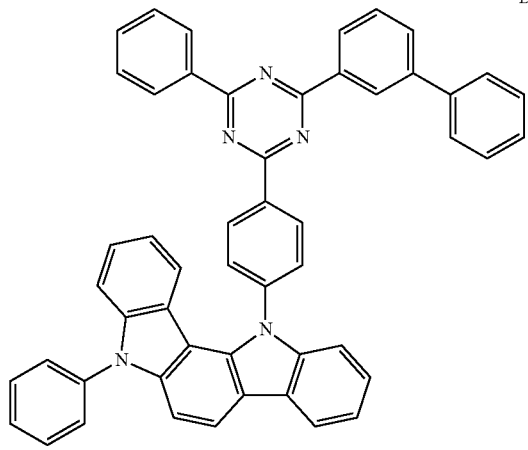
D1-8
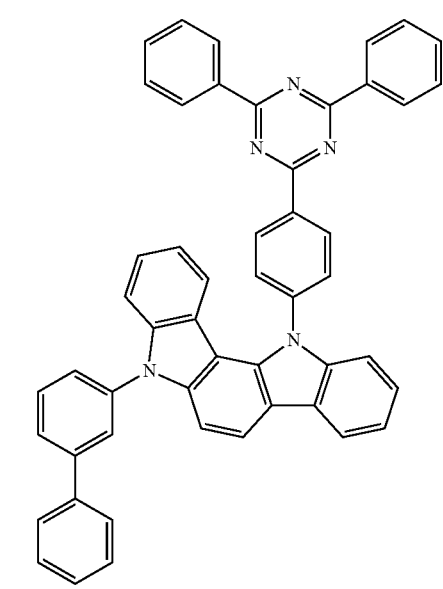
D1-9
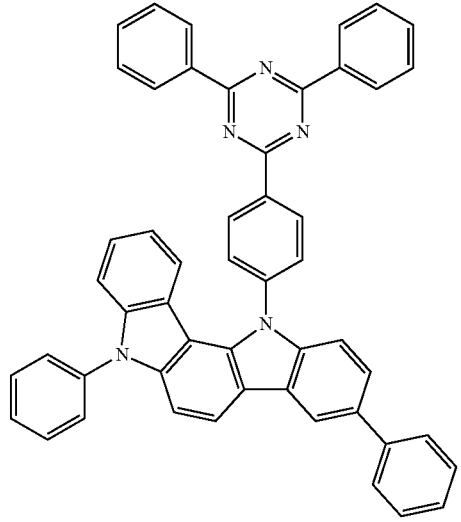
-continued
D1-10
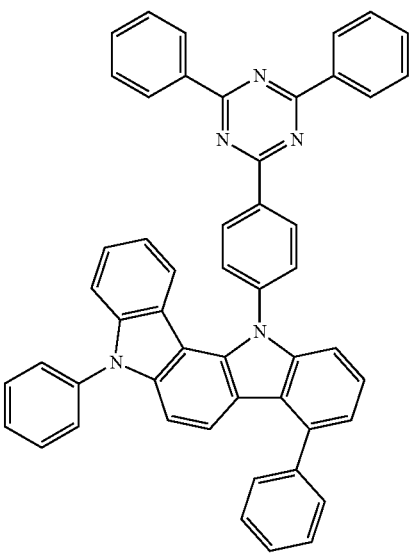
D1-11
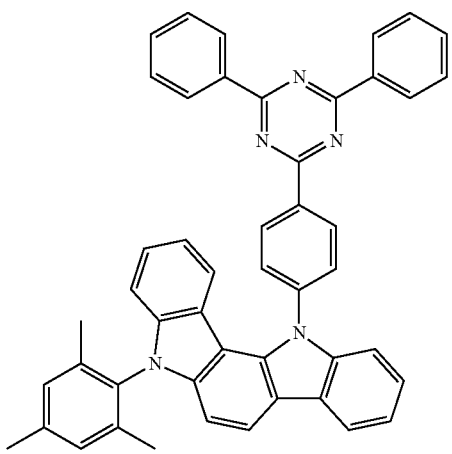
D1-12
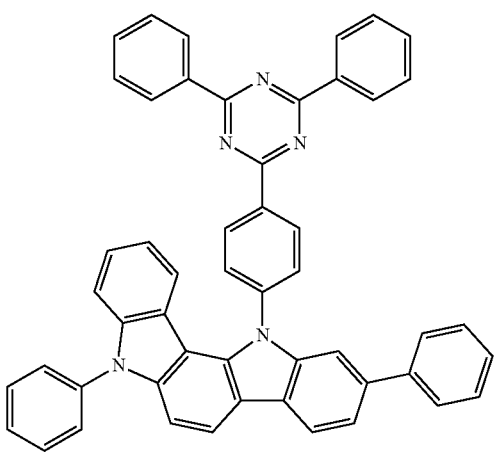

D1-13
D1-16
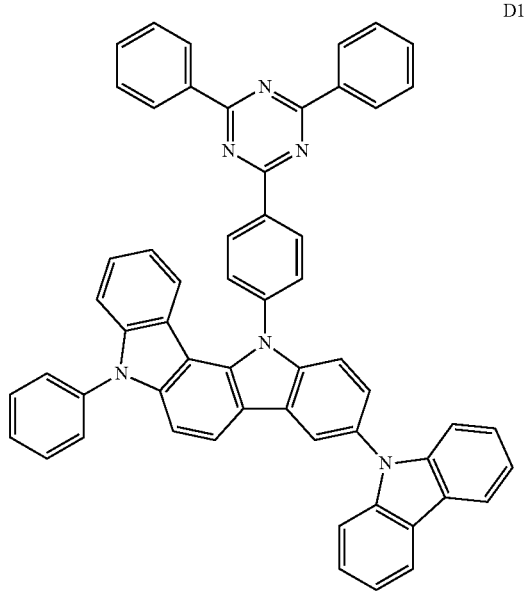
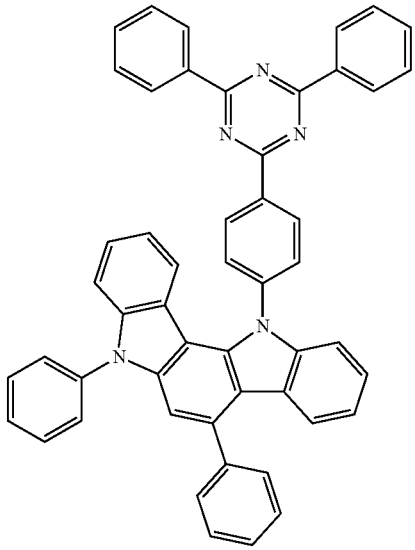
D1-14
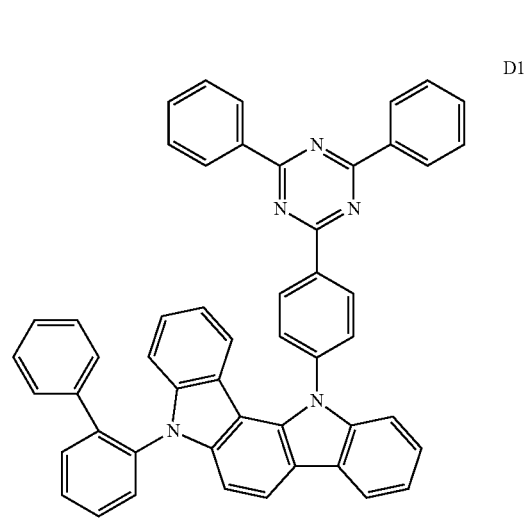
D1-17
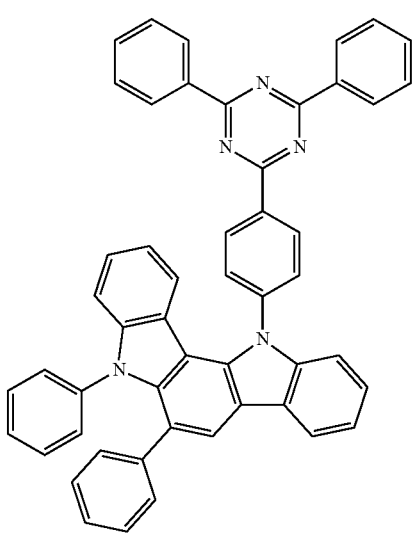
D1-15
D1-18

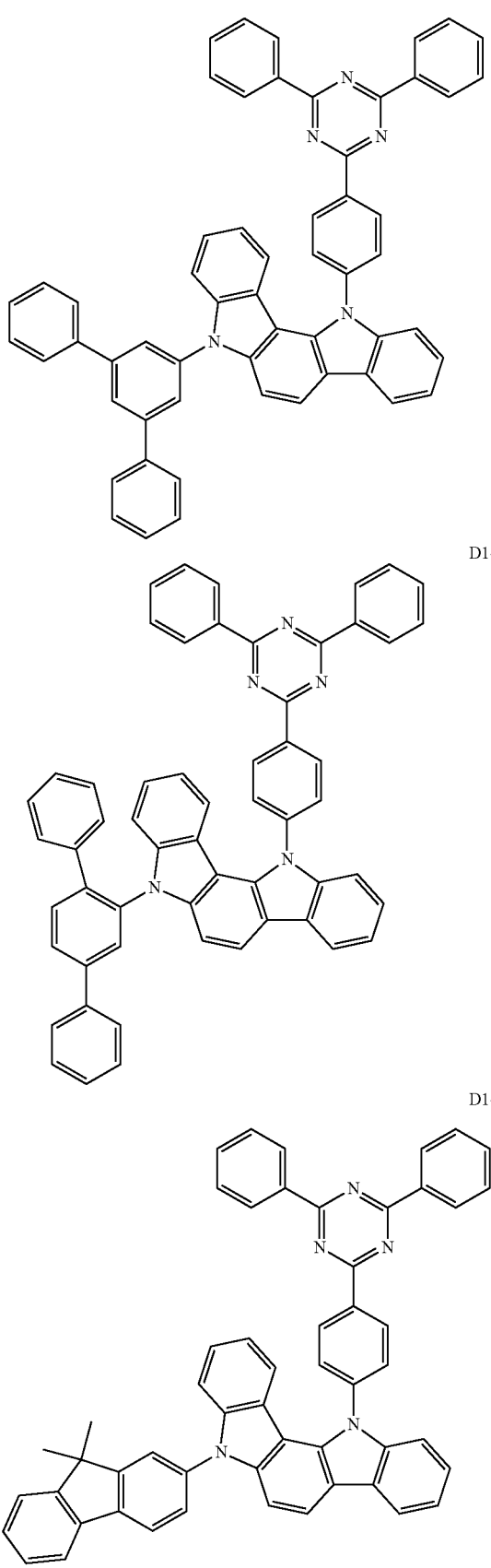
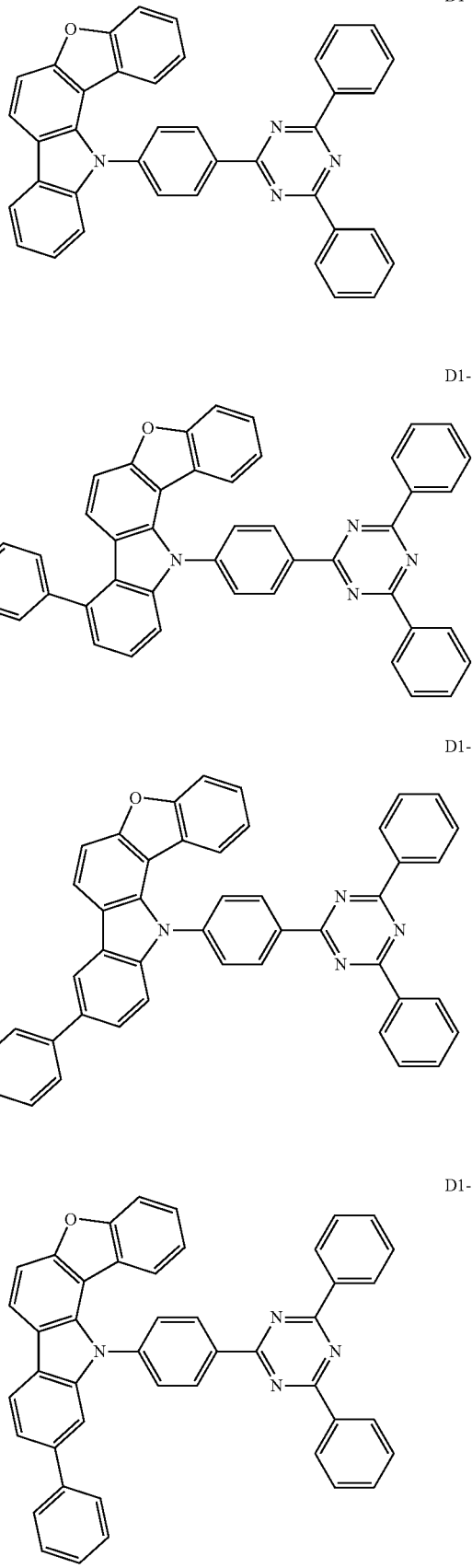

D1-26
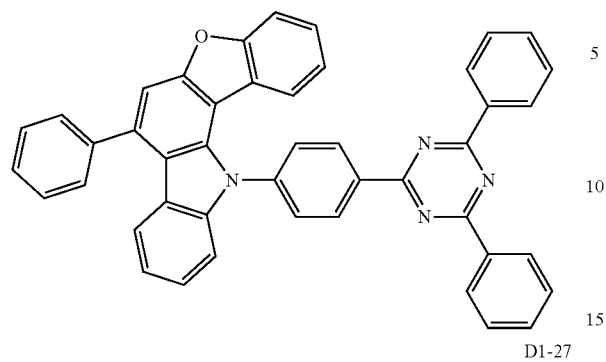
D1-27
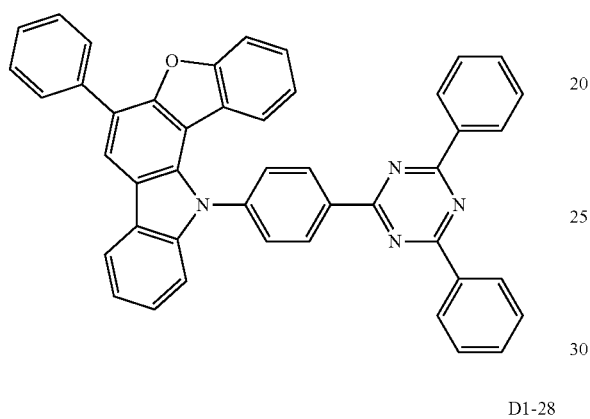
D1-28
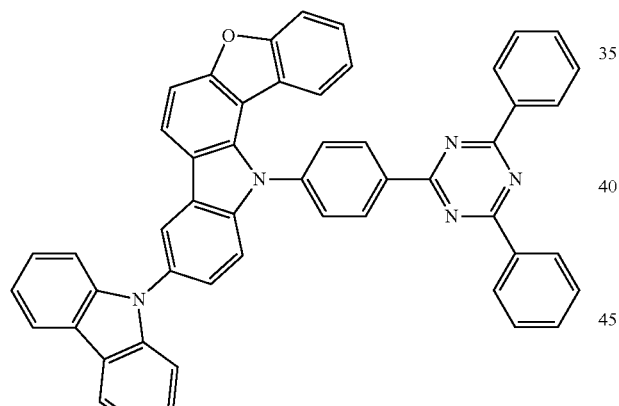
D1-29
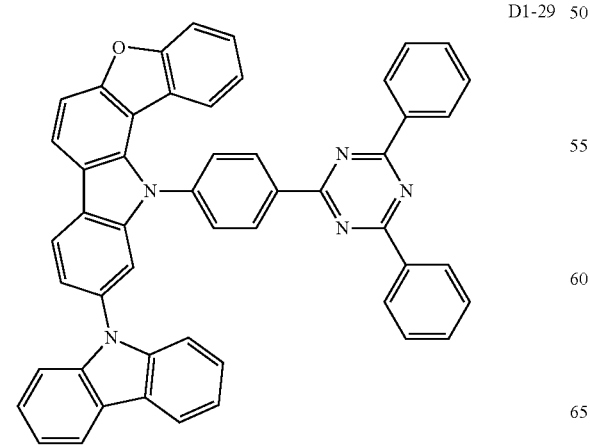
D1-30
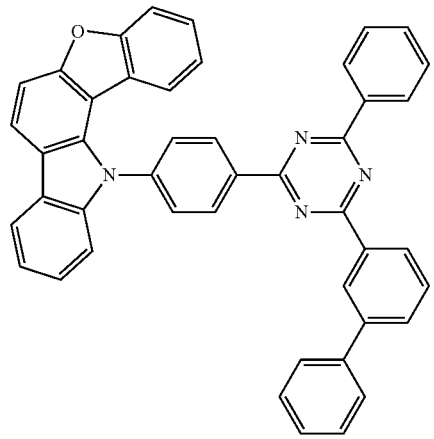
D1-31
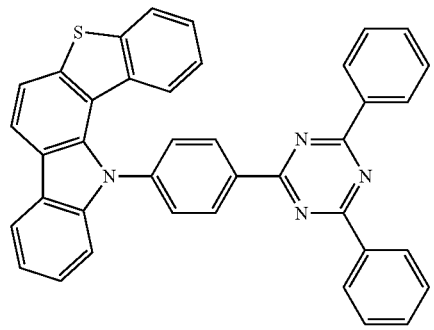
D1-32
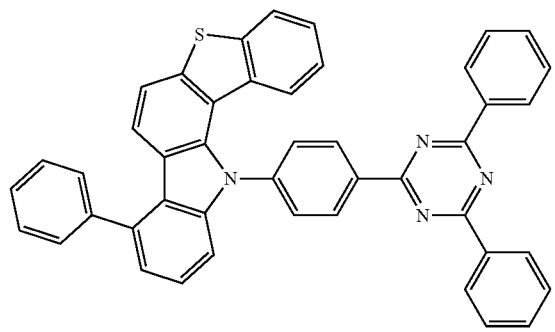
D1-33
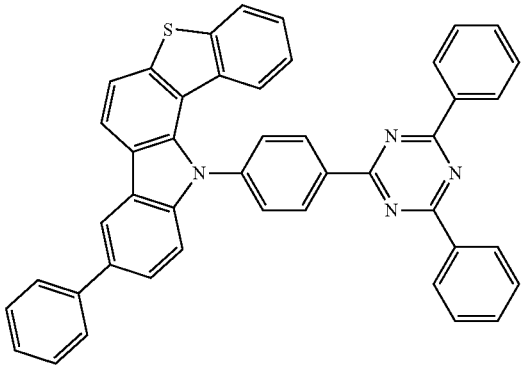

D1-34
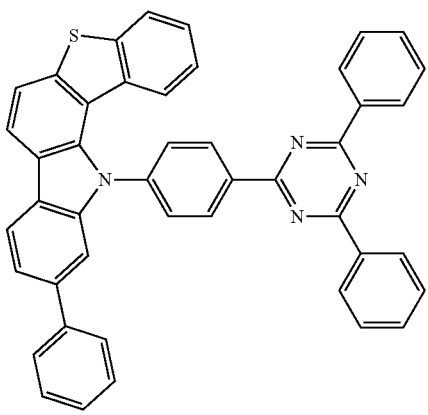
D1-35
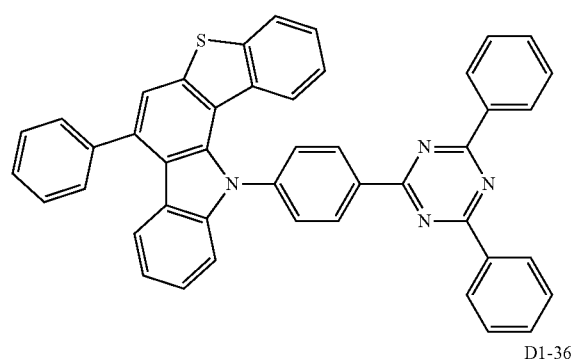
D1-36
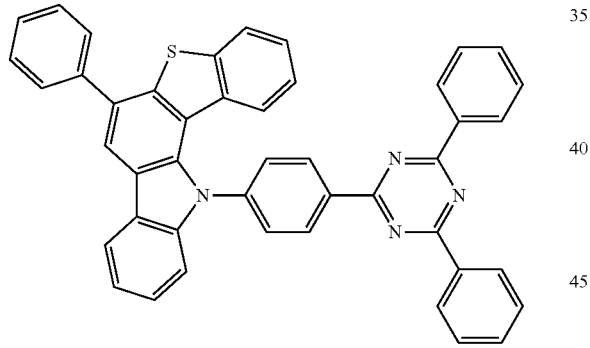
D1-37
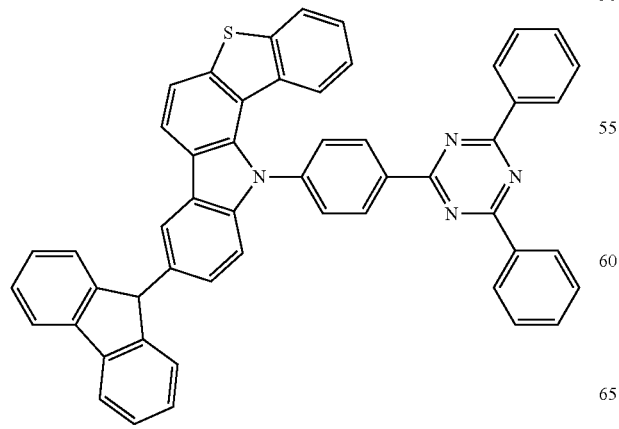
D1-38
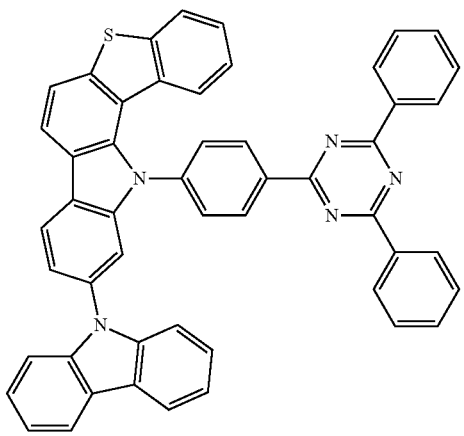
D1-39
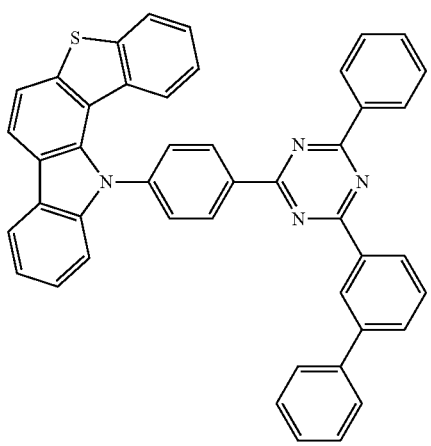
D1-40
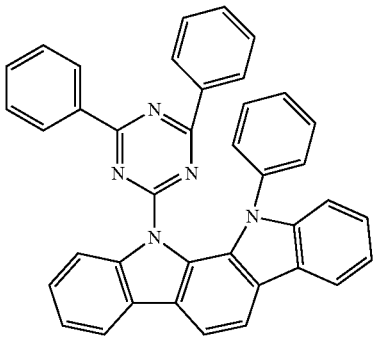
D1-41
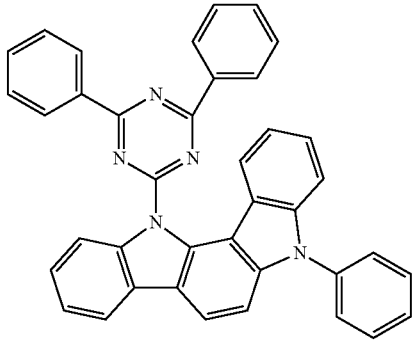

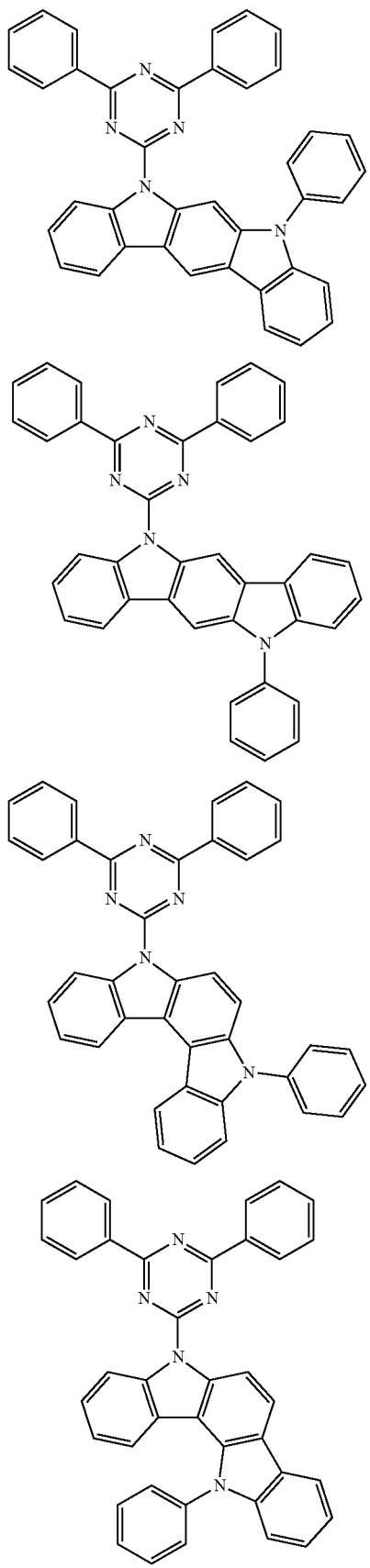
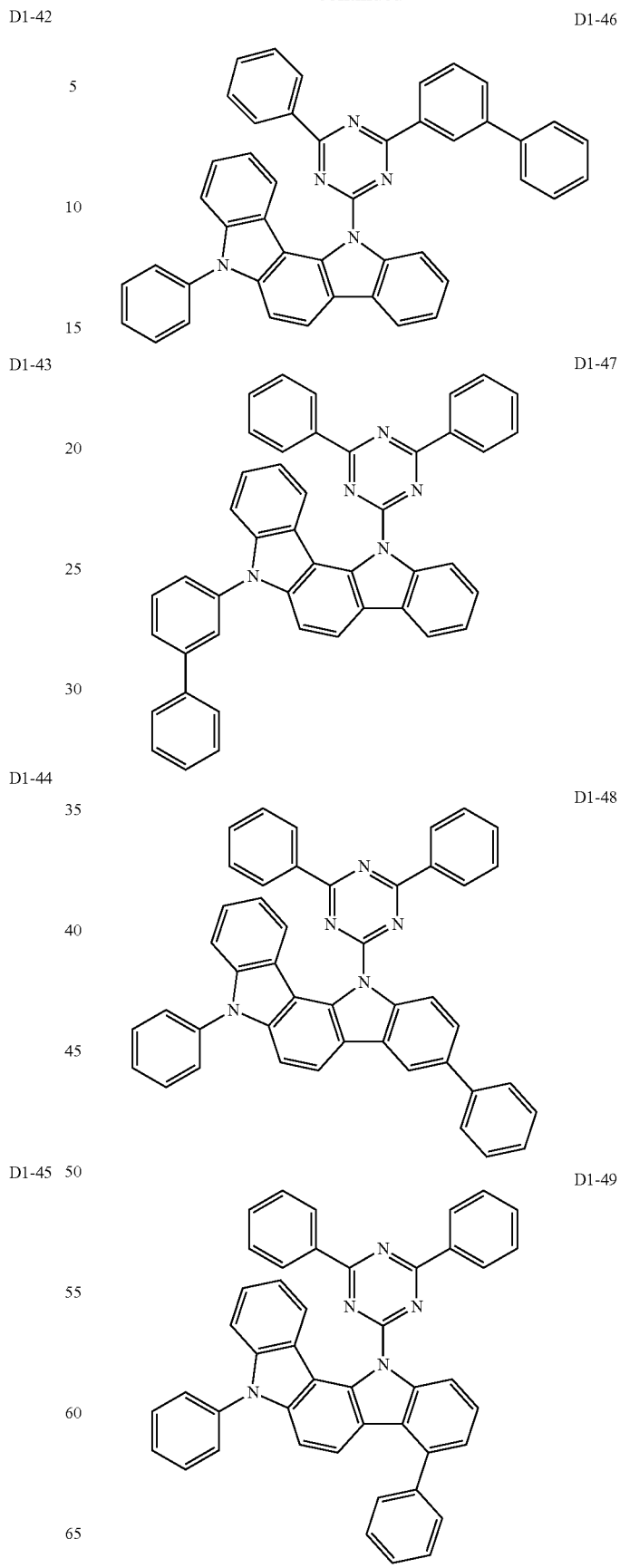

-continued
D1-50
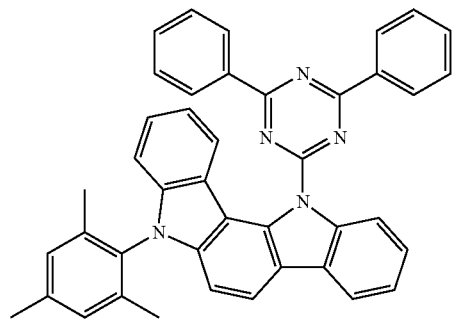
D1-51
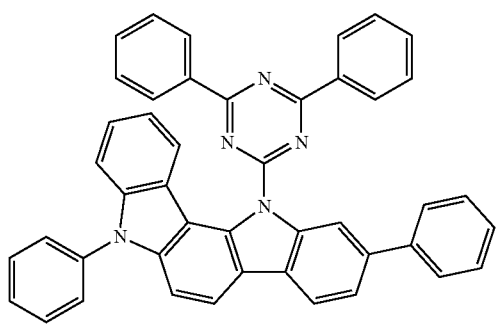
D1-52
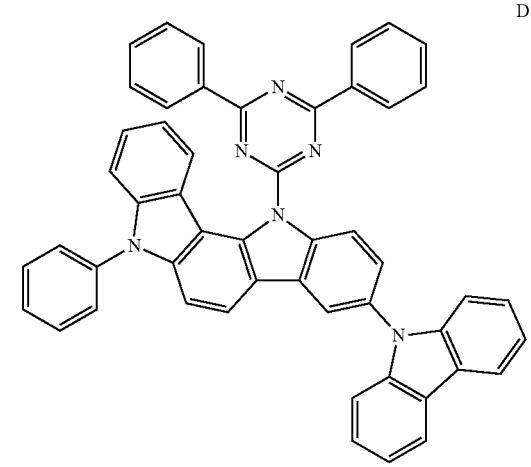
D1-53
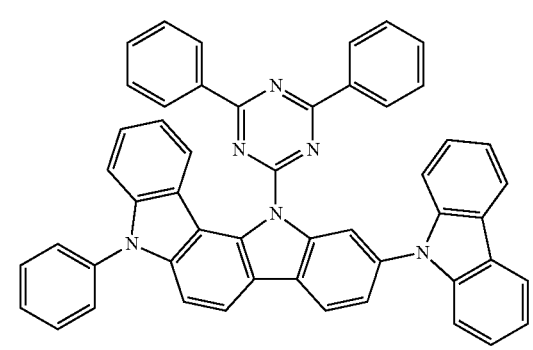
-continued
D1-54
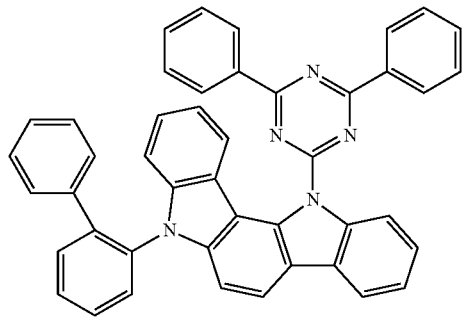
D1-55
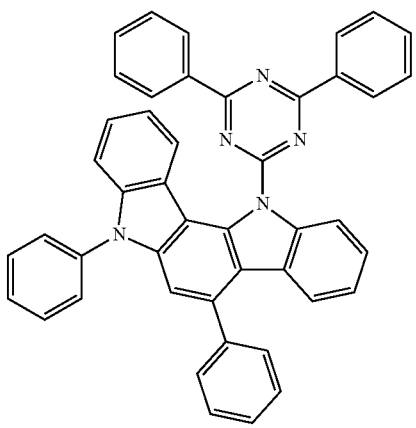
D1-56
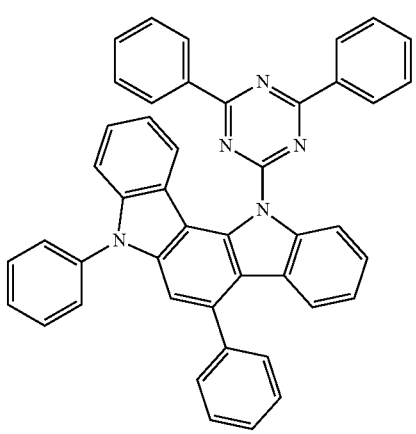
D1-57
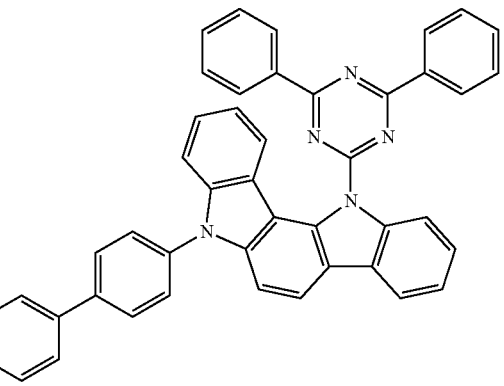

-continued
D1-58
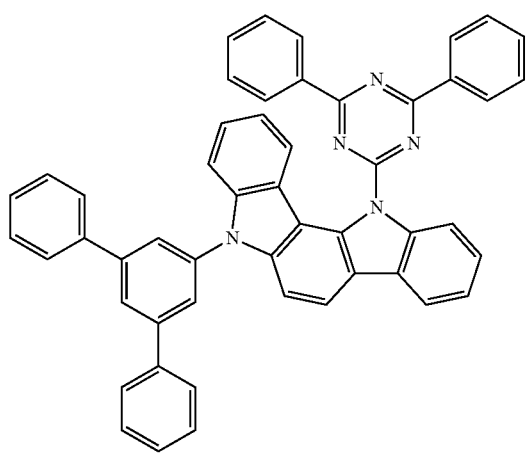
D1-59
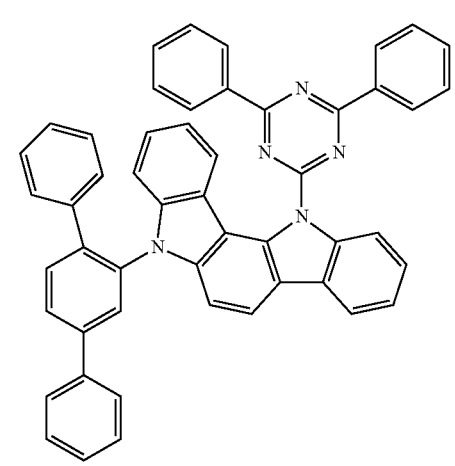
D1-60
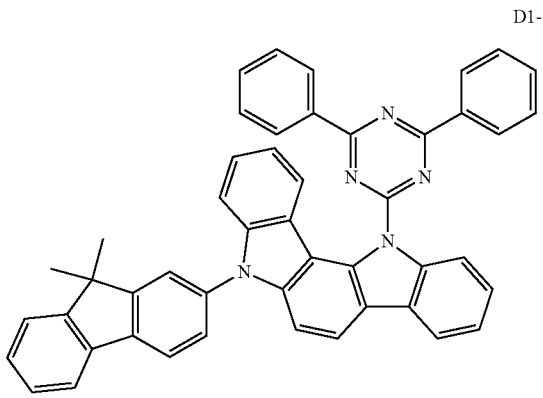
D1-61
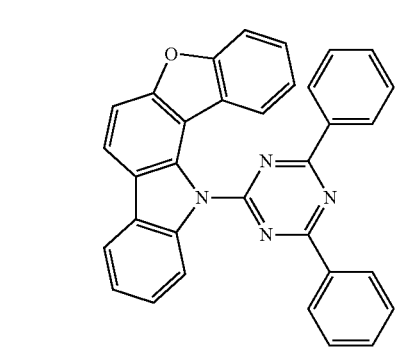
-continued
D1-62
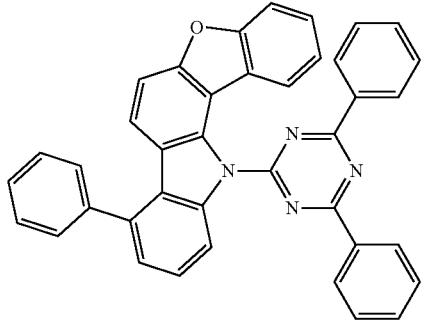
D1-63
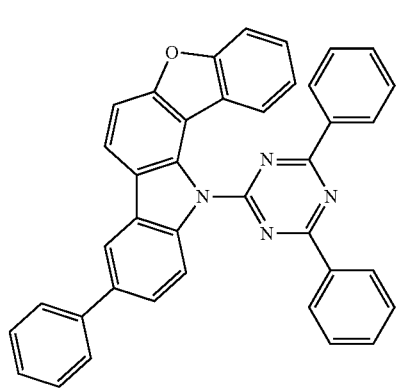
D1-64
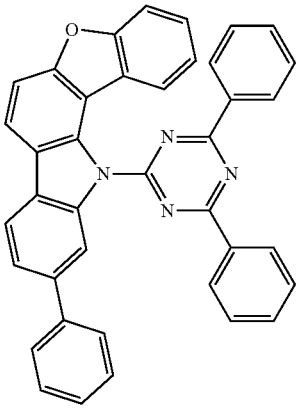
D1-65
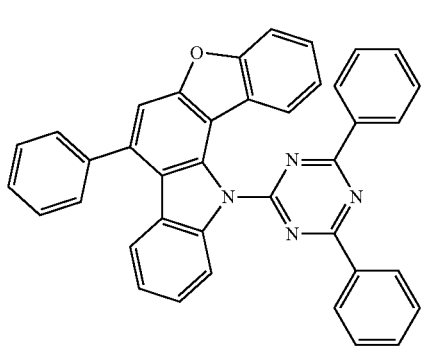

D1-66
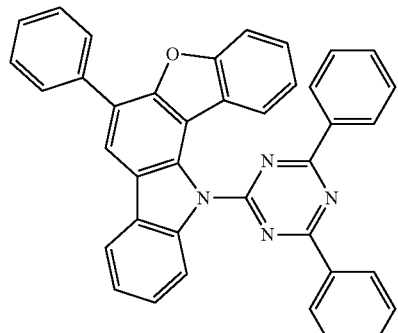
D1-67
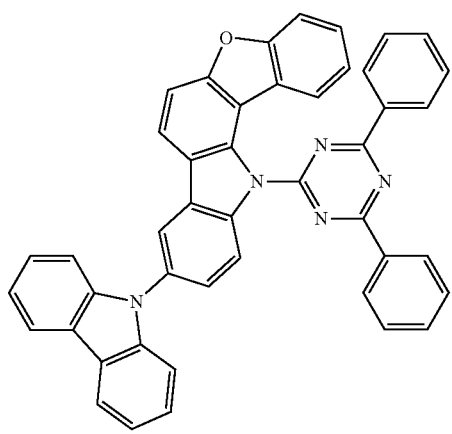
D1-68
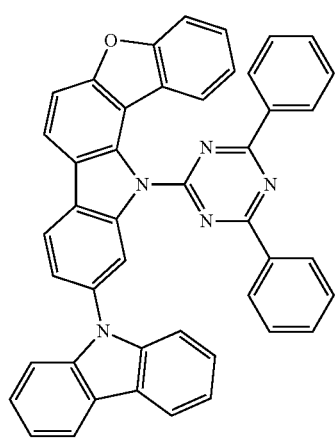
D1-69
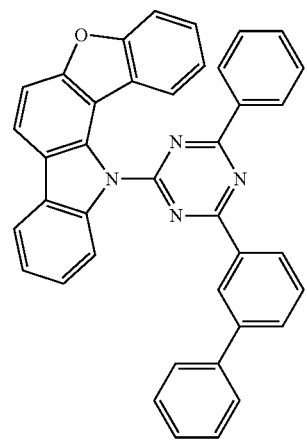
D2-70
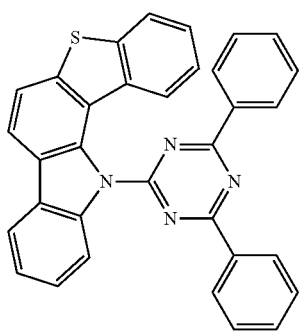
D1-71
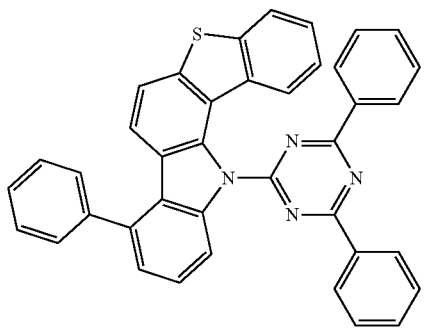
D1-72
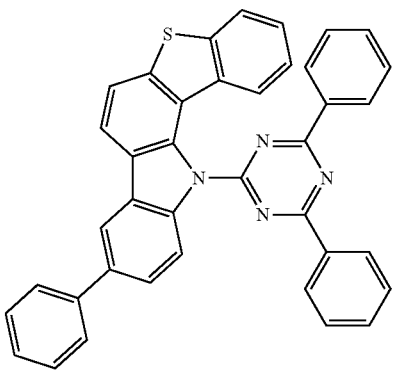
D1-73
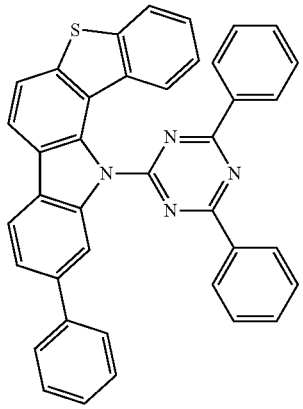

D1-74
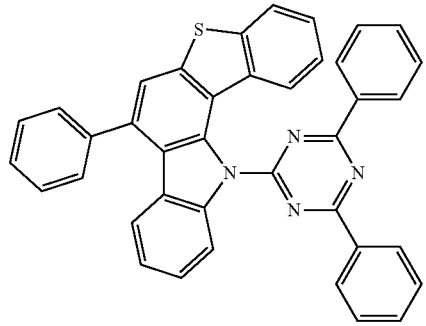
D1-75
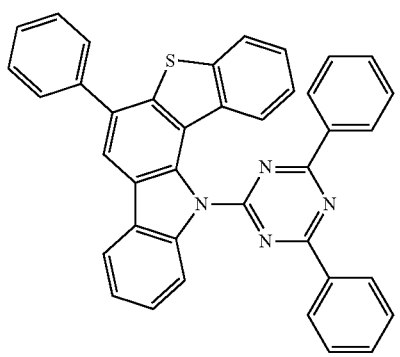
D1-76
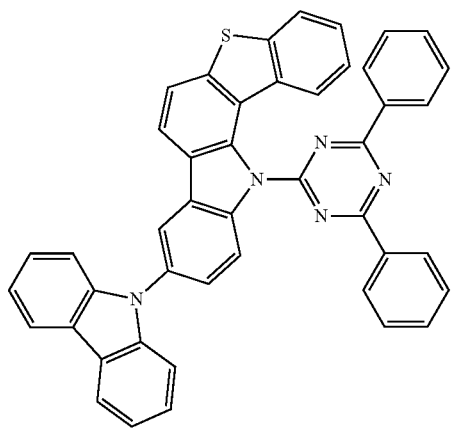
D1-77
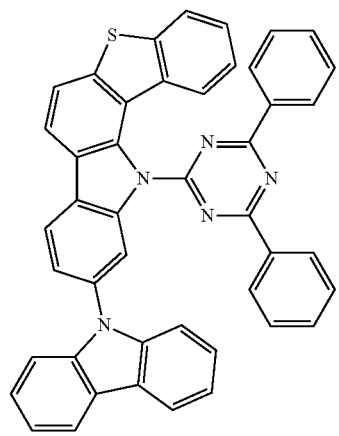
D1-78
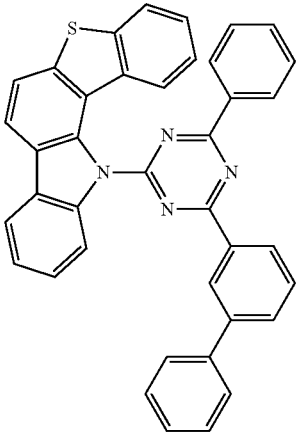
D1-79
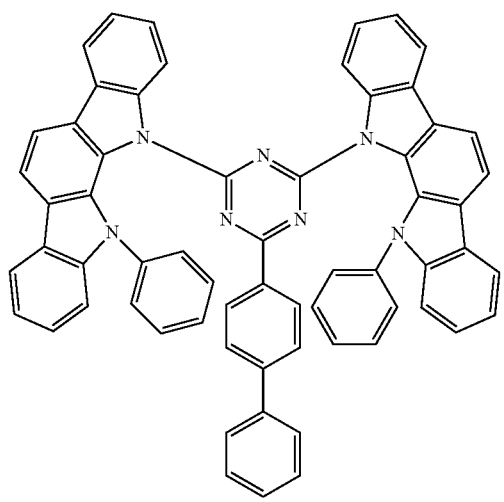
D1-80
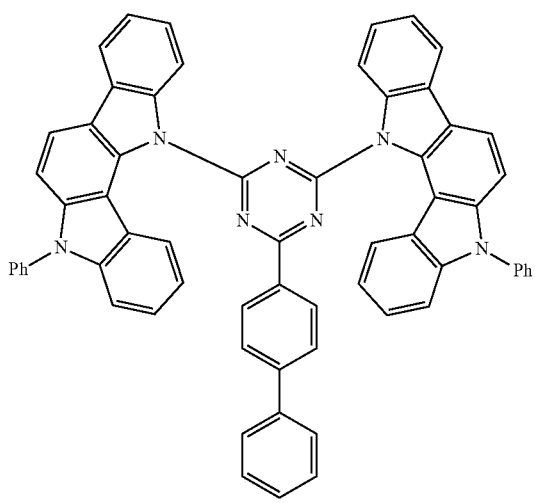

-continued
D1-81
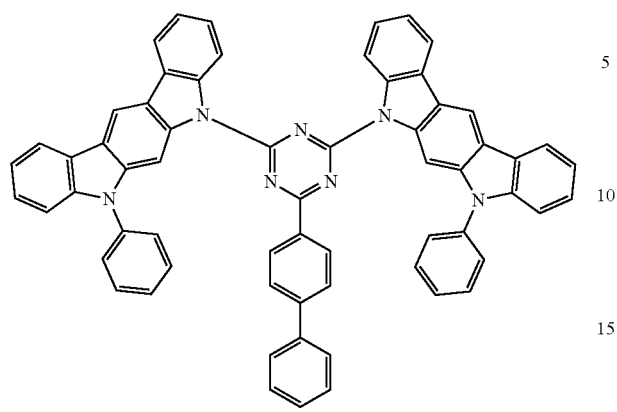
D1-82
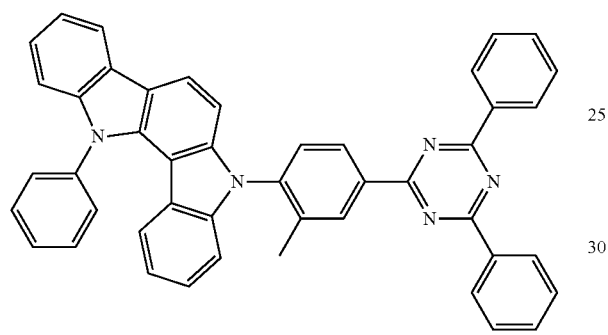
D1-83
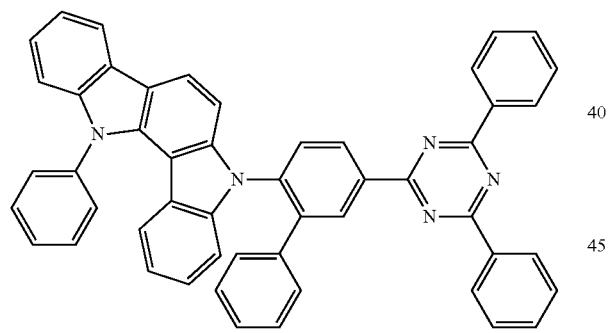
D2-1
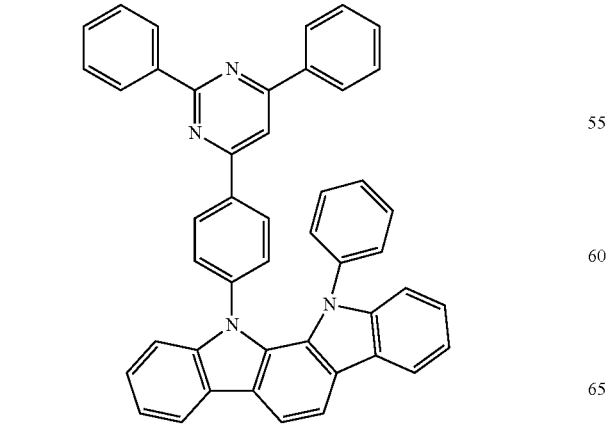
-continued
D2-2
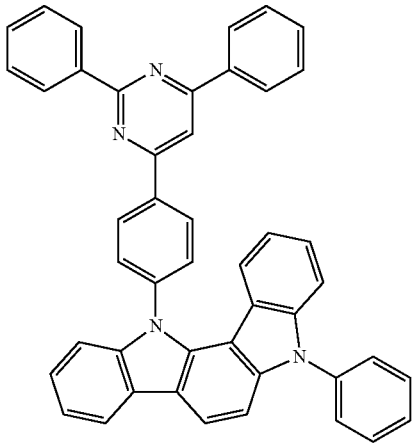
D2-3
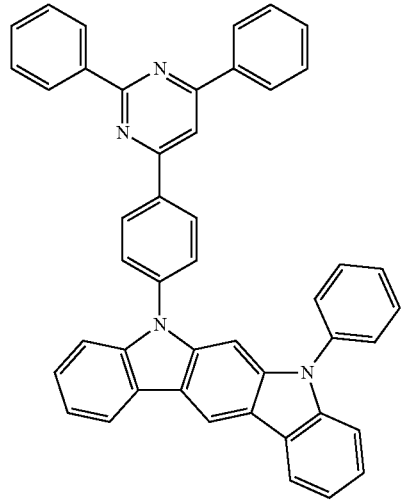
D2-4
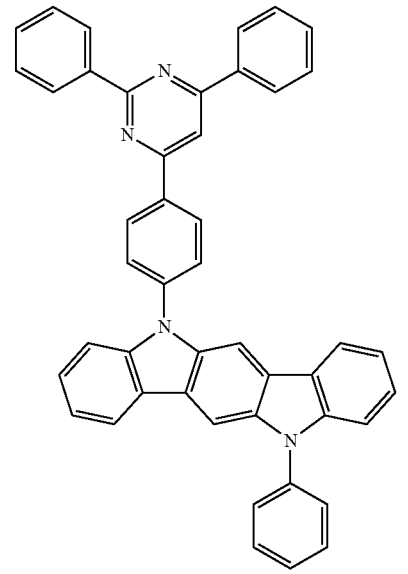

-continued
D2-5
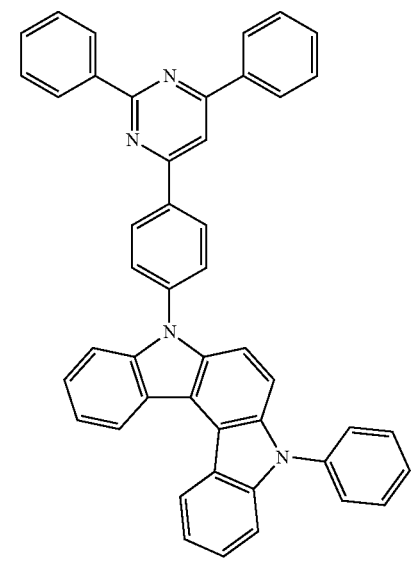
D2-6
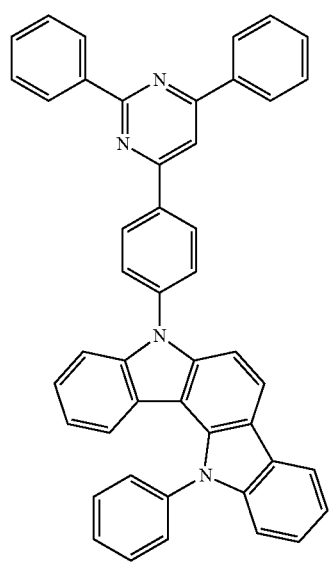
D2-7
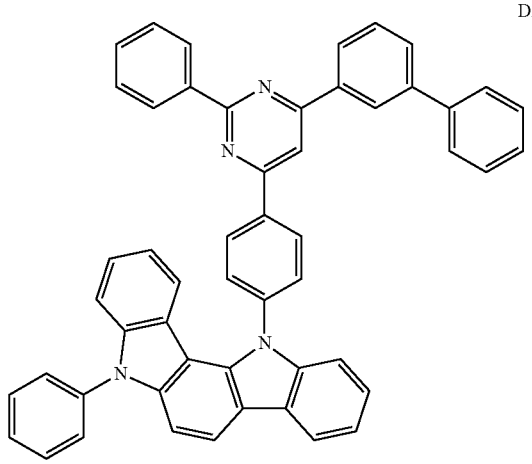
-continued
D2-8
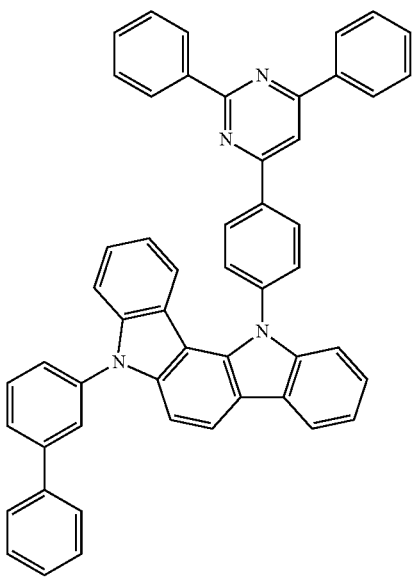
D2-9
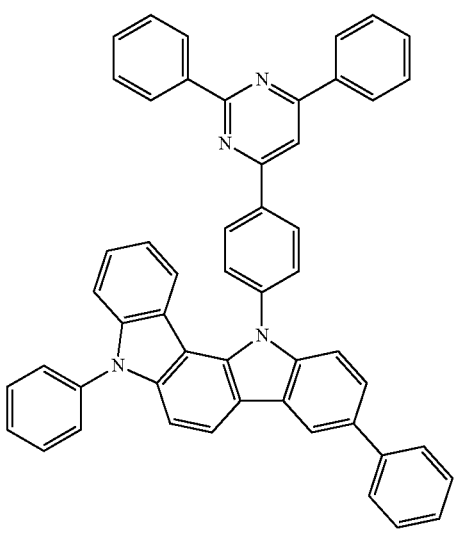
D2-10
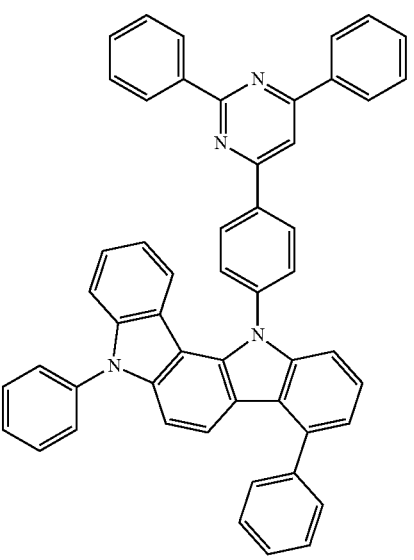

-continued
D2-11
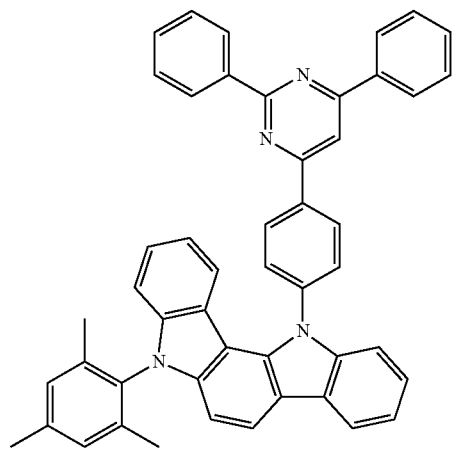
D2-12
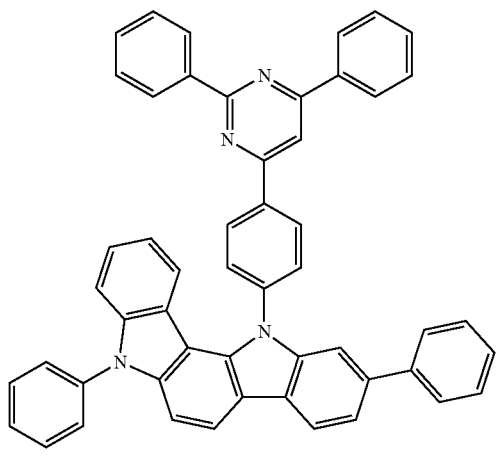
D2-13
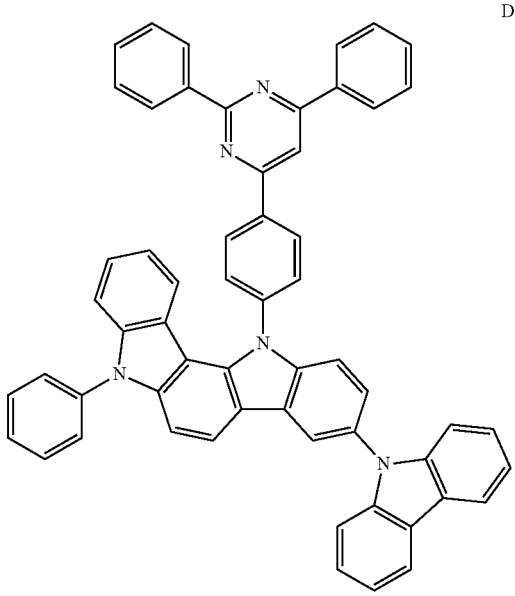
-continued
D2-14
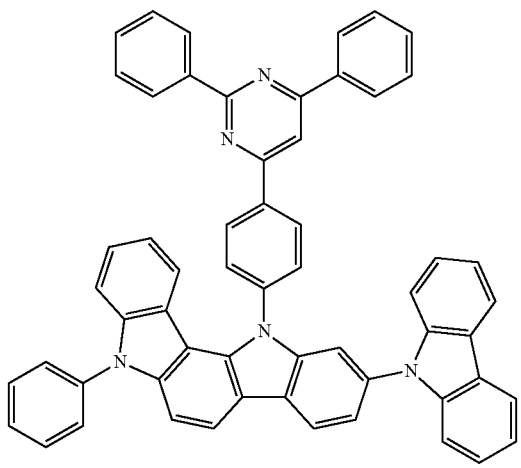
D2-15
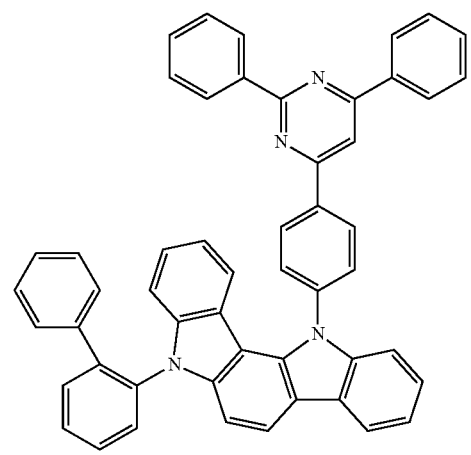
D2-16
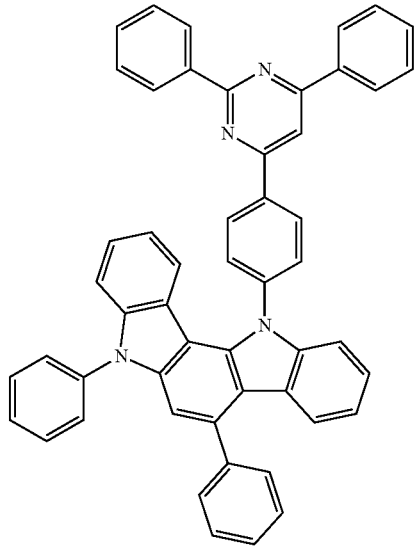

D2-17
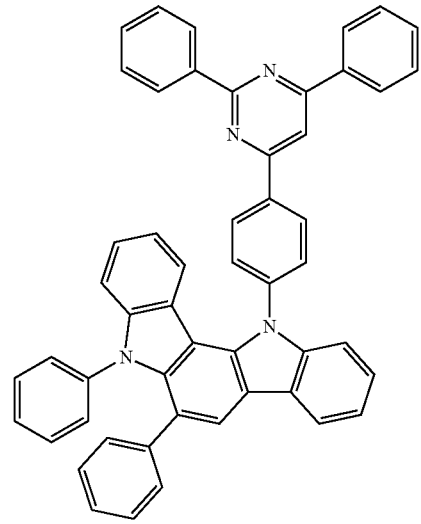
D2-18
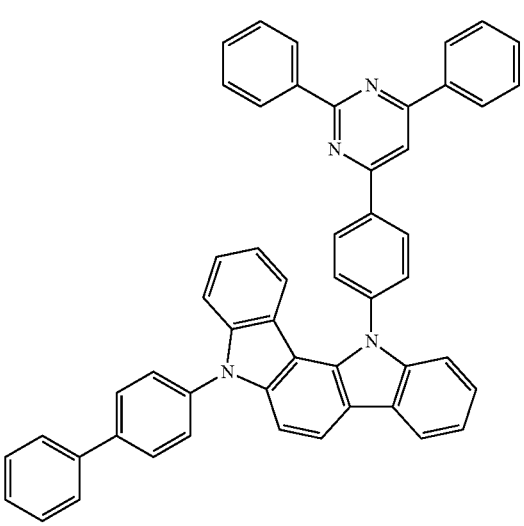
D2-19
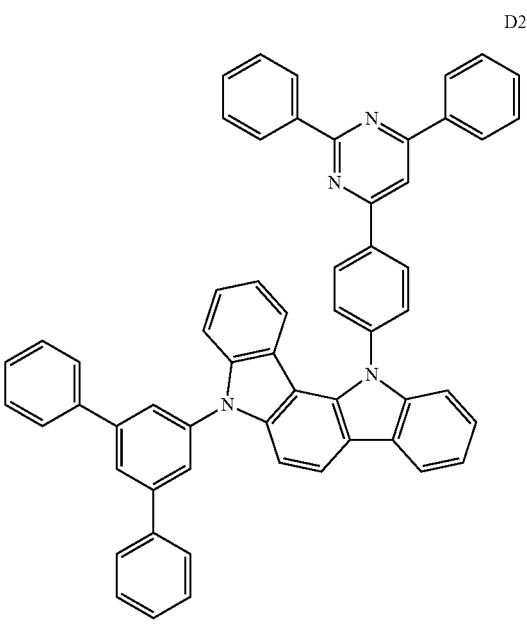
D2-20
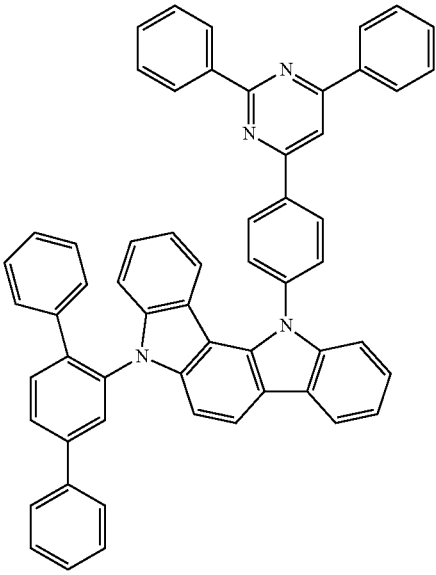
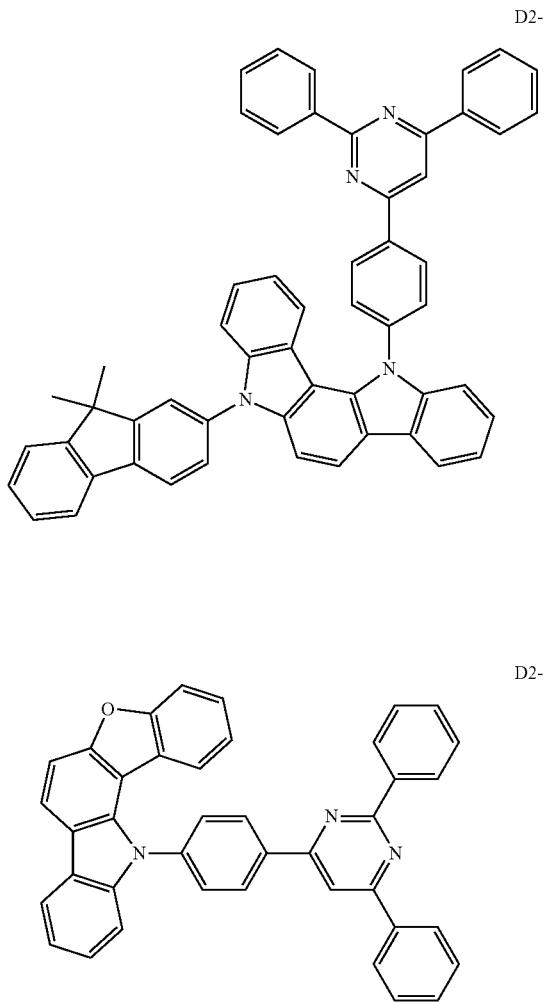

D2-23
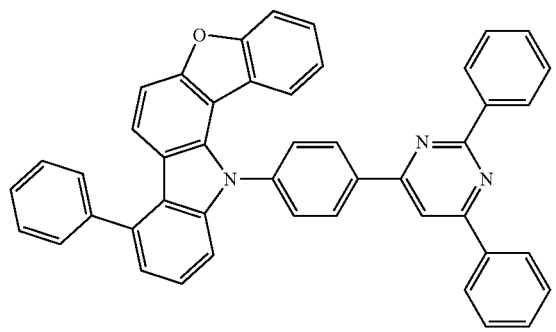
D2-24
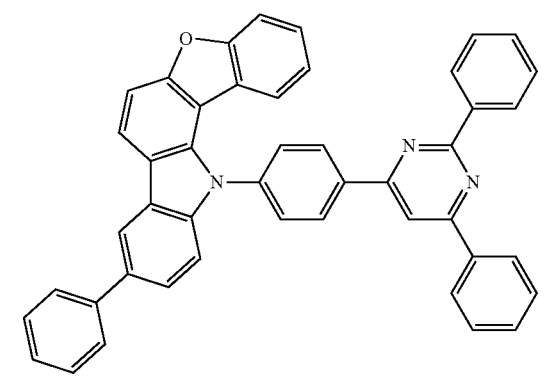
D2-25
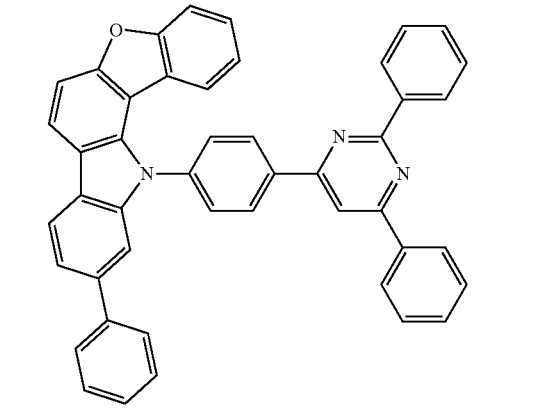
D2-26
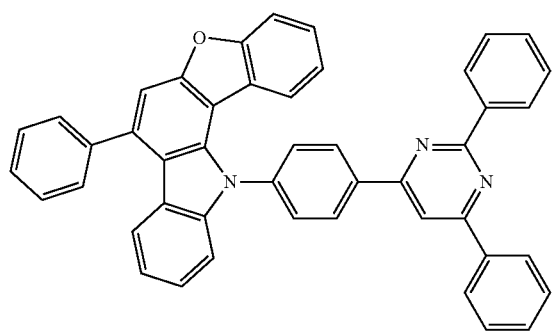
D2-27
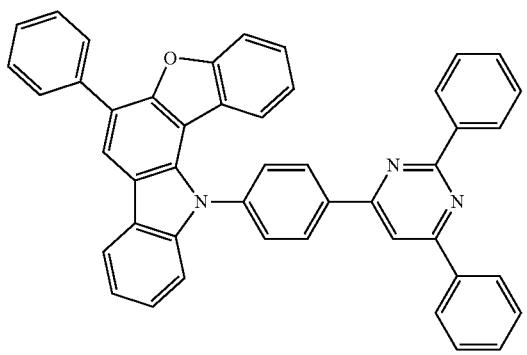
D2-28
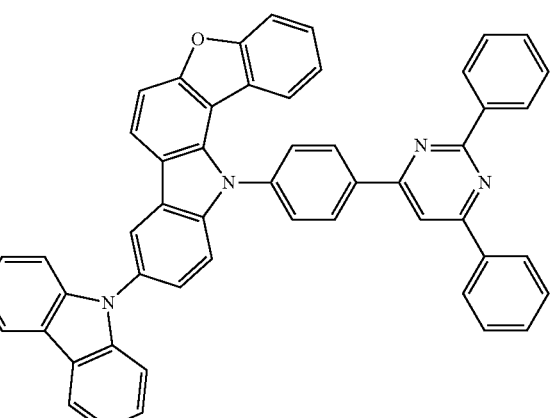
D2-29
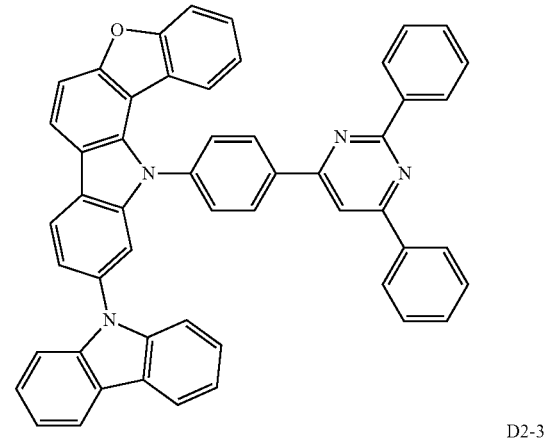
D2-30
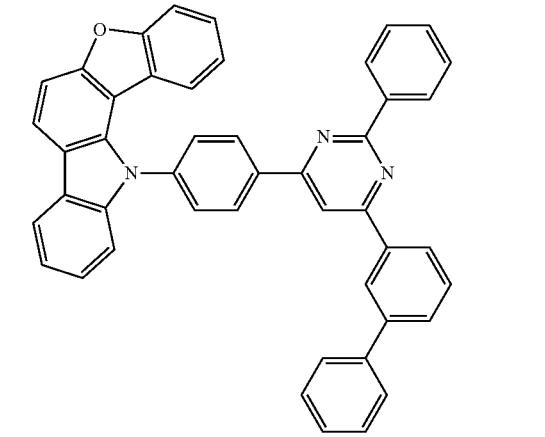

-continued
D2-31
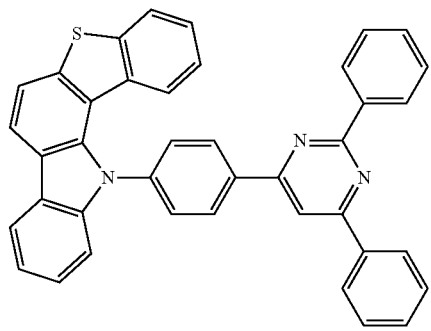
D2-32
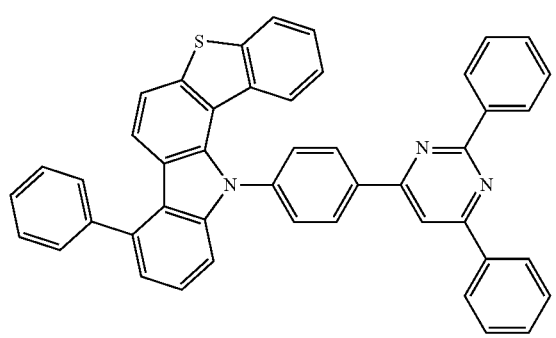
D2-33
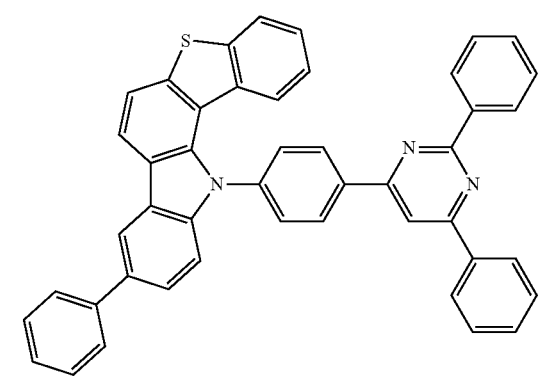
D2-34
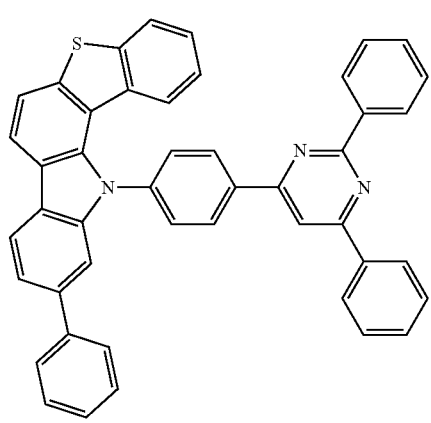
-continued
D2-35
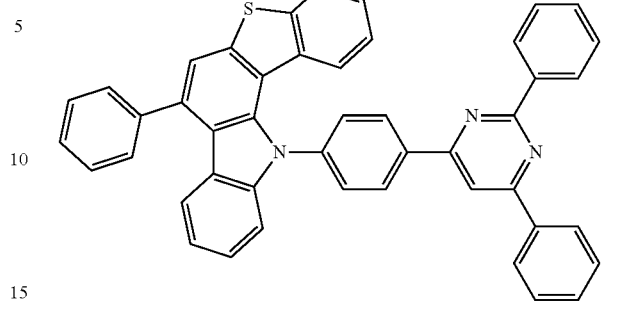
D2-36
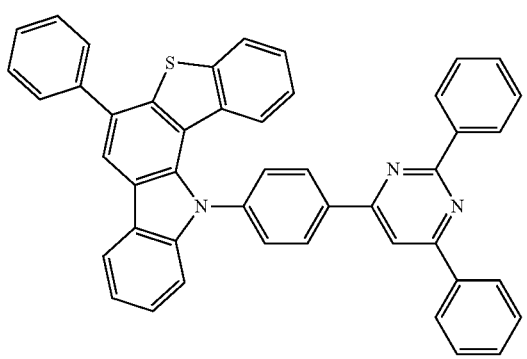
D2-37
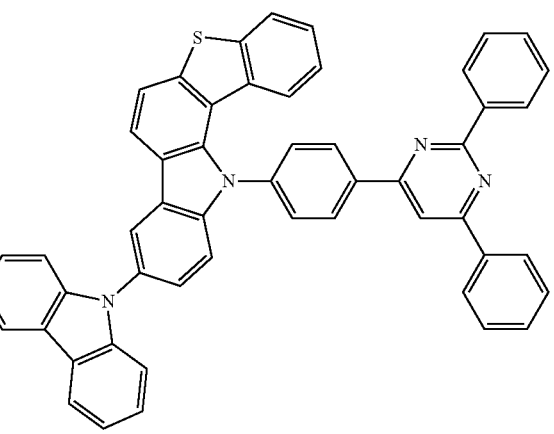
D2-38
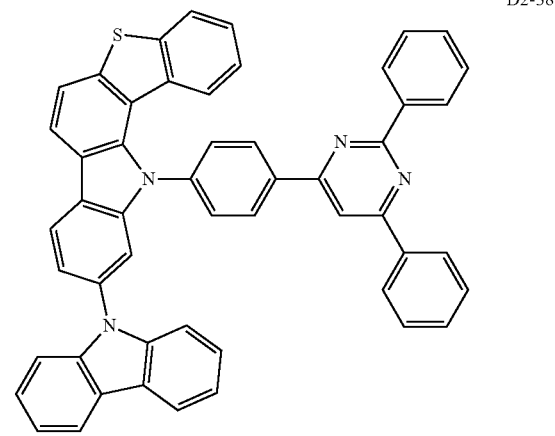

D2-39
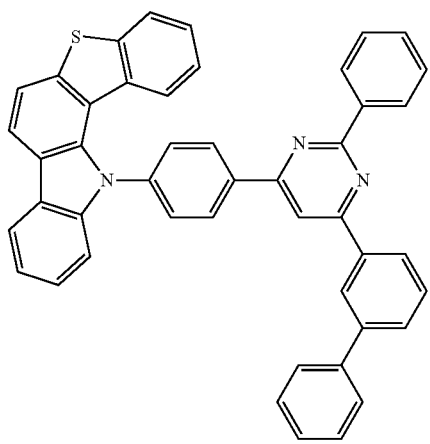
D2-40
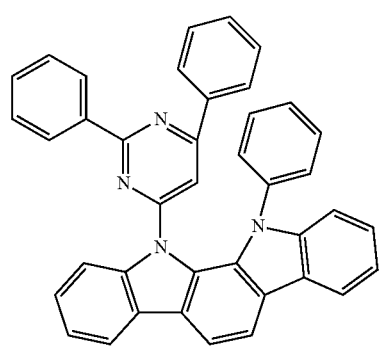
D2-41
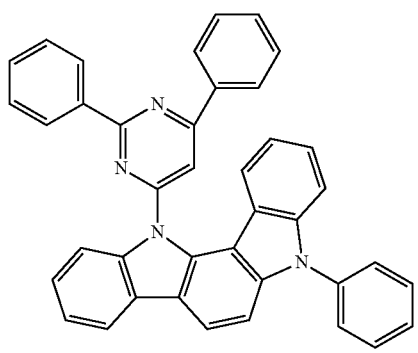
D2-42
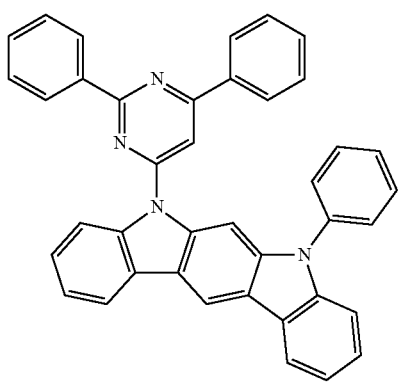
D2-43
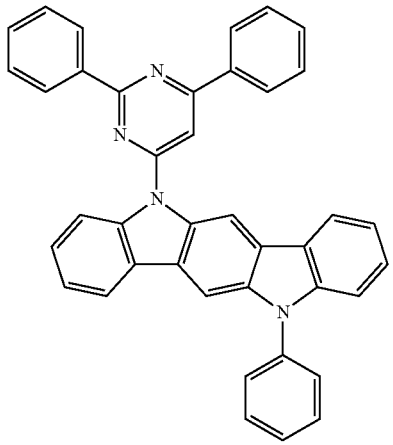
D2-44
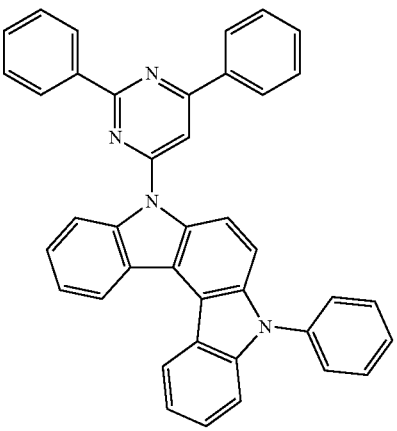
D2-45
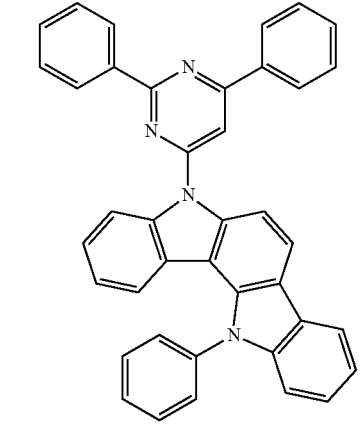
D2-46
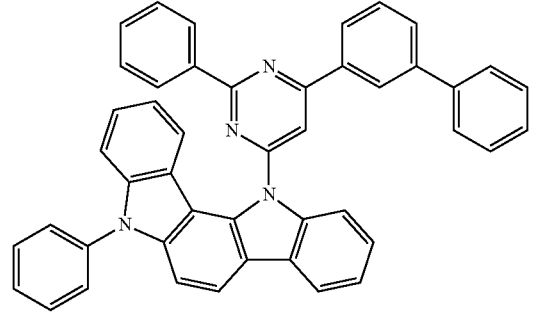

D2-47
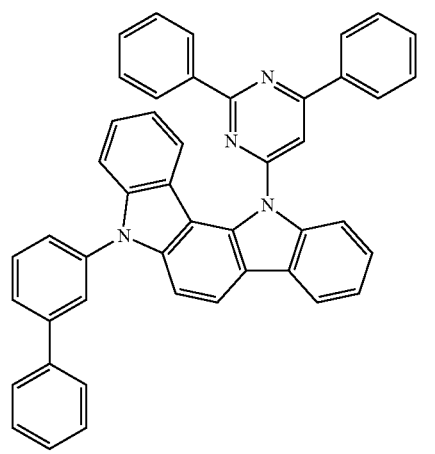
D2-48
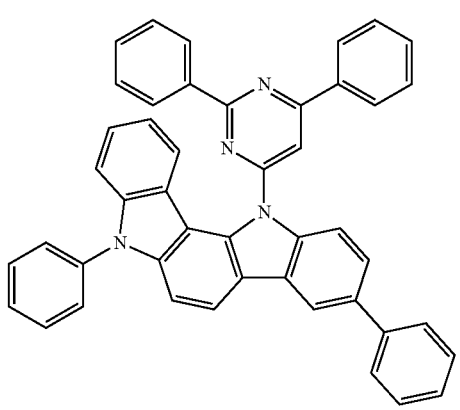
D2-49
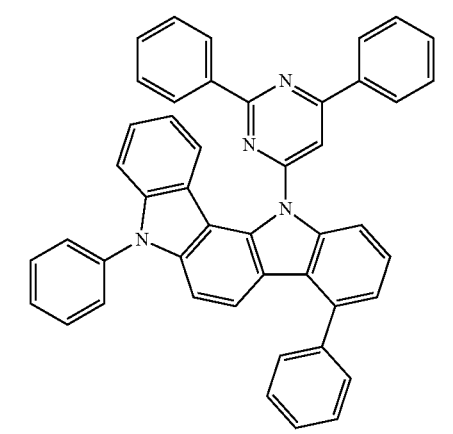
D2-50
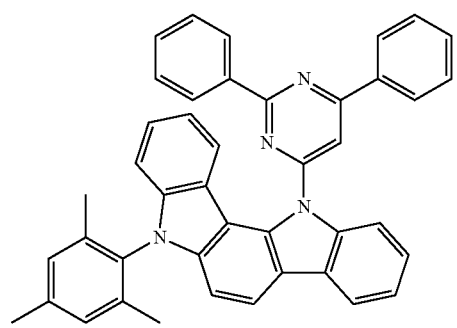
D2-51
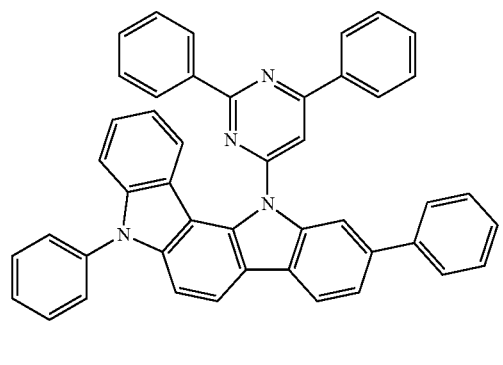
D2-52
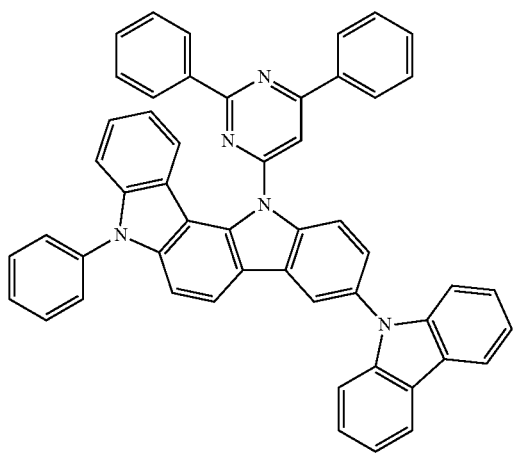
D2-53
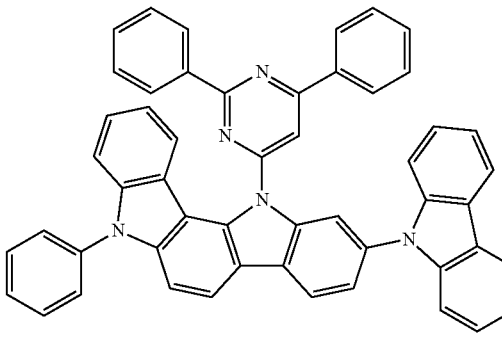
D2-54
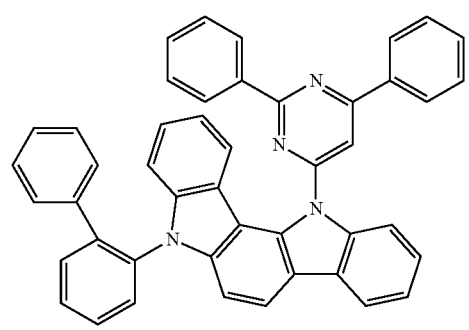

-continued
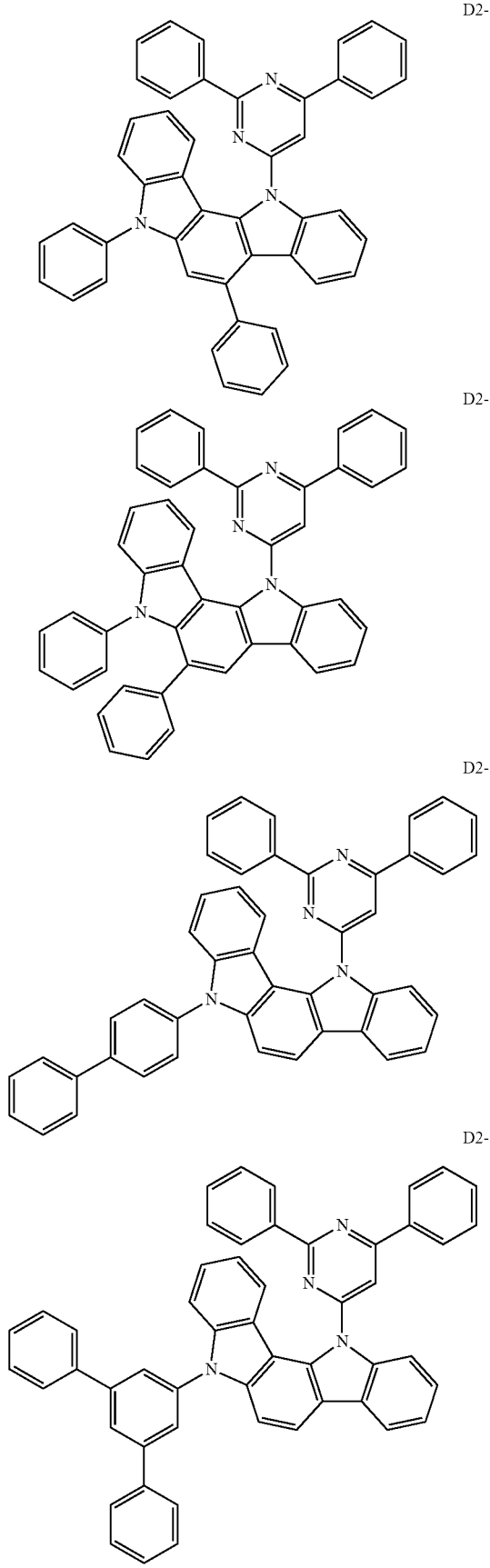
D2-55
D2-56
D2-57
D2-58
-continued
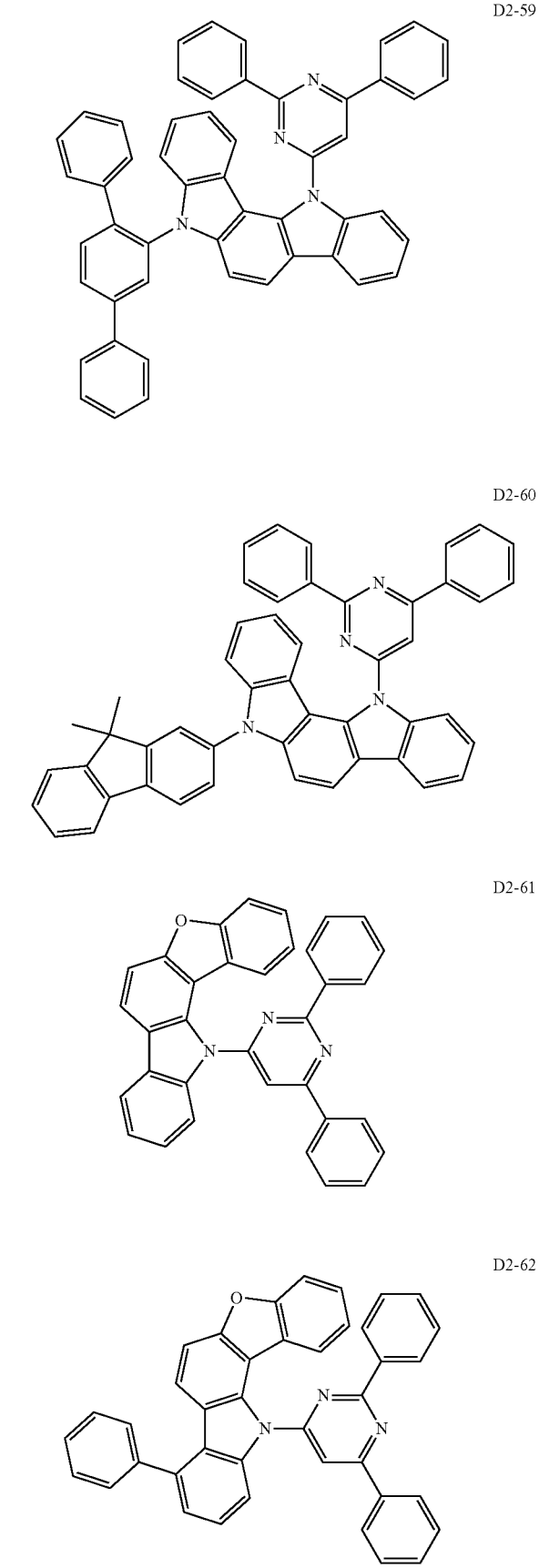
D2-59
D2-60
D2-61
D2-62

D2-63
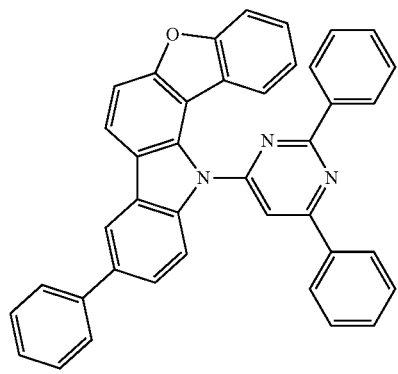
D2-64
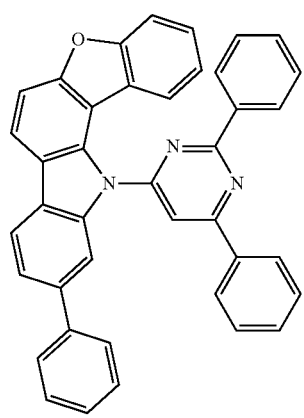
D2-65
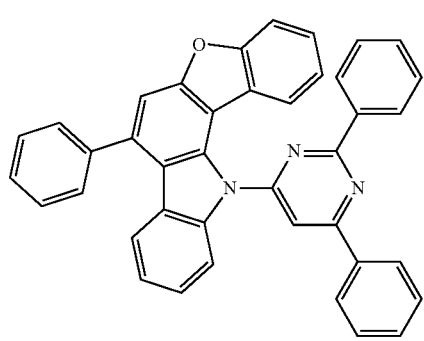
D2-66
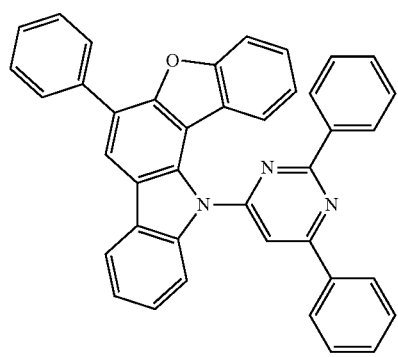
D2-67
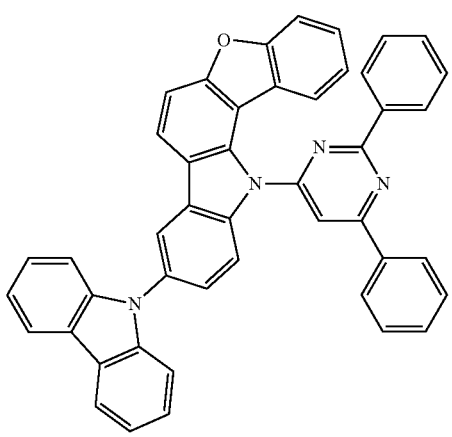
D2-68
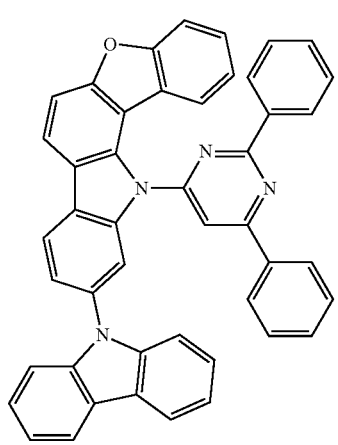
D2-69
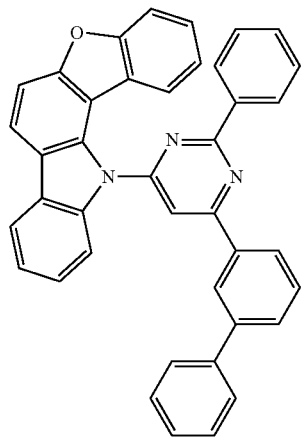
D2-70
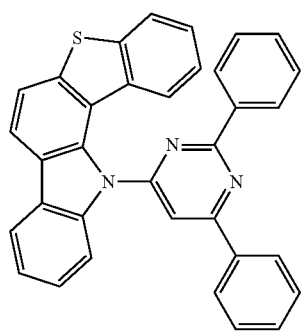

D2-71
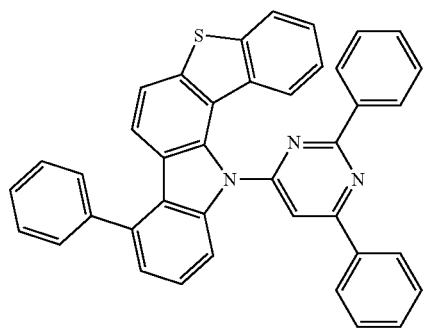
D2-72
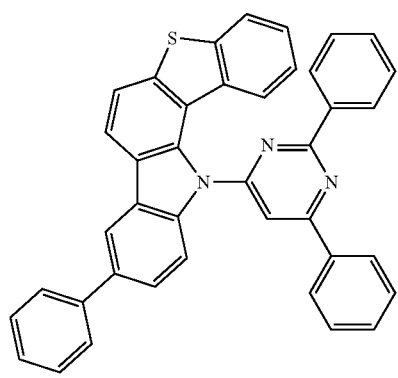
D2-73
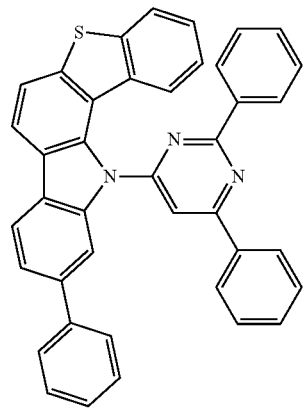
D2-74
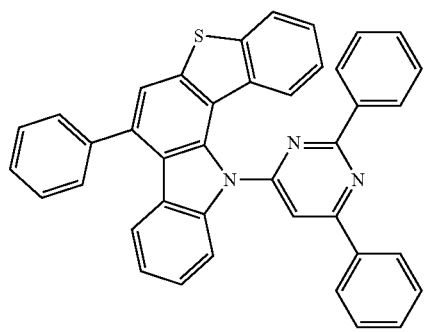
D2-75
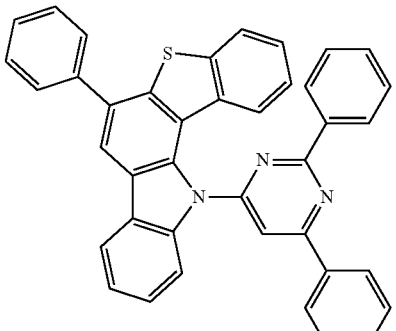
D2-76
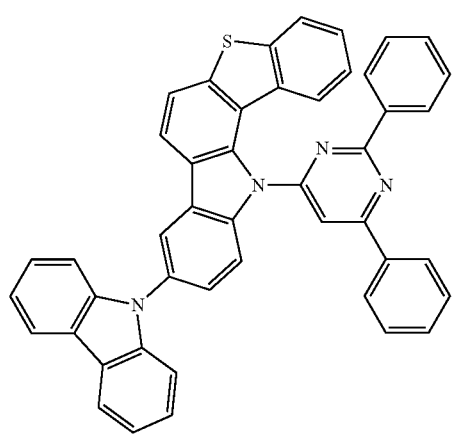
D2-77
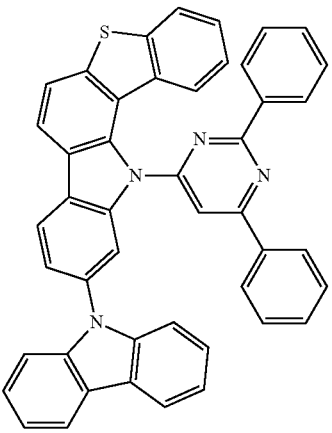
D2-78
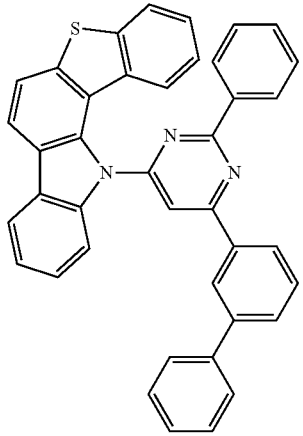

-continued
D2-79
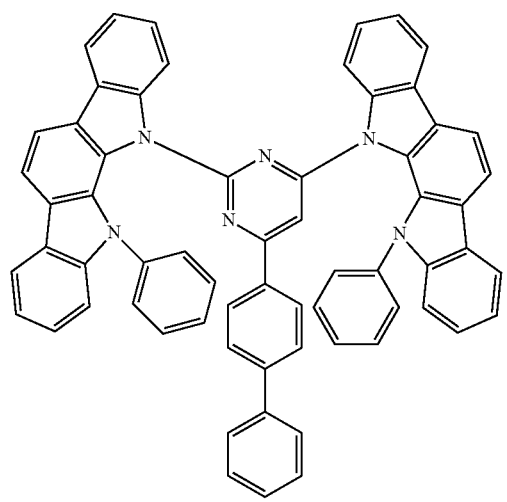
D2-80
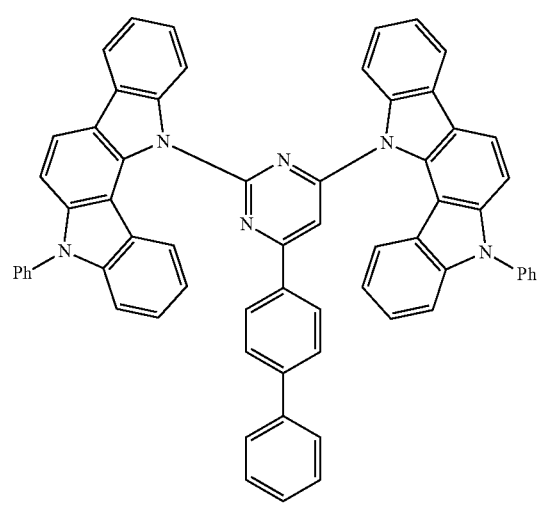
D2-81
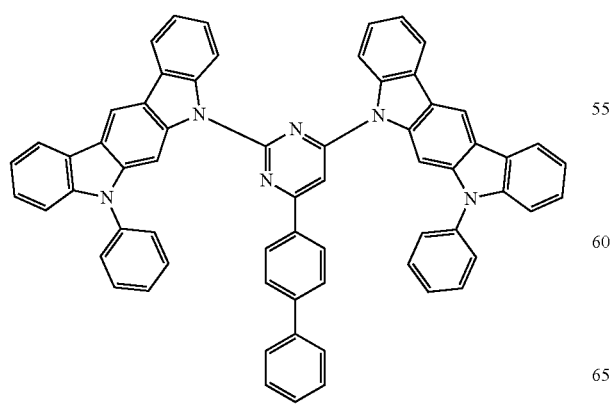
-continued
D3-1
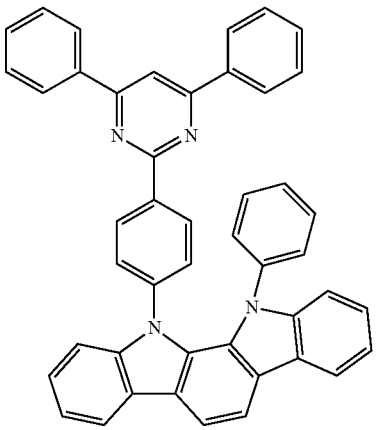
D3-2
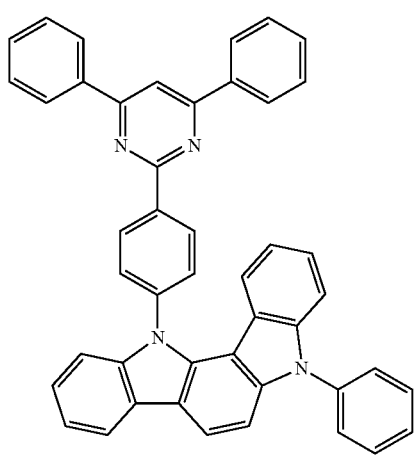
D3-3
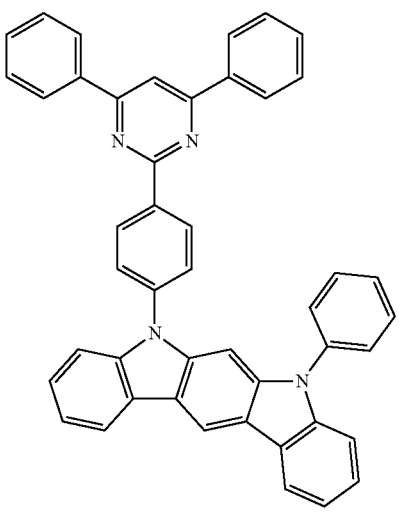

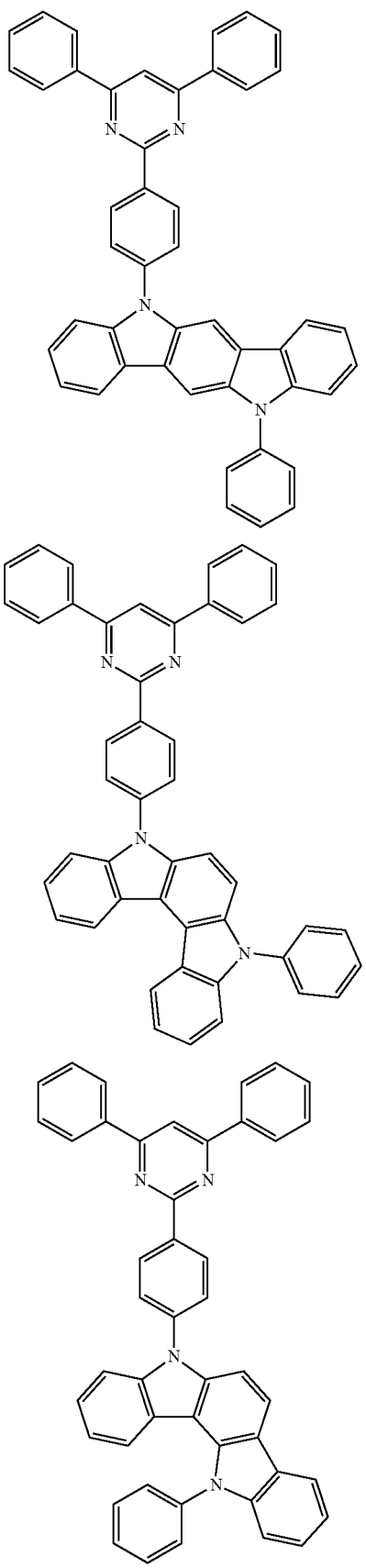
D3-4
D3-5
D3-6
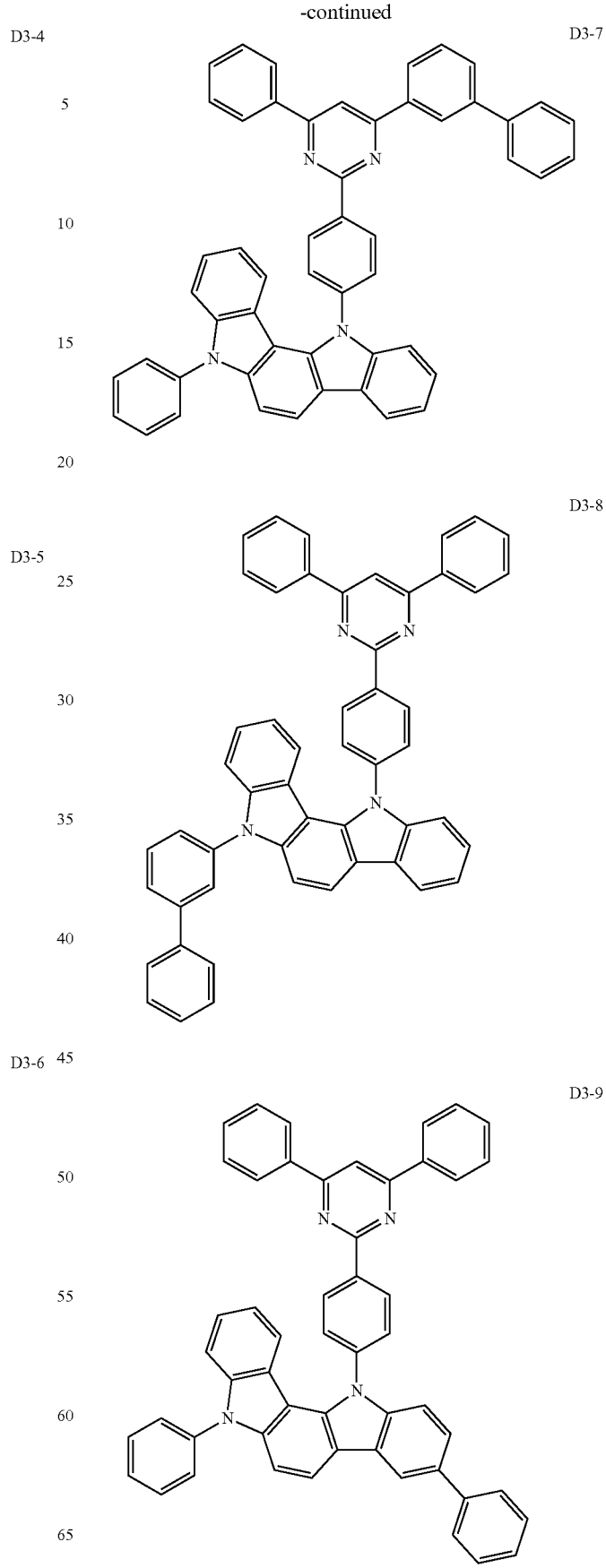
D3-7
D3-8
D3-9

-continued
D3-10
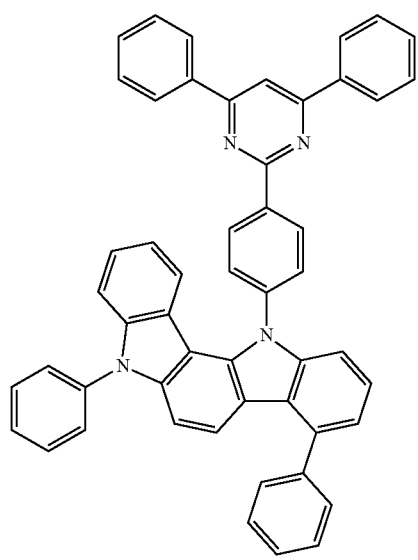
D3-11
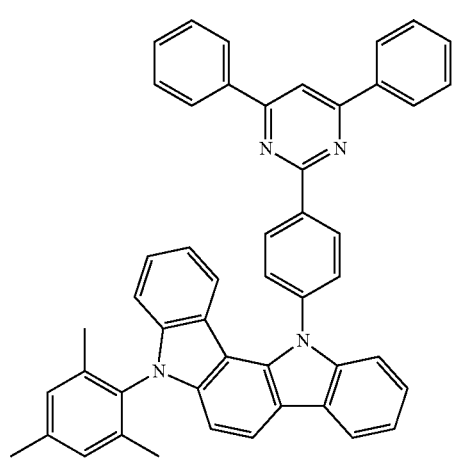
D3-12
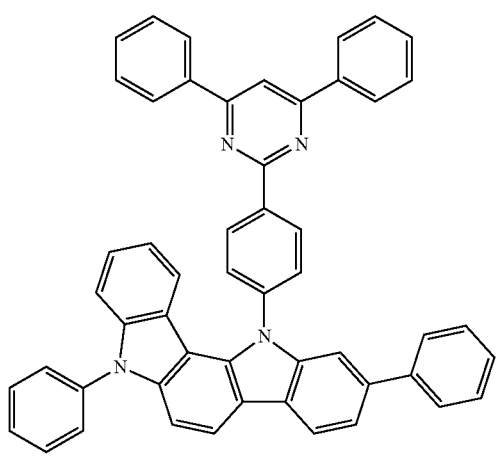
D3-13
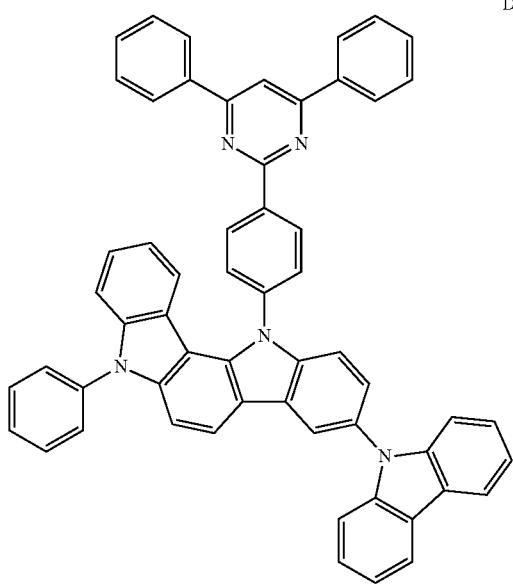
D3-14
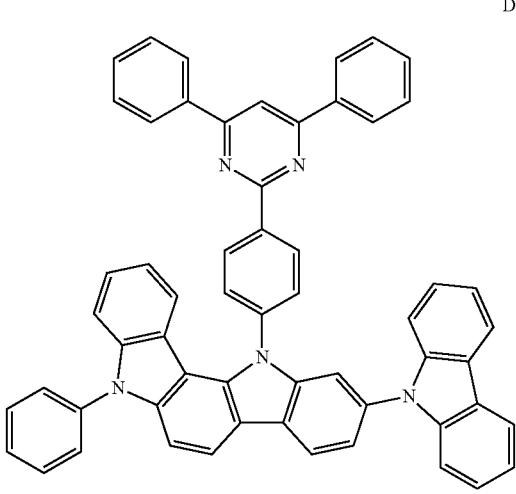
D3-15
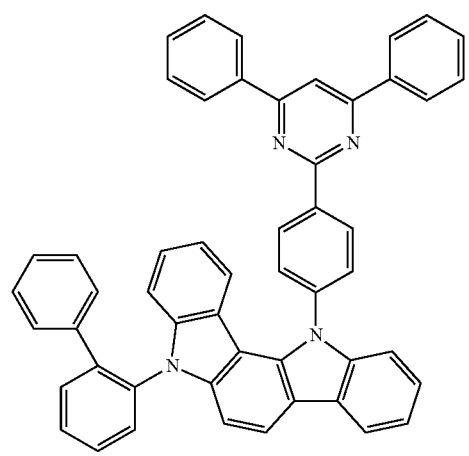

-continued
D3-16
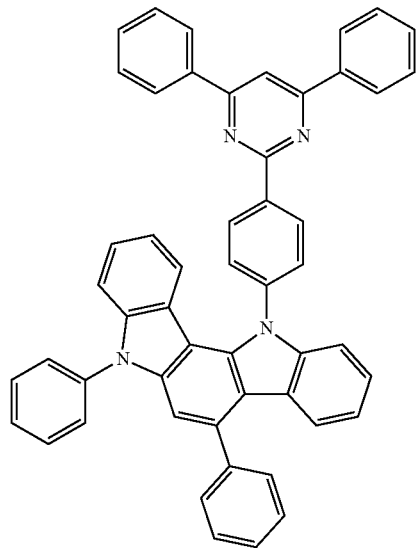
D3-17
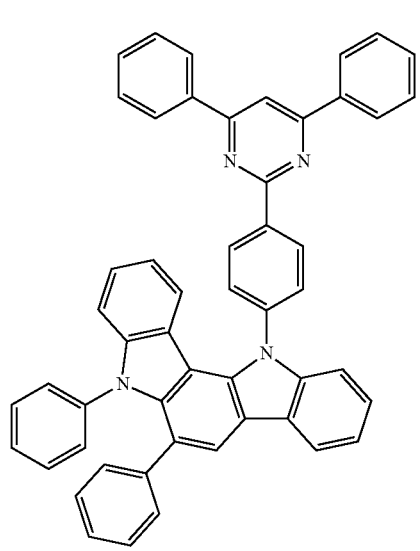
D3-18
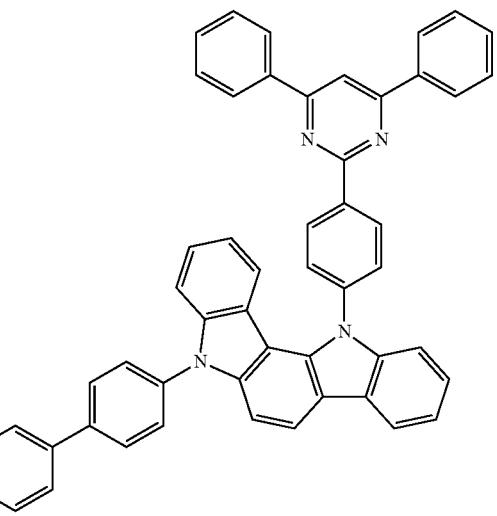
-continued
D3-19
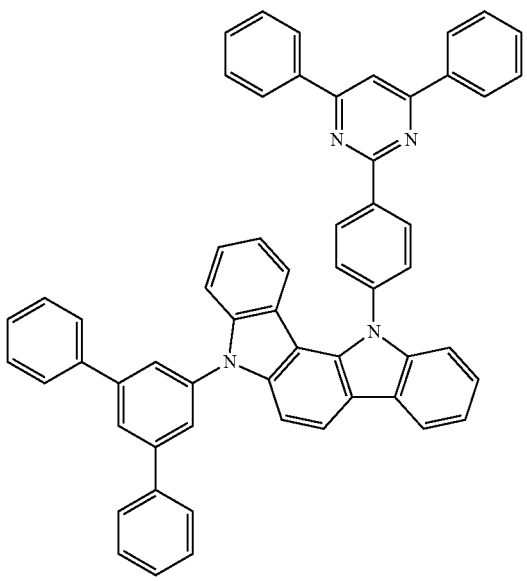
D3-20
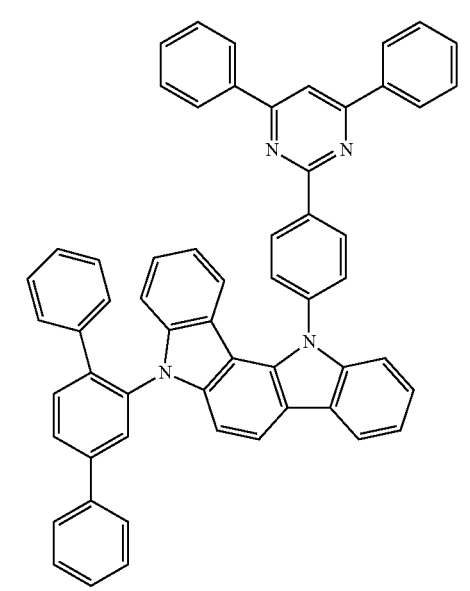
D3-21
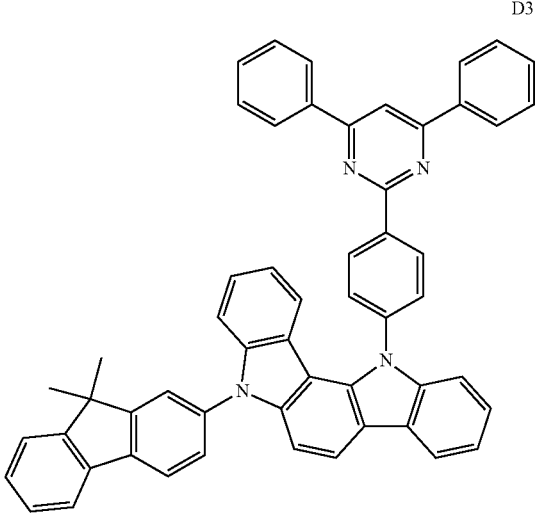

D3-22
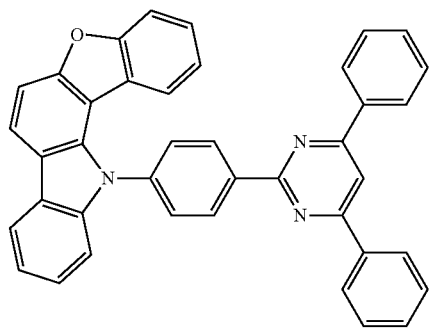
D3-23
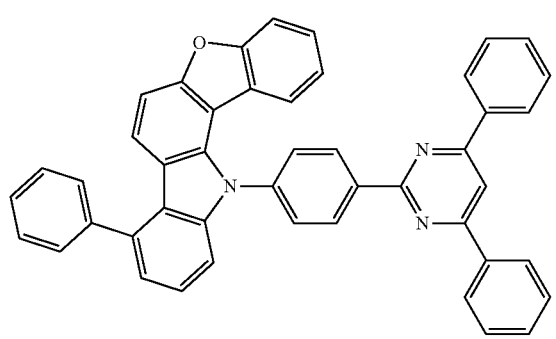
D3-24
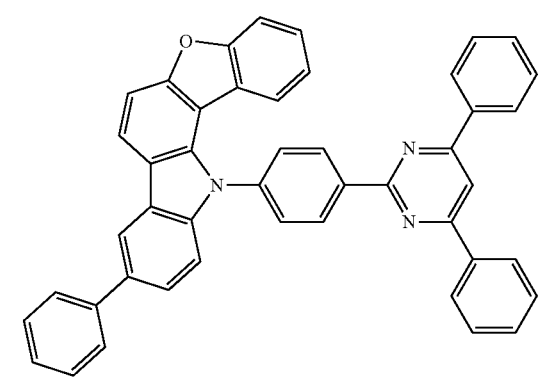
D3-25
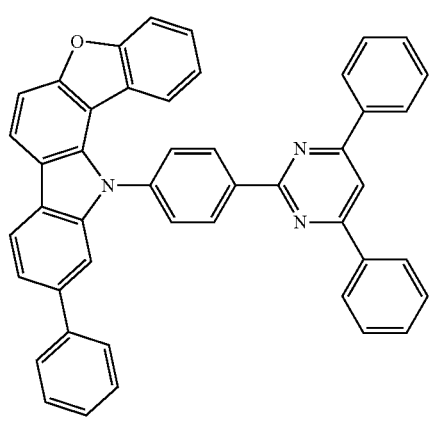
D3-26
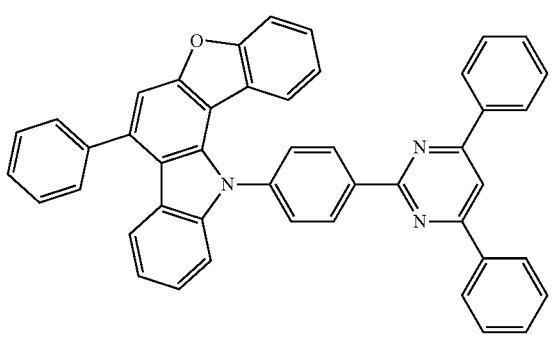
D3-27
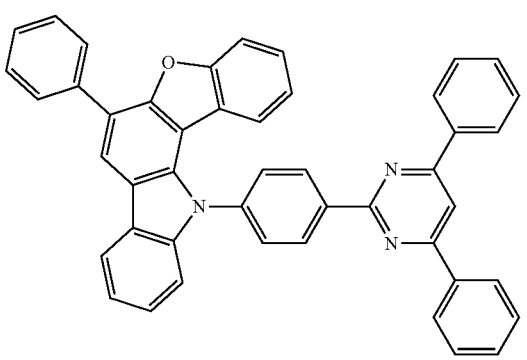
D3-28
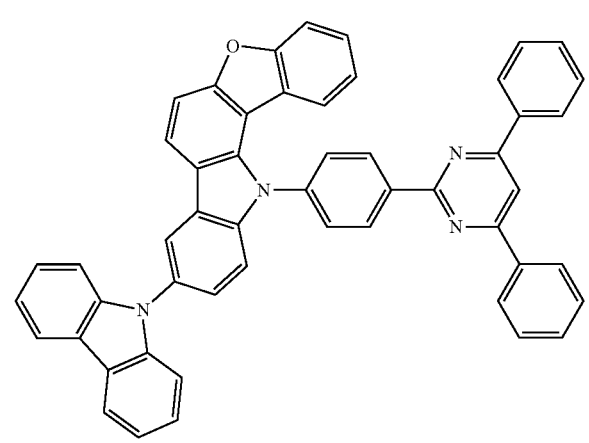
D3-29
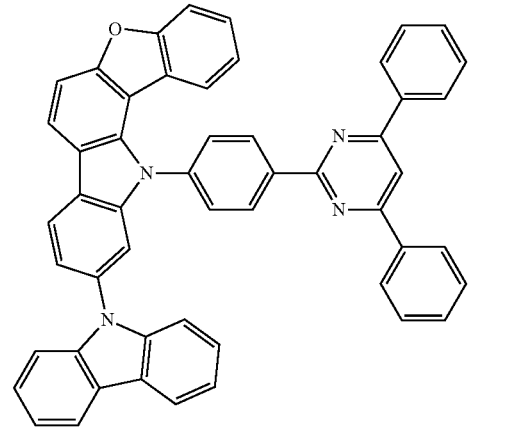

-continued
D3-30
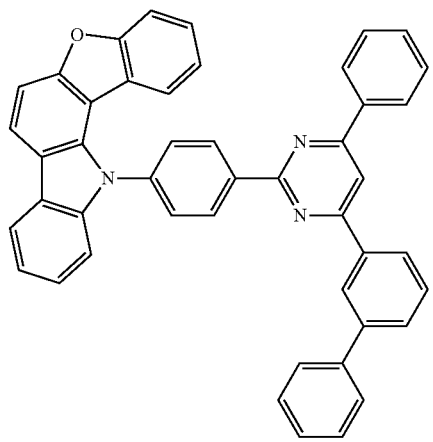
D3-31
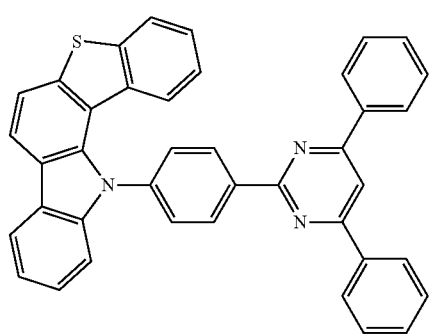
D3-32
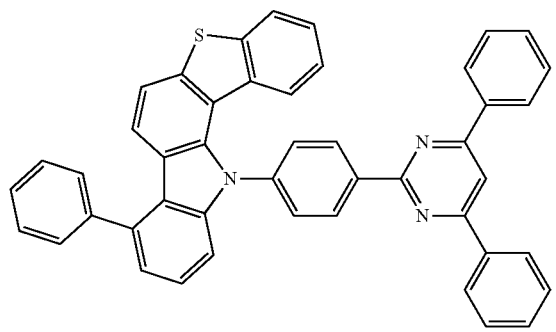
D3-33
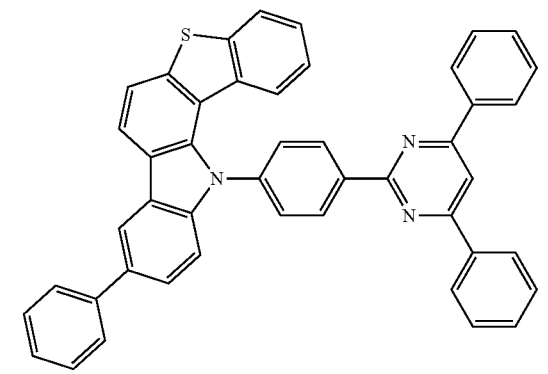
-continued
D3-34
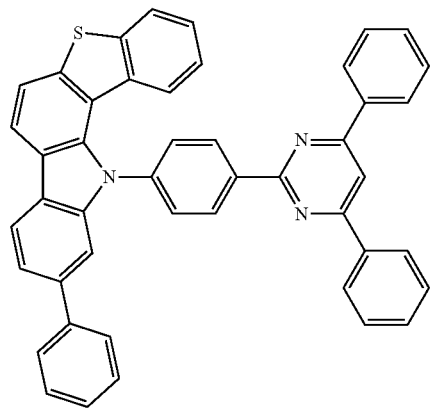
D3-35
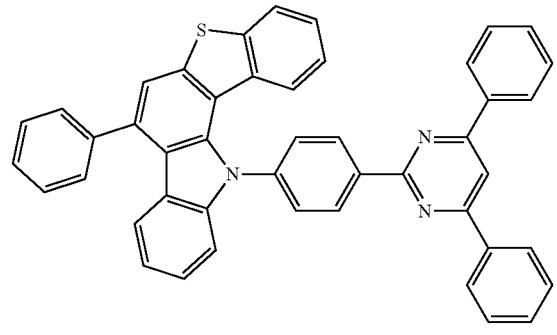
D3-36
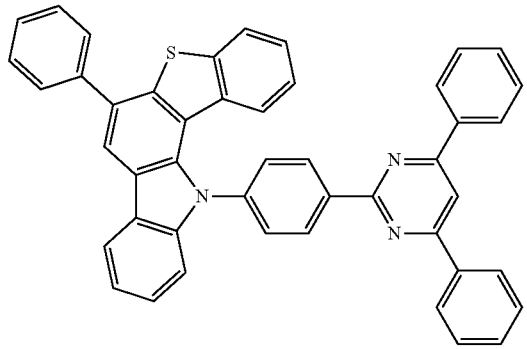
D3-37
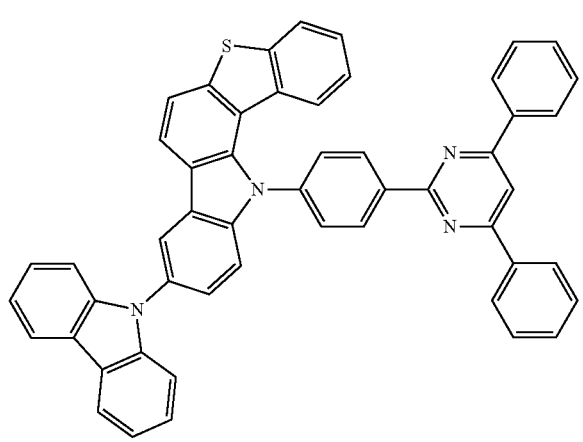

D3-38
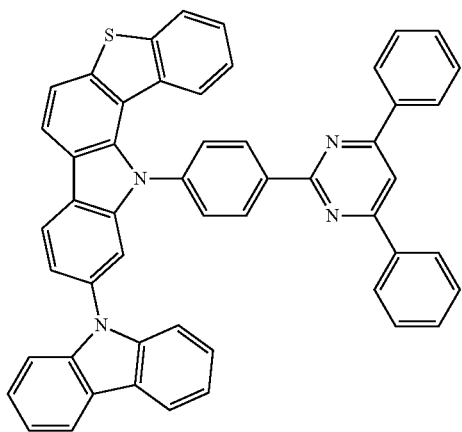
D3-39
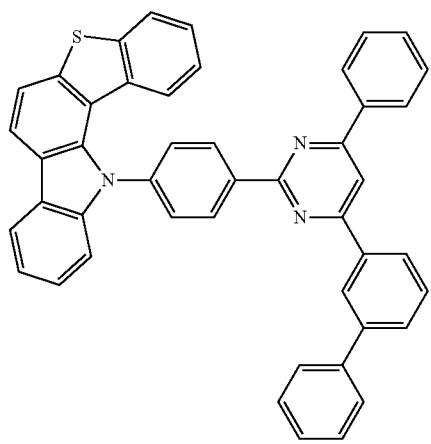
D3-40
D3-41
D3-42
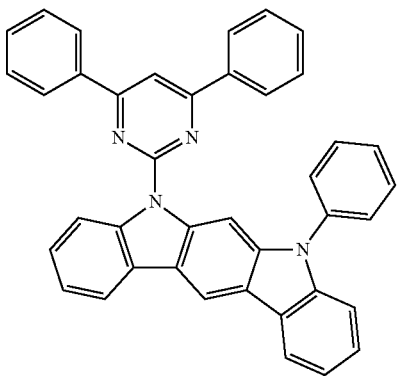
D3-43
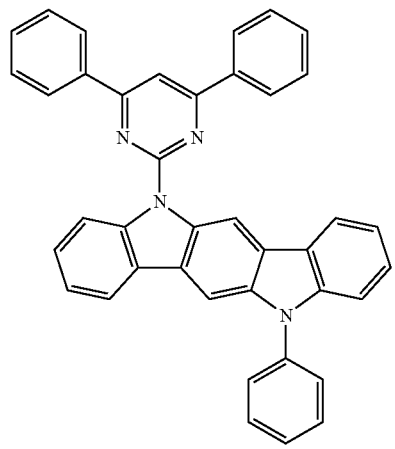
D3-44
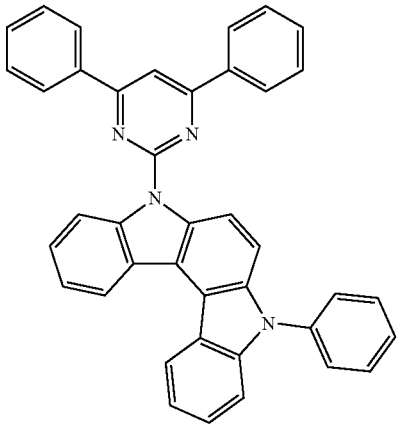
D3-45
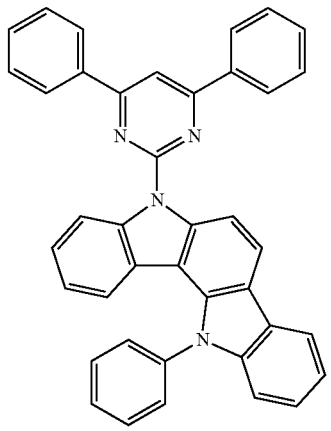

-continued
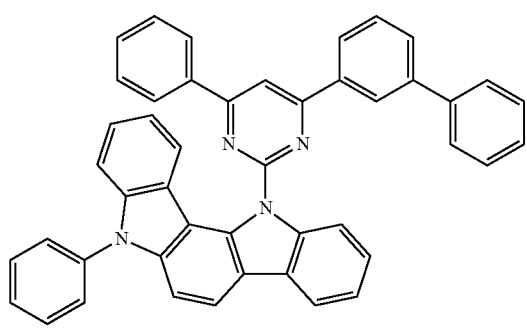
D3-46
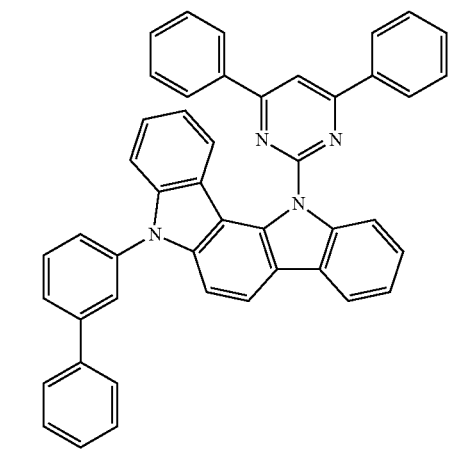
D3-47
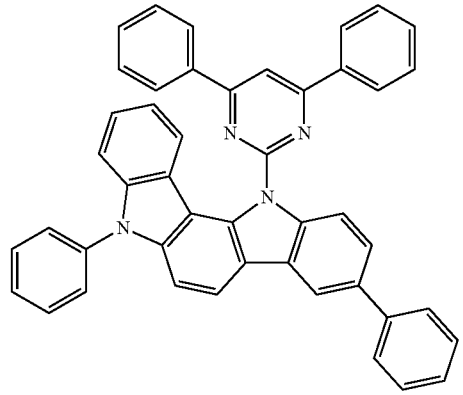
D3-48
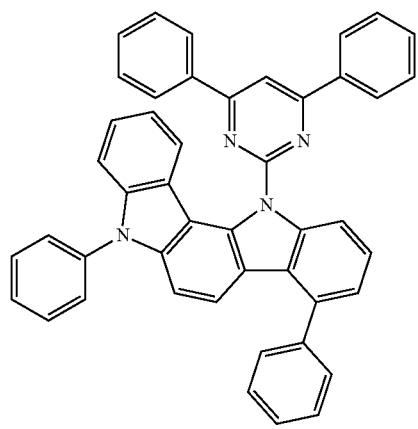
D3-49
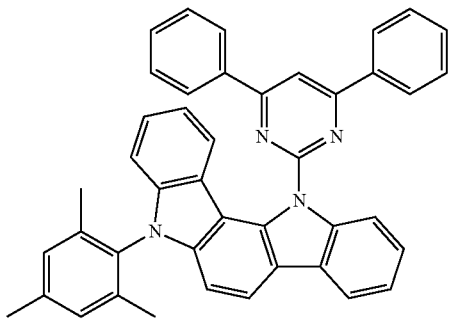
D3-50
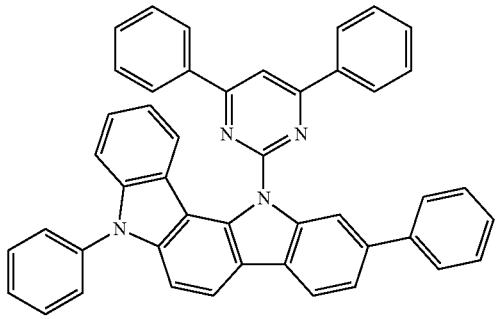
D3-51
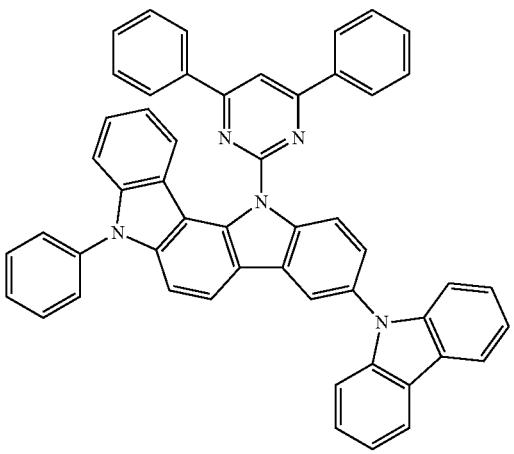
D3-52
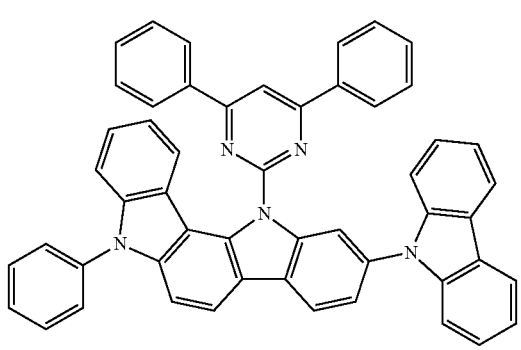
D3-53

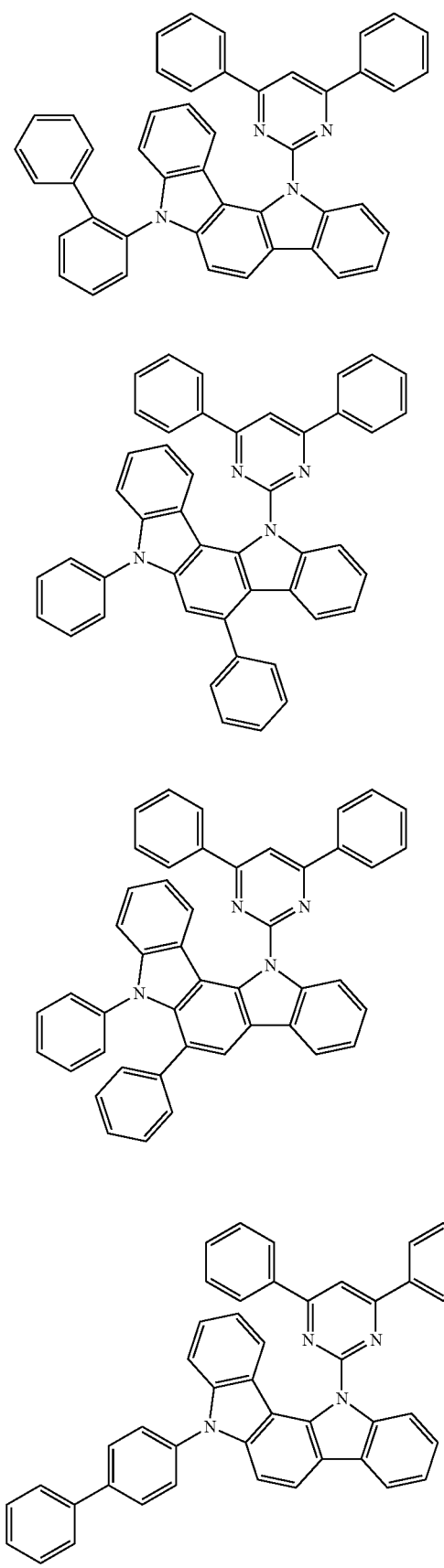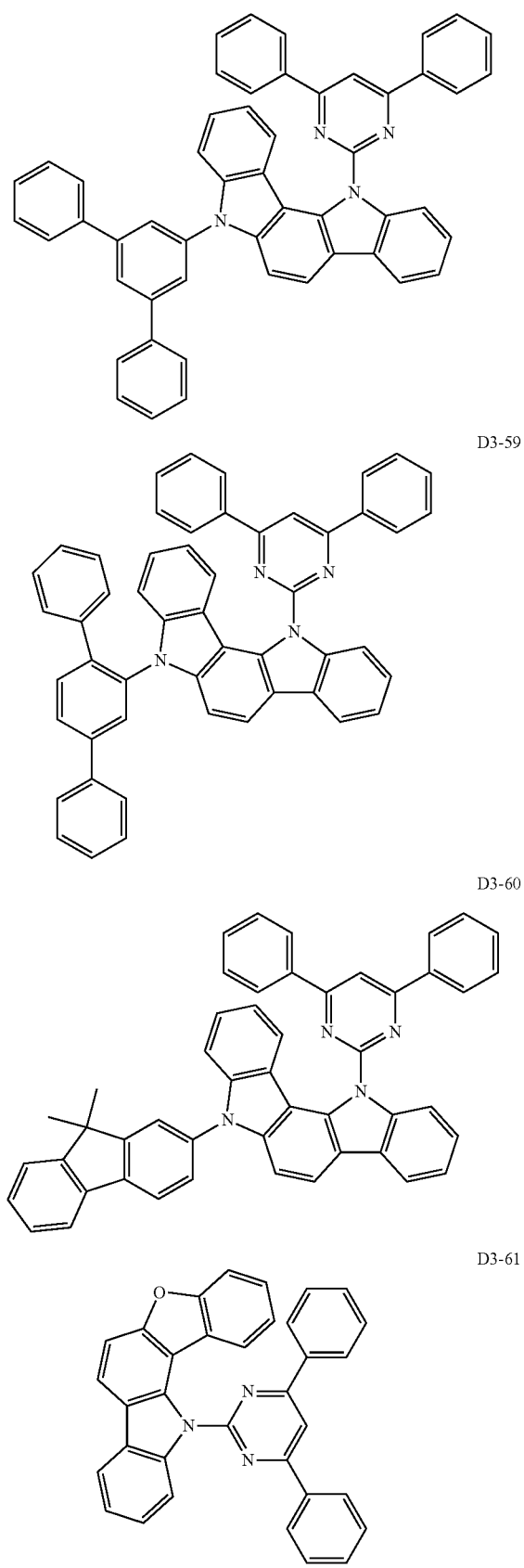

-continued
D3-62
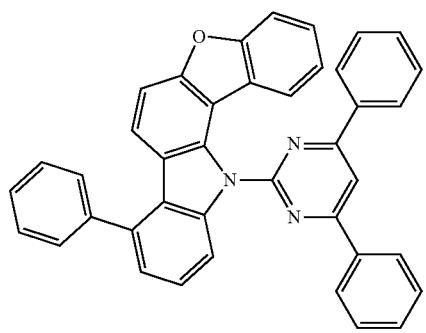
D3-63
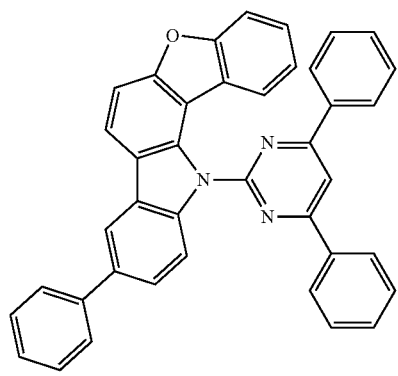
D3-64
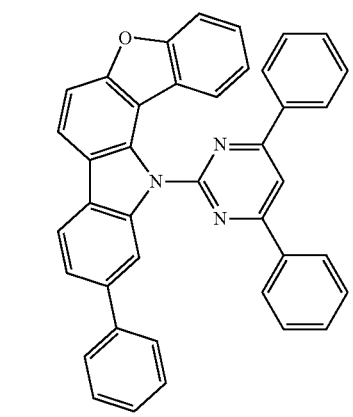
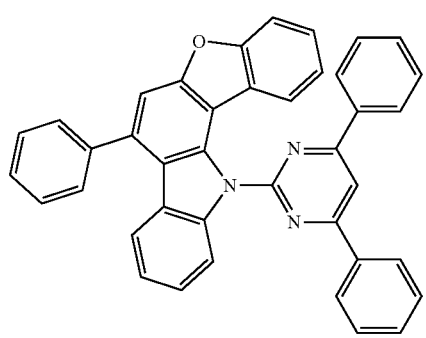
-continued
D3-66
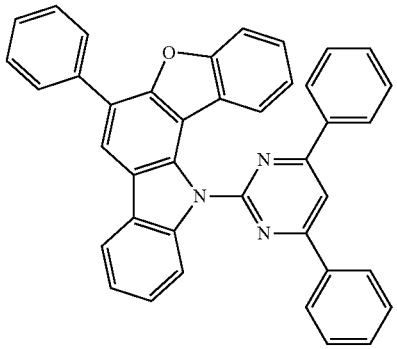
D3-67
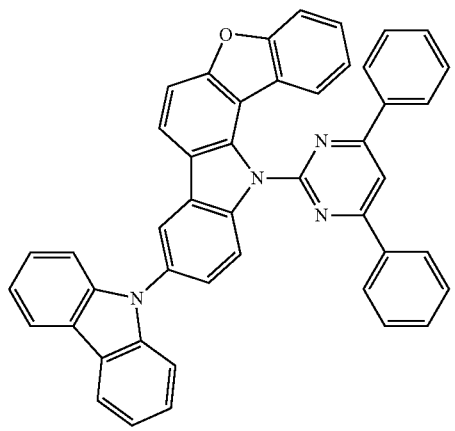
D3-68
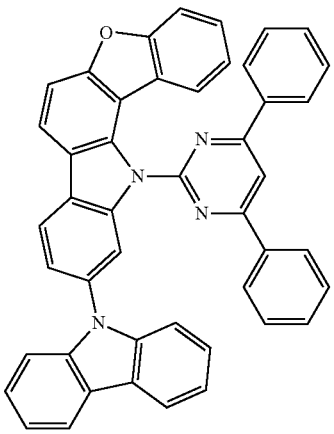
D3-69
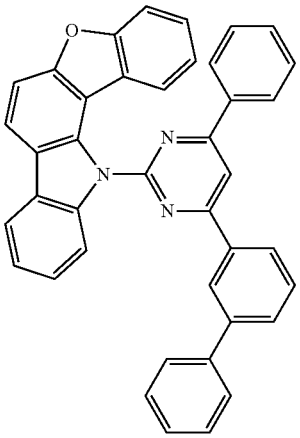

-continued
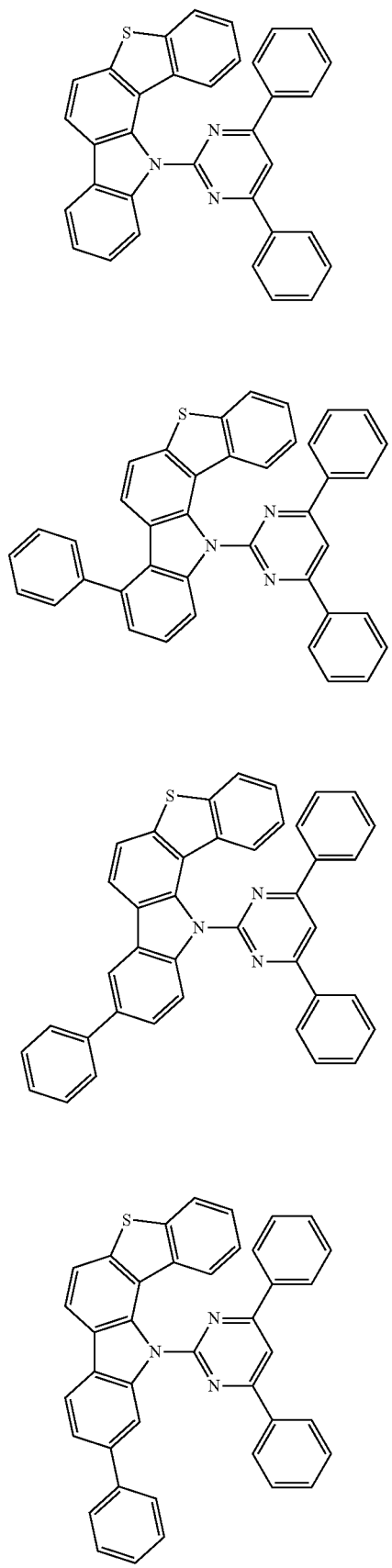
D3-70
D3-71
D3-72
D3-73
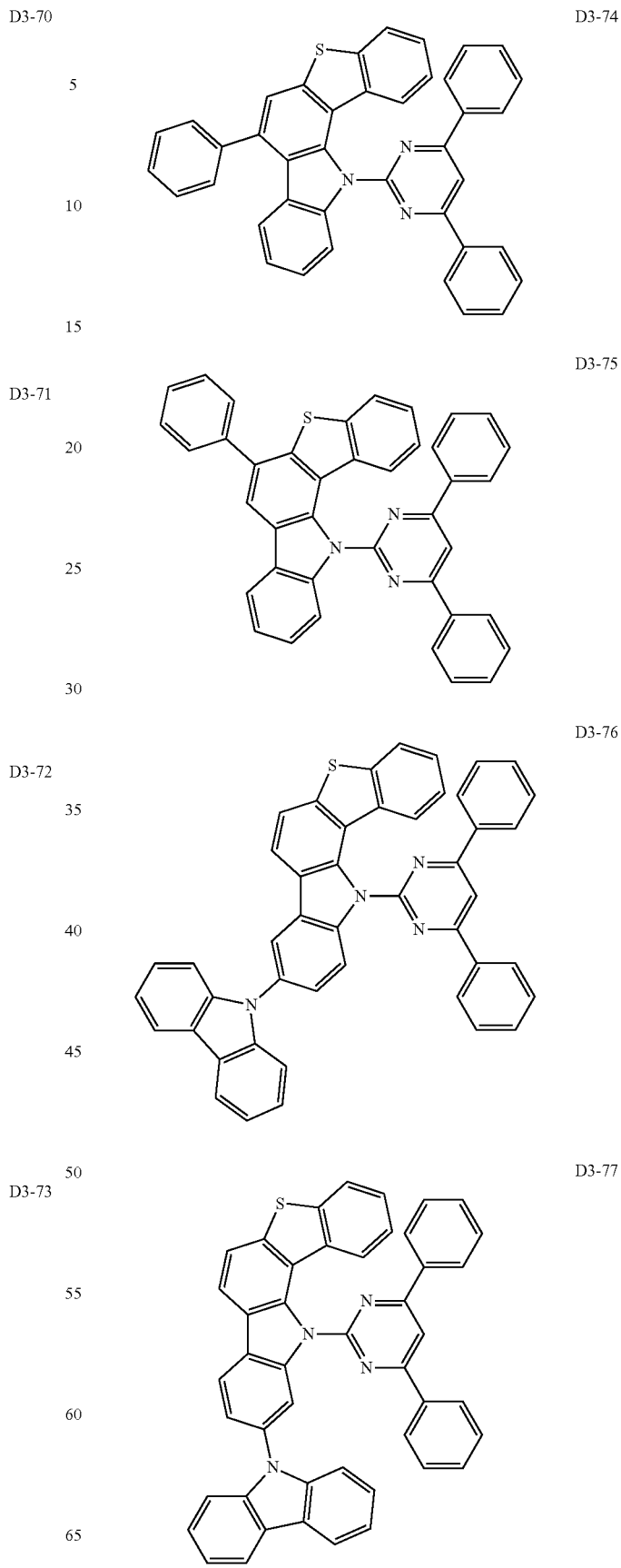
D3-74
D3-75
D3-76
D3-77

D3-78
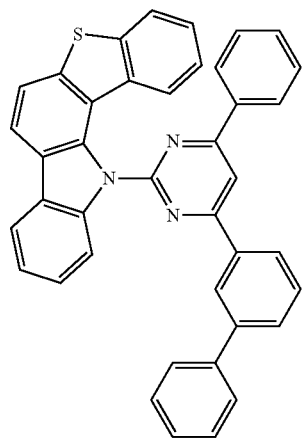
D3-79
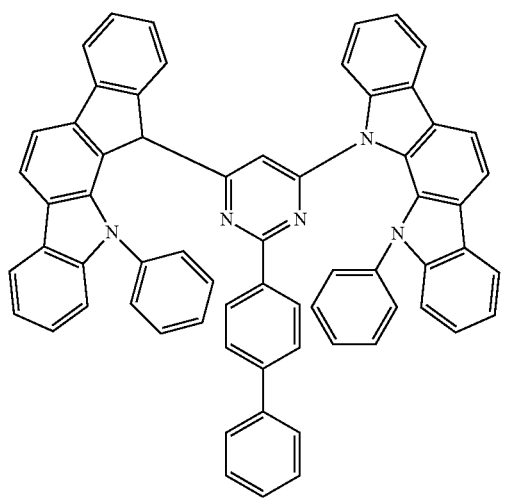
D3-80
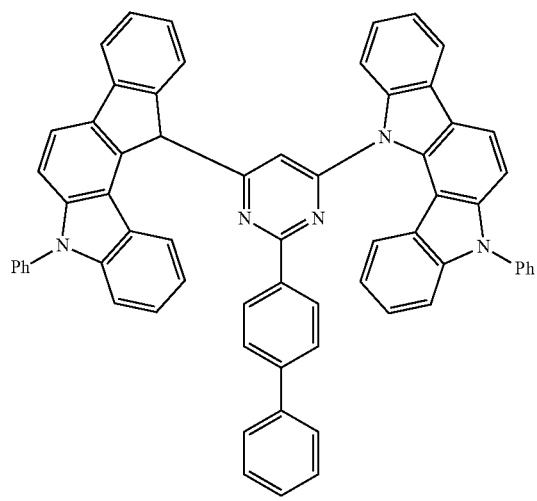
D3-81
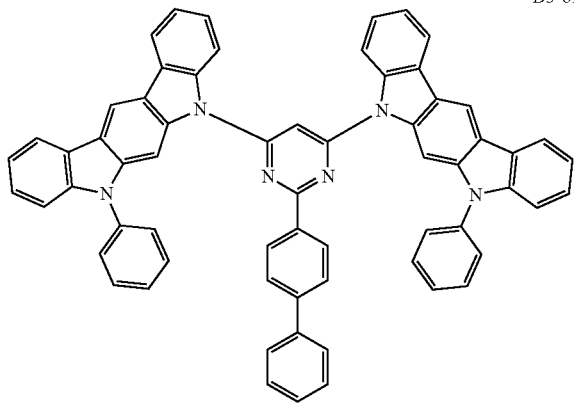
D201
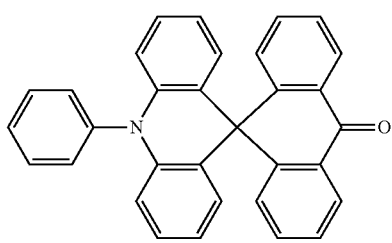
D202
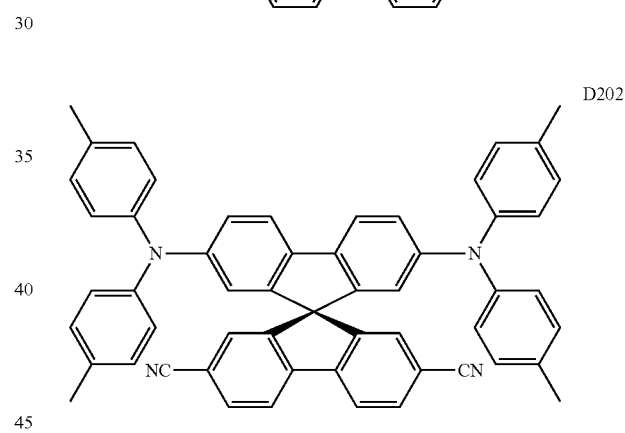
D203
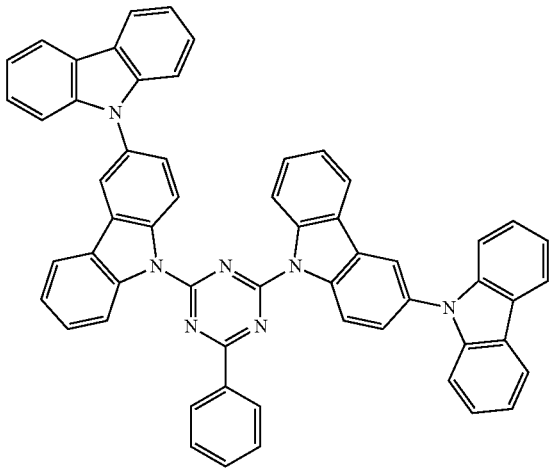

D204
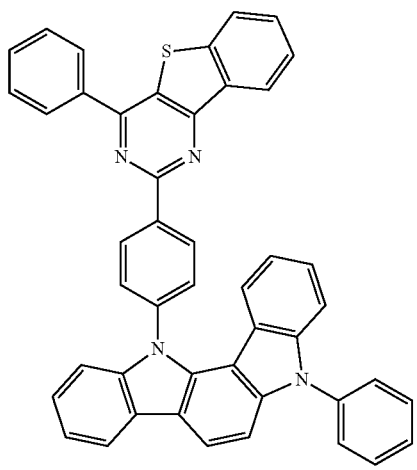
D207
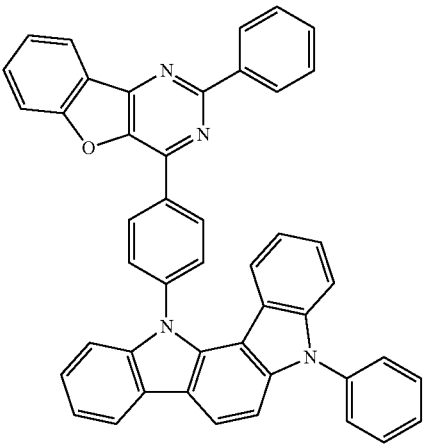
D205 D208
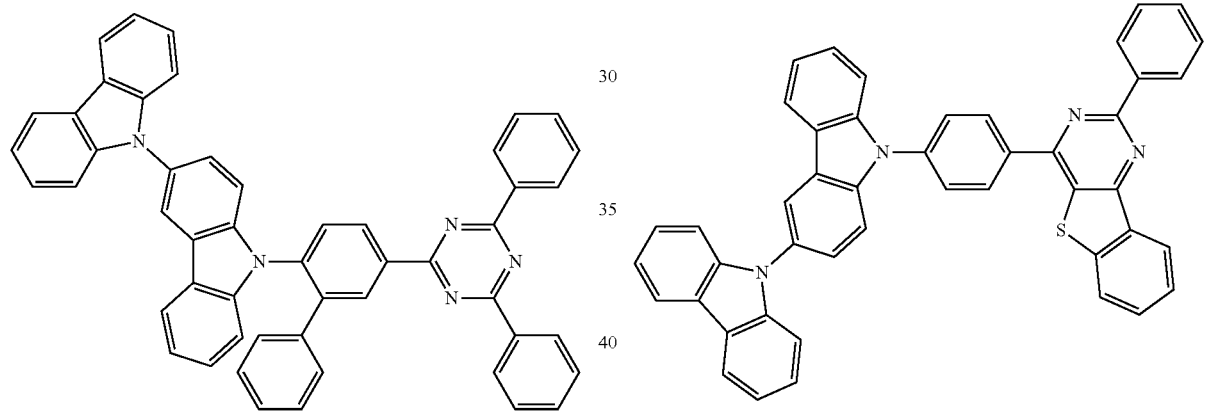
D206
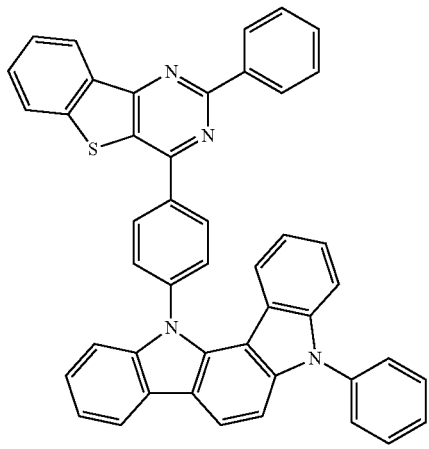
D209

D210

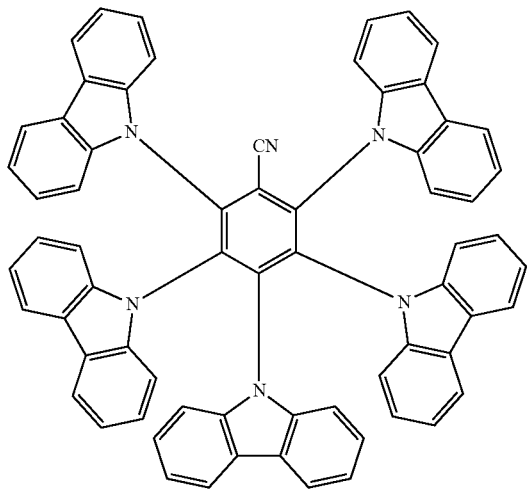

D211

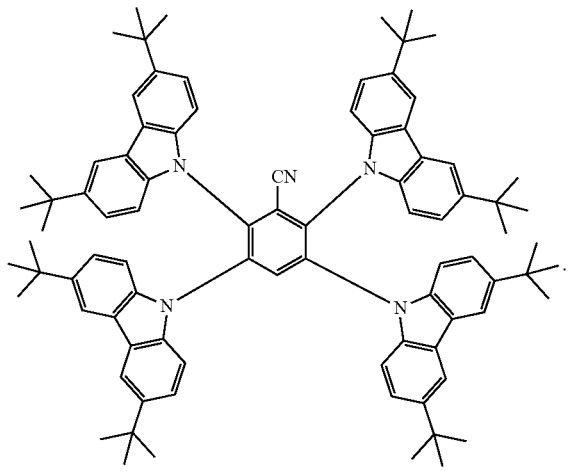

The emission layer including the host and the thermally activated delayed fluorescence emitter as described above does not include a transition metal-containing organometallic compound. That is, the emission layer differs from a phosphorescent emission layer that includes a transition metal-containing organometallic compound and emits phosphorescent light from the transition metal-containing organometallic compound.

The delayed fluorescence component emitted from the thermally activated delayed fluorescence emitter may be about 20% or more, about 26.7% or more, about 90% or more, about 92% or more, about 94% or more, about 96% or more, or about 98% or more based on the total emission component emitted from the emission layer including the host and the thermally activated delayed fluorescence emitter.

The emission layer may variously emit red light, green light, and blue light according to the maximum emission wavelength of the thermally activated delayed fluorescence emitter.

In an embodiment, the light emitted from the thermally activated delayed fluorescence emitter in the emission layer may be blue light, but embodiments of the present disclosure are not limited thereto.

An amount of the thermally activated delayed fluorescence emitter in the emission layer may be in a range of about 0.01 parts by weight to about 30 parts by weight based on 100 parts by weight of the host, but embodiments of the present disclosure are not limited thereto. While not wishing to be bound by theory, it is understood that when the amount of the thermally activated delayed fluorescence emitter is within this range, a high-quality organic light-emitting device having no concentration quenching may be implemented.

In an embodiment, since the emission layer includes the host and the thermally activated delayed fluorescence emitter but does not include the phosphorescent compound (for example, the transition metal-containing organometallic compound), the organic light-emitting device including the emission layer may emit not phosphorescence but delayed fluorescence, and may have high efficiency and a long lifespan simultaneously.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

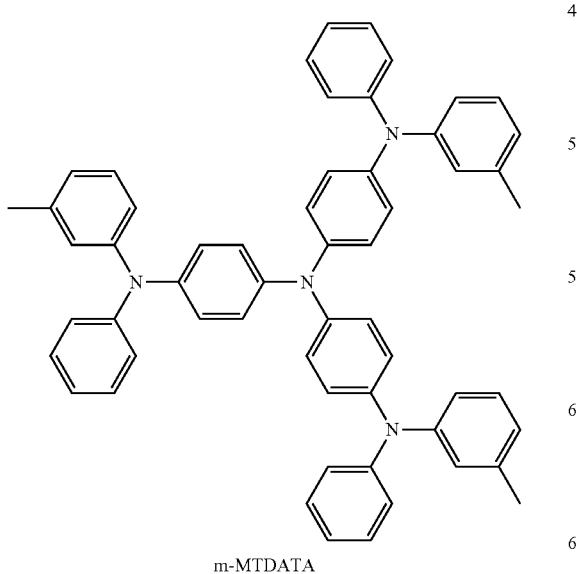

m-MTDATA

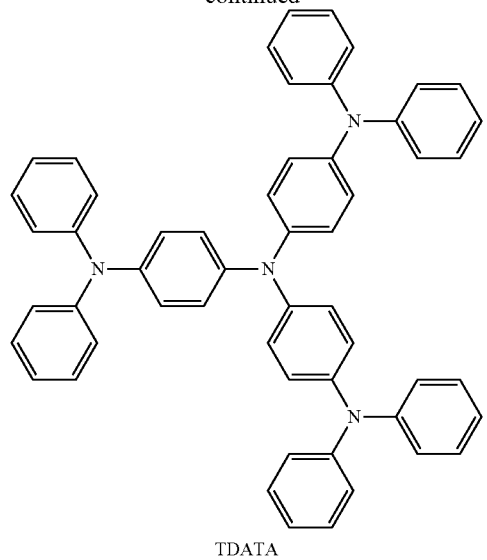

TDATA

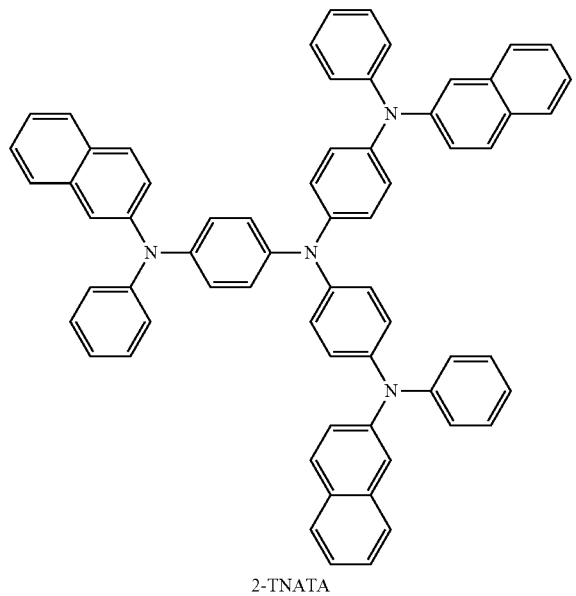

2-TNATA

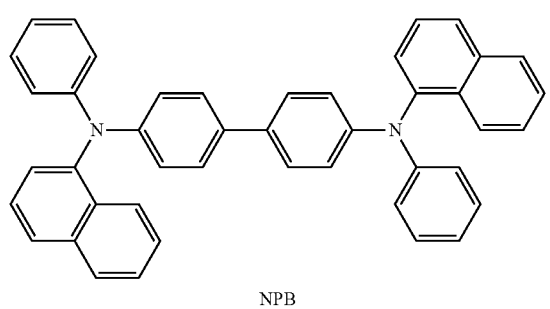

NPB

-continued
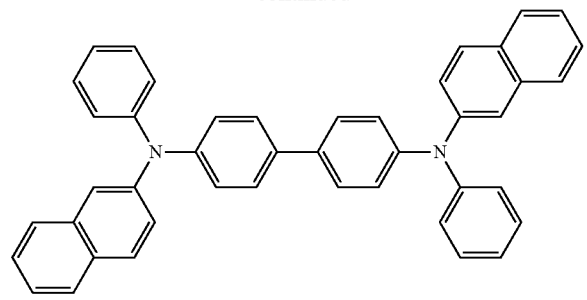
β-NPB
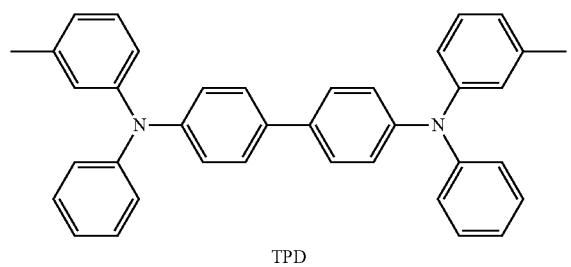
TPD
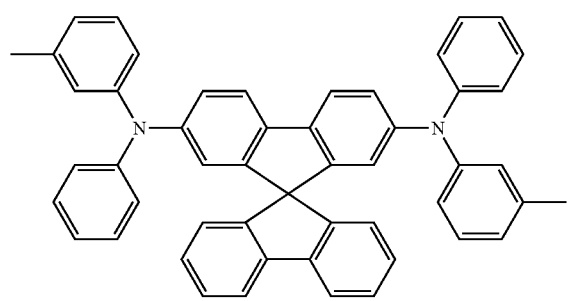
Spiro-TPD
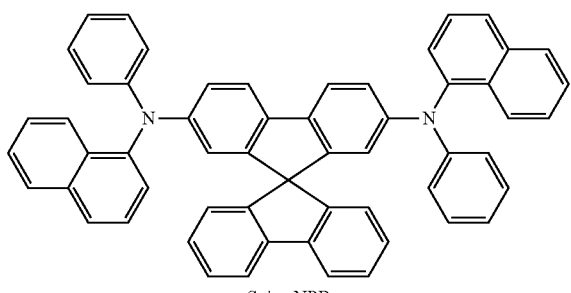
Spiro-NPB
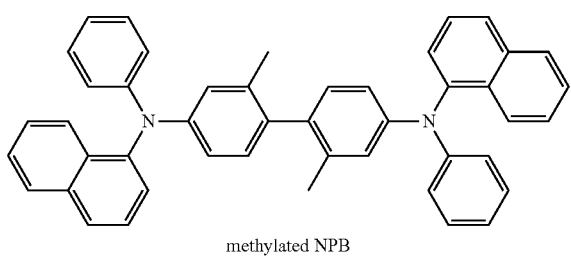
methylated NPB
-continued
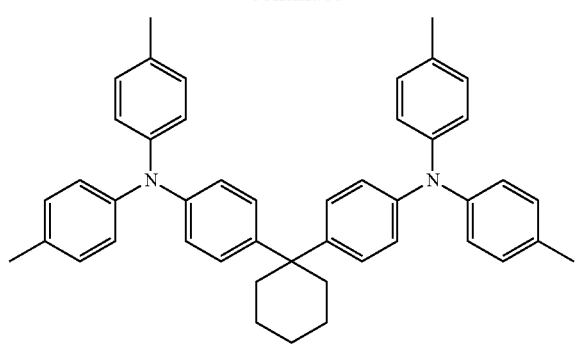
TAPC
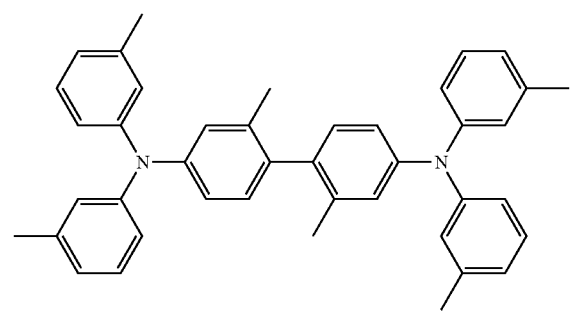
HMTPD
Formula 201
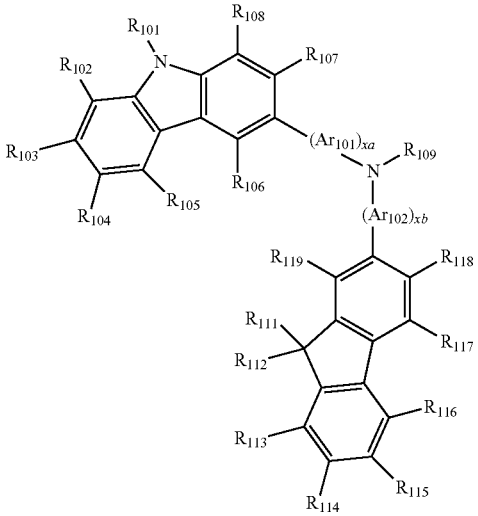
Formula 202
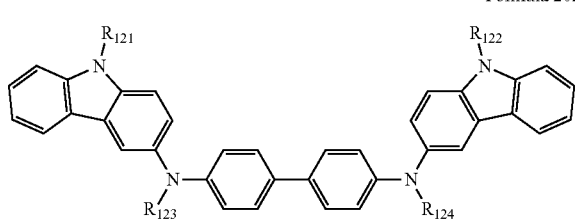

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

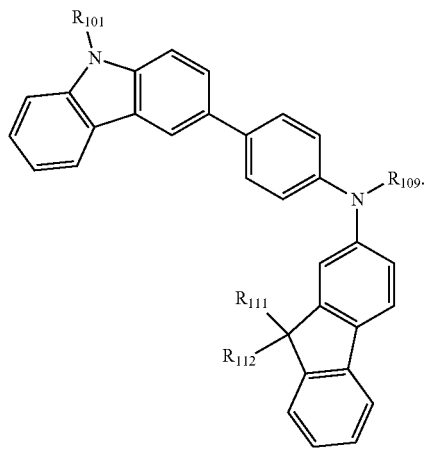

$R_{101}$, $R_{111}$, $R_{112}$, and $R_{109}$ in Formula 201A may each independently have the same definition as described above.

For example, the compound represented by Formula 201, and the compound represented by Formula 202 may include compounds HT1 to HT20 illustrated below, but are not limited thereto.

HT1

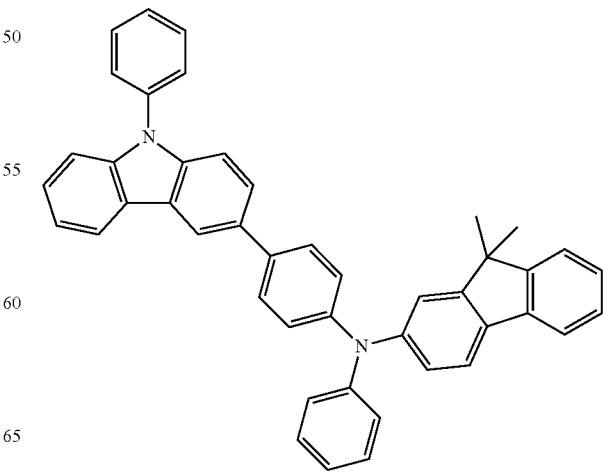

147
-continued
HT2
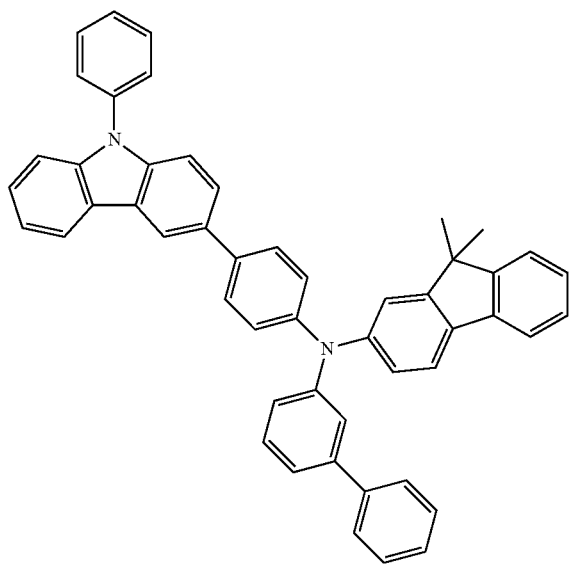
HT3
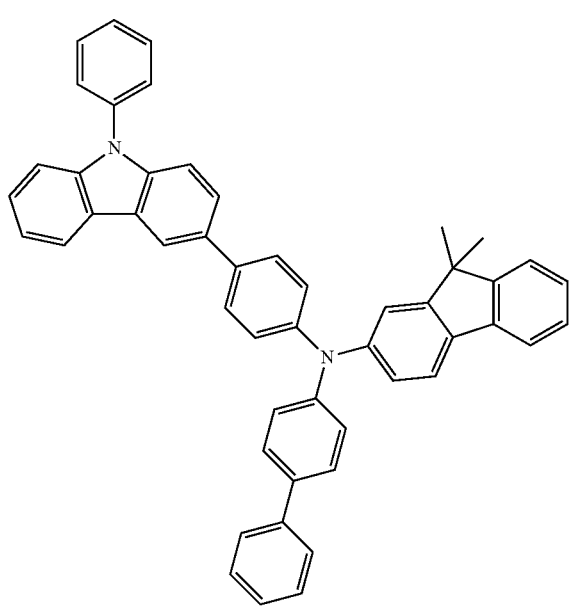
148
-continued
HT4
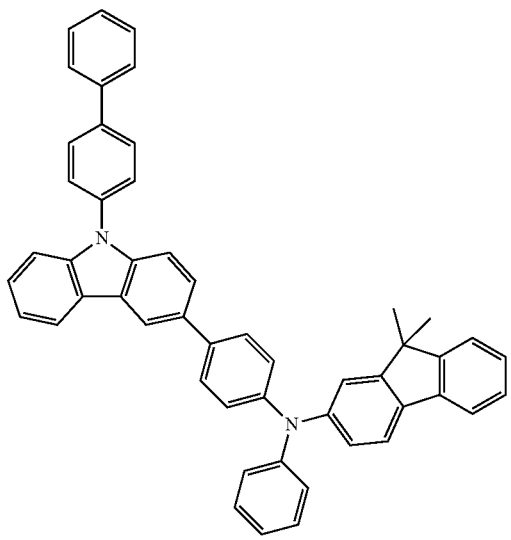
HT5
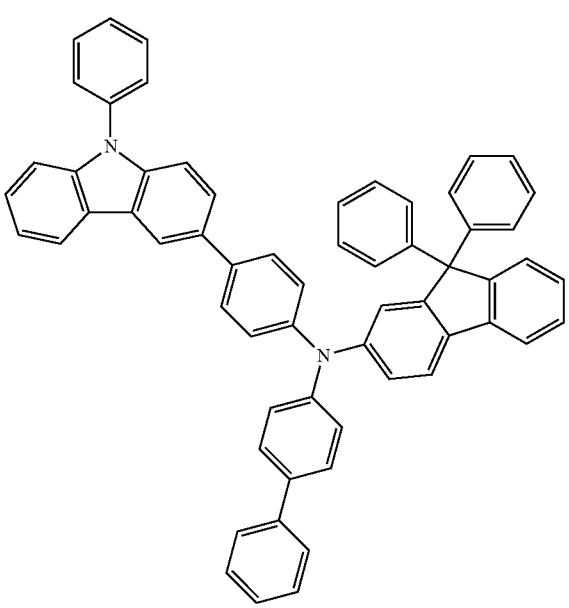

HT6
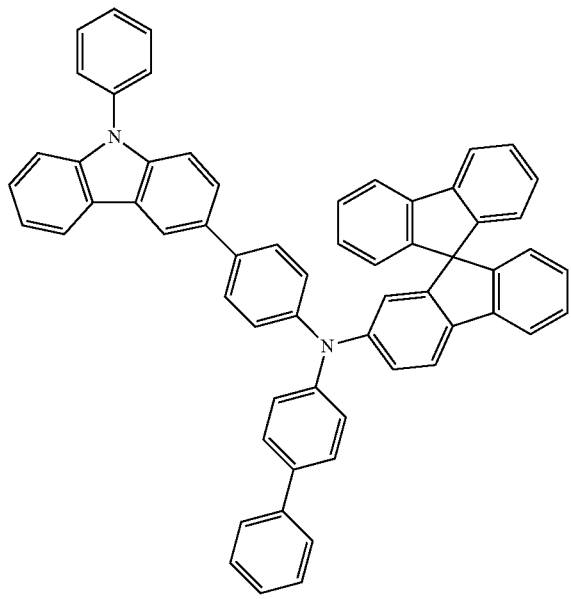
HT7
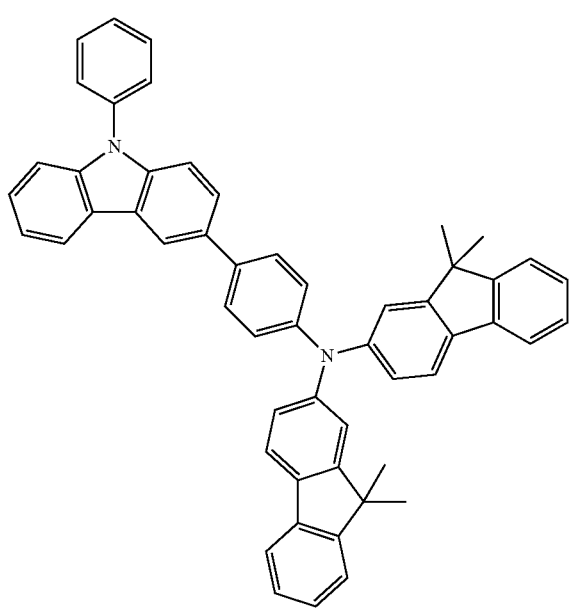
HT8
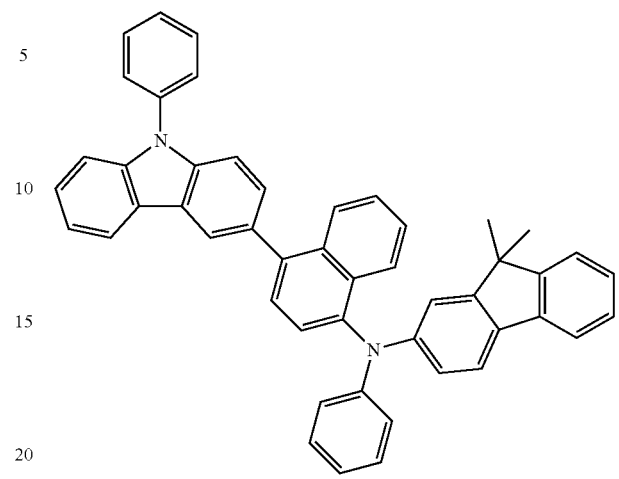
HT9
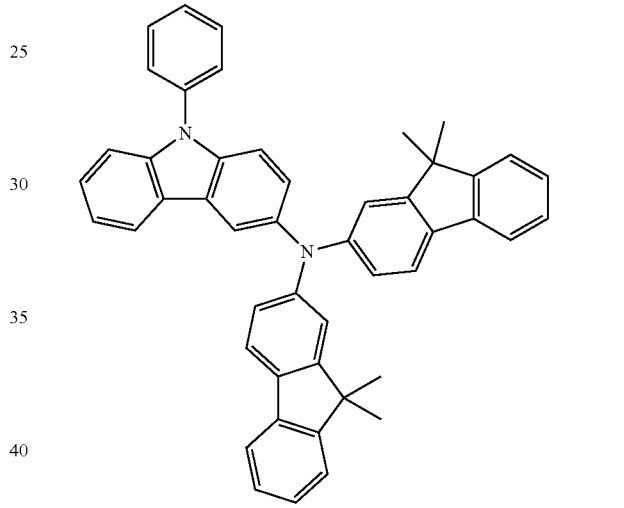
HT10
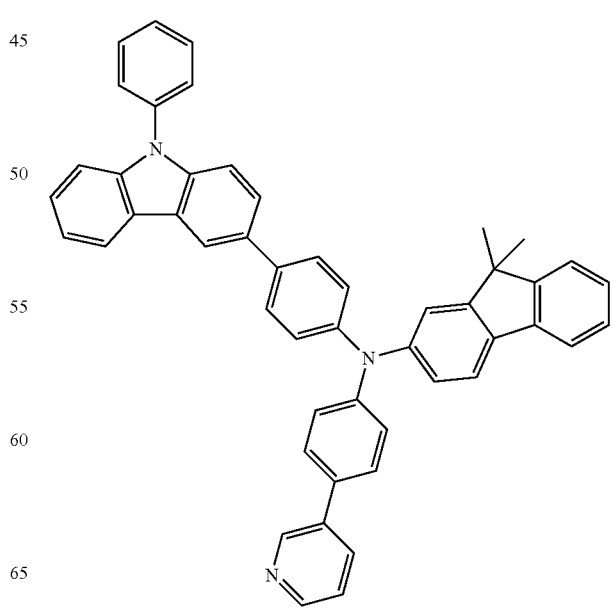

-continued
HT11
HT12
HT13
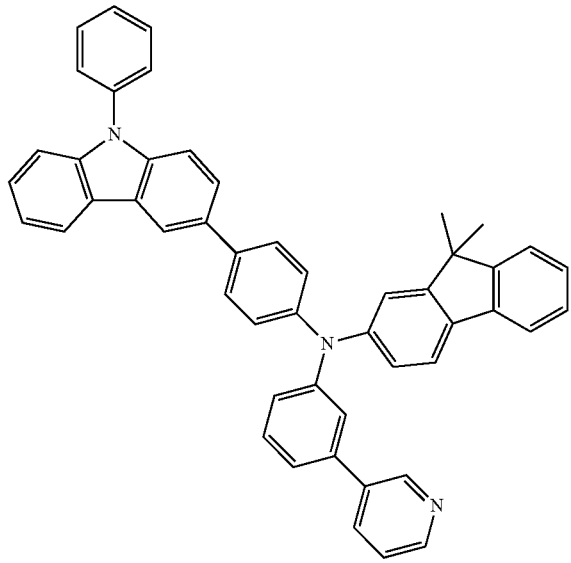
HT14
HT15
HT16
HT17
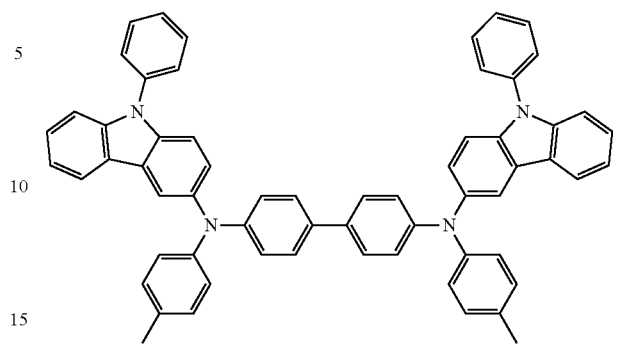
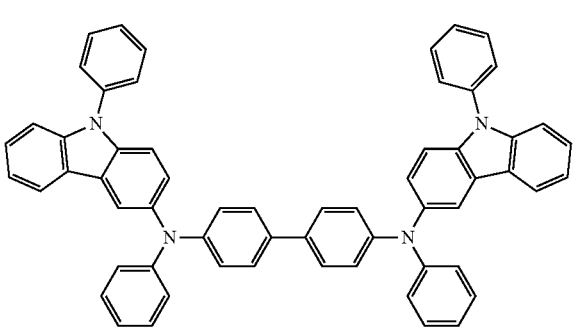

-continued

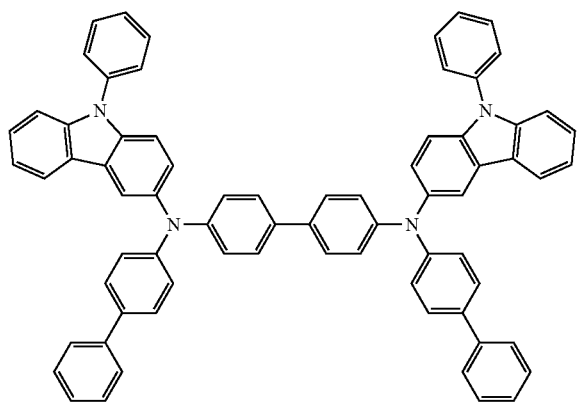
HT18

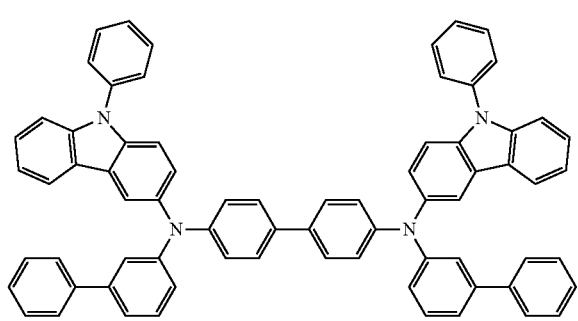
HT19

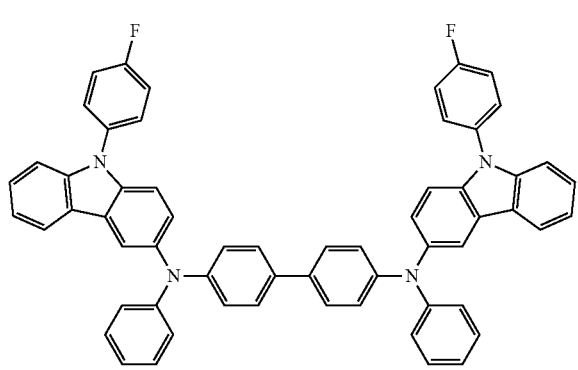
HT20

A thickness of the hole transport region may be in a range of about 100 Angstroms (Å) to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or Compound HT-D2 below, but are not limited thereto.

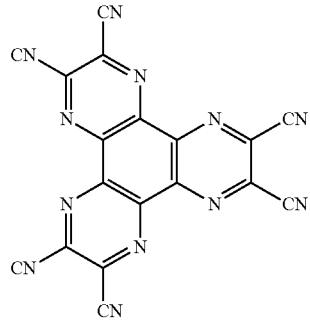
HT-D1

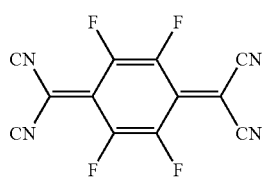
F4-TCNQ

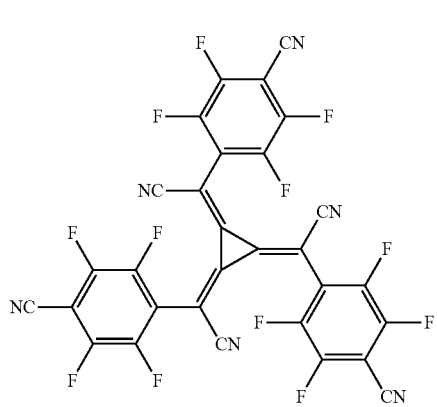
HT-D2

The hole transport region may include a buffer layer.

Also, the buffer layer may compensate for an optical resonance distance according to a wavelength of light emitted from the emission layer, and thus, efficiency of a formed organic light-emitting device may be improved.

The hole transport region may further include an electron blocking layer. The electron blocking layer may include, for example, mCP, but a material therefor is not limited thereto.

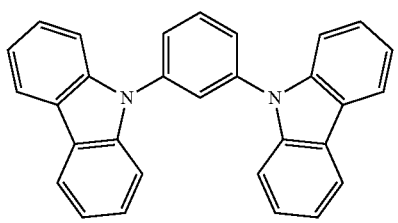

mCP

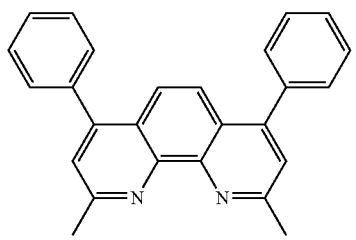

BCP

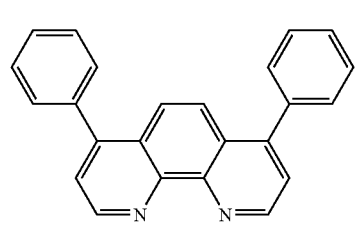

Bphen

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

The emission layer may include a host and a thermally activated delayed fluorescence emitter, and the host and the thermally activated delayed fluorescence emitter may be the same as described above.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and BPhen, but may also include other materials.

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, BPhen, Alq$_3$, BAlq, TAZ, and NTAZ.

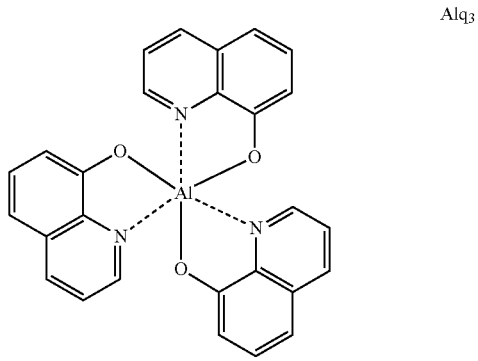

Alq$_3$

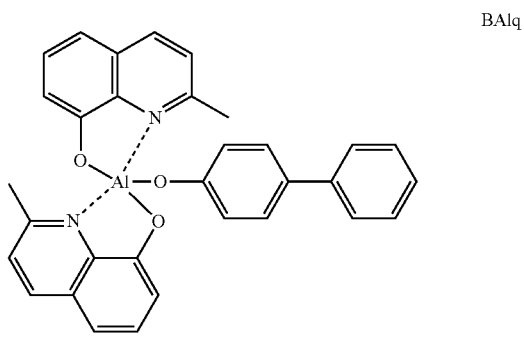

BAlq

TAZ
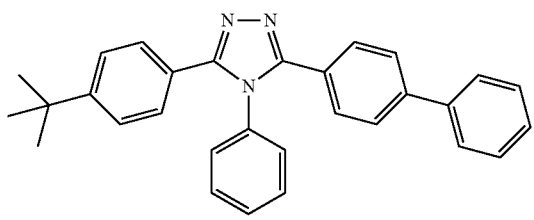
NTAZ
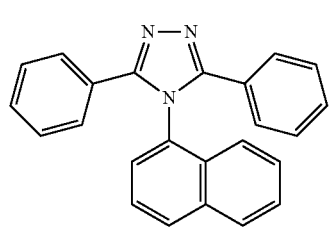
In one or more embodiments, the electron transport layer may include at least one of ET1 to ET25, but are not limited thereto:
ET1
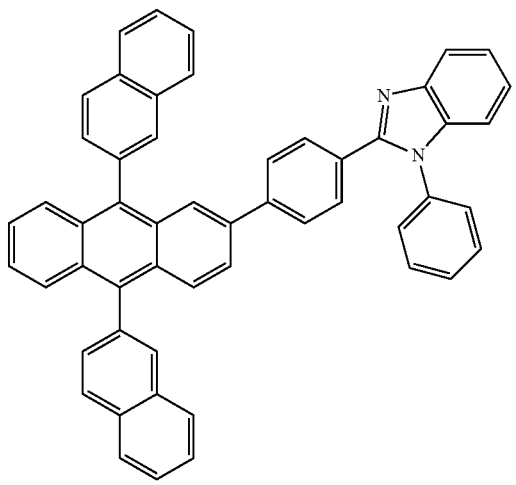
ET2
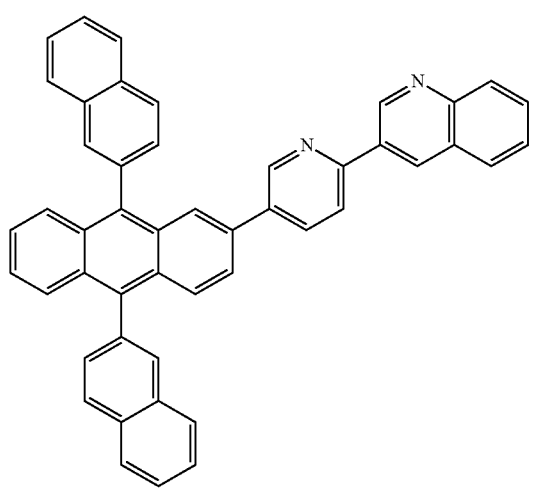
ET3
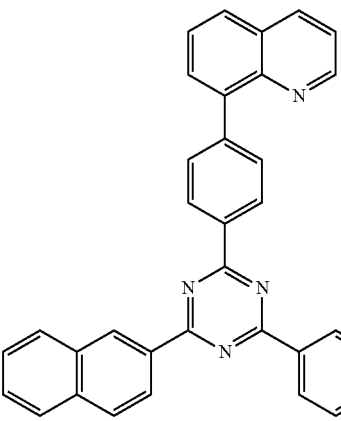
ET4
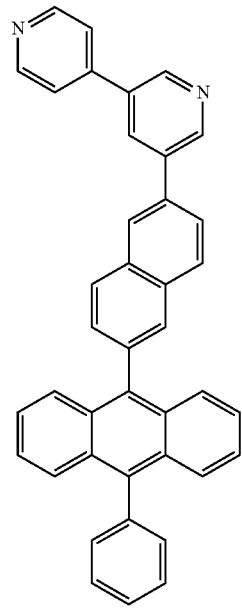
ET5
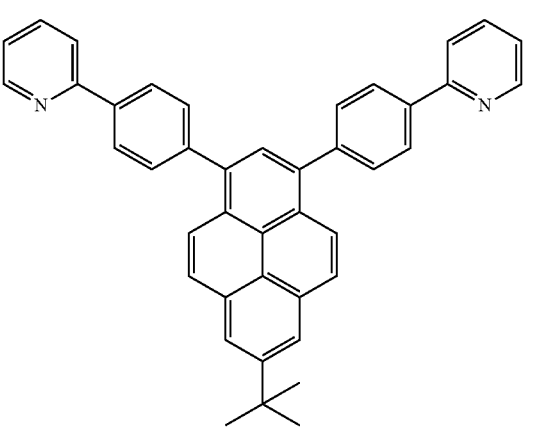

-continued
ET6
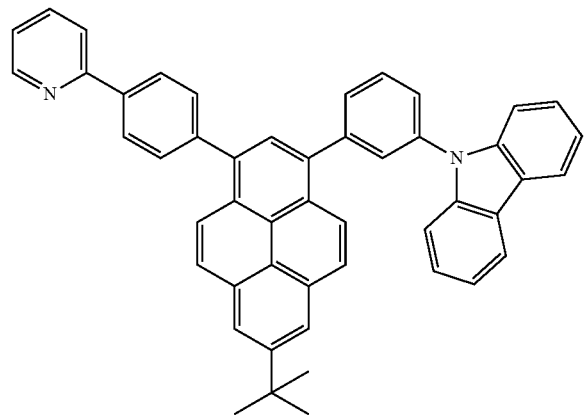
ET7
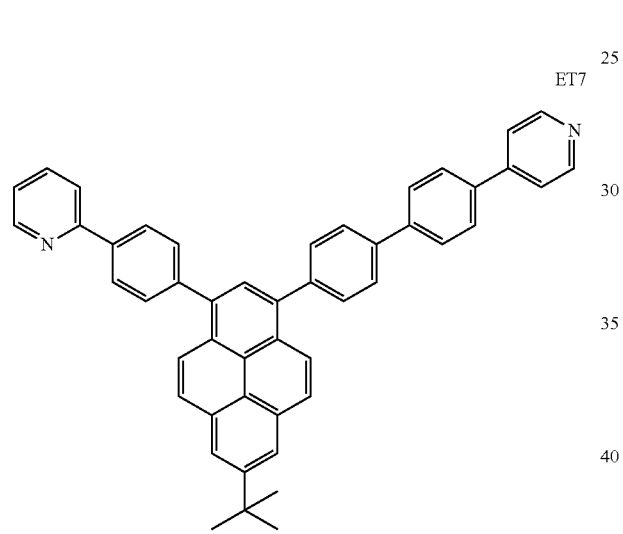
ET8
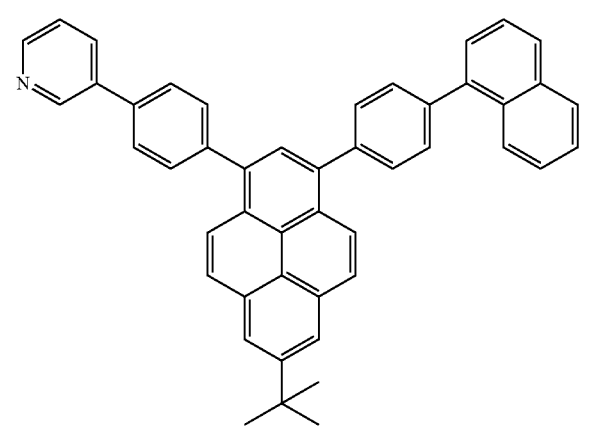
-continued
ET9
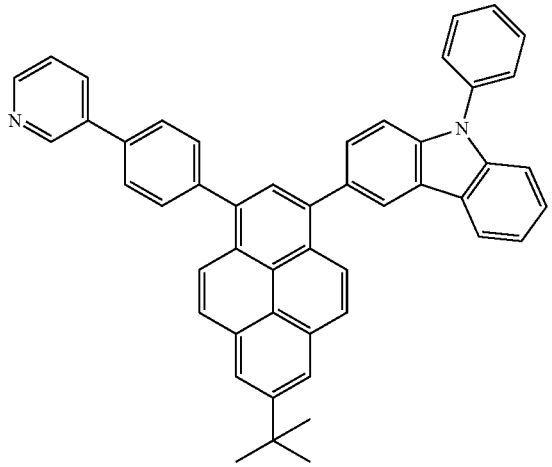
ET10
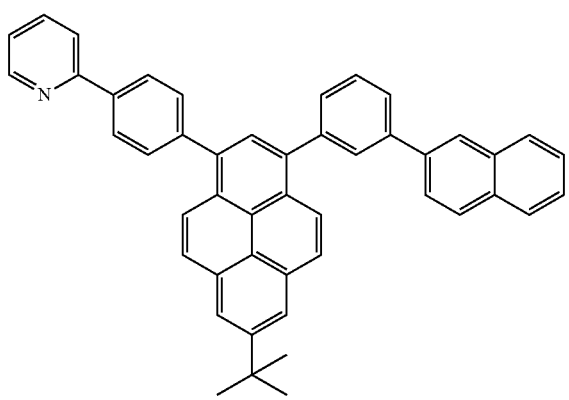
ET11
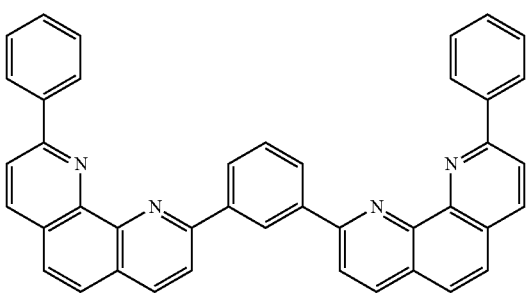
ET12
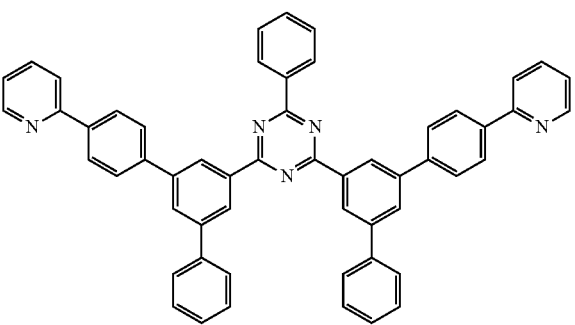

ET13
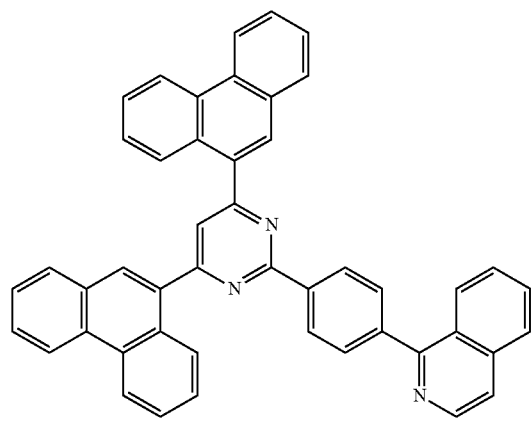
ET14
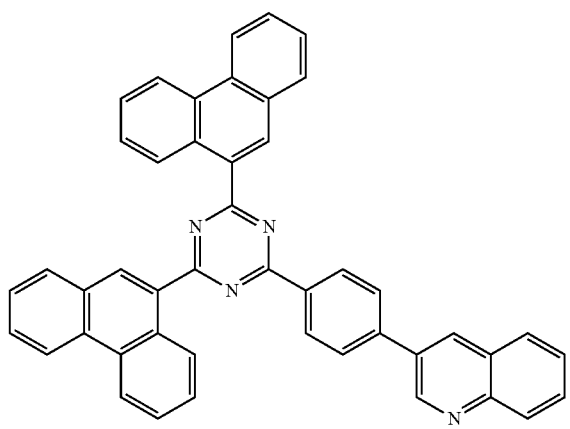
ET15
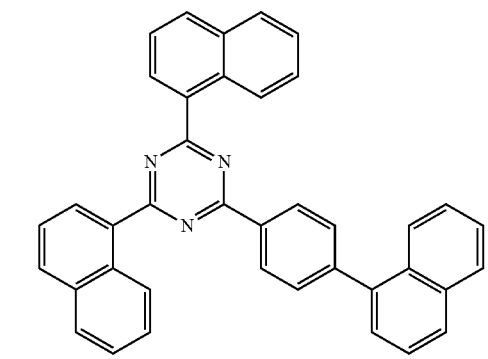
ET16
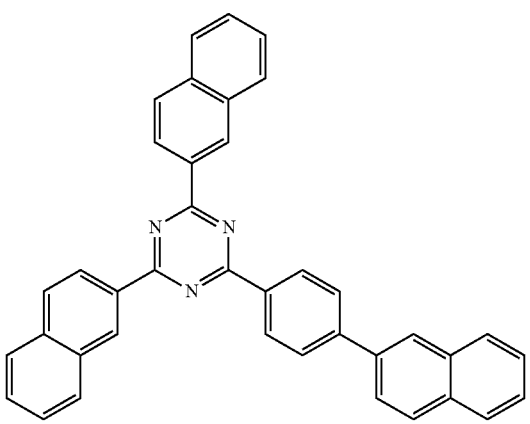
ET17
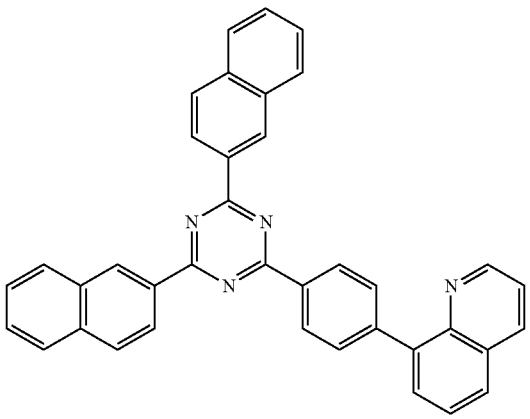
ET18
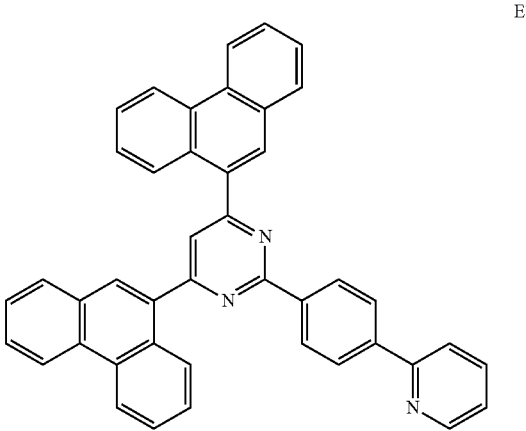

-continued
ET19
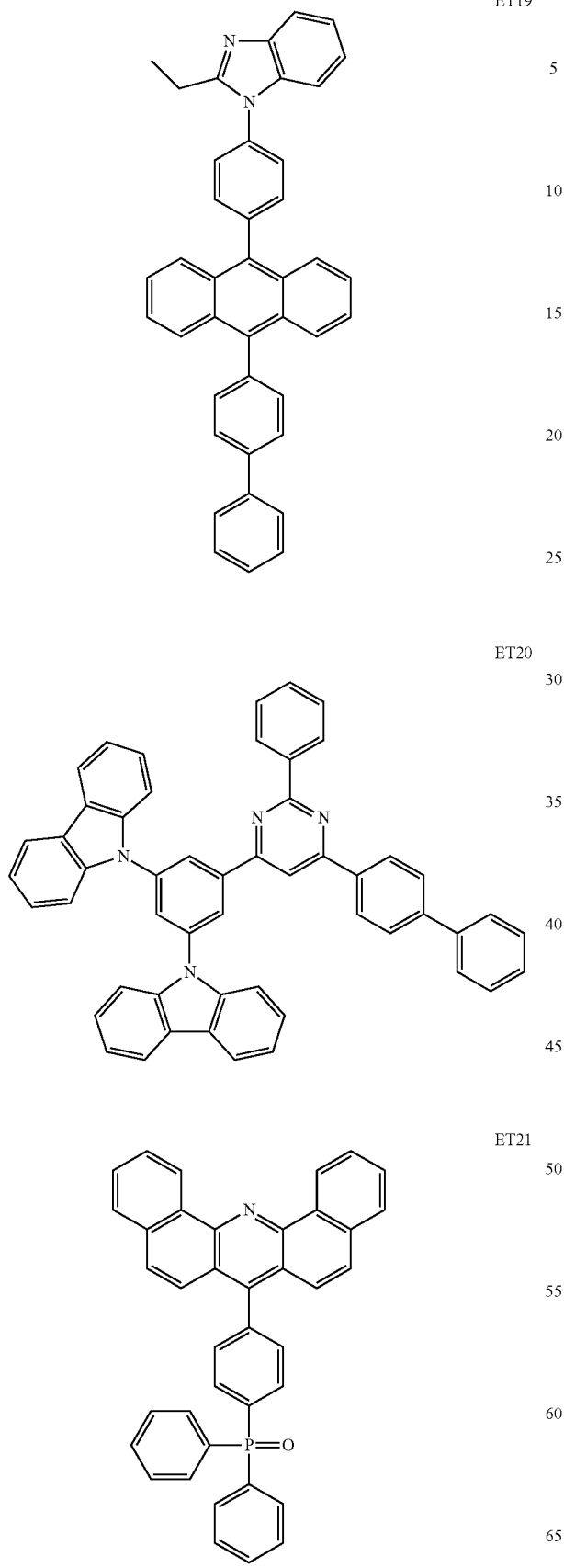
ET20
ET21
-continued
ET22
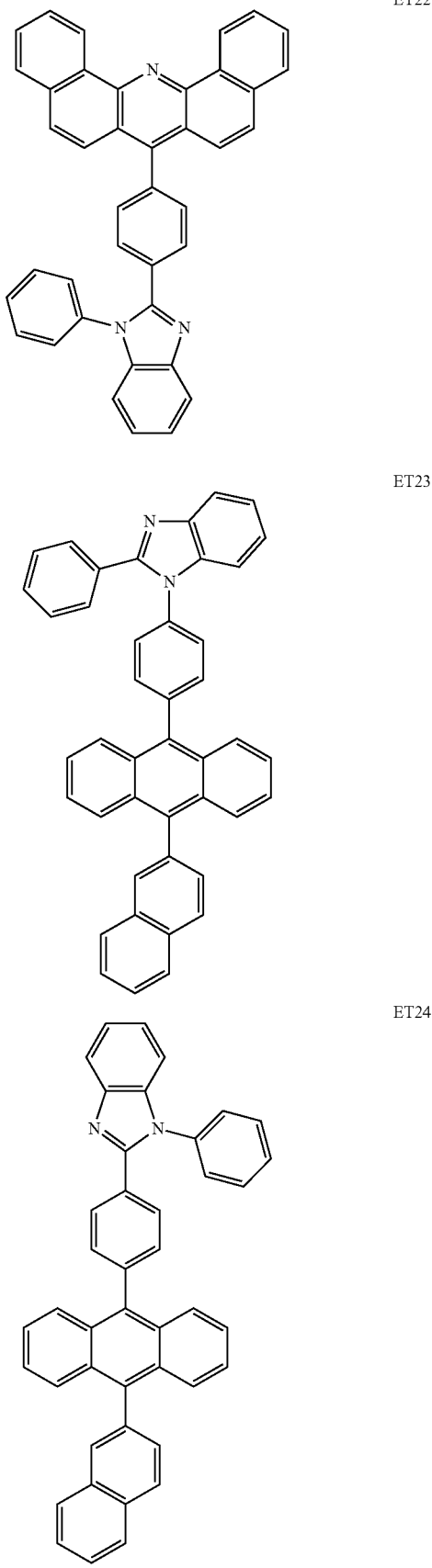
ET23
ET24

ET25

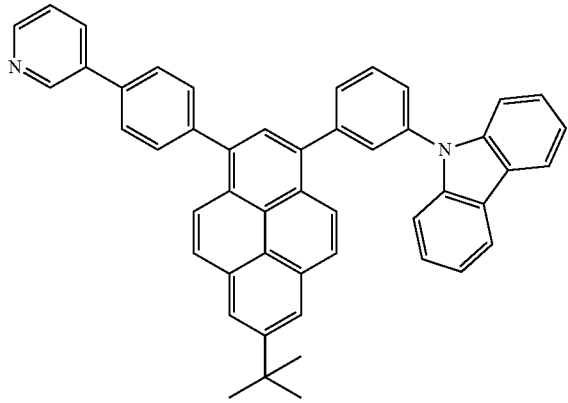

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

ET-D1

ET-D2

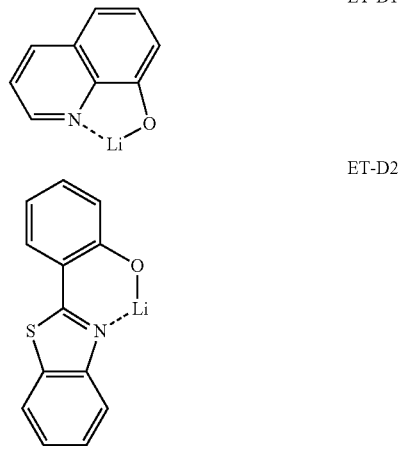

The electron transport region may include an electron injection layer (EIL) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent saturated monocyclic group having at least one heteroatom selected from N, O, P, Si and S as a ring-forming atom and 2 to 10 carbon atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-

$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom selected from N, O, P, Si, and S as a ring-forming atom, 2 to 10 carbon atoms, and at least one double bond in its ring. Non-limiting examples of the $C_2$-$C_{10}$ heterocycloalkenyl group include a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_2$-$C_{60}$ heteroaryl group" as used herein refers to a monovalent group having a heterocyclic aromatic system that has at least one heteroatom selected from N, O, P, Si, and S as a ring-forming atom, and 2 to 60 carbon atoms. The term "$C_2$-$C_{60}$ heteroarylene group," as used herein refers to a divalent group having a heterocyclic aromatic system that has at least one heteroatom selected from N, O, P, Si, and S as a ring-forming atom, and 2 to 60 carbon atoms. Non-limiting examples of the $C_2$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

The term "$C_6$-$C_{60}$ aryloxy group" as used herein refers to —$OA_{102}$ (wherein $A_{102}$ is the $C_6$-$C_{60}$ aryl group), a $C_6$-$C_{60}$ arylthio group as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group having two or more rings condensed to each other, only carbon atoms (for example, the number of carbon atoms may be in a range of 8 to 60) as a ring-forming atom, and no aromaticity in its entire molecular structure. Non-limiting examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, and S, other than carbon atoms (for example, the number of carbon atoms may be in a range of 2 to 60), as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

At least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroaryl alkyl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —$Si(Q_{11})(Q_{12})(Q_{13})$, —$N(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and
—Si($Q_{31}$)($Q_{32}$)($Q_{33}$), —N($Q_{34}$)($Q_{35}$), and —B($Q_{36}$)($Q_{37}$), and $Q_1$ to $Q_7$, $Q_{11}$ to $Q_{17}$, $Q_{21}$ to $Q_{27}$, and $Q_{31}$ to $Q_{37}$ may each independently be selected from hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, and a substituted or unsubstituted monovalent non-aromatic condensed heteropolycyclic group.

The term "room temperature" as used herein refers to about 25° C.

The term "a biphenyl group and a terphenyl group" as used herein refers to a monovalent group in which two or three benzene groups are linked via a single bond.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound H1

Compound H1 was synthesized according to the Reaction Scheme below.

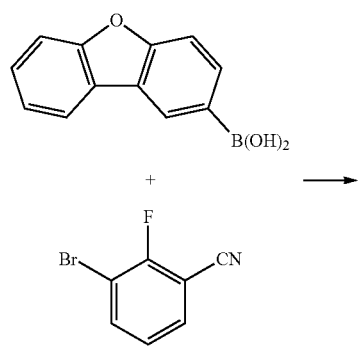

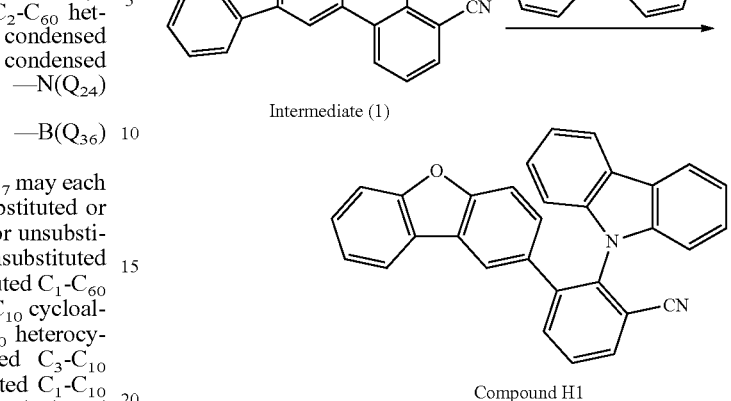

Intermediate (1)

Compound H1

Synthesis of Intermediate (1)

Dibenzofuran-2-yl boronic acid (10 grams (g), 47.2 millimoles, mmol), 3-bromo-2-fluorobenzonitrile (9.43 g, 47.2 mmol), palladium tetrakis(triphenylphosphine) (Pd(PPh$_3$)$_4$) (10.9 g, 9.4 mmol), and potassium carbonate (K$_2$CO$_3$) (19.6 g, 141.5 mmol) were added to a mixture of 100 milliliters (ml) of tetrahydrofuran and 70 ml of distilled water, and the reaction mixture was heated under reflux. After the reaction was completed, the reaction product was cooled to room temperature, and the organic layer was extracted therefrom by using ethyl acetate, dried by using anhydrous sodium sulfate (Na$_2$SO$_4$), concentrated, and then separated by silica gel column chromatography (dichloromethane/hexane). A solid obtained therefrom was recrystallized (dichloromethane/methanol) to synthesize Intermediate (1) that was a white solid.

Synthesis of Compound H1

20 ml of N,N-dimethylformamide was added to sodium hydride (NaH, 60% in mineral oil) (1.9 g, 47.8 mmol) at a temperature of 0° C. and stirred for 10 minutes. Then, carbazole (8 g, 47.8 mmol) was dissolved in 30 ml of N,N-dimethylformamide, slowly added to the reaction solution, and the reaction mixture was stirred at room temperature for 2 hours. The mixture of 90 ml of N,N-dimethylformamide and Intermediate (1) (10.9 g, 38.0 mmol) was added to the reaction solution. Then, the reaction solution was heated at a temperature of 120° C. under reflux. After the reaction was completed, the reaction product was poured to methanol/water and a precipitate obtained therefrom is filtered. The resultant obtained by washing with methanol was dissolved in hot toluene and filtered by using silica gel. A solid obtained by concentrating the filtrate obtained therefrom was recrystallized twice (dichloromethane/methanol, ethyl acetate) to provide Compound H1 (yield of 52%).

MALDI-TOF Mass (Calcd.: 434.49 g/mol, Found: 434.15 g/mol).

Evaluation Example 1: Measurement of Dipole Moment

The Mulliken charge and interatomic distance of each atom of Compounds H1 and H21 to H28 were calculated by using a DFT method of Gaussian program (structurally optimized at a level of B3LYP, 6-31G(d,p)), and the dipole moment of the corresponding compound was calculated therefrom. Results thereof are shown in Table 1.

TABLE 1

| Compound No. | Dipole moment (Debye) |
| --- | --- |
| H1 | 4.6323 |
| H21 | 3.4481 |
| H22 | 4.5336 |
| H23 | 8.5754 |
| H24 | 8.2051 |
| H25 | 7.3057 |
| H26 | 5.2772 |
| H27 | 8.5898 |
| H28 | 8.716 |

TABLE 1-continued

| Compound No. | Dipole moment (Debye) |
| --- | --- |

TABLE 1-continued

| Compound No. | Dipole moment (Debye) |
|---|---|

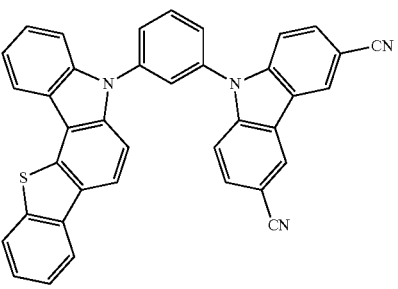

H28

Referring to Table 1, it is confirmed that Compounds H1 and H21 to H28 have a relatively high dipole moment.

Evaluation Example 2: Evaluation of Decay Time and Ratio of Delayed Fluorescence Component A quartz substrate cleaned by using chloroform and pure water was prepared, and films H1, H21, H24, H25, H26, and B each having a thickness of 50 nanometers (nm) were prepared by vacuum-depositing (co-depositing) a predetermined material shown in Table 2 at a vacuum degree of $10^{-7}$ torr.

TABLE 2

| Film name | Compounds used for manufacturing film |
|---|---|
| Film H1 | Compound H1:Compound D205 (volume ratio of 85:15) |
| Film H21 | Compound H21:Compound D205 (volume ratio of 85:15) |
| Film H24 | Compound H24:Compound D205 (volume ratio of 85:15) |
| Film H25 | Compound H25:Compound D205 (volume ratio of 85:15) |
| Film H26 | Compound H26:Compound D205 (volume ratio of 85:15) |
| Film B | Compound B:Compound D205 (volume ratio of 85:15) |

Then, PL spectrum of each of the films H1, H21, H24, H25, H26, and B was evaluated at room temperature by using a time-resolved photoluminescence (TRPL) measurement system FluoTime 300 (manufactured by PicoQuant) and a pumping source PLS340 (manufactured by PicoQuant) (excitation wavelength=340 nm, spectral width=20 nm), and the wavelength of main peak of the spectrum was determined. PLS340 repeated the measure of the number of photons emitted from each film at the main peak by a photon pulse (pulse width=500 picoseconds, ps) applied to each film according to the time, based on Time-Correlated Single Photon Counting (TCSPC), thereby obtaining a sufficiently fittable TRPL curve. Two or more exponential decay function was fitted to the result obtained therefrom, thereby obtaining $T_{decay}(E_x)$ (decay time) of the films H1, H21, H24, H25, H26, and B. The function used for fitting is represented by Equation 1, and the largest value among the $T_{decay}$ values obtained from each exponential decay function used for fitting $T_{decay}$ was taken as $T_{decay}(E_x)$ and shown in Table 3. The other $T_{decay}$ values may be used to determine a decay lifespan of a general fluorescence. At this time, the same measurement was performed once more for the same measurement time as the measurement time for calculating the TRPL curve in a dark state (a state in which the pumping signal incident on the predetermined film was blocked). In this manner, a baseline or background signal curve was obtained and used as a baseline for fitting.

Then, a ratio of a value obtained by integrating the exponential decay curve (=intensity change according to the time) determined by $T_{decay}(E_x)$ with respect to the time to the total light emission intensity according to the time was calculated, and the ratio of the delayed fluorescence component to the total emission component was evaluated. Results thereof are shown in Table 3.

$$f(t) = \sum_{i=1}^{n} A_i \exp(-t/T_{decay,i})$$ Equation 1

TABLE 3

| Film name | $T_{decay}(Ex)$ (µs) (decay time) | Ratio of delayed fluorescence component to total emission component (%) |
|---|---|---|
| Film H1 | 20.65 | 68.8 |
| Film H21 | 20.65 | 52.3 |
| Film H24 | 9.36 | 26.7 |
| Film H25 | 8.04 | 80.1 |
| Film H26 | 12.4 | 51.0 |
| Film B | 7.17 | 11.2 |

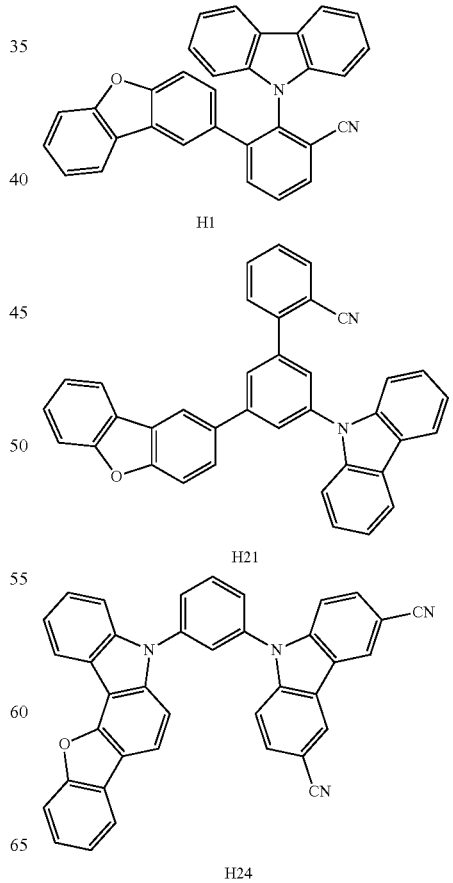

TABLE 3-continued

| Film name | T$_{decay}$(Ex) (μs) (decay time) | Ratio of delayed fluorescence component to total emission component (%) |
|---|---|---|

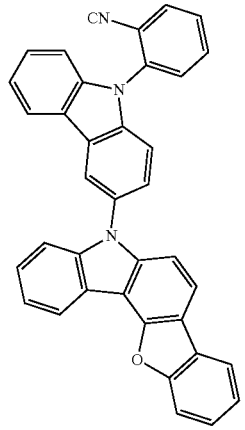

H25

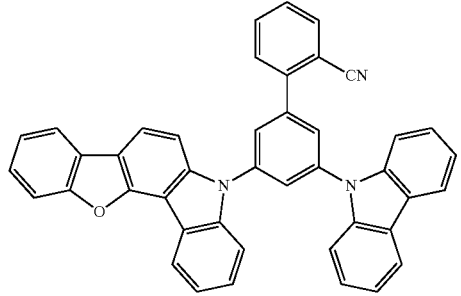

H26

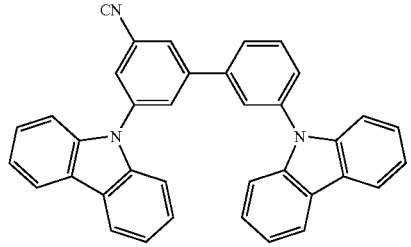

B

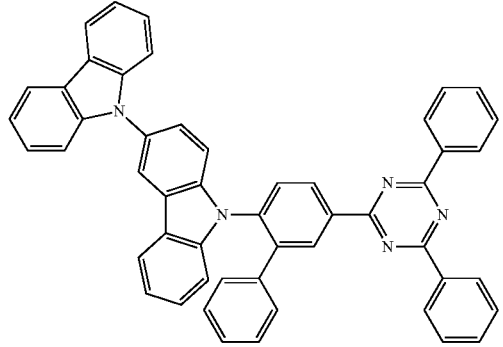

D205

Referring to Table 3, it is confirmed that the films H1, H21, H24, H25, and H26 have a longer decay time and a greater ratio of the delayed fluorescence component, as compared with the film B.

Example 1

A glass substrate, on which a 1,500 Å-thick ITO electrode (first electrode, anode) was formed, was washed with distilled water ultrasonic wave. When the washing with distilled water was completed, sonification washing was performed using a solvent, such as iso-propyl alcohol, acetone, or methanol. The resultant was dried and then transferred to a plasma washer, and the resultant substrate was washed with oxygen plasma for 5 minutes and then transferred to a vacuum depositing device.

Compound HT3 and Compound HT-D2 were co-deposited on the ITO electrode of the glass substrate to form a hole injection layer having a thickness of 100 Å, Compound HT3 was deposited on the hole injection layer to form a hole transport layer having a thickness of 1,350 Å, and mCP was deposited on the hole transport layer to form an electron blocking layer having a thickness of 100 Å, thereby forming a hole transport region.

Compound H1 (host) and Compound D205 (delayed fluorescence emitter) were co-deposited on the hole transport region at a volume ratio of 85:15 to form an emission layer having a thickness of 300 Å.

Compound BCP was vacuum-deposited on the emission layer to form a hole blocking layer having a thickness of 100 Å, Compound ET3 and LiQ were vacuum-deposited together on the hole blocking layer to form an electron transport layer having a thickness of 300 Å, and then, LiQ was deposited on the electron transport layer to form an electron injection layer having a thickness of 10 Å, and an Al second electrode (cathode) having a thickness of 1,000 Å was formed on the electron injection layer, thereby completing the manufacture of an organic light-emitting device.

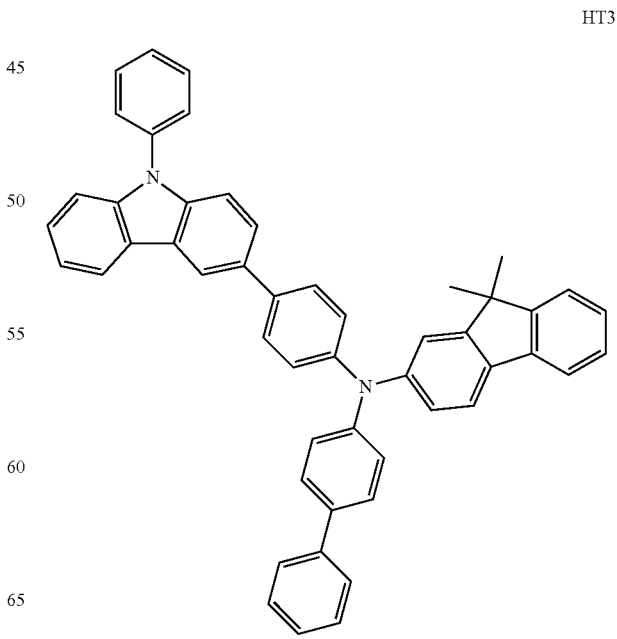

HT3

-continued

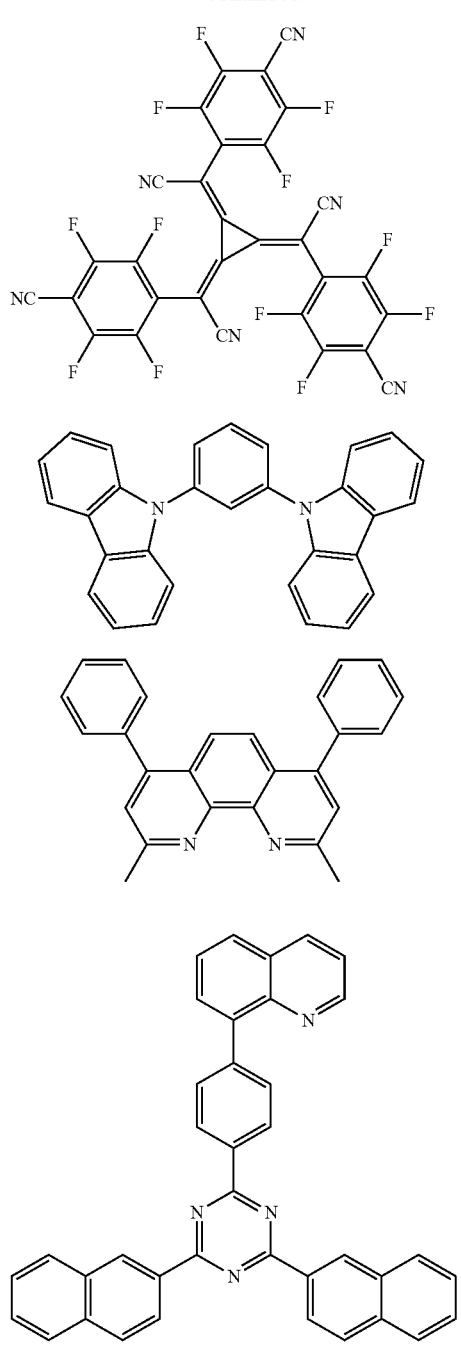

HT-D2 mCP

BCP

ET3

Comparative Examples A and B

Organic light-emitting devices were manufactured in the same manner as in Example 1, except that the host in the emission layer was changed as shown in Table 4.

Evaluation Example 3: Evaluation of Data about Organic Light-Emitting Devices

The maximum external quantum efficiency ($EQE_{max}$), external quantum efficiency (EQE) at 500 candelas per square meter (cd/m$^2$), and lifespan ($T_{80}$) of Example 1 and Comparative Examples A and B were measured by using a current-voltage meter (Keithley 2400) and a luminance meter (Minolta Cs-1000A), and results thereof are shown in Table 4. The lifespan ($T_{80}$) data (at 500 cd/m$^2$) in Table 4 indicates an amount of time (hours, hr) that lapsed when luminance was 80% of initial luminance (100%).

TABLE 4

| Example No. | Host | Delayed fluorescence emitter | $EQE_{max}$ (%) | EQE at 500 cd/m$^2$ (%) | Lifespan ($T_{80}$) at 500 cd/m$^2$ (hr) |
| --- | --- | --- | --- | --- | --- |
| Example 1 | H1 | D205 | 19.2 | 11.9 | 7.36 |
| Comparative Example A | A | D205 | 21.1 | 9.9 | 0.15 |
| Comparative Example B | B | D205 | 8.8 | 7.4 | 14.26 |

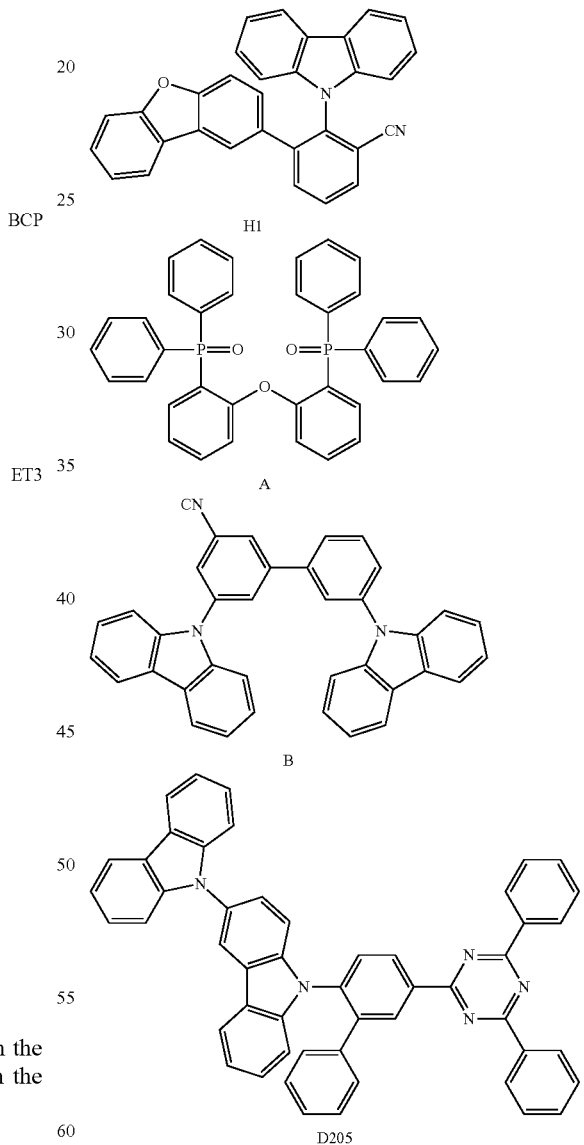

Referring to Table 4, it is confirmed that the organic light-emitting device of Example 1 has improved luminescent efficiency and lifespan characteristics "at the same", as compared with the organic light-emitting devices of Comparative Examples A and B.

The organic light-emitting device may have high efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present disclosure as defined by the following claims.

What is claimed is:

1. An organic light-emitting device including:
a first electrode;
a second electrode facing the first electrode; and
an emission layer disposed between the first electrode and the second electrode,
wherein the emission layer comprises a host and a thermally activated delayed fluorescence emitter, and
the host comprises at least one compound selected from a compound represented by Formula 1 and a compound represented by Formula 2, and CZ in Formulae 1 and 2 is a group represented by Formula CZ1 or CZ2:

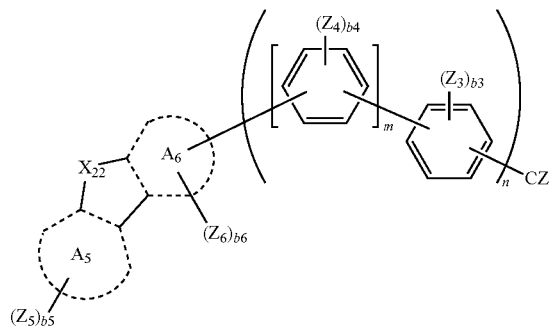

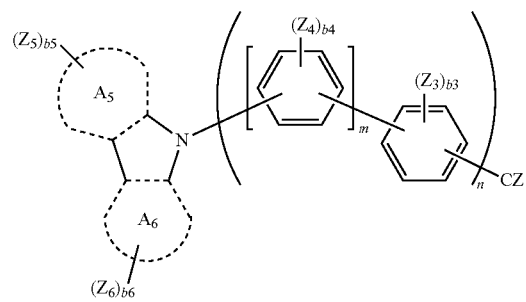

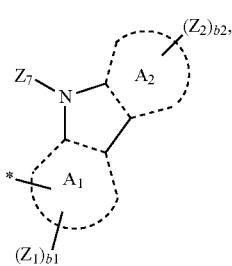

wherein, in Formulae 1, 2, CZ1, and CZ2,
rings $A_1$, $A_2$, $A_5$, and $A_6$ are each independently a benzene group, a naphthalene group, a fluorene group, a carbazole group, a dibenzosilole group, a dibenzofuran group, or a dibenzothiophene group, wherein ring $A_6$ in Formula 2 is a dibenzofuran group or a dibenzothiophene group,
$X_{22}$ is O or S,
m is 0, 1, or 2,
n is 0 or 1,
$Z_1$ to $Z_7$ are each independently:
hydrogen, deuterium, or a cyano group (CN); or
a $C_1$-$C_{20}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_1$-$C_{20}$ alkyl group, a phenyl group, and a biphenyl group,
b1 to b6 are each independently 0, 1, 2, or 3,
*indicates a binding site to a neighboring atom, and
each of the compound represented by Formula 1 and the compound represented by Formula 2 includes at least one cyano group, and
wherein
a difference between a triplet energy level (electron volts) of the thermally activated delayed fluorescence emitter and a singlet energy level (electron volts) of the thermally activated delayed fluorescence emitter is in a range of about 0 electron volts to about 0.5 electron volts, and
the triplet energy level and the singlet energy level are evaluated by using a DFT method structurally optimized at a level of B3LYP/6-31G(d,p).

2. The organic light-emitting device of claim 1, wherein $Z_1$ to $Z_7$ are each independently:
hydrogen, deuterium, or a cyano group; or
a $C_3$-$C_{10}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_3$-$C_{10}$ alkyl group, a phenyl group, and a biphenyl group.

3. The organic light-emitting device of claim 1, wherein a number of the cyano groups included in the compound represented by Formula 1 and a number of the cyano groups included in the compound represented by Formula 2 are each independently 1, 2, 3, or 4.

4. The organic light-emitting device of claim 1, wherein, in Formulae 1 and 2,
at least one selected from groups $Z_1$ in the number of b1 and groups $Z_2$ in the number of b2 is a cyano group,
at least one selected from groups $Z_3$ in the number of b3 and groups $Z_4$ in the number of b4 is a cyano group, at least one selected from groups $Z_5$ in the number of b5 and groups $Z_6$ in the number of b6 is a cyano group, at least one selected from groups $Z_1$ in the number of b1 and groups $Z_2$ in the number of b2 is a cyano group, and at least one selected from groups $Z_3$ in the number of b3 and groups $Z_4$ in the number of b4 is a cyano group, at least one selected from groups $Z_1$ in the number of b1 and groups $Z_2$ in the number of b2 is a cyano group, and at least one selected from groups $Z_5$ in the number of b5 and groups $Z_6$ in the number of b6 is a cyano group, at least one selected from groups $Z_3$ in the number of b3 and groups $Z_4$ in the number of b4 is a cyano group, and at least one selected from groups $Z_5$ in the number of b5 and groups $Z_6$ in the number of b6 is a cyano group, or at least one selected from groups $Z_1$ in the number of b1 and groups $Z_2$ in the number of b2 is a cyano group, at least one selected from groups $Z_3$ in the number of b3 and groups $Z_4$ in the number of b4 is a cyano group, and at least one selected from groups $Z_5$ in the number of b5 and groups $Z_6$ in the number of b6 is a cyano group.

5. The organic light-emitting device of claim 1, wherein CZ in Formulae 1 and 2 is a group represented by Formula CZ2, $Z_7$ in Formula CZ2 is a $C_1$-$C_{20}$ alkyl group, a phenyl group, a biphenyl group, a terphenyl group, a dibenzofuranyl group, or a dibenzothiophenyl group, each substituted with at least one cyano group.

6. The organic light-emitting device of claim 1, wherein a group represented by

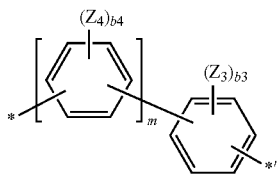

in Formulae 1 and 2 is one selected from Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9:

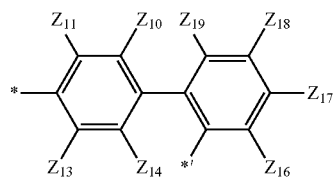

PO1

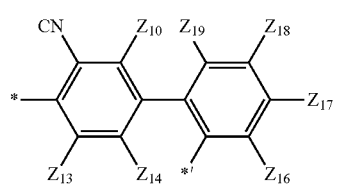

PO2

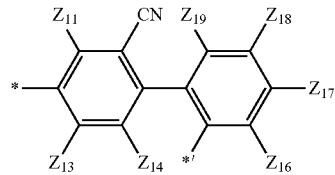

PO3

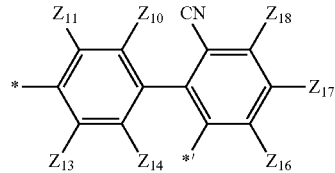

PO4

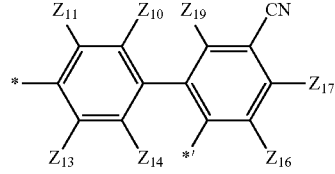

PO5

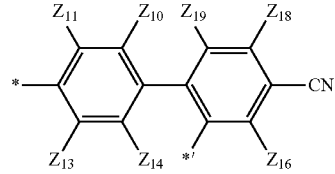

PO6

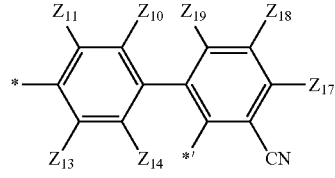

PO7

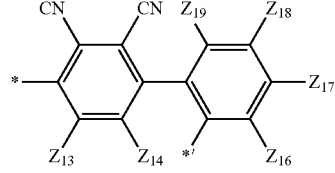

PO8

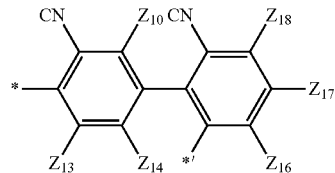

PO9

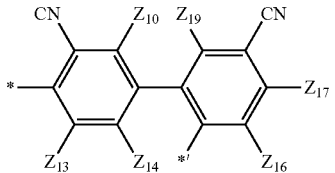

PO10

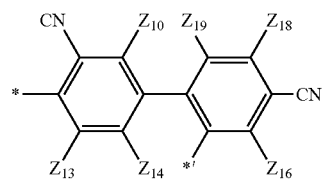
PO11
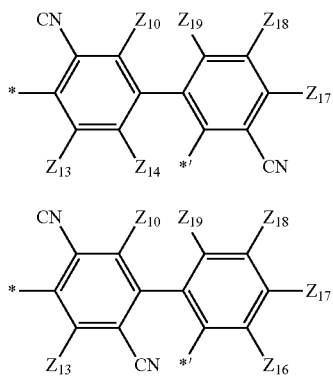
PO12
PO13
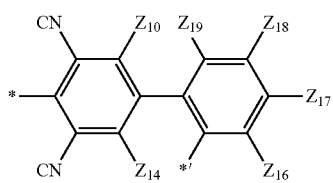
PO14
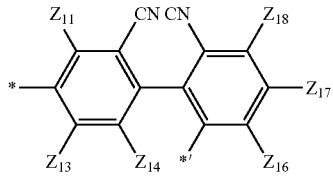
PO15
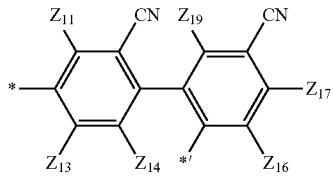
PO16
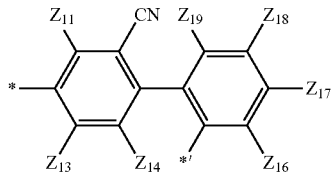
PO17
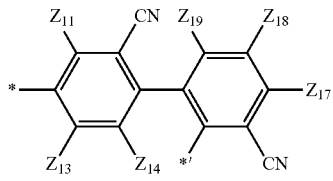
PO18
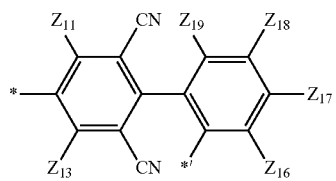
PO19
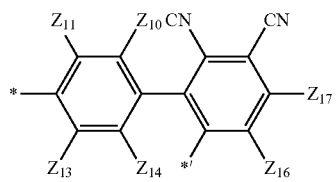
PO20
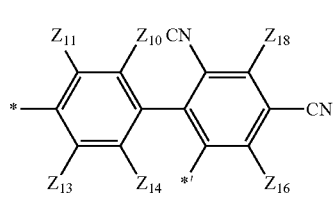
PO21
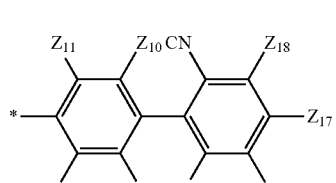
PO22
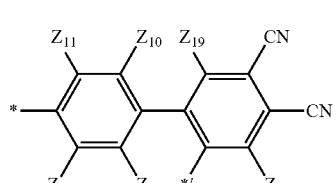
PO23
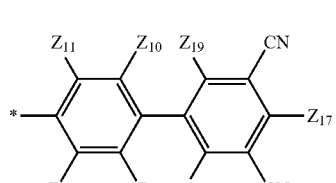
PO24
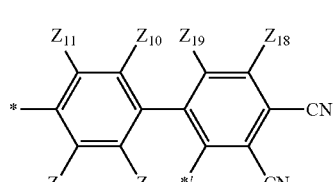
PO25
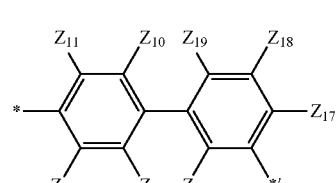
PM1

-continued
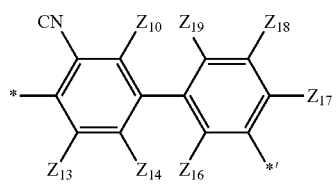 PM2
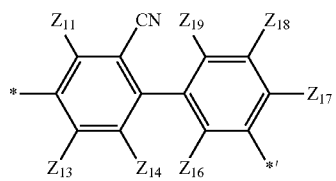 PM3
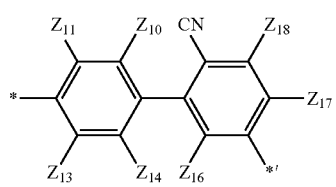 PM4
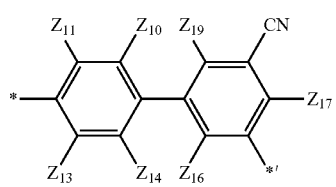 PM5
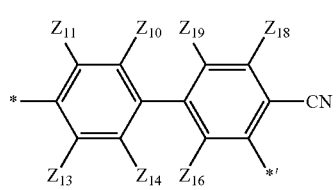 PM6
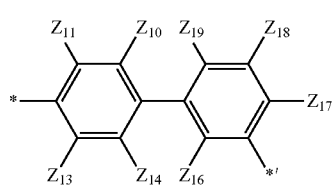 PM7
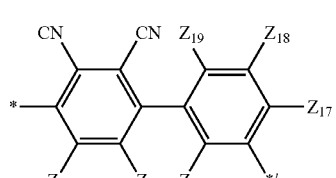 PM8
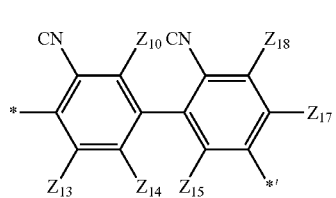 PM9
-continued
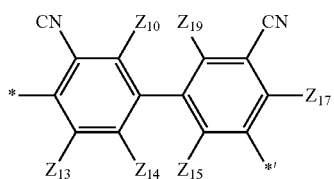 PM10
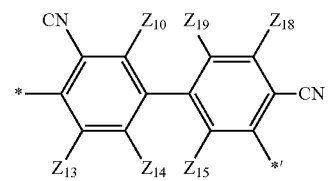 PM11
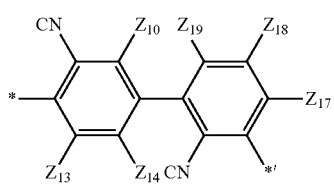 PM12
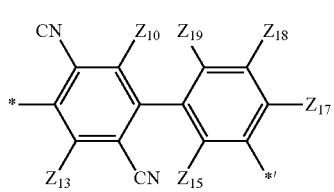 PM13
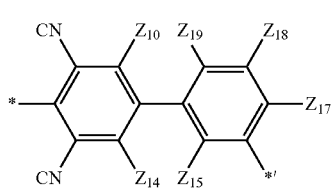 PM14
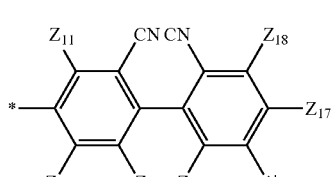 PM15
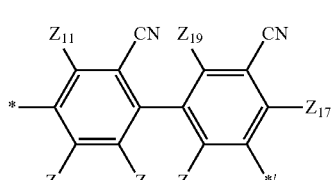 PM16
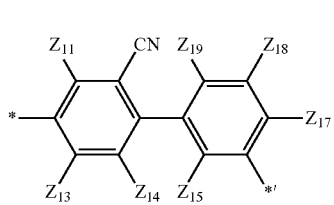 PM17

-continued
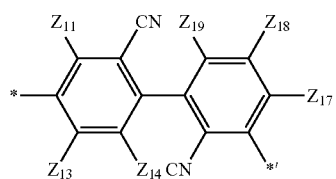 PM18
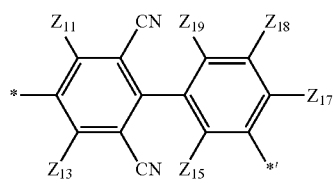 PM19
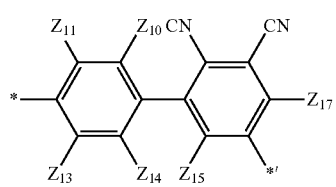 PM20
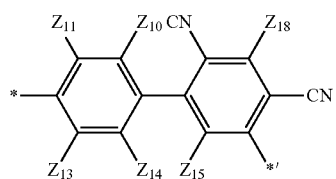 PM21
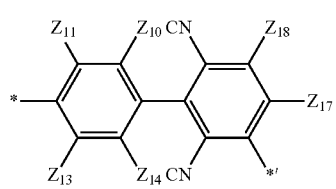 PM22
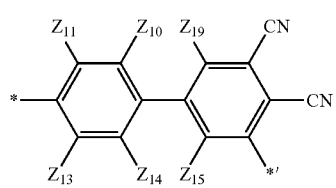 PM23
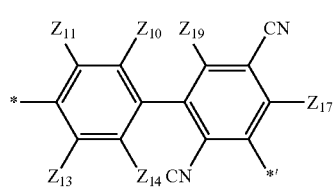 PM24
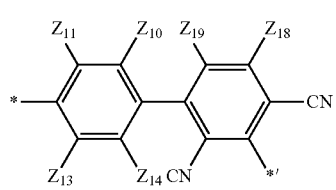 PM25
-continued
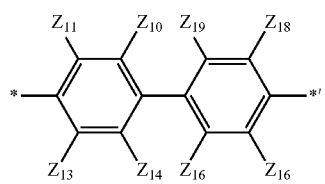 PP1
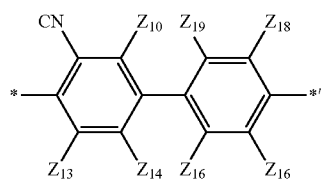 PP2
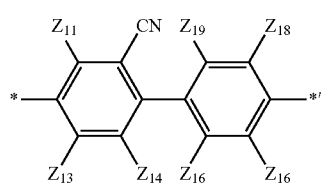 PP3
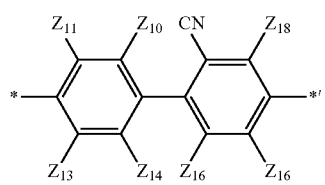 PP4
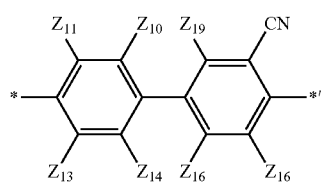 PP5
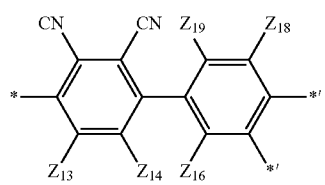 PP6
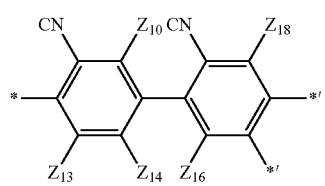 PP7
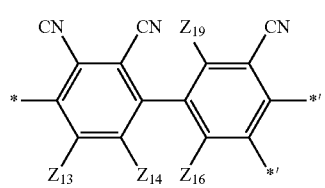 PP8

| | |
|---|---|
| 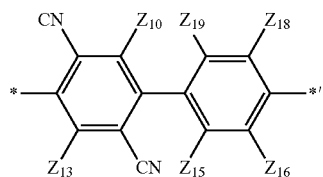 PP9 | 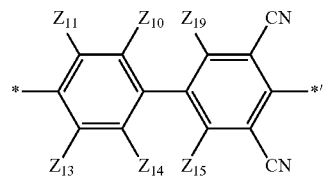 PP17 |
| 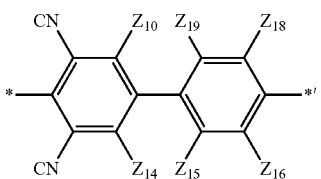 PP10 | 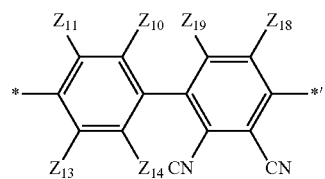 PP18 |
| 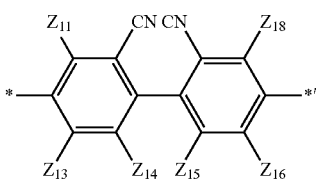 PP11 | 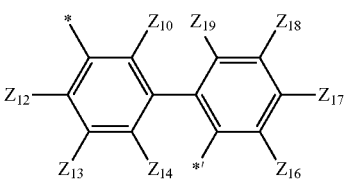 MO1 |
| 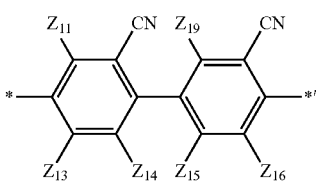 PP12 | 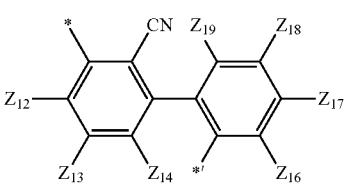 MO2 |
| 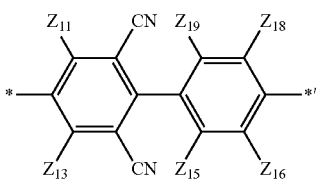 PP13 | 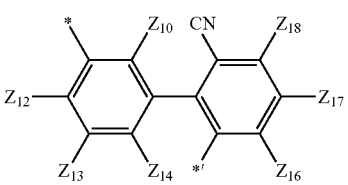 MO3 |
| 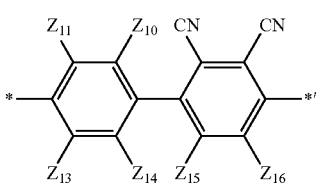 PP14 | 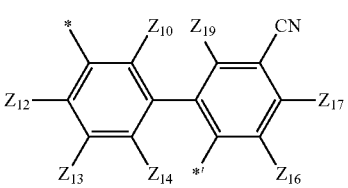 MO4 |
| 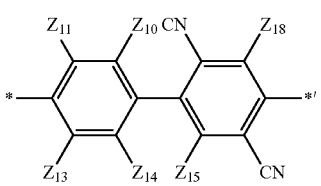 PP15 | 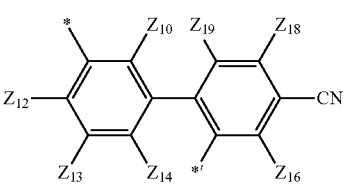 MO5 |
| 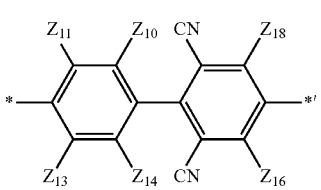 PP16 | 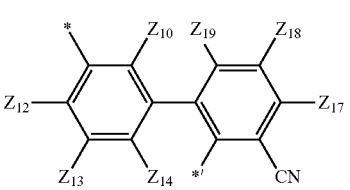 MO6 |

-continued
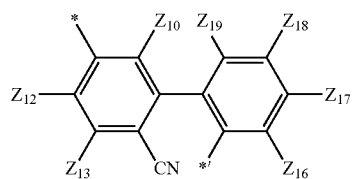
MO7
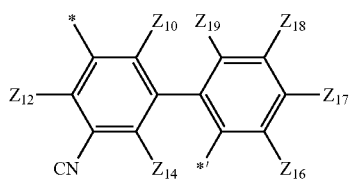
MO8
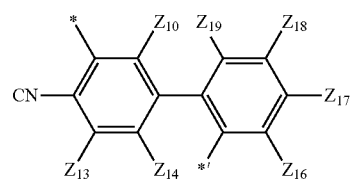
MO9
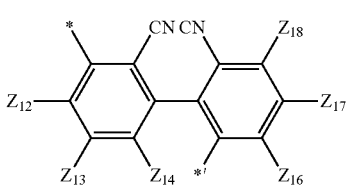
MO10
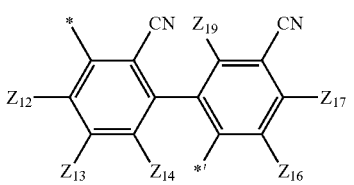
MO11
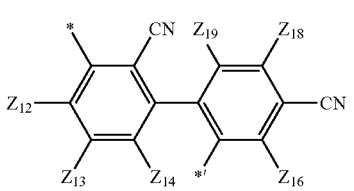
MO12
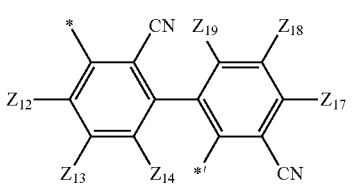
MO13
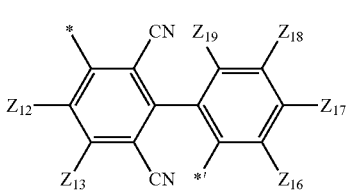
MO14
-continued
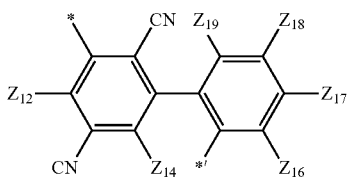
MO15
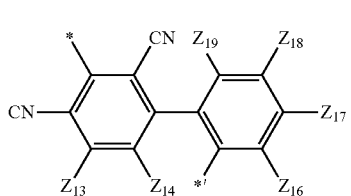
MO16
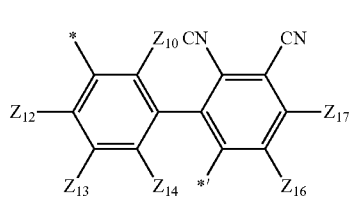
MO17
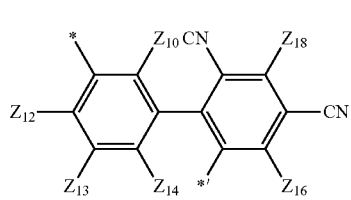
MO18
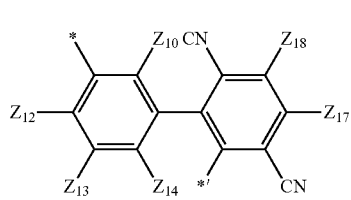
MO19
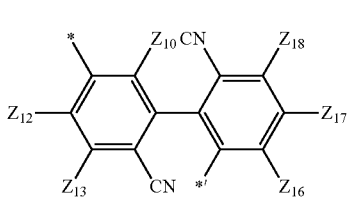
MO20
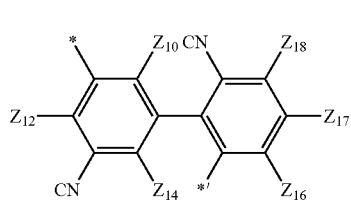
MO21
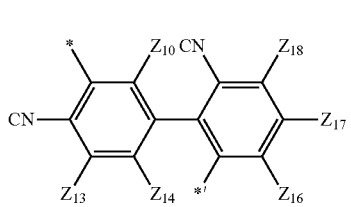
MO22

-continued
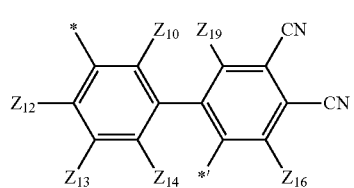
MO23
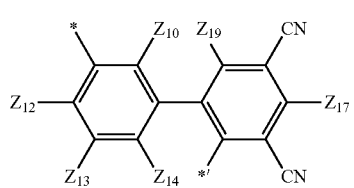
MO24
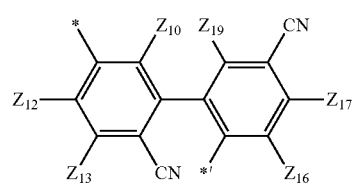
MO25
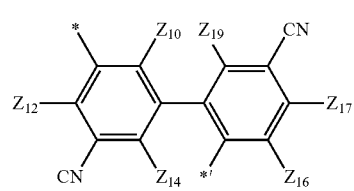
MO26
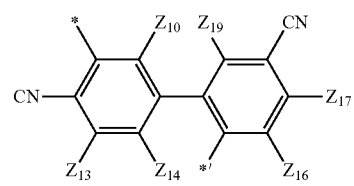
MO27
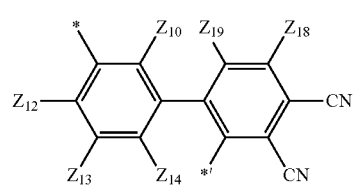
MO28
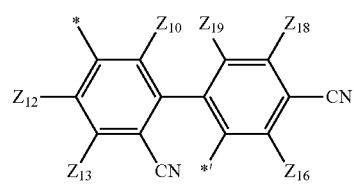
MO29
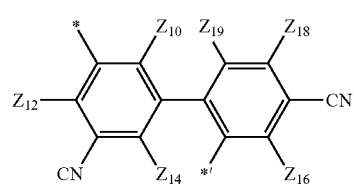
MO30
-continued
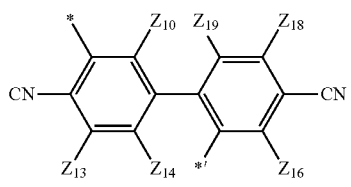
MO31
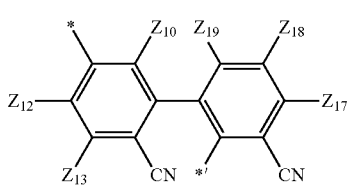
MO32
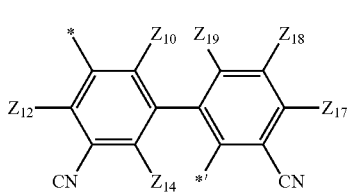
MO33
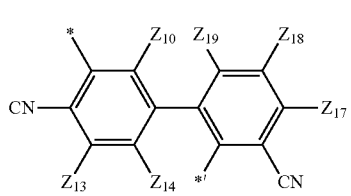
MO34
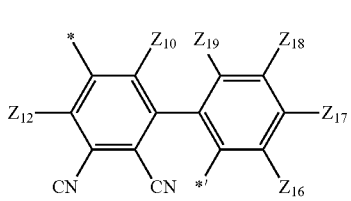
MO35
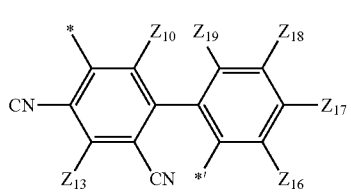
MO36
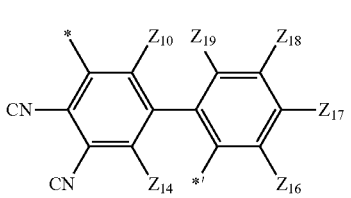
MO37
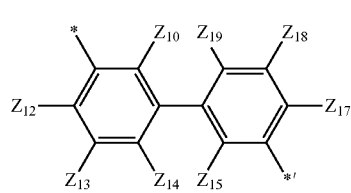
MM1

-continued
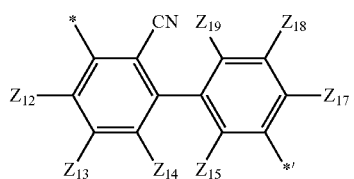
MM2
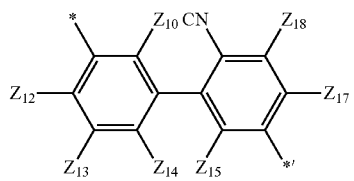
MM3
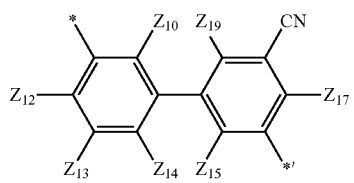
MM4
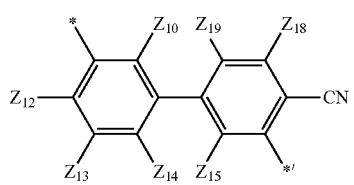
MM5
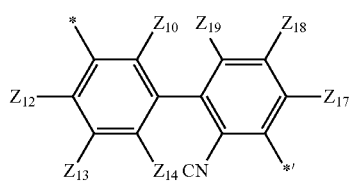
MM6
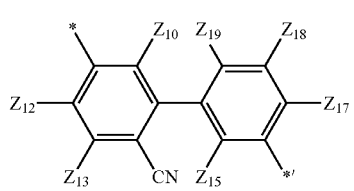
MM7
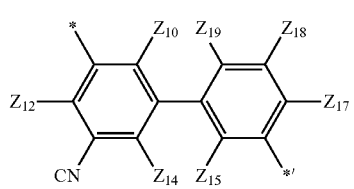
MM8
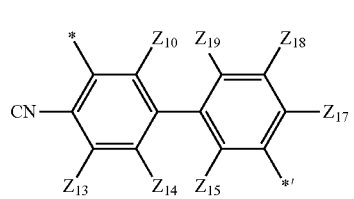
MM9
-continued
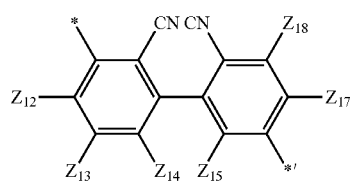
MM10
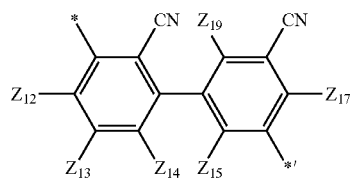
MM11
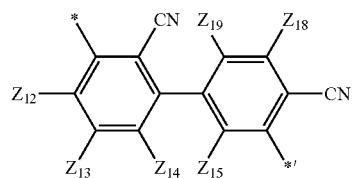
MM12
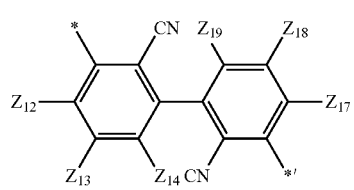
MM13
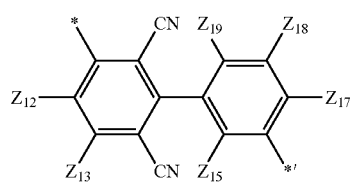
MM14
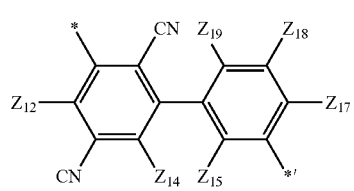
MM15
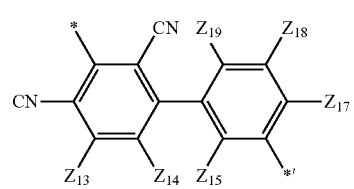
MM16
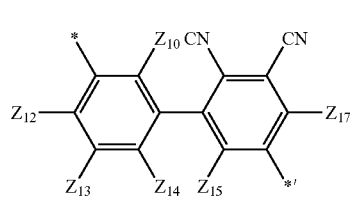
MM17

-continued
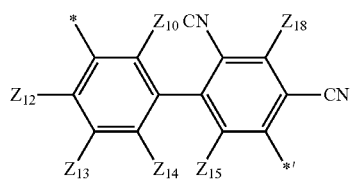 MM18
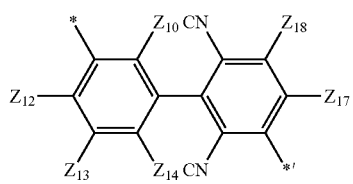 MM19
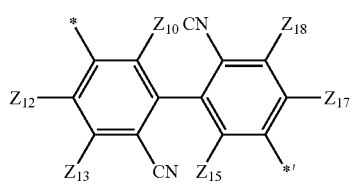 MM20
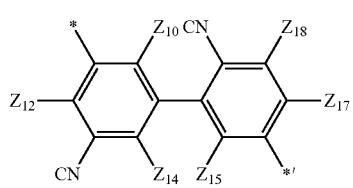 MM21
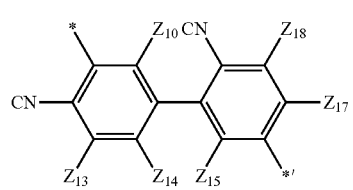 MM22
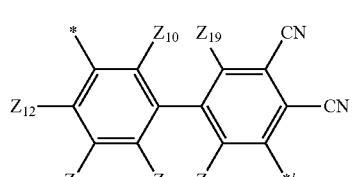 MM23
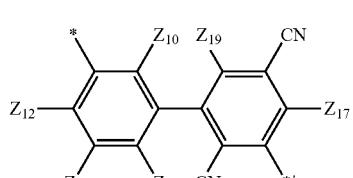 MM24
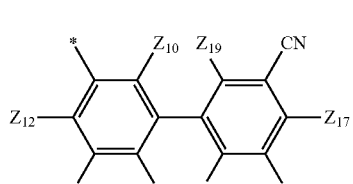 MM25
-continued
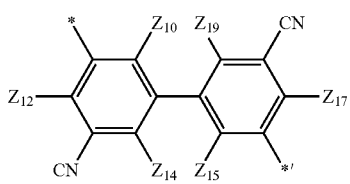 MM26
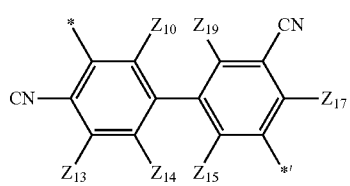 MM27
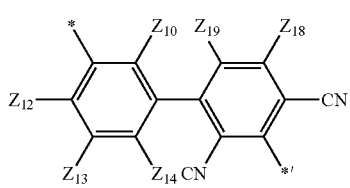 MM28
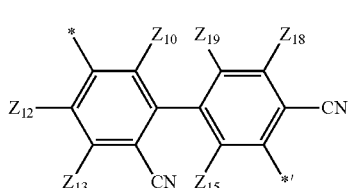 MM29
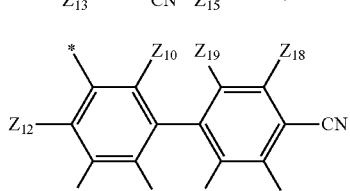 MM30
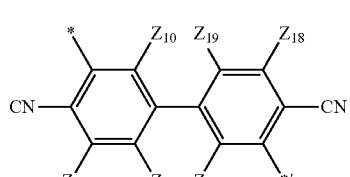 MM31
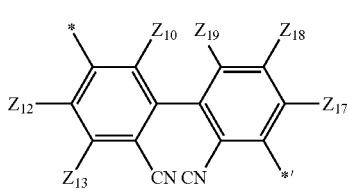 MM32
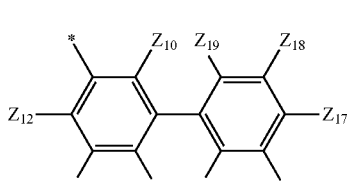 MM33

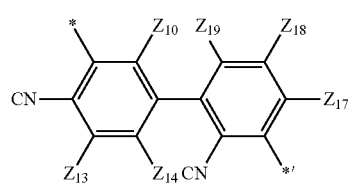 MM34
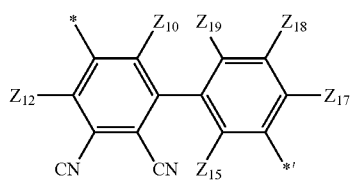 MM35
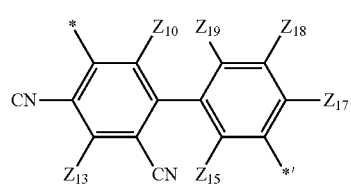 MM36
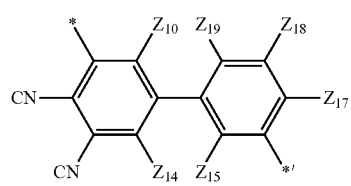 MM37
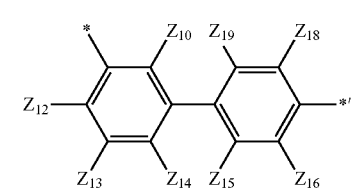 MP1
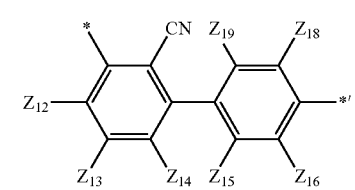 MP2
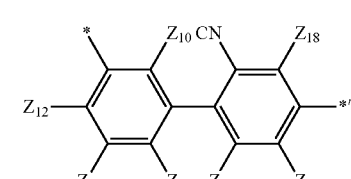 MP3
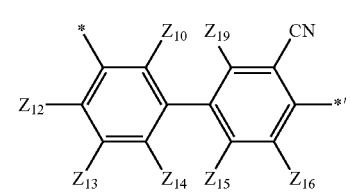 MP4
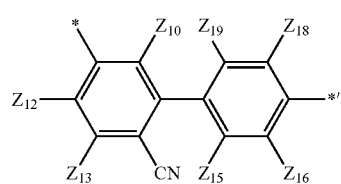 MP5
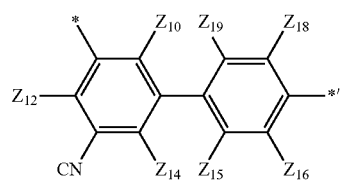 MP6
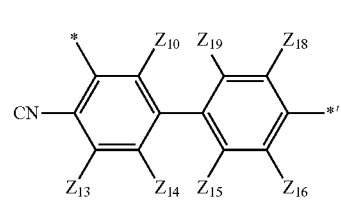 MP7
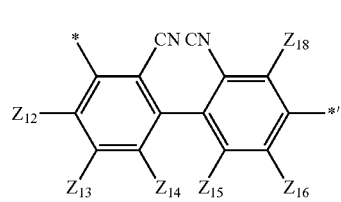 MP8
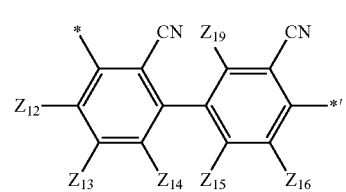 MP9
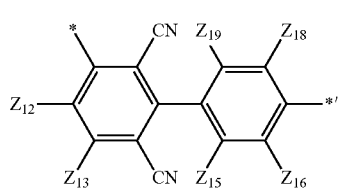 MP10
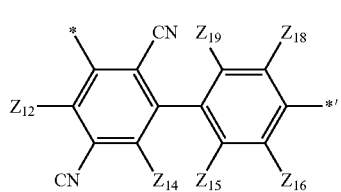 MP11
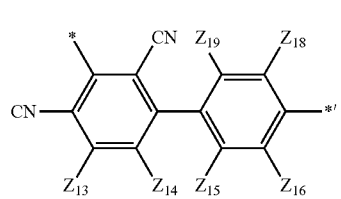 MP12

-continued
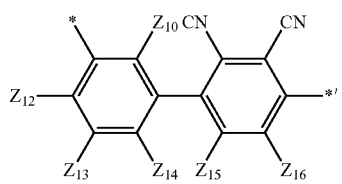
MP13
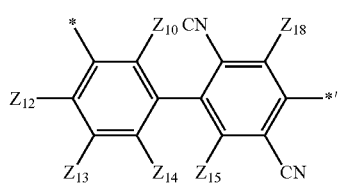
MP14
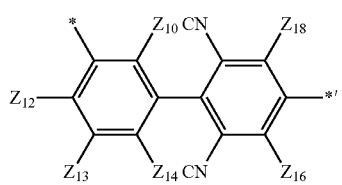
MP15
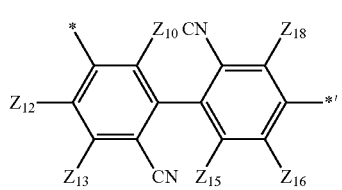
MP16
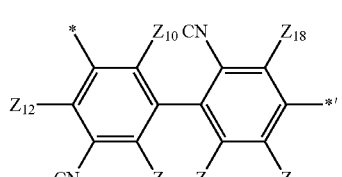
MP17
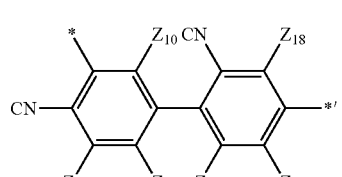
MP18
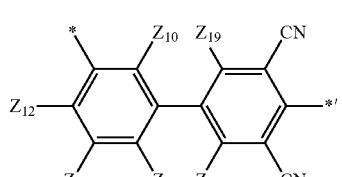
MP19
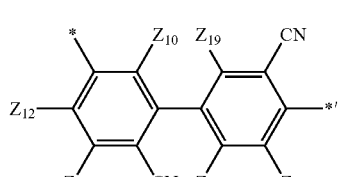
MP20
-continued
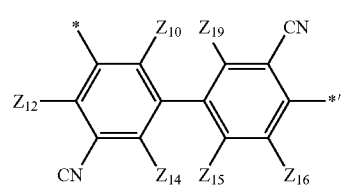
MP21
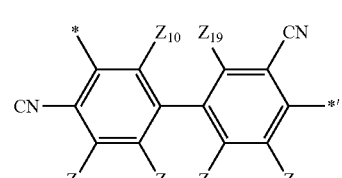
MP22
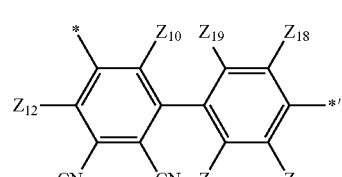
MP23
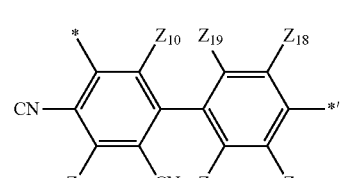
MP24
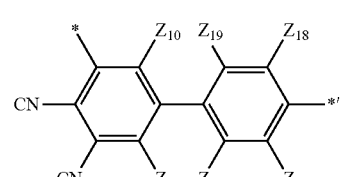
MP25
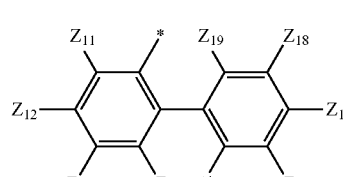
OO1
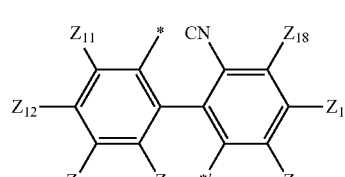
OO2
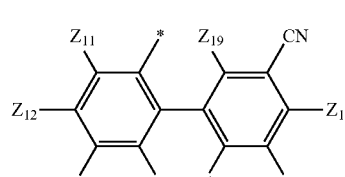
OO3

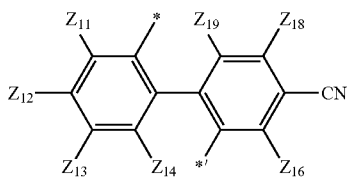
OO4
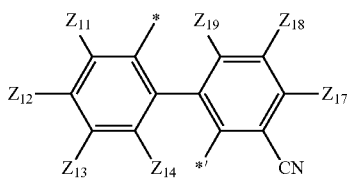
OO5
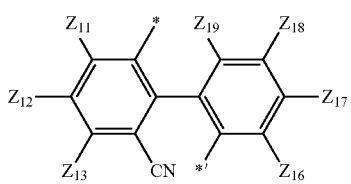
OO6
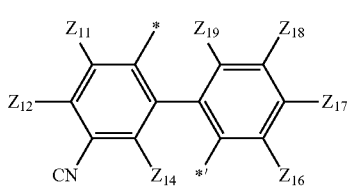
OO7
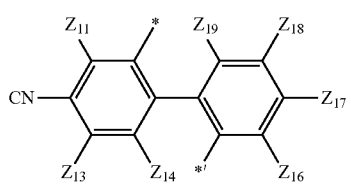
OO8
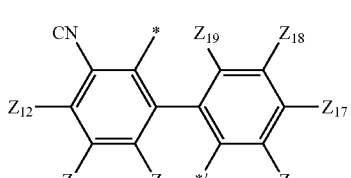
OO9
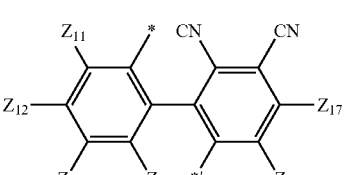
OO10
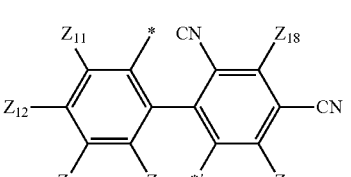
OO11
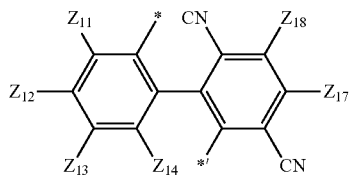
OO12
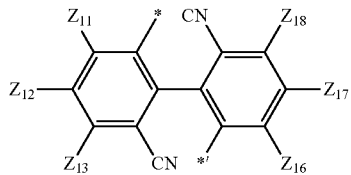
OO13
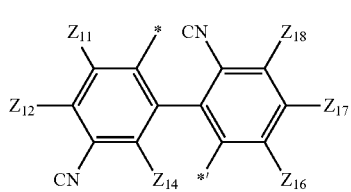
OO14
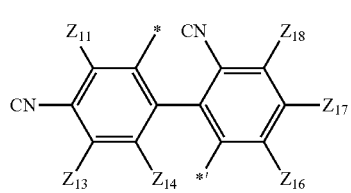
OO15
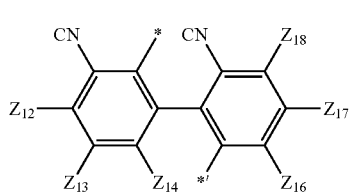
OO16
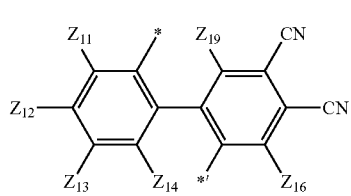
OO17
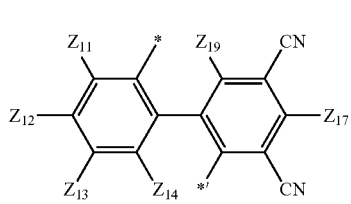
OO18
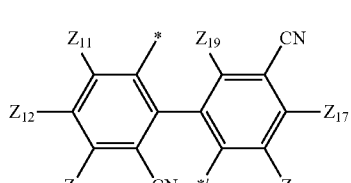
OO19

-continued
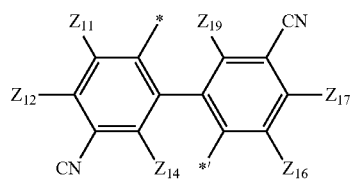 OO20
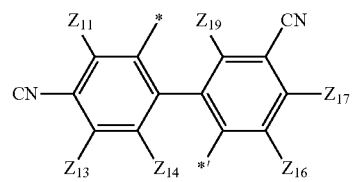 OO21
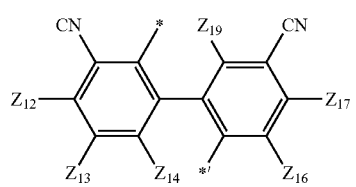 OO22
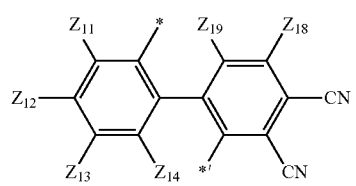 OO23
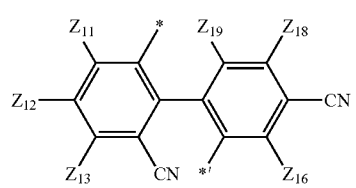 OO24
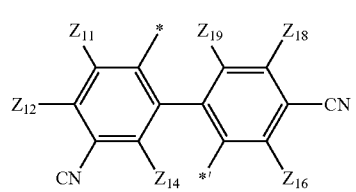 OO25
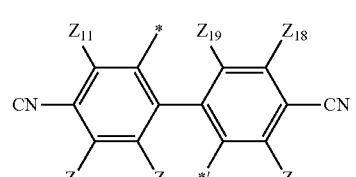 OO26
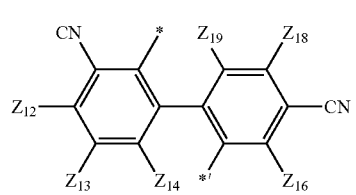 OO27
-continued
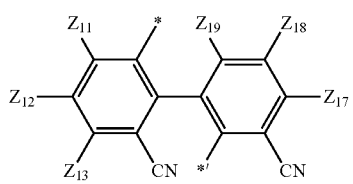 OO28
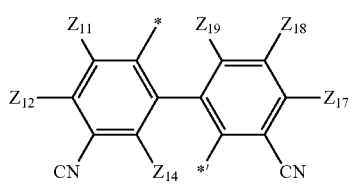 OO29
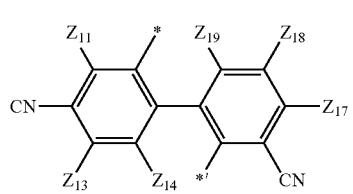 OO30
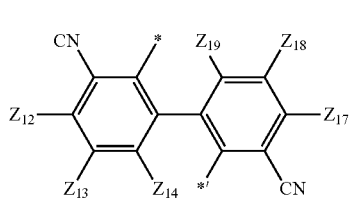 OO31
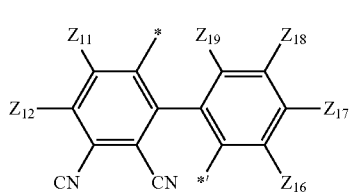 OO32
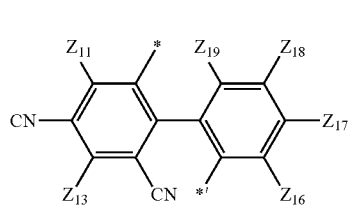 OO33
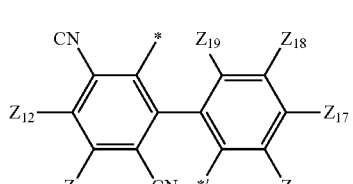 OO34
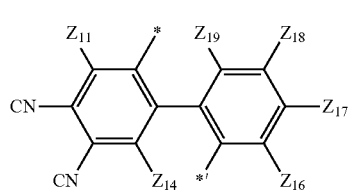 OO35

207
-continued
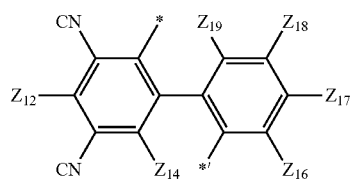 OO36
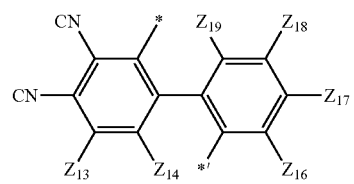 OO37
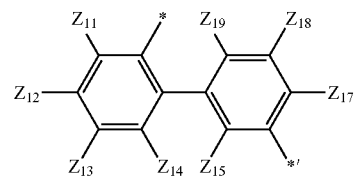 OM1
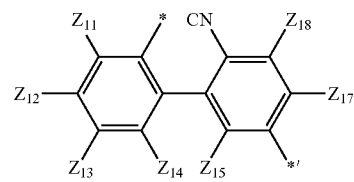 OM2
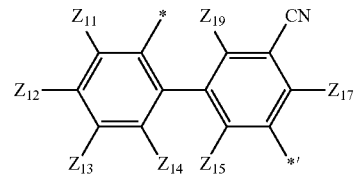 OM3
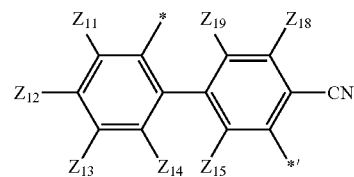 OM4
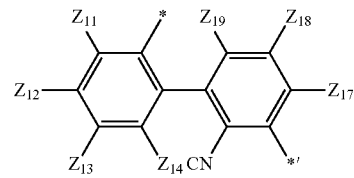 OM5
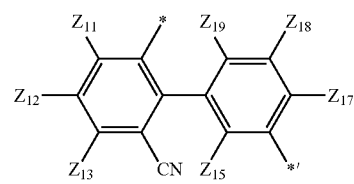 OM6
208
-continued
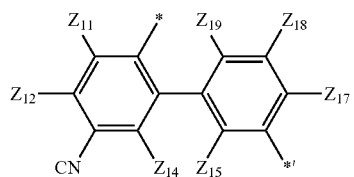 OM7
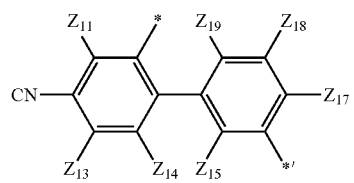 OM8
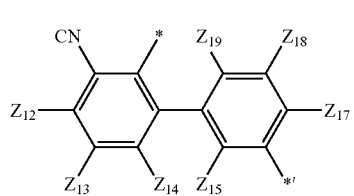 OM9
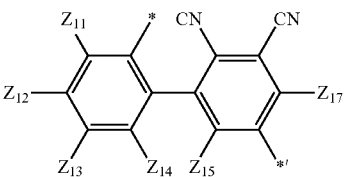 OM10
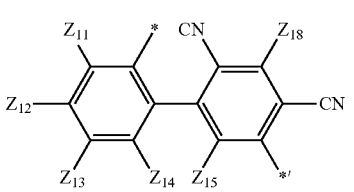 OM11
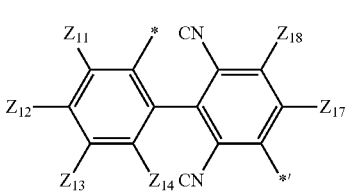 OM12
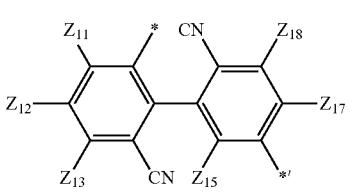 OM13
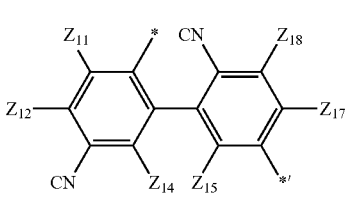 OM14

-continued
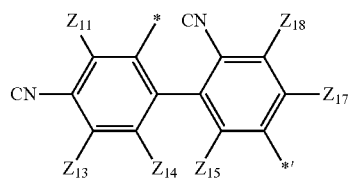
OM15
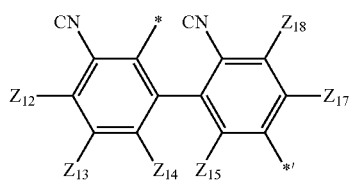
OM16
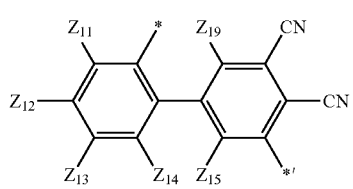
OM17
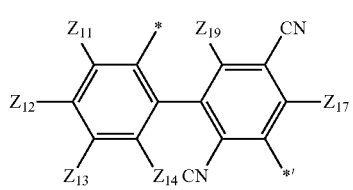
OM18
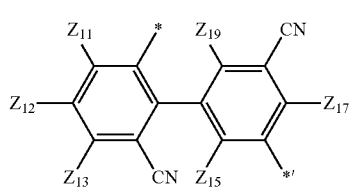
OM19
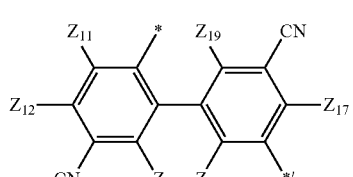
OM20
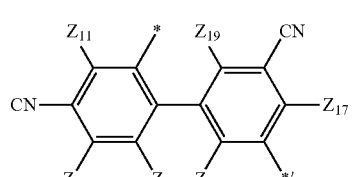
OM21
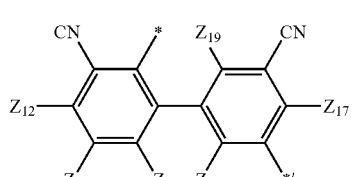
OM22
-continued
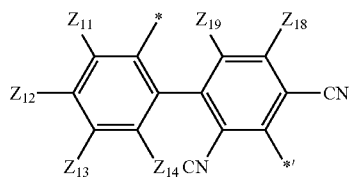
OM23
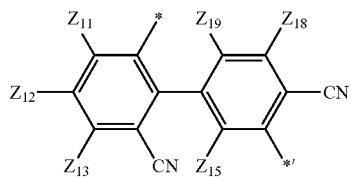
OM24
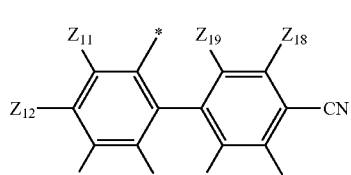
OM25
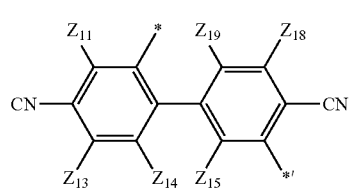
OM26
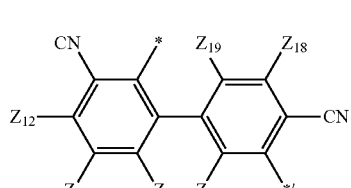
OM27
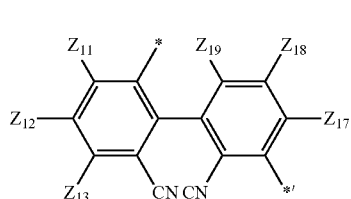
OM28
OM29
OM30

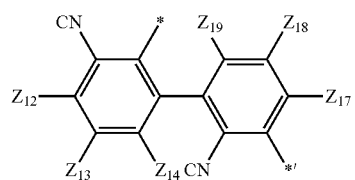 OM31
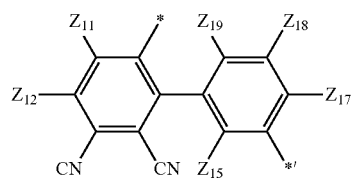 OM32
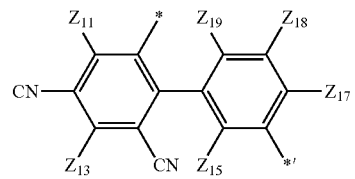 OM33
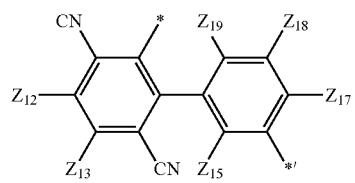 OM34
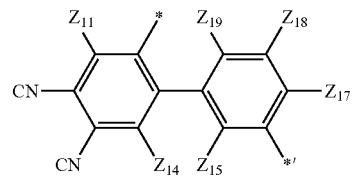 OM35
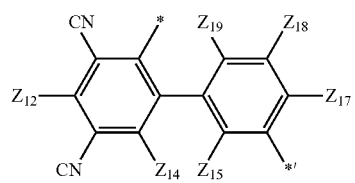 OM36
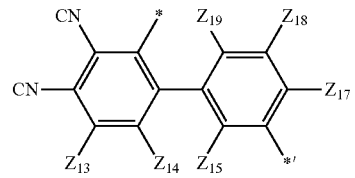 OM37
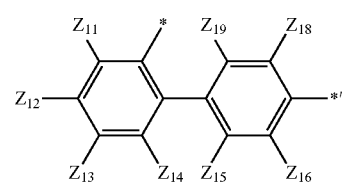 OP1
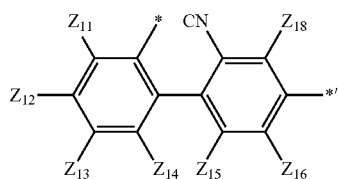 OP2
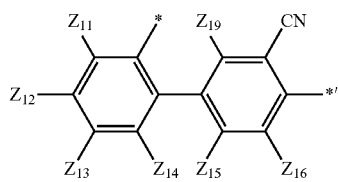 OP3
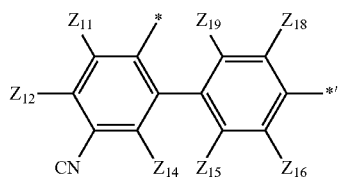 OP4
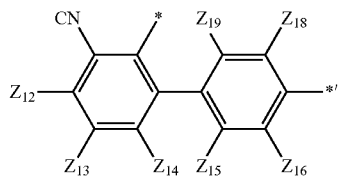 OP5
OP6
OP7
OP8
OP9

OP10
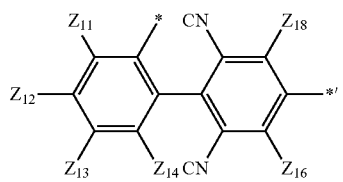
OP11
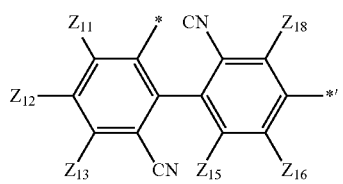
OP12
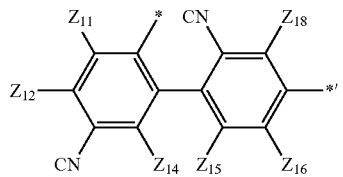
OP13
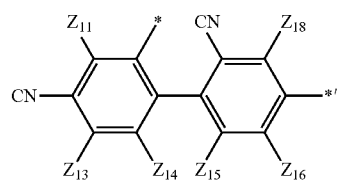
OP14
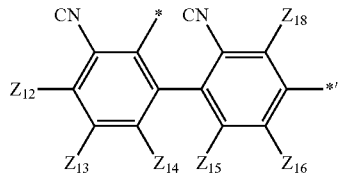
OP15
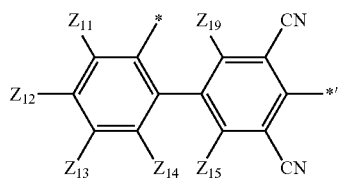
OP16
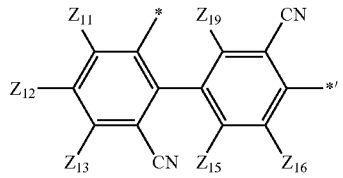
OP17
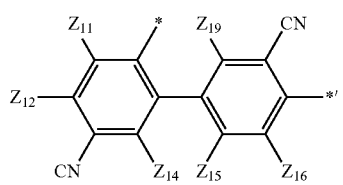
OP18
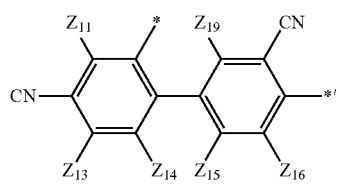
OP19
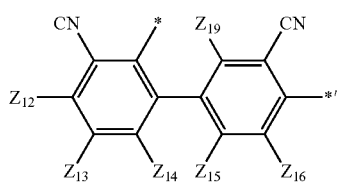
OP20
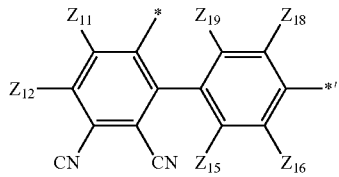
OP21
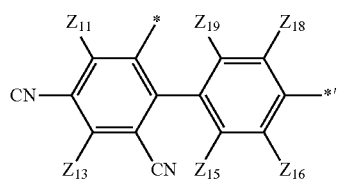
OP22
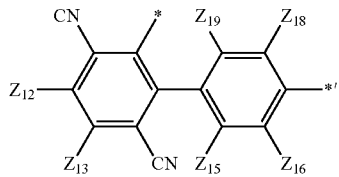
OP23
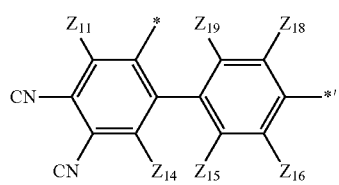
OP24
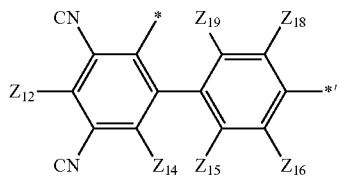
OP25
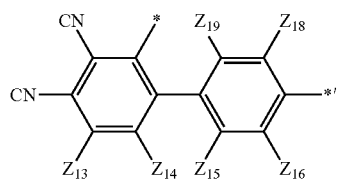

| 215 | 216 |
|---|---|
| O1: benzene with Z19, Z18, Z16, Z15, *', * | O9: benzene with CN, Z18, CN, Z15, *', * |
| O2: benzene with Z19, Z18, Z16, CN, *', * | O10: benzene with Z19, CN, CN, Z15, *', * |
| O3: benzene with Z19, Z18, CN, Z15, *', * | O11: benzene with CN, CN, Z16, Z15, *', * |
| O4: benzene with CN, Z18, Z16, Z15, *', * | O12: benzene with CN, Z18, CN, CN, *', * |
| O5: benzene with Z19, CN, Z16, Z15, *', * | O13: benzene with Z19, CN, CN, CN, *', * |
| O6: benzene with Z19, Z18, CN, CN, *', * | O14: benzene with CN, CN, Z16, CN, *', * |
| O7: benzene with CN, Z18, Z16, CN, *', * | O15: benzene with CN, CN, CN, Z15, *', * |
| O8: benzene with Z19, CN, Z16, CN, *', * | O16: benzene with CN, CN, CN, CN, *', * |

-continued
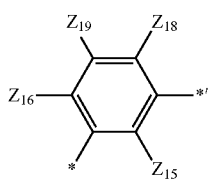 M1
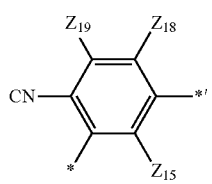 M2
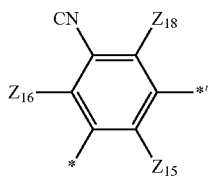 M3
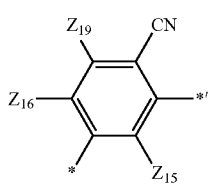 M4
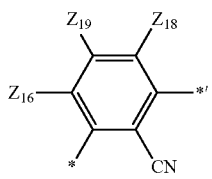 M5
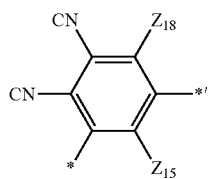 M6
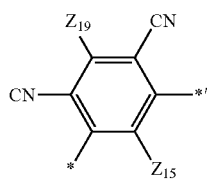 M7
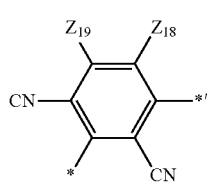 M8
-continued
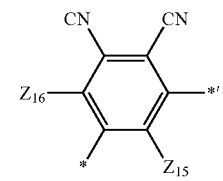 M9
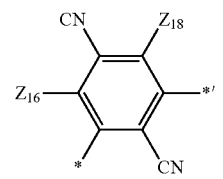 M10
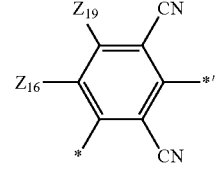 M11
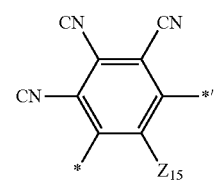 M12
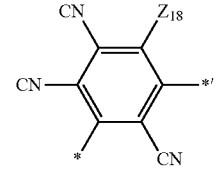 M13
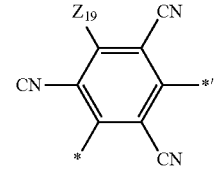 M14
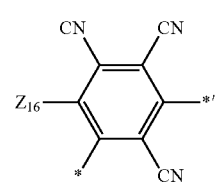 M15
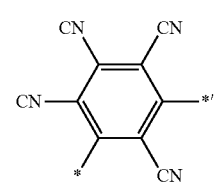 M16

P1 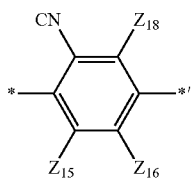

P2 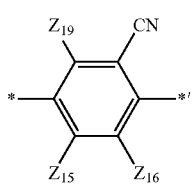

P3 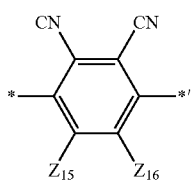

P4 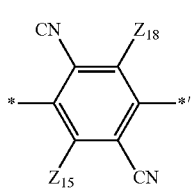

P5 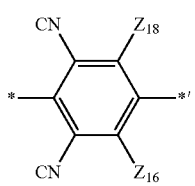

P6 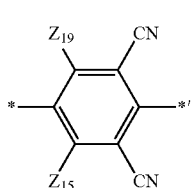

P7 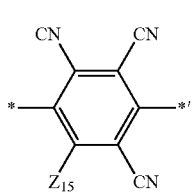

P8 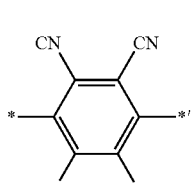

P9 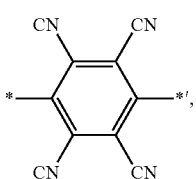

wherein, in Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ are each independently:

hydrogen, deuterium, or a cyano group; or a $C_1$-$C_{20}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_1$-$C_{20}$ alkyl group, a phenyl group, and a biphenyl group, and

*and *' each indicate a binding site to a neighboring atom.

7. The organic light-emitting device of claim 1, wherein a group represented by

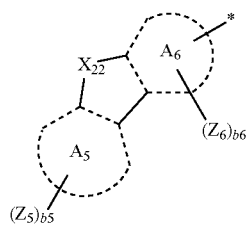

in Formula 1 is selected from groups represented by Formulae 1(1) to 1(4), a group represented by

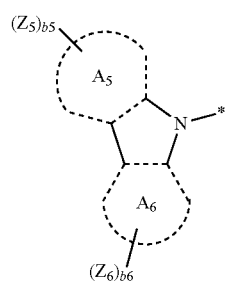

in Formula 2 is selected from groups represented by Formulae 2(1) to 2(12), a group represented by Formula CZ1 is selected from groups represented by Formulae CZ1(1) to CZ1(3), and a group represented by Formula CZ2 is selected from groups represented by Formulae CZ2(1) to CZ2(14):

1(1) 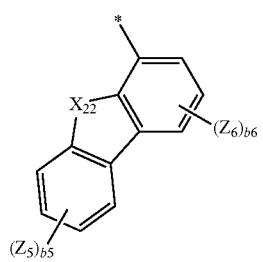
1(2) 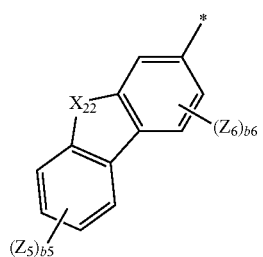
1(3) 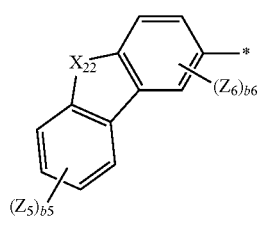
1(4) 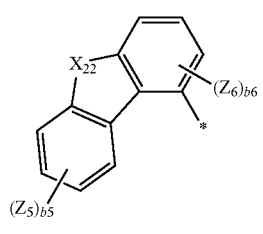
2(1) 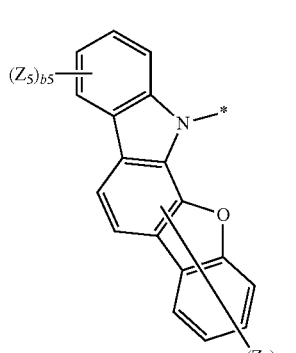
2(2) 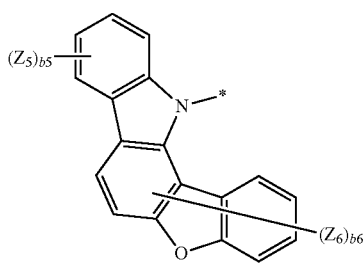
2(3) 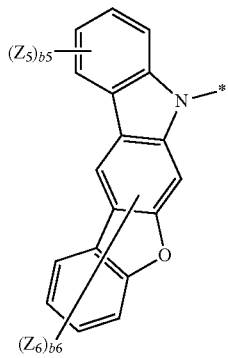
2(4) 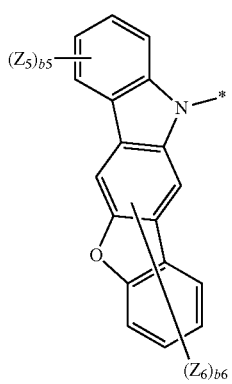
2(5) 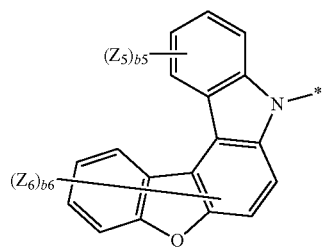
2(6) 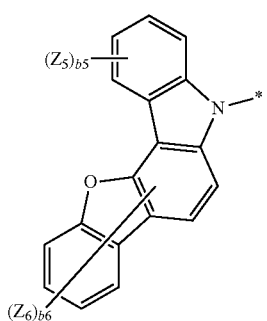

2(7)
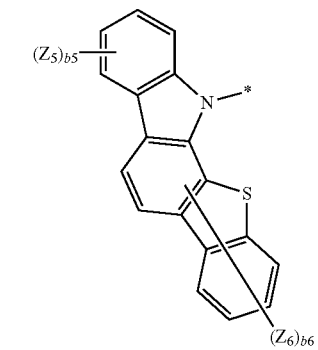
2(8)
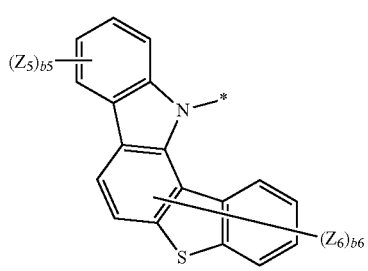
2(9)
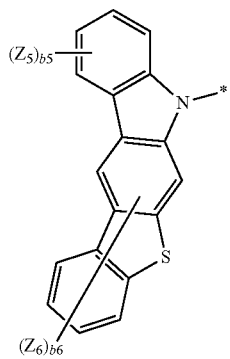
2(10)
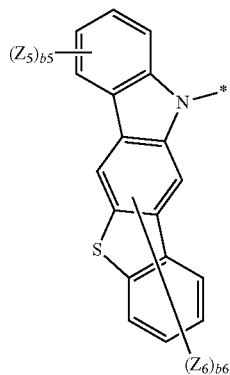
2(11)
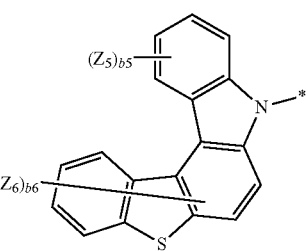
2(12)
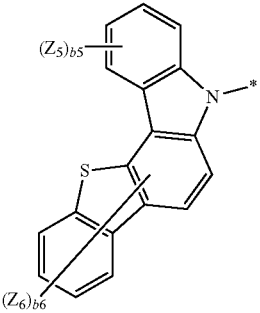
CZ1(1)
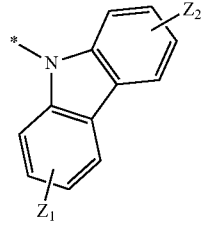
CZ1(2)
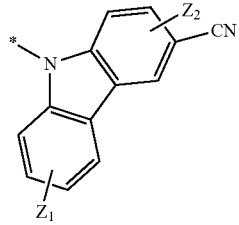
CZ1(3)
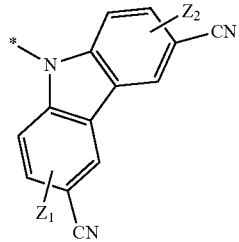
CZ2(1)
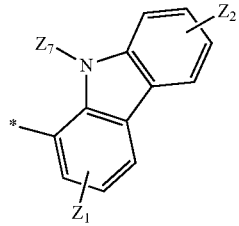
CZ2(2)
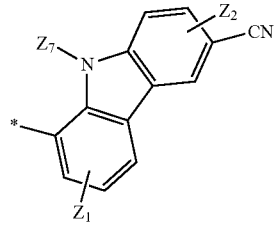

-continued
CZ2(3)
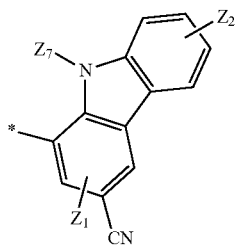
CZ2(4)
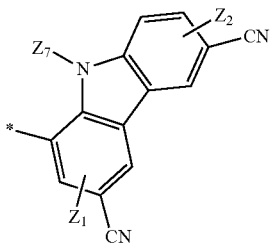
CZ2(5)
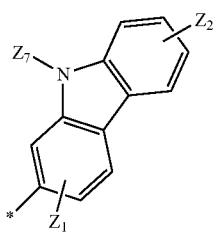
CZ2(6)
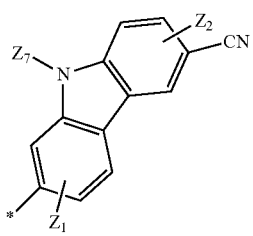
CZ2(7)
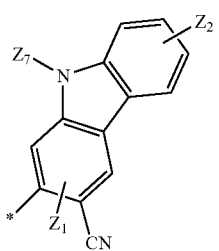
CZ2(8)
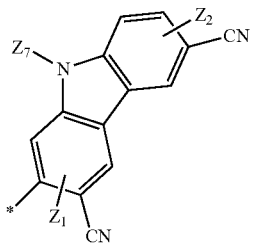
-continued
CZ2(9)
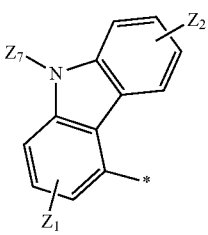
CZ2(10)
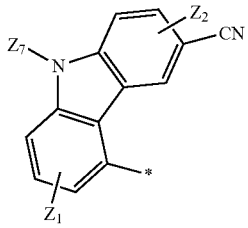
CZ2(11)
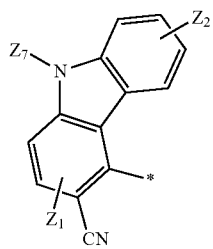
CZ2(12)
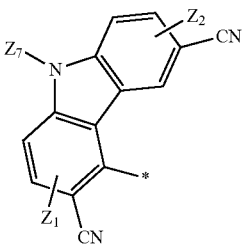
CZ2(13)
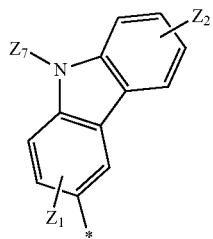
CZ2(14)
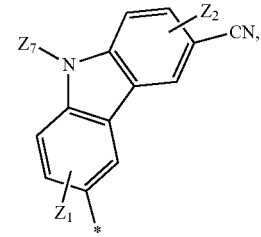
wherein, in Formulae 1(1) to 1(4), 2(1) to 2(12), CZ1(1) to CZ1(3), and CZ2(1) to CZ2(14), $X_{22}$, $Z_1$, $Z_2$, $Z_5$ to $Z_7$, b5, and b6 are each independently the same as described in claim 1, and *indicates a binding site to a neighboring atom.

8. The organic light-emitting device of claim 1, wherein the host comprises at least one compound selected from Compounds H1 to H28:
H1
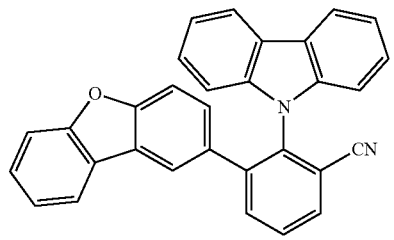
H2
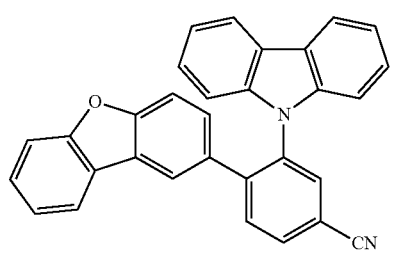
H3
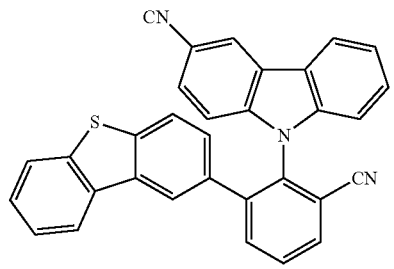
H4
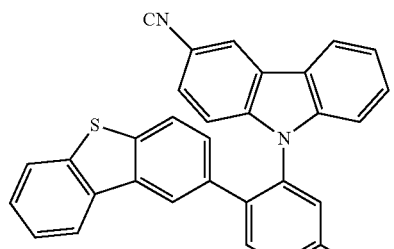
H5
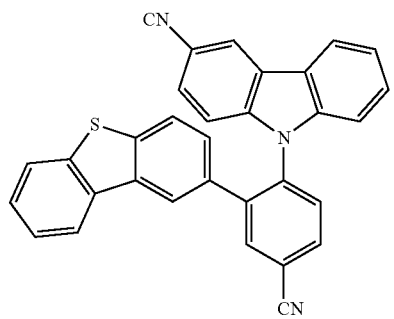
-continued
H6
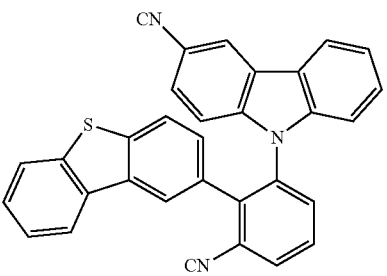
H7
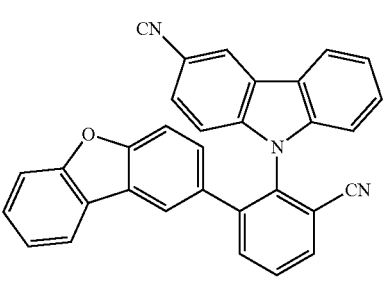
H8
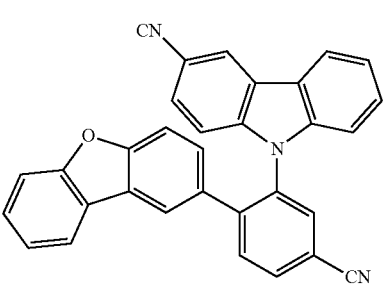
H9
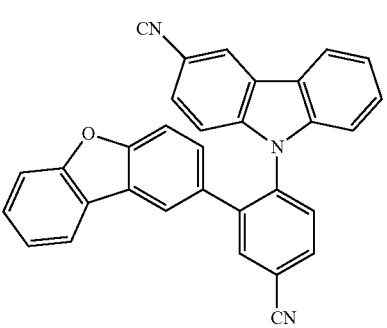
H10
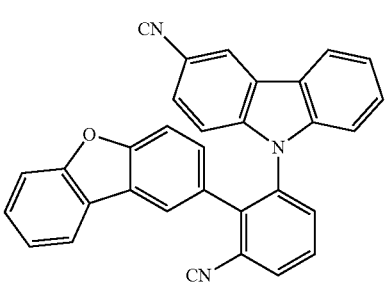

-continued
H11
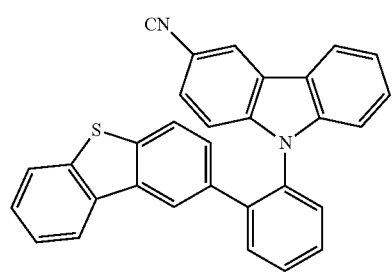
H12
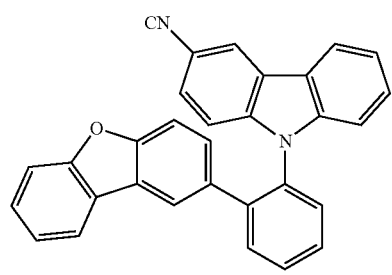
H13
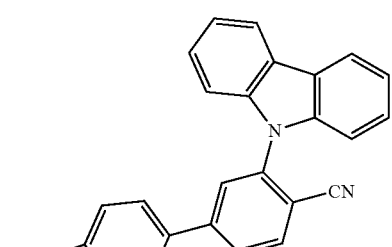
H14
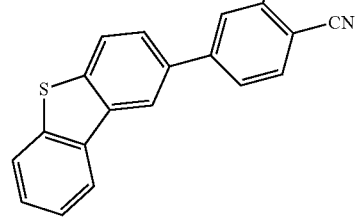
H15
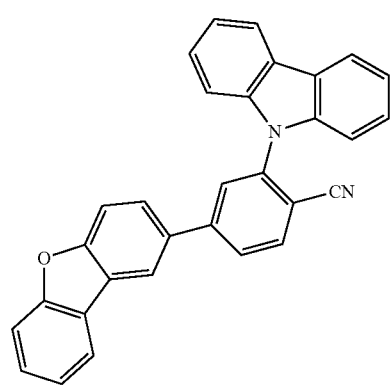
-continued
H16
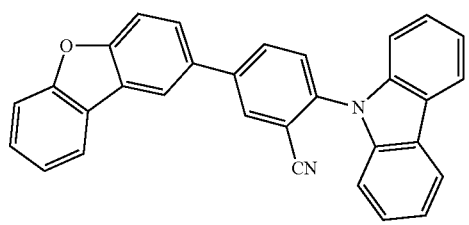
H17
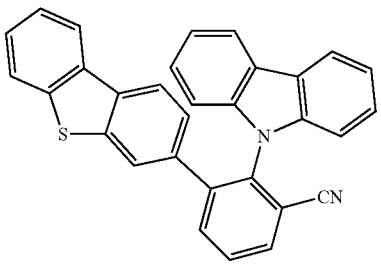
H18
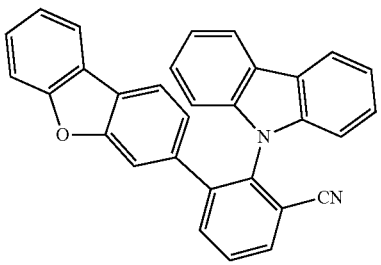
H19
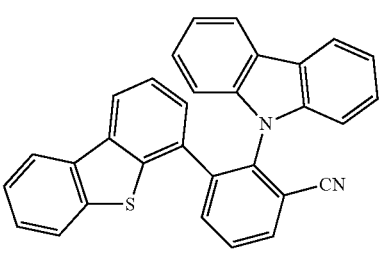
H20
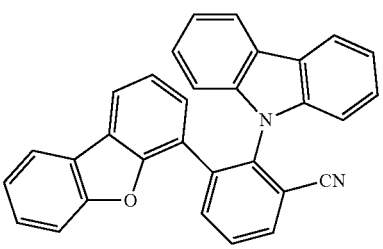
H21
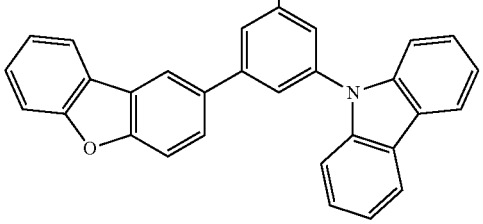

-continued

H22
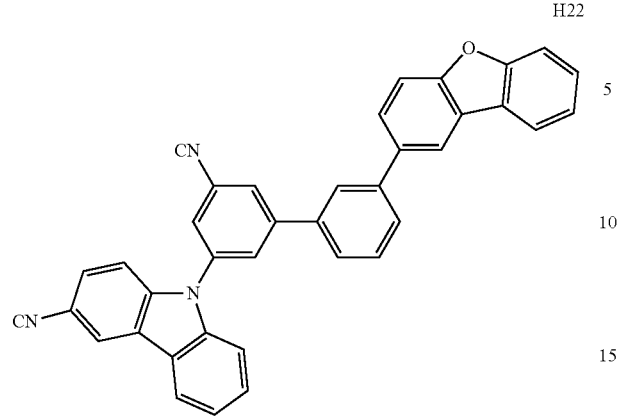

H23
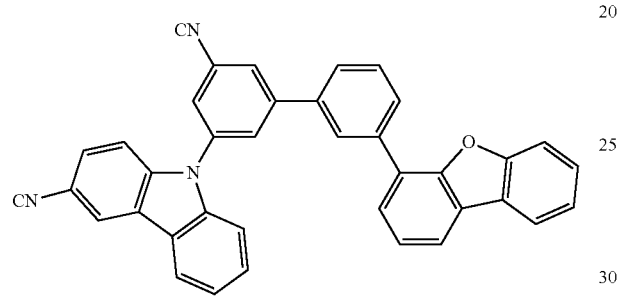

H24
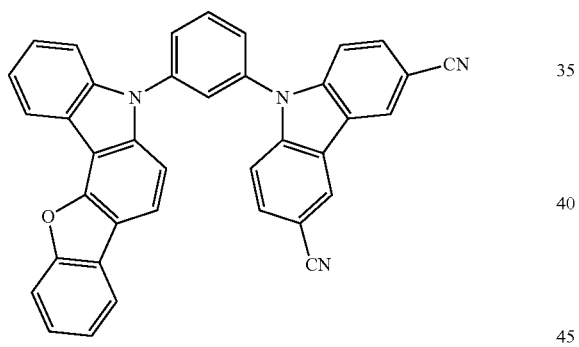

H25
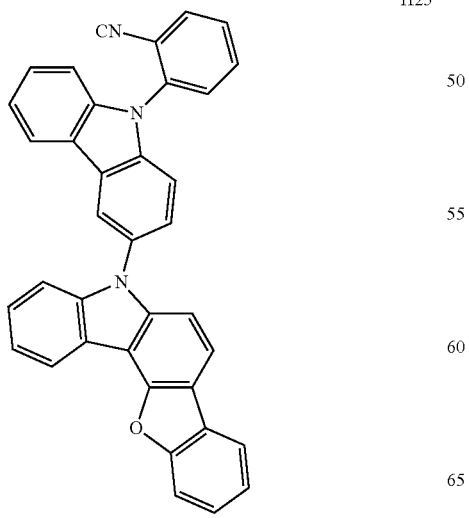

-continued

H26
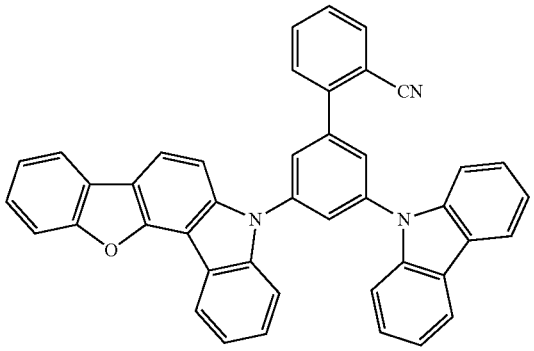

H27
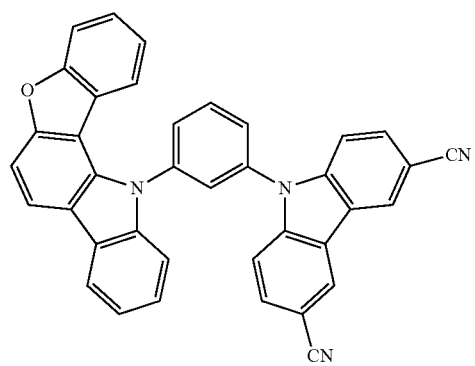

H28
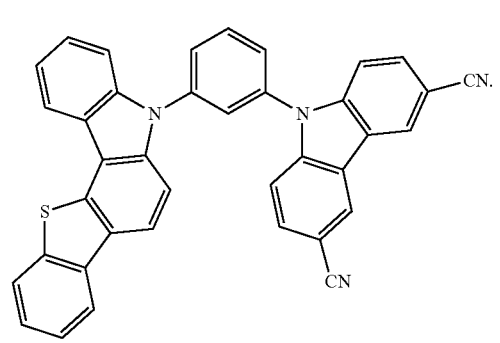

9. The organic light-emitting device of claim 1, wherein the thermally activated delayed fluorescence emitter comprises a compound represented by Formula 11:

Formula 11
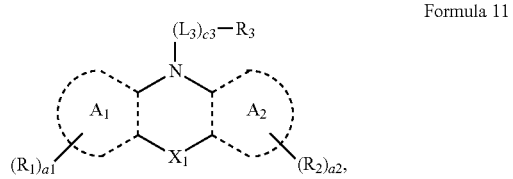

wherein, in Formula 11,
$X_1$ is a single bond, N-[$(L_4)_{c4}$-$R_4$], $C(R_5)(R_6)$, O, or S,
ring $A_1$ and ring $A_2$ are each independently a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, $L_3$ and $L_4$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, c3 and c4 are each independently an integer from 0 to 4, $R_1$ to $R_6$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$), a1 and a2 are each independently an integer from 0 to 10, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroaryl alkyl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$), and $Q_1$ to $Q_7$, $Q_{11}$ to $Q_{17}$, $Q_{21}$ to $Q_{27}$, and $Q_{31}$ to $Q_{37}$ are each independently selected from hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, and a substituted or unsubstituted monovalent non-aromatic condensed heteropolycyclic group.

10. The organic light-emitting device of claim 9, wherein $L_3$ and $L_4$ are each independently selected from:
a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group; and
a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, —Si($Q_{31}$)($Q_{32}$)($Q_{33}$), and —N($Q_{34}$)($Q_{35}$),
$Q_{31}$ to $Q_{35}$ are each independently selected from a $C_1$-$C_{10}$ alkyl group, a $C_1$-$C_{10}$ alkoxy group, a phenyl group, a biphenyl group, a terphenyl group, and a naphthyl group, and
c3 and c4 are each independently 0, 1, or 2.

11. The organic light-emitting device of claim 9, wherein $R_3$ comprises at least one π electron-depleted nitrogen-containing cyclic group.

12. The organic light-emitting device of claim 11, wherein the π electron-depleted nitrogen-containing cyclic group is an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinolic group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

13. The organic light-emitting device of claim 9, wherein $R_3$ is selected from:
a group represented by Formula 13(1) or 13(2);
a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group; and
a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, and —Si($Q_{31}$)($Q_{32}$)($Q_{33}$), and
$Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group:

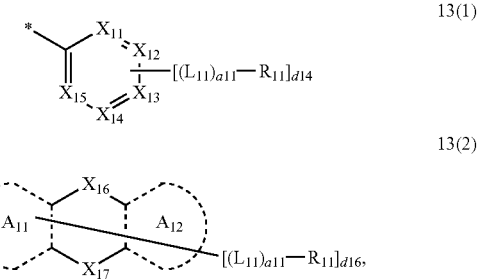

wherein, in Formulae 13(1) and 13(2),
$X_{11}$ to $X_{15}$ are each independently C or N, and at least one selected from $X_{11}$ to $X_{15}$ is N,
ring $A_{11}$ and ring $A_{12}$ are each independently a benzene group, a naphthalene group, a pyridine group, a pyrazine group, a pyrimidine group, a pyridazine group, a quinoline group, an isoquinoline group, a quinoxaline group, or a quinazoline group, and at least one selected from ring $A_{11}$ and ring $A_{12}$ is each independently a pyridine group, a pyrazine group, a pyrimidine group, a pyridazine group, a quinoline group, an isoquinoline group, a quinoxaline group, or a quinazoline group,
$X_{16}$ is N-[($L_{12}$)$_{a12}$-$R_{12}$], C($R_{14}$)($R_{15}$), O, or S,
$X_{17}$ is a single bond, N-[($L_{13}$)$_{a13}$-$R_{13}$], C($R_{16}$)($R_{17}$), O, or S,
$L_{11}$ to $L_{13}$ are each independently the same as described in connection with $L_3$ in claim 9,
a11 to a13 are each independently the same as described in connection with c3 in claim 9, $R_{11}$ to $R_{17}$ are each independently the same as described in connection with $R_1$ in claim 9,
d16 is an integer from 0 to 6,
d14 is an integer from 0 to 4, and
*indicates a binding site to a neighboring atom.
14. The organic light-emitting device of claim 9, wherein $R_3$ is selected from groups represented by Formulae 13-1 to 13-20:
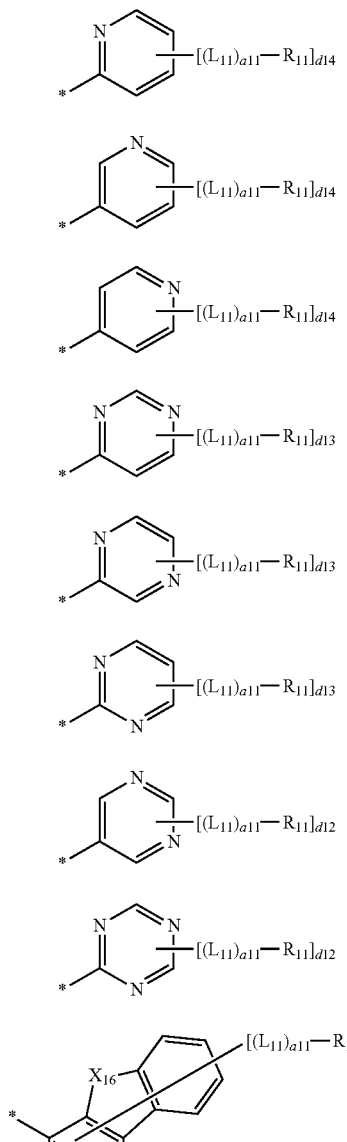
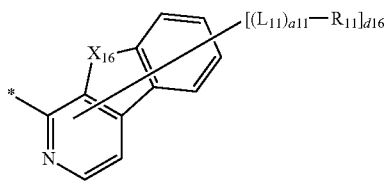
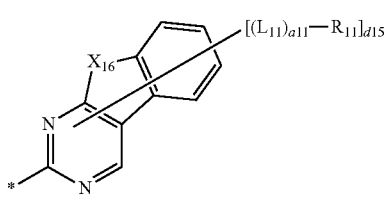
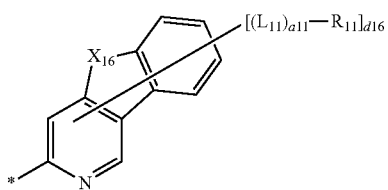
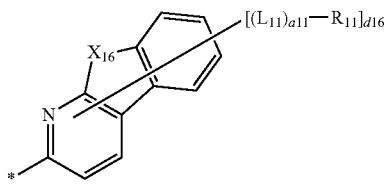
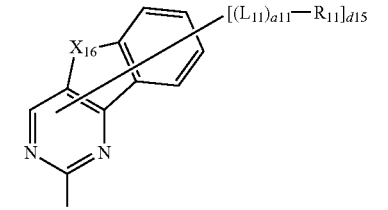
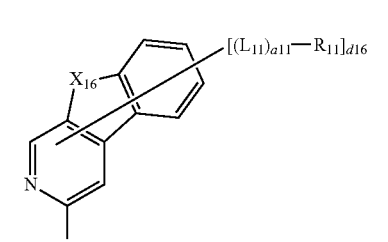
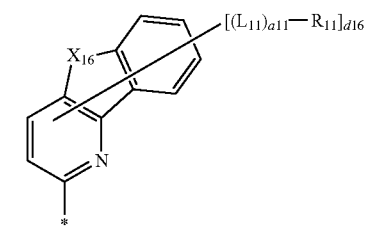

13-18

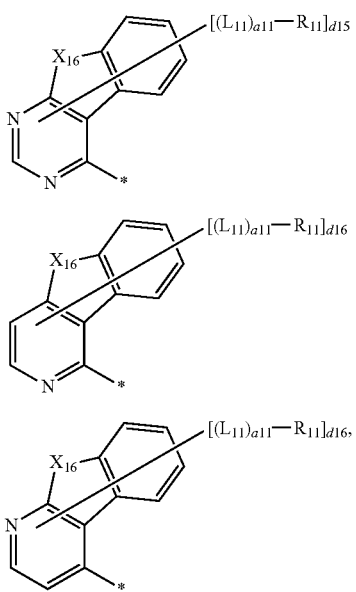

13-19

13-20 wherein, in Formulae 13-1 to 13-20,
$X_{16}$ is $N-[(L_{12})_{a12}-R_{12}]$, $C(R_{14})(R_{15})$, O, or S,
$L_{11}$ and $L_{12}$ are each independently the same as described in connection with $L_3$ in claim 9,
a11 and a12 are each independently the same as described in connection with c3 in claim 9,
$R_{11}$, $R_{12}$, $R_{14}$, and $R_{15}$ are each independently the same as described in connection with $R_1$ in claim 9,
d16 is an integer from 0 to 6,
d15 is an integer from 0 to 5,
d14 is an integer from 0 to 4,
d13 is an integer from 0 to 3,
d12 is an integer from 0 to 2, and
*indicates a binding site to a neighboring atom.

15. The organic light-emitting device of claim 9, wherein the thermally activated delayed fluorescence emitter comprises a compound represented by one selected from Formulae 11-1 to 11-7:

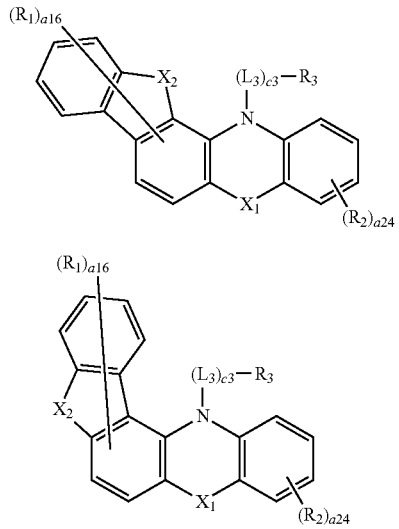

11-1

11-2

11-3

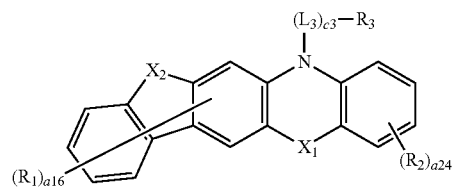

11-4

11-5

11-6

11-7 wherein, in Formulae 11-1 to 11-7,
$X_1$, $L_3$, c3, and $R_1$ to $R_3$ are each independently the same as described in claim 9,
$X_2$ is $N-[(L_5)_{c5}-R_7]$, $C(R_8)(R_9)$, O, or S,
$L_5$ and c5 are each independently the same as described in connection with $L_3$ and c3 in claim 9, respectively,
$R_7$ is the same as described in connection with $R_3$ in claim 9,
$R_8$ and $R_9$ are each independently the same as described in connection with $R_5$ and $R_6$ in claim 9, respectively,
a16 is an integer from 0 to 6, and
a14 and a24 are each independently an integer from 0 to 4.

16. The organic light-emitting device of claim 9, wherein $R_1$, $R_2$, $R_5$, and $R_6$ are each independently selected from hydrogen, deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a carbazolyl group, a dibenzofuranyl group, a dibenzothiophenyl group, an indolocarbazolyl group, —Si($Q_1$)($Q_2$)($Q_3$), and —N($Q_4$)($Q_5$), and $Q_1$ to $Q_5$ are each independently selected from a $C_1$-$C_{10}$ alkyl group, a $C_1$-$C_{10}$ alkoxy group, a phenyl group, a biphenyl group, a terphenyl group, and a naphthyl group.

17. The organic light-emitting device of claim 1, wherein the emission layer does not comprise a transition metal-containing organometallic compound, and a delayed fluorescence component emitted from the thermally activated delayed fluorescence emitter is about 20% or more based on a total emission component emitted from the emission layer.

18. The organic light-emitting device of claim 1, wherein light emitted from the thermally activated delayed fluorescence emitter in the emission layer is blue light.

19. The organic light-emitting device of claim 1, wherein an amount of the thermally activated delayed fluorescence emitter is in a range of about 0.01 parts by weight to about 30 parts by weight based on 100 parts by weight of the host.

20. The organic light-emitting device of claim 1, wherein the difference between a triplet energy level (electron volts) of the thermally activated delayed fluorescence emitter and the singlet energy level (electron volts) of the thermally activated delayed fluorescence emitter is in a range of about 0.2 electron volts to about 0.5 electron volts, and the triplet energy level and the singlet energy level are evaluated by using a DFT method structurally optimized at a level of B3LYP/6-31G(d,p).

\* \* \* \* \*